(12) United States Patent
Lekivetz et al.

(10) Patent No.: US 11,328,106 B2
(45) Date of Patent: May 10, 2022

(54) DATA SET GENERATION FOR PERFORMANCE EVALUATION

(71) Applicant: SAS Institute Inc., Cary, NC (US)

(72) Inventors: Ryan Adam Lekivetz, Cary, NC (US); Joseph Albert Morgan, Raleigh, NC (US); Caleb Bridges King, Cary, NC (US); Bradley Allen Jones, Cary, NC (US)

(73) Assignee: SAS Institute Inc., Cary, NC (US)

( * ) Notice: Subject to any disclaimer, the term of this patent is extended or adjusted under 35 U.S.C. 154(b) by 0 days.

(21) Appl. No.: 17/365,083

(22) Filed: Jul. 1, 2021

(65) Prior Publication Data

US 2021/0326501 A1 Oct. 21, 2021

Related U.S. Application Data

(63) Continuation-in-part of application No. 17/074,022, filed on Oct. 19, 2020, now Pat. No. 11,074,483, (Continued)

(51) Int. Cl.
*G06N 20/00* (2019.01)
*G06N 3/02* (2006.01)
(Continued)

(52) U.S. Cl.
CPC .............. *G06F 30/20* (2020.01); *G06N 3/08* (2013.01)

(58) Field of Classification Search
CPC .. G06K 9/6262; G06K 9/6228; G06K 9/6232; G06K 9/629; G06N 20/00; G06N 3/084
See application file for complete search history.

(56) References Cited

U.S. PATENT DOCUMENTS 7,295,956 B1 11/2007 Ruetsch
7,536,364 B2 5/2009 Subbu et al.
(Continued)

OTHER PUBLICATIONS

Lekivetz, R. et al., "Combinatorial Testing: Using Blocking to Assign Test Cases for Validating Complex Software Systems", Statistical Theory and Related Fields, vol. 5 Issue 2, Apr. 6, 2021, pp. 114 121, Taylor & Francis.
(Continued)

*Primary Examiner* — David F Dunphy
(74) *Attorney, Agent, or Firm* — Coats & Bennett, PLLC

(57) ABSTRACT

A computing system receives a request to generate computer-generated data for an experiment. The computer-generated data comprises generated inputs defining setting(s) for a plurality of factors for a design of the experiment. The generated inputs are generated to be representative of a respective design space of different design spaces for the design of the experiment. The system receives first characteristic(s) for specifying generation of the computer-generated data associated with a first design space. The system receives second characteristic(s) for specifying generation of the computer-generated data associated with a second design space. The system, responsive to the request, generates a design suite that comprises the computer-generated data that represents, in a first set of design cases of the design suite, settings constrained by the first design space, and represents, in a second set of design cases of the design suite, settings constrained by the second design space.

30 Claims, 86 Drawing Sheets

Related U.S. Application Data which is a continuation-in-part of application No. 16/663,474, filed on Oct. 25, 2019, now Pat. No. 10,878,345, which is a continuation-in-part of application No. 16/154,332, filed on Oct. 8, 2018, now Pat. No. 10,503,846.

(60) Provisional application No. 63/172,354, filed on Apr. 8, 2021, provisional application No. 63/057,025, filed on Jul. 27, 2020, provisional application No. 62/886,162, filed on Aug. 13, 2019, provisional application No. 62/681,651, filed on Jun. 6, 2018, provisional application No. 62/661,061, filed on Apr. 22, 2018.

(51) Int. Cl.
  *G06K 9/62* (2006.01)
  *G06F 17/16* (2006.01)
  *G06F 30/20* (2020.01)
  *G06N 3/08* (2006.01)

(56) References Cited

U.S. PATENT DOCUMENTS

| | | |
|---|---|---|
| 7,742,902 B1 | 6/2010 | Ruetsch |
| 8,577,480 B2 | 11/2013 | Vikström et al. |
| 8,898,042 B2 | 11/2014 | Stander |
| 2004/0143798 A1 | 7/2004 | Washizawa et al. |
| 2005/0143962 A1 | 6/2005 | Keane et al. |
| 2005/0246148 A1 | 11/2005 | Levitan et al. |
| 2006/0095888 A1 | 5/2006 | Li et al. |
| 2008/0010044 A1 | 1/2008 | Ruetsch |
| 2008/0201117 A1 | 8/2008 | Wong et al. |
| 2009/0083680 A1 | 3/2009 | McConaghy et al. |
| 2009/0125285 A1 | 5/2009 | Gugaliya et al. |
| 2009/0132216 A1 | 5/2009 | Grichnik et al. |
| 2011/0011595 A1 | 1/2011 | Huang et al. |
| 2011/0029235 A1 | 2/2011 | Berry |
| 2012/0150508 A1 | 6/2012 | Wikström et al. |
| 2012/0253770 A1 | 10/2012 | Stern et al. |
| 2013/0346036 A1 | 12/2013 | Börjesson |
| 2014/0074758 A1 | 3/2014 | Amid et al. |
| 2014/0365180 A1 | 12/2014 | Lam et al. |
| 2015/0017609 A1 | 1/2015 | Leao et al. |
| 2015/0019173 A1 | 1/2015 | Amid et al. |
| 2015/0347641 A1 | 12/2015 | Gristede et al. |
| 2016/0147916 A1 | 5/2016 | Liu et al. |
| 2017/0255721 A1 | 9/2017 | Kowatar et al. |
| 2021/0241866 A1* | 8/2021 | Bhattacharya ......... G16H 40/20 |

OTHER PUBLICATIONS

Xie, H., et al. "General Sliced Latin Hypercube Designs", Statistica Sinica, vol. 24 No. 3, Jul. 1, 2014, pp. 1239-1256, Institute of Statistical Science, Academia Sinica.

Joseph, V. et al., "Maximum Projection Designs for Computer Experiments", Biometrika Advance Access, Mar. 18, 2018, pp. 1-10, Biometrika Trust.

Mak, S. et al., "Minimax and Minimax Projection Designs Using Clustering", arXiv:1602.03938v3 [stat.CO], Oct. 28, 2016, pp. 1-43.

Lekiveiz, R. et al., "Fast Flexible Space-Filling Designs for Nonrectangular Regions", Wiley Online Library: Quality and Reliability Engineering International, vol. 31, Mar. 21, 2014, pp. 829-837, John Wiley & Sons, Ltd.

D'Huys, K. et al., "Design and Analysis of Computer Experiments for Efficient Model-based Active Thermography in the Agro-food Sector", 13th International Conference on Quantitative Infrared Thermography (QIRT 2016), 10.21611/qirt.2016/026, Feb. 1, 2017, pp. 1-10, retrieved on Sep. 10, 2018, retrieved from the internet: https://www.ndt.net/search/docs.php3?showForm=off&id=20687.

Keresztes, J. et al., "Augmented Design and Analysis of Computer Experiments: a Novel Tolerance Embedded Global Optimization Approach Applied to SWIR Hyperspectral Illumination Design", Optics Express 29380, vol. 24 No. 26, Dec. 26, 2016, pp. 1-26, Optical Society of America.

Draguljić, D. et al., "Noncollapsing Space-Filling Designs for Bounded Nonrectangular Regions", Technometrics, vol. 54 No. 2, May 25, 2012, pp. 169-178, American Statistical Association and the American Society for Quality.

Ba, S., "Maximin-Distance (Sliced) Latin Hypercube Designs", Package 'SLHD', Version 2-.1-1, Jan. 28, 2015, pp. 1-5.

Ba, S. et al., "Optimal Sliced Latin Hypercube Designs", Technometrics, vol. 57 No. 4, Nov. 1, 2015, pp. 479-487, American Statistical Association and the American Society for Quality.

Kuhn, D. et al., "Software Fault Interactions and Implications for Software Testing," IEEE Transactions on Software Engineering, vol. 30 No. 6, Jun. 1, 2004, pp. 418-421, IEEE.

Dalal, S. et al., "Factor-Covering Designs for Testing Software," Technometrics, vol. 40 No. 3, Aug. 1, 1998, pp. 234-243, American Statistical Association and the American Society for Quality.

Morgan, J., "Combinatorial Testing: An Approach to Systems and Software Testing Based on Covering Arrays", Analytic Methods in Systems and Software Testing, Chapter 5, Jul. 6, 2018, pp. 131-158, John Wiley & Sons Ltd.

Yilmaz, C. et al., "Covering Arrays for Efficient Fault Characterization in Complex Configuration Spaces", ISSTA '04: Proceedings of the 2004 ACM SIGSOFT International Symposium on Software Testing and Analysis, Jul. 11, 2004, pp. 1-20, ACM.

SAS Institute, "Quality Statement—JMP", pp. 1-4, retrieved on:= Aug. 10, 2020, retrieved from internet: https://www.jmp.com/en_us/software/quality-statement.html.

Huang et al., "Adaptive Random Test Case Generation for Combinatorial Testing", 2012 IEEE 36th International Conference on Computer Software and Applications, Jul. 16, 2012, pp. 52-61, IEEE.

Harman, M. et al., "Achievements, Open Problems, and Challenges for Search Based Software Testing", 2015 IEEE 8th International Conference on Software Testing, Verification and Validation (ICST), Apr. 13, 2015, pp. 1-12, IEEE.

Ghandehari, L. et al., "Fault Localization Based on Failure-Inducing Combinations", 2013 IEEE 24th International Symposium on Software Reliability Engineering (ISSRE), Nov. 4, 2013, pp. 168-177, IEEE.

Danziger, P. et al., "Covering Arrays Avoiding Forbidden Edges", Theoretical Computer Science, vol. 410 Issue 52, Dec. 6, 2009, pp. 5403-5414, Elsevier.

Cohen, M. et al., "Interaction Testing of Highly-Configurable Systems in the Presence of Constraints", ISSTA '07: Proceedings of the 2007 International Symposium on Software Testing and Analysis, Jul. 9, 2007, pp. 1-11, ACM.

\* cited by examiner

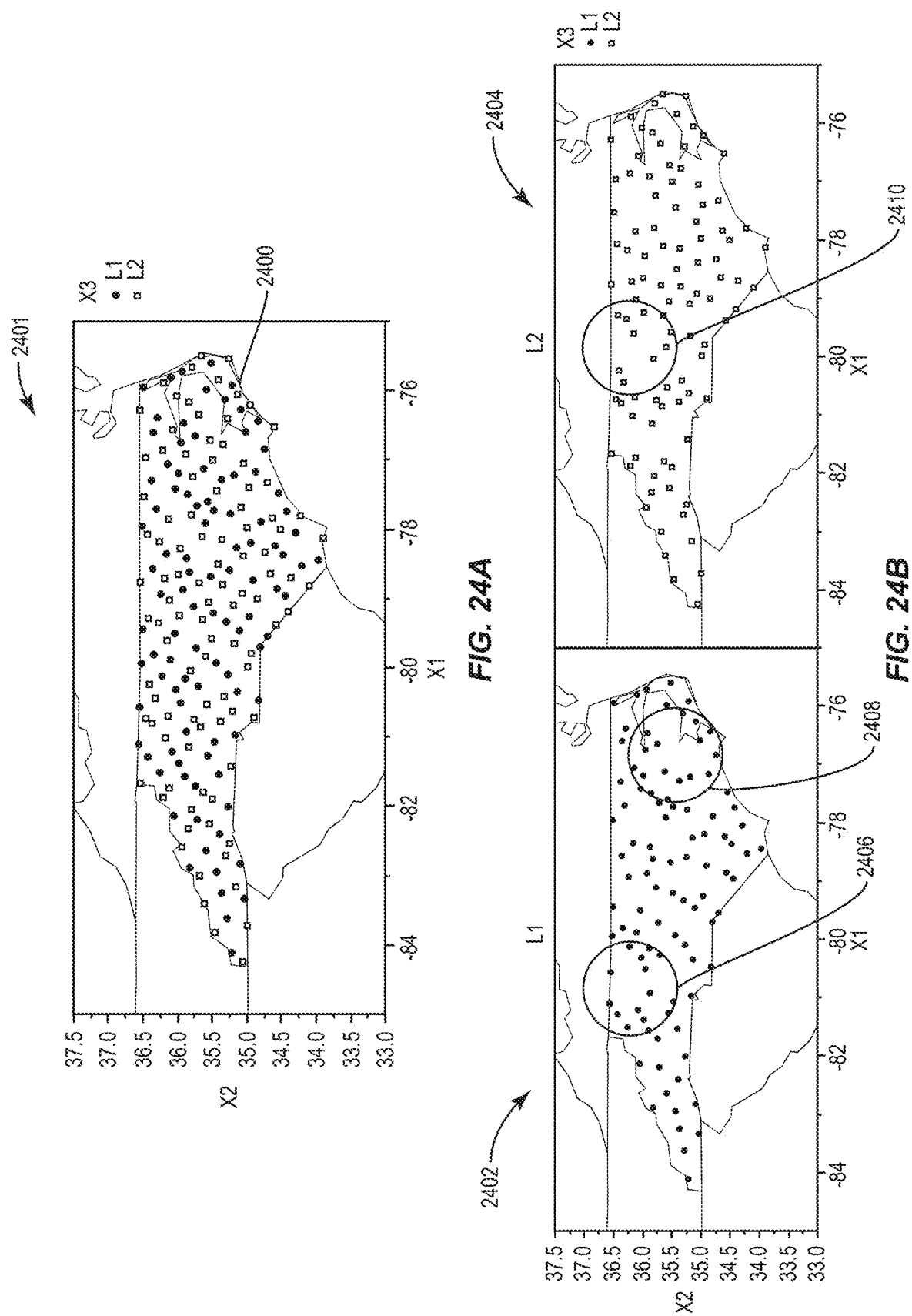

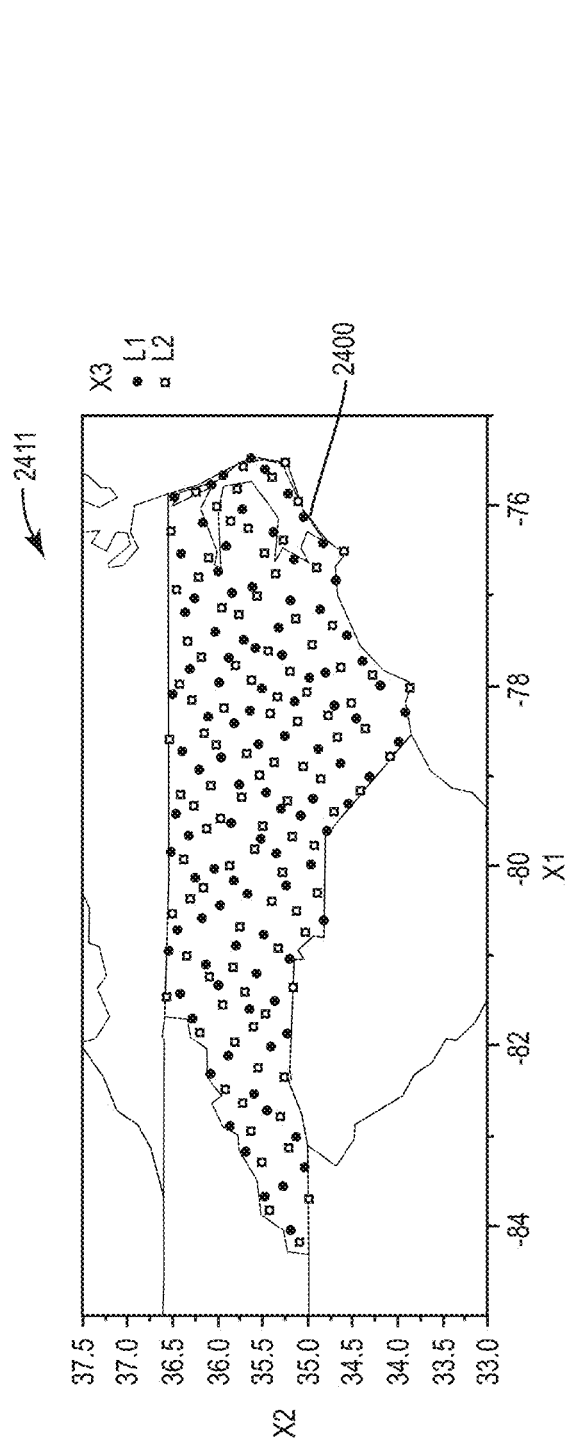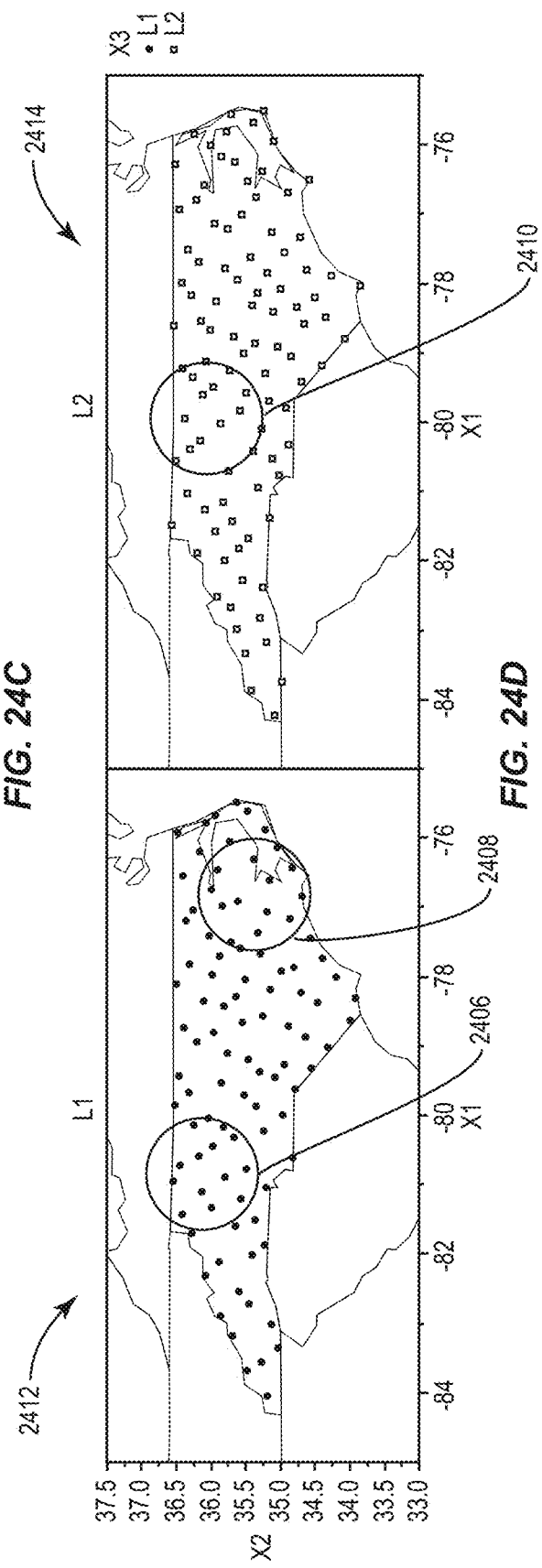

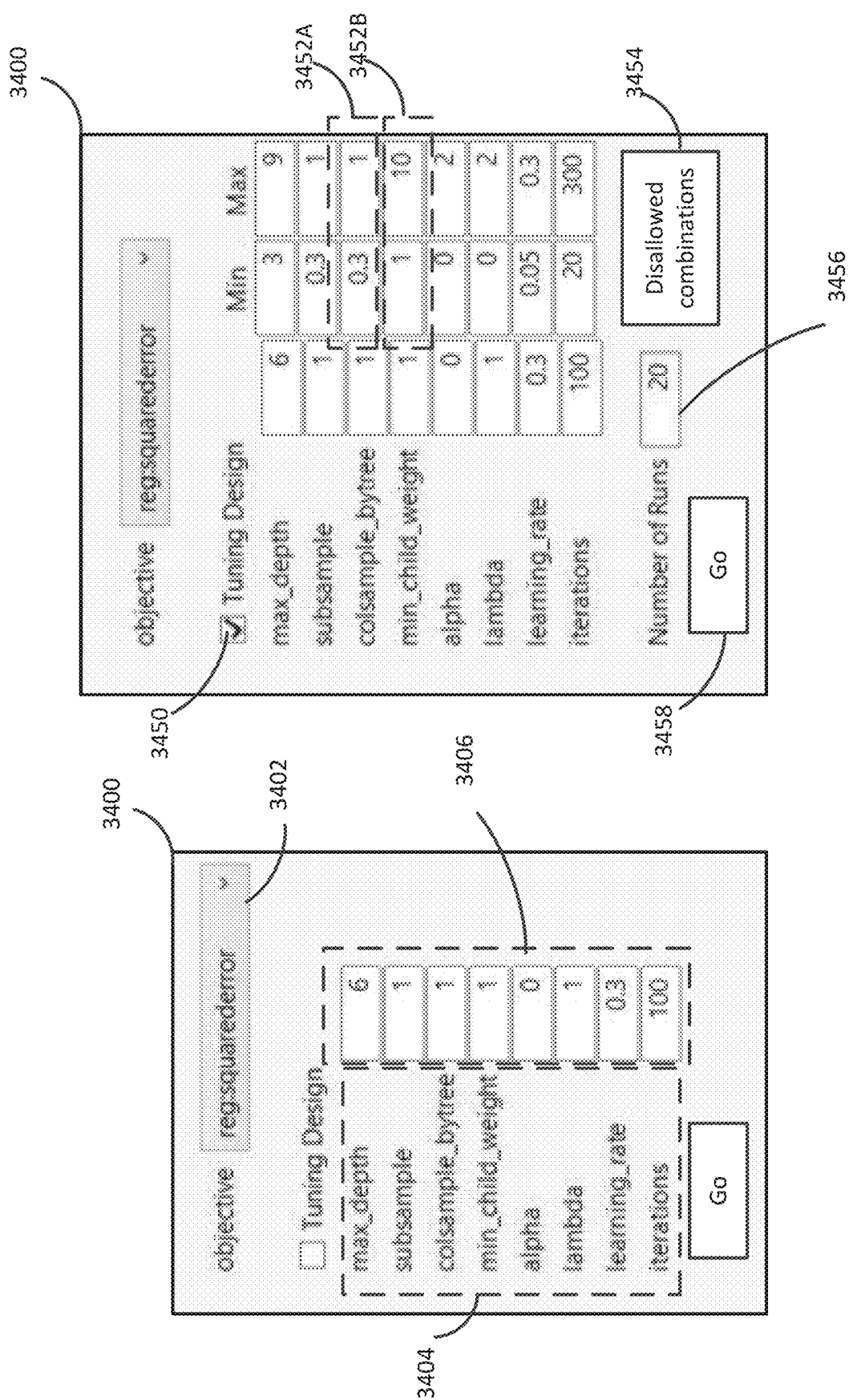

| Model | Response | Train RSquare | Val RSquare | max_depth | subsample | colsample_bytree | min_child_weight | alpha | lambda | learning rate | iterations |
|---|---|---|---|---|---|---|---|---|---|---|---|
| | | | | 6 | 1 | 1 | 1 | 0 | 1 | 0.3 | 100 |
| 1 | mvalue | 1.0000 | 0.8845 | 6 | 1 | 1 | 1 | 0 | 1 | 0.3 | 100 |
| 2 | mvalue | 0.9958 | 0.8745 | 5 | 0.992 | 0.7606 | 8.8805 | 1.2612 | 1.5399 | 0.0899 | 251 |
| 3 | mvalue | 0.9922 | 0.8617 | 5 | 0.3382 | 0.8298 | 9.9669 | 1.6888 | 1.9905 | 0.273 | 191 |
| 4 | mvalue | 0.8619 | 0.7890 | 3 | 0.6426 | 0.9069 | 8.7552 | 1.4312 | 1.2092 | 0.0729 | 38 |
| 5 | mvalue | 0.9369 | 0.8513 | 3 | 0.3155 | 0.3712 | 5.2 | 1/5233 | 1.002 | 0.0507 | 203 |
| 6 | mvalue | 0.9906 | 0.8714 | 5 | 0.9512 | 0.9945 | 9.9013 | 1.5722 | 0.5783 | 0.1568 | 81 |
| 7 | mvalue | 0.9440 | 0.8474 | 4 | 0.8895 | 0.6752 | 7.8476 | 0.6136 | 1.147 | 0.1357 | 31 |
| 8 | mvalue | 0.9430 | 0.8496 | 3 | 0.3047 | 0.7166 | 3.9576 | 0.9142 | 1.3475 | 0.2107 | 40 |
| 9 | mvalue | 0.9686 | 0.8752 | 6 | 0.5639 | 0.8973 | 6.2389 | 1.9924 | 0.4385 | 0.1098 | 118 |
| 10 | mvalue | 0.9981 | 0.8710 | 6 | 0.8584 | 0.4485 | 9.2622 | 1.7865 | 0.768 | 0.1512 | 237 |
| 11 | mvalue | 0.9877 | 0.8746 | 6 | 0.3813 | 0.99 | 8.2059 | 1.4059 | 0.0102 | 0.0824 | 294 |
| 12 | mvalue | 0.9879 | 0.8847 | 4 | 0.9396 | 0.8539 | 1.8142 | 1.9627 | 0.6362 | 0.0588 | 156 |
| 13 | mvalue | 0.9847 | 0.8699 | 6 | 0.6851 | 0.7496 | 4.4363 | 0.9408 | 1.2822 | 0.0539 | 150 |
| 14 | mvalue | 0.9931 | 0.8790 | 4 | 0.4575 | 0.8809 | 2.9287 | 1.1952 | 1.4049 | 0.1332 | 163 |
| 15 | mvalue | 0.9984 | 0.8807 | 6 | 0.31 | 0.9567 | 1.7271 | 0.777 | 0.8274 | 0.1413 | 243 |
| 16 | mvalue | 0.9992 | 0.8740 | 4 | 0.3646 | 0.6605 | 2.4065 | 1.0637 | 1.7253 | 0.2486 | 291 |
| 17 | mvalue | 1.0000 | 0.8138 | 6 | 0.3077 | 0.435 | 1.3352 | 0.1899 | 0.0044 | 0.2492 | 279 |

*FIG. 35*

| | max_depth | subsample | colsample_bytree | min_child_weight | alpha | lambda |
|---|---|---|---|---|---|---|
| 1 | 5.360496045 | 0.8920494565 | 0.760626954 | 8.860466564 | 1.261506265 | 1.539 |
| 2 | 5.948829345 | 0.3382167363 | 0.629792679 | 9.356820192 | 1.688306609 | 1.99 |
| 3 | 3.447417201 | 0.6427809163 | 0.906667955 | 8.751574333 | 1.431150146 | 1.209 |
| 4 | 3.072009153 | 0.3155241953 | 0.371206622 | 5.200040367 | 1.152314056 | 1.002 |
| 5 | 5.408591791 | 0.9512208137 | 0.994304227 | 9.613481106 | 1.572209712 | 0.578 |
| 6 | 4.072034607 | 0.8895097701 | 0.675199808 | 7.847628734 | 0.613570265 | 1.147 |
| 7 | 3.878093894 | 0.3046859276 | 0.71683825 | 3.957639782 | 0.914205773 | 1.347 |
| 8 | 6.079632863 | 0.5639235431 | 0.897259467 | 6.239866151 | 1.902408394 | 0.438 |
| 9 | 6.118117079 | 0.858431721 | 0.448461386 | 9.262194528 | 1.786526920 | 0.76 |
| 10 | 6.589229863 | 0.381289547 | 0.990014713 | 8.205692873 | 1.405607465 | 0.01 |
| 11 | 4.014125733 | 0.936630932 | 0.853940680 | 1.814183722 | 1.962689566 | 0.63 |
| 12 | 6.519347935 | 0.685074371 | 0.749592694 | 4.436325770 | 0.940795111 | 1.282 |
| 13 | 4.804011599 | 0.457498284 | 0.890879965 | 2.928699242 | 1.195188591 | 1.404 |
| 14 | 8.474343442 | 0.310027357 | 0.958745836 | 1.727068388 | 0.776993586 | 0.827 |
| 15 | 4.707026588 | 0.384604033 | 0.660625192 | 2.400535046 | 1.063652885 | 1.725 |
| 16 | 8.023833573 | 0.307716263 | 0.435032753 | 1.336184293 | 0.169859430 | 0.004 |
| 17 | 4.156349591 | 0.625682212 | 0.679324179 | 7.360382470 | 1.618625198 | 0.561 |
| 18 | 6.441044823 | 0.432357383 | 0.352092765 | 1.190205383 | 1.630477106 | 0.277 |
| 19 | 4.850234237 | 0.820432391 | 0.394359967 | 4.866263367 | 1.927457264 | 0.901 |

FIG. 36

| Covering Array | | | |
|---|---|---|---|
| ▷ Responses | | | |
| ⊿ Factors | | | |

| Name | Role | Values | |
|---|---|---|---|
| max_depth | Continuous | 3 | 9 |
| subsample | Continuous | 0.3 | 1 |
| colsample_bytree | Continuous | 0.3 | 1 |
| min_child_weight | Continuous | 1 | 10 |
| alpha | Continuous | 0 | 2 |
| lambda | Continuous | 0 | 2 |
| learning_rate | Continuous | 0.05 | 0.3 |
| iterations | Continuous | 20 | 300 |
| tree_method | Categorical | auto exact approx hist | gpu_ex gpu_hist |
| predictor | Categorical | cpu_predictor | gpu_predictor |
| grow_policy | Categorical | depthwise | lossguide |
| booster | Categorical | gbtree gblinear | dart |
| process_type | Categorical | default | update |
| sample_type | Categorical | uniform | weighted |
| normalize_type | Categorical | tree | forest |
| feature_selector | Categorical | cyclic shuffle | greedy thrifty |
| colsample_bylevel | Continuous | 0.3 | 1 |
| colsample_bynode | Continuous | 0.3 | 1 |
| max_delta_step | Continuous | 0 | 10 |
| gamma | Continuous | 0 | 10 |
| scale_pos_weight | Continuous | 1 | 10 |
| num_parallel_tree | Continuous | 1 | 10 |
| base_score | Continuous | 0.3 | 1 |
| nthread | Continuous | 0 | 10 |
| seed | Continuous | 0 | 12345 |
| sketch_eps | Continuous | 0 | 0.5 |
| refresh_leaf | Continuous | 0 | 1 |
| max_leaves | Continuous | 0 | 10 |
| max_bin | Continuous | 256 | 512 |
| rate_drop | Continuous | 0 | 0.5 |
| one_drop | Continuous | 0 | 0.5 |
| skip_drop | Continuous | 0 | 0.5 |
| top_k | Continuous | 0 | 10 |
| tweedie_variance_pow | Continuous | 1.5 | 2 |

*FIG. 43A*

| Test Case | max_depth | subsample | colsample_bytree | min_child | alpha | lambda | learning_rate | iterations | tree_method | predictor | grow_policy |
|---|---|---|---|---|---|---|---|---|---|---|---|
| 1 | 3 | 1 | 0.3 | 10 | 2 | 0 | 0.3 | 20 | gpu_exact | cpu_predictor | lossguide |
| 2 | 3 | 0.3 | 0.3 | 10 | 2 | 2 | 0.3 | 300 | auto | gpu_predictor | depthwise |
| 3 | 9 | 0.3 | 1 | 10 | 0 | 0 | 0.3 | 300 | auto | cpu_predictor | depthwise |
| 4 | 9 | 1 | 1 | 10 | 0 | 2 | 0.3 | 20 | hist | cpu_predictor | depthwise |
| 5 | 3 | 1 | 0.3 | 1 | 0 | 2 | 0.05 | 20 | approx | cpu_predictor | lossguide |
| 6 | 9 | 0.3 | 1 | 1 | 0 | 0 | 0.05 | 20 | gpu_hist | cpu_predictor | lossguide |
| 7 | 3 | 1 | 0.3 | 1 | 2 | 2 | 0.05 | 20 | approx | gpu_predictor | depthwise |
| 8 | 3 | 1 | 0.3 | 10 | 2 | 2 | 0.05 | 300 | hist | gpu_predictor | depthwise |
| 9 | 9 | 1 | 0.3 | 10 | 0 | 2 | 0.3 | 300 | exact | cpu_predictor | lossguide |
| 10 | 9 | 0.3 | 0.3 | 1 | 0 | 2 | 0.05 | 300 | gpu_exact | gpu_predictor | depthwise |
| 11 | 9 | 0.3 | 1 | 1 | 2 | 0 | 0.05 | 20 | gpu_exact | gpu_predictor | lossguide |
| 12 | 3 | 0.3 | 1 | 1 | 2 | 2 | 0.05 | 300 | exact | gpu_predictor | lossguide |
| 13 | 9 | 0.3 | 0.3 | 10 | 0 | 2 | 0.3 | 300 | approx | gpu_predictor | lossguide |
| 14 | 3 | 1 | 1 | 1 | 0 | 0 | 0.3 | 300 | gpu_hist | gpu_predictor | depthwise |
| 15 | 3 | 1 | 0.3 | 1 | 0 | 0 | 0.05 | 20 | gpu_hist | gpu_predictor | depthwise |
| 16 | 9 | 1 | 1 | 10 | 2 | 0 | 0.05 | 20 | approx | gpu_predictor | lossguide |
| 17 | 3 | 0.3 | 0.3 | 1 | 0 | 2 | 0.05 | 20 | hist | gpu_predictor | lossguide |
| 18 | 3 | 1 | 1 | 10 | 0 | 0 | 0.05 | 20 | exact | cpu_predictor | depthwise |
| 19 | 9 | 0.3 | 1 | 1 | 2 | 2 | 0.05 | 20 | hist | gpu_predictor | lossguide |
| 20 | 3 | 1 | 0.3 | 10 | 2 | 0 | 0.05 | 20 | exact | gpu_predictor | lossguide |
| 21 | 9 | 1 | 1 | 1 | 0 | 0 | 0.05 | 20 | auto | cpu_predictor | lossguide |
| 22 | 3 | 1 | 1 | 10 | 2 | 0 | 0.3 | 300 | gpu_hist | gpu_predictor | depthwise |
| 23 | 9 | 1 | 1 | 1 | 2 | 0 | 0.3 | 20 | gpu_exact | cpu_predictor | lossguide |
| 24 | 3 | 1 | 0.3 | 10 | 2 | 2 | 0.05 | 20 | auto | cpu_predictor | depthwise |

| Test Case | base_score | nthread | seed | sketch_eps | refresh_leaf | max_leaves | max_bin | rate_drop | one_drop | skip_drop | top_k | tweedie_variance_power |
|---|---|---|---|---|---|---|---|---|---|---|---|---|
| 1 | 1 | 0 | 0 | 0 | 0 | 1 | 256 | 0.5 | 0.5 | 0 | 0 | 1.5 |
| 2 | 0.3 | 0 | 12345 | 0 | 0 | 1 | 512 | 0 | 0 | 0.5 | 0 | 1.5 |
| 3 | 0.3 | 10 | 12345 | 0.5 | 0 | 0 | 512 | 0 | 0 | 0 | 10 | 2 |
| 4 | 0.3 | 0 | 12345 | 0.5 | 0 | 0 | 256 | 0 | 0.5 | 0.5 | 10 | 2 |
| 5 | 0.3 | 0 | 0 | 0 | 0 | 0 | 512 | 0 | 0.5 | 0 | 0 | 2 |
| 6 | 1 | 10 | 0 | 0 | 0 | 1 | 256 | 0.5 | 0 | 0.5 | 0 | 1.5 |
| 7 | 1 | 0 | 0 | 0.5 | 0 | 0 | 512 | 0 | 0 | 0 | 0 | 2 |
| 8 | 1 | 10 | 0 | 0.5 | 0 | 1 | 512 | 0.5 | 0.5 | 0 | 10 | 1.5 |
| 9 | 0.3 | 0 | 12345 | 0.5 | 0 | 1 | 256 | 0 | 0.5 | 0 | 0 | 2 |
| 10 | 1 | 10 | 0 | 0.5 | 0 | 0 | 512 | 0.5 | 0 | 0.5 | 10 | 1.5 |
| 11 | 0.3 | 0 | 0 | 0 | 0 | 0 | 512 | 0 | 0.5 | 0.5 | 0 | 2 |
| 12 | 1 | 10 | 0 | 0 | 0 | 0 | 256 | 0.5 | 0.5 | 0.5 | 0 | 1.5 |
| 13 | 1 | 0 | 0 | 0 | 0 | 0 | 256 | 0.5 | 0.5 | 0.5 | 0 | 2 |
| 14 | 0.3 | 0 | 0 | 0 | 0 | 0 | 256 | 0.5 | 0.5 | 0.5 | 10 | 2 |
| 15 | 1 | 10 | 12345 | 0 | 0 | 1 | 256 | 0 | 0.5 | 0.5 | 10 | 2 |
| 16 | 0.3 | 10 | 12345 | 0 | 0 | 1 | 256 | 0.5 | 0.5 | 0.5 | 10 | 2 |
| 17 | 1 | 0 | 12345 | 0 | 0 | 1 | 512 | 0.5 | 0.5 | 0 | 10 | 1.5 |
| 18 | 0.3 | 0 | 0 | 0.5 | 0 | 1 | 512 | 0.5 | 0.5 | 0 | 0 | 2 |
| 19 | 0.3 | 10 | 12345 | 0.5 | 0 | 1 | 512 | 0.5 | 0.5 | 0 | 0 | 2 |
| 20 | 1 | 10 | 12345 | 0 | 0 | 0 | 512 | 0.5 | 0.5 | 0.5 | 10 | 1.5 |
| 21 | 1 | 10 | 0 | 0.5 | 0 | 1 | 256 | 0.5 | 0 | 0 | 0 | 2 |
| 22 | 0.3 | 10 | 12345 | 0.5 | 0 | 0 | 512 | 0 | 0 | 0 | 10 | 1.5 |
| 23 | 0.3 | 0 | 12345 | 0 | 0 | 1 | 256 | 0 | 0 | 0.5 | 10 | 1.5 |
| 24 | 1 | 10 | 12345 | 0 | 0 | 1 | 256 | 0 | 0 | 0 | 0 | 2 |

| Test Case | booster | process_type | sample_type | normalize_type | feature_selector | colsample_bylevel | colsample_bynode | max_delta_step | gamma | scale_pos_weight | num_parallel_tree |
|---|---|---|---|---|---|---|---|---|---|---|---|
| 1 | gblinear | update | weighted | forest | shuffle | 1 | 0.3 | 10 | 0 | 10 | 10 |
| 2 | dart | default | weighted | tree | thrifty | 1 | 0.3 | 0 | 10 | 1 | 10 |
| 3 | gblinear | default | uniform | tree | greedy | 0.3 | 1 | 0 | 10 | 10 | 10 |
| 4 | gbtree | default | uniform | tree | thrifty | 1 | 0.3 | 0 | 0 | 1 | 1 |
| 5 | gbtree | update | uniform | tree | shuffle | 1 | 0.3 | 0 | 0 | 10 | 10 |
| 6 | gblinear | default | weighted | tree | shuffle | 1 | 0.3 | 10 | 0 | 1 | 1 |
| 7 | dart | default | uniform | tree | cyclic | 0.3 | 1 | 10 | 0 | 10 | 10 |
| 8 | dart | update | uniform | forest | shuffle | 0.3 | 1 | 0 | 10 | 10 | 1 |
| 9 | gbtree | default | weighted | forest | cyclic | 0.3 | 0.3 | 0 | 0 | 1 | 1 |
| 10 | gbtree | update | uniform | tree | cyclic | 0.3 | 1 | 0 | 10 | 10 | 10 |
| 11 | gblinear | update | weighted | forest | thrifty | 0.3 | 1 | 10 | 10 | 10 | 1 |
| 12 | gbtree | update | uniform | forest | thrifty | 1 | 1 | 10 | 10 | 1 | 1 |
| 13 | dart | update | uniform | tree | greedy | 1 | 0.3 | 10 | 10 | 1 | 10 |
| 14 | gbtree | update | uniform | forest | thrifty | 0.3 | 1 | 0 | 10 | 10 | 1 |
| 15 | dart | update | weighted | forest | greedy | 0.3 | 1 | 10 | 10 | 1 | 10 |
| 16 | gblinear | update | uniform | forest | thrifty | 1 | 1 | 0 | 0 | 10 | 1 |
| 17 | dart | update | weighted | forest | cyclic | 1 | 1 | 0 | 10 | 10 | 10 |
| 18 | gbtree | update | weighted | forest | greedy | 1 | 1 | 10 | 10 | 1 | 1 |
| 19 | dart | update | weighted | tree | greedy | 0.3 | 0.3 | 10 | 0 | 1 | 1 |
| 20 | dart | update | weighted | tree | shuffle | 1 | 1 | 10 | 10 | 10 | 10 |
| 21 | gbtree | update | uniform | forest | shuffle | 1 | 1 | 10 | 10 | 1 | 1 |
| 22 | gblinear | update | uniform | tree | cyclic | 1 | 1 | 10 | 0 | 10 | 10 |
| 23 | dart | default | weighted | forest | greedy | 1 | 0.3 | 0 | 10 | 1 | 1 |
| 24 | gblinear | update | weighted | forest | cyclic | 1 | 0.3 | 10 | 0 | 10 | 10 |

| Name | Role | Values | |
|---|---|---|---|
| ❯ max_depth | Categorical | 3 | 9 |
| ❯ subsample | Categorical | 0.3 | 1 |
| ❯ colsample_bytree | Categorical | 0.3 | 1 |
| ❯ min_child_weight | Categorical | 1 | 10 |
| ❯ alpha | Categorical | 0 | 2 |
| ❯ lambda | Categorical | 0 | 2 |
| ❯ learning_rate | Categorical | 0.05 | 0.3 |
| ❯ iterations | Categorical | 20 | 300 |
| ❯ tree_method | Categorical | auto  exact  approx  hist | gpu_exa gpu_hist |
| ❯ predictor | Categorical | cpu_predictor | gpu_predictor |
| ❯ grow_policy | Categorical | depthwise | lossguide |
| ❯ booster | Categorical | gbtree  gblinear | dart |
| ❯ process_type | Categorical | default | update |
| ❯ sample_type | Categorical | uniform | weighted |
| ❯ normalize_type | Categorical | tree | forest |
| ❯ feature_selector | Categorical | cyclic  shuffle  greedy | thrifty |
| ❯ colsample_bylevel | Categorical | 0.3 | 1 |
| ❯ colsample_bynode | Categorical | 0.3 | 1 |
| ❯ max_delta_step | Categorical | 0 | 10 |
| ❯ gamma | Categorical | 0 | 10 |
| ❯ scale_pos_weight | Categorical | 1 | 10 |
| ❯ num_parallel_tree | Categorical | 1 | 10 |
| ❯ base_score | Categorical | 0.3 | 1 |
| ❯ nthread | Categorical | 0 | 10 |
| ❯ seed | Categorical | 0 | 12345 |
| ❯ sketch_eps | Categorical | 0 | .5 |
| ❯ refresh_leaf | Categorical | 0 | 1 |
| ❯ max_leaves | Categorical | 0 | 10 |
| ❯ max_bin | Categorical | 256 | 512 |
| ❯ rate_drop | Categorical | 0 | .5 |
| ❯ one_drop | Categorical | 0 | .5 |
| ❯ skip_drop | Categorical | 0 | .5 |
| ❯ top_k | Categorical | 0 | 10 |
| ❯ tweedie_variance_power | Categorical | 1.5 | 2 |

Validation Specification — 5000

[Add Response] [Remove] [Number of Response...]

| Response Name | Response Type | Pass Indication | Fail Indication | Importance |
|---|---|---|---|---|
| crash | Threshold/Match Target | 1 | 0 | 10 |
| R^2 < .5 | Threshold/Match Target | 1 | 0 | 1 |
| >300 Sec | Threshold/Match Target | Pass | Fail | 4 |

5010 — Response Name
5020
5030
5040 — Importance

| Test Case | crash | >300 sec | R2<.5 | max_depth | subsample | colsample_bytree | min_child_weight | alpha | lambda | learning_rate | iterations |
|---|---|---|---|---|---|---|---|---|---|---|---|
| 1 | | | | 3 | 3 | 0.3 | 0.3 | 1 | 0 | 0.05 | 20 |
| 2 | | | | 9 | 1 | 1 | 1 | 10 | 2 | 0.05 | 20 |
| 3 | | | | 9 | 1 | 1 | 1 | 1 | 0 | 0.3 | 300 |
| 4 | | | | 9 | 0.3 | 0.3 | 0.3 | 10 | 2 | 0.3 | 300 |
| 5 | | | | 3 | 1 | 1 | 1 | 10 | 0 | 0.3 | 20 |
| 6 | | | | 3 | 0.3 | 0.3 | 1 | 1 | 2 | 0.05 | 300 |

| Name | Role | Values | | | | | | |
|---|---|---|---|---|---|---|---|---|
| ❯ max_depth | Categorical | 3 | 5 | | 7 | | 9 | |
| ❯ subsample | Categorical | 0 | 0.3 | | .7 | | 1 | |
| ❯ colsample_bytree | Categorical | 0 | 0.3 | | .7 | | 1 | |
| ❯ min_child_weight | Categorical | 1 | 4 | | 7 | | 10 | |
| ❯ alpha | Categorical | 0 | .5 | 1 | | 1.5 | | 2 |
| ❯ lambda | Categorical | 0 | .5 | 1 | | 1.5 | | 2 |
| ❯ learning_rate | Categorical | 0 | 0.05 | 0.3 | | 0.5 | | 1 |
| ❯ iterations | Categorical | 20 | 100 | 200 | | 300 | | 500 |

| Blocks | Average Tests Per Block | Full Test Suite |
|---|---|---|
| 2 | 143 | 246 |
| 3 | 82 | 246 |
| 4 | 64 | 256 |
| 5 | 58.2 | 291 |
| 6 | 48.5 | 291 |
| 7 | 44.14 | 309 |
| 8 | 39 | 312 |

◢ Data Generation Factors

Add Factor ▾ | Remove | Add N Factors [ 1 ]

| Name | Role | Changes | Values | | |
|---|---|---|---|---|---|
| ▸ X Type | Categorical | Easy | Continuous | Categorical | Ordinal |
| ▸ X Levels | Categorical | Easy | 2 | 3 | 10 |
| ▸ X balance | Categorical | Easy | Balanced | Unbalanced | Random |
| ▸ Y Type | Categorical | Easy | Continuous | Categorical | Ordinal |
| ▸ Y Levels | Categorical | Easy | 2 | 3 | 10 |
| ▸ Y balance | Categorical | Easy | Balanced | Unbalanced | Random |
| ▸ Number of Runs | Categorical | Easy | 10 | 50 | 1000 |

FIG. 56B

| Response | X Type | X Levels | X balance | Y Type | Y Levels | Y balance | # of Runs |
|---|---|---|---|---|---|---|---|
| | Ordinal | 10 | Balanced | Continuous | 10 | Random | 10 |
| | Continuous | 10 | Unbalanced | Ordinal | 2 | Random | 50 |
| | Continuous | 2 | Balanced | Ordinal | 2 | Balanced | 10 |
| | Categorical | 3 | Unbalanced | Ordinal | 10 | Random | 1000 |
| | Categorical | 2 | Unbalanced | Continuous | 3 | Balanced | 50 |
| | Ordinal | 10 | Random | Categorical | 3 | Unbalanced | 50 |
| | Categorical | 3 | Unbalanced | Categorical | 2 | Balanced | 10 |
| | Continuous | 3 | Random | Continuous | 3 | Unbalanced | 1000 |
| | Categorical | 3 | Balanced | Categorical | 10 | Unbalanced | 10 |
| | Ordinal | 3 | Unbalanced | Ordinal | 3 | Unbalanced | 50 |
| | Continuous | 2 | Balanced | Categorical | 10 | Balanced | 1000 |
| | Ordinal | 2 | Random | Continuous | 3 | Random | 1000 |
| | Categorical | 10 | Random | Ordinal | 10 | Random | 1000 |
| | Continuous | 2 | Balanced | Categorical | 2 | Balanced | 10 |
| | Ordinal | 10 | Random | Categorical | | | |

| Response | X Type | X Levels | X balance | Y Type | Y Levels | Y balance | # of Runs | Save Script to Data Table | Save Script to Journal | Save Script to Script Window | Save Script to Log | Save Script to Report | Save Script to Clipboard | Redo Analysis | Copy Graph |
|---|---|---|---|---|---|---|---|---|---|---|---|---|---|---|---|
| | Ordinal | 10 | Balanced | Continuous | 10 | Random | 10 | No | No | No | No | Yes | No | Yes | No |
| | Continuous | 10 | Unbalanced | Ordinal | 2 | Random | 50 | No | No | No | Yes | Yes | Yes | Yes | No |
| | Continuous | 2 | Balanced | Ordinal | 2 | Balanced | 10 | Yes | Yes | Yes | Yes | No | Yes | Yes | No |
| | Categorical | 3 | Unbalanced | Ordinal | 10 | Random | 1000 | Yes | No | No | No | No | No | No | No |
| | Categorical | 2 | Unbalanced | Continuous | 3 | Balanced | 50 | Yes | Yes | Yes | No | Yes | No | Yes | No |
| | Ordinal | 10 | Random | Categorical | 3 | Unbalanced | 50 | No | Yes | Yes | Yes | Yes | Yes | No | Yes |
| | Categorical | 3 | Unbalanced | Categorical | 2 | Balanced | 10 | No | Yes | No | No | No | No | Yes | Yes |
| | Continuous | 3 | Random | Continuous | 2 | Unbalanced | 1000 | No | Yes | Yes | Yes | Yes | Yes | No | Yes |
| | Categorical | 3 | Balanced | Categorical | 3 | Unbalanced | 10 | Yes | Yes | Yes | Yes | No | No | Yes | Yes |
| | Ordinal | 3 | Unbalanced | Ordinal | 10 | Unbalanced | 50 | No | No | Yes | Yes | No | Yes | Yes | Yes |
| | Continuous | 2 | Balanced | Categorical | 3 | Unbalanced | 50 | No | No | Yes | Yes | No | No | No | Yes |
| | Categorical | 2 | Random | Continuous | 10 | Balanced | 1000 | Yes | Yes | Yes | Yes | No | No | Yes | Yes |
| | Ordinal | 10 | Random | Ordinal | 3 | Random | 1000 | Yes | Yes | Yes | Yes | No | Yes | Yes | No |
| | Continuous | 2 | Balanced | Categorical | 10 | Random | 1000 | No | Yes | Yes | Yes | No | No | Yes | Yes |
| | Ordinal | 10 | Random | Categorical | 2 | Balanced | 10 | Yes | Yes | Yes | Yes | No | No | No | Yes |

FIG. 56C

Platform Factors

Add Factor ▼ | Remove | Add N Factors [1]

| Name | Role | Changes | Values |
|---|---|---|---|
| ▶ Save Script to Data Table | Categorical | Easy | Yes No |
| ▶ Save Script to Journal | Categorical | Easy | Yes No |
| ▶ Save Script to Script Window | Categorical | Easy | Yes No |
| ▶ Save Script to Log | Categorical | Easy | Yes No |
| ▶ Save Script to Report | Categorical | Easy | Yes No |
| ▶ Save Script to Clipboard | Categorical | Easy | Yes No |
| ▶ Redo Analysis | Categorical | Easy | Yes No |
| ▶ Copy Graph | Categorical | Easy | Yes No |

| Response | X Type | X Levels | X balance | Y Type | Y Levels | Y balance | Runs | Save Script to Data Table | Save Script to Journal | Save Script to Script Window | Save Script to Log | Save Script to Report | Save Script to Clipboard | Redo Analysis | Copy Graph |
|---|---|---|---|---|---|---|---|---|---|---|---|---|---|---|---|
| | Categorical | 10 | Random | Continuous | 2 | Unbalanced | 50 | No | Yes | Yes | Yes | Yes | No | Yes | Yes |
| | Ordinal | 10 | Random | Categorical | 3 | Balanced | 10 | No | No | No | No | No | No | Yes | Yes |
| | Categorical | 3 | Balanced | Ordinal | 3 | Random | 1000 | No | Yes | Yes | No | No | No | Yes | Yes |
| | Continuous | 10 | Unbalanced | Continuous | 3 | Balanced | 1000 | No | Yes | No | No | No | No | No | No |
| | Continuous | 10 | Random | Ordinal | 2 | Random | 1000 | Yes | Yes | Yes | Yes | No | No | No | Yes |
| | Ordinal | 10 | Balanced | Continuous | 10 | Random | 50 | Yes | Yes | Yes | Yes | No | Yes | Yes | Yes |
| | Continuous | 3 | Unbalanced | Ordinal | 10 | Unbalanced | 10 | No | No | No | No | No | Yes | No | No |
| | Ordinal | 3 | Random | Ordinal | 3 | Unbalanced | 50 | Yes | No | Yes | Yes | Yes | No | No | No |
| | Ordinal | 2 | Random | Ordinal | 10 | Unbalanced | 1000 | No | No | No | No | No | No | No | No |
| | Categorical | 10 | Unbalanced | Continuous | 2 | Random | 50 | No | Yes | Yes | Yes | Yes | Yes | Yes | Yes |
| | Continuous | 3 | Unbalanced | Categorical | 10 | Unbalanced | 1000 | No | No | Yes | No | No | Yes | No | No |
| | Ordinal | 10 | Balanced | Continuous | 10 | Balanced | 1000 | Yes | Yes | Yes | Yes | No | No | No | Yes |
| | Ordinal | 3 | Balanced | Categorical | 2 | Balanced | 50 | Yes | Yes | Yes | Yes | Yes | Yes | Yes | Yes |
| | Categorical | 3 | Unbalanced | Continuous | 3 | Balanced | 50 | Yes | No | Yes | Yes | Yes | No | Yes | Yes |
| | Categorical | 2 | Random | Categorical | 10 | Unbalanced | 10 | Yes | No | Yes | Yes | No | Yes | No | Yes |
| | Continuous | 2 | Unbalanced | Categorical | 2 | Random | 50 | Yes | Yes | Yes | No | No | No | No | Yes |
| | Ordinal | 2 | Unbalanced | Categorical | 2 | Balanced | 10 | No | Yes | No | No | No | No | Yes | No |
| | Ordinal | 2 | Balanced | Continuous | 2 | Balanced | 10 | Yes | Yes | Yes | Yes | No | No | Yes | Yes |
| | Continuous | 3 | Random | Categorical | 10 | Random | 50 | Yes | No | Yes | Yes | Yes | Yes | Yes | Yes |
| | Ordinal | 3 | Unbalanced | Continuous | 3 | Balanced | 1000 | Yes | Yes | No | No | Yes | Yes | No | No |
| | Categorical | 2 | Unbalanced | Categorical | 3 | Unbalanced | 10 | Yes | Yes | Yes | Yes | Yes | Yes | No | Yes |
| | Categorical | 2 | Balanced | Categorical | 2 | Balanced | 1000 | Yes | No | No | Yes | Yes | No | No | Yes |

FIG. 57B

| Name | Role | Values | |
|---|---|---|---|
| X1 | Categorical | 3-level categorical | 3-level categorical |
| X2 | Categorical | 3-level categorical | 3-level categorical |
| X3 | Categorical | 3-level categorical | 3-level categorical |
| X4 | Categorical | 3-level categorical | 3-level categorical |
| Remaining Factors | Categorical | 3-level discrete numeric | 3-level discrete numeric |
| Number of Responses | Categorical | 3-level discrete numeric | 3-level discrete numeric |
| Response Goal | Categorical | 3-level discrete numeric | 3-level discrete numeric |
| | | Continuous | Categorical |
| | | 1 | 3 |
| | | Maximize | Minimize |
| Constraint 1 | Categorical | X1 == 1 & X2 == 1 | Match Target\|Random |
| Constraint 2 | Categorical | none | X1 == 1 & X2 == 1 & X3 == 1 |
| Constraint 3 | Categorical | none | X3 == 1 & X4 == 3 |
| Continuous Constraint | Categorical | X11 + X12 > 0.5 | X4 == 1 & X11 > 0.5 |
| Design Creation | Categorical | Main Effects | X11*X12 > 0.8 |
| Maximize & Remember | Categorical | Yes | If Possible Interactions |
| Maximize Desirability | Categorical | 1X | No |
| Run Size | Categorical | 32 | 3X |
| Augment Design | Categorical | Yes | 64 |
| Simulated Model | Categorical | Main Effects | No |
| Sensitivity Indicator | Categorical | On | Few Interactions |
| | | | Off |

| Design Space | X1 | X2 | X3 | X4 | X5 | X6 | X7 | X8 | X9 | X10 |
|---|---|---|---|---|---|---|---|---|---|---|
| 1 | 3-level discrete | 3-level categorical | 3-level categorical | 3-level discrete | Continuous | Continuous | Categorical | Categorical | Continuous | Continuous |
| 2 | 3-level categorical | 3-level discrete | 3-level discrete | 3-level discrete | Categorical | Continuous | Continuous | Continuous | Categorical | Categorical |
| 3 | 3-level discrete | 3-level discrete | 3-level discrete | 3-level categorical | Continuous | Continuous | Continuous | Continuous | Continuous | Continuous |
| 4 | 3-level categorical | 3-level categorical | 3-level discrete | 3-level discrete | Categorical | Categorical | Categorical | Categorical | Categorical | Continuous |
| 5 | 3-level categorical | 3-level categorical | 3-level categorical | 3-level discrete | Categorical | Categorical | Continuous | Categorical | Continuous | Categorical |
| 6 | 3-level discrete | 3-level categorical | 3-level categorical | 3-level categorical | Continuous | Continuous | Continuous | Continuous | Continuous | Continuous |
| 7 | 3-level categorical | 3-level categorical | 3-level categorical | 3-level discrete | Categorical | Categorical | Categorical | Categorical | Categorical | Categorical |
| 8 | 3-level discrete | 3-level discrete | 3-level discrete | 3-level categorical | Continuous | Categorical | Categorical | Categorical | Categorical | Continuous |
| 9 | 3-level categorical | 3-level discrete | 3-level discrete | 3-level discrete | Continuous | Continuous | Categorical | Continuous | Categorical | Categorical |
| 10 | 3-level categorical | 3-level categorical | 3-level categorical | 3-level categorical | Categorical | Categorical | Categorical | Categorical | Continuous | Continuous |
| 11 | 3-level discrete | 3-level discrete | 3-level categorical | 3-level categorical | Categorical | Categorical | Categorical | Continuous | Continuous | Categorical |
| 12 | 3-level discrete | 3-level discrete | 3-level categorical | 3-level categorical | Continuous | Continuous | Categorical | Continuous | Continuous | Continuous |

*FIG. 61A*

| Design Space | # of Responses | Response Goal | Constraint 1 | Constraint 2 | Constraint 3 |
|---|---|---|---|---|---|
| 1 | 1 | Maximize | X1 == 1 & X2==1 | none | X4==1 & X11 > 0.5 |
| 2 | 1 | Random | X1==1&X2==1&X3==1 | none | X4==1 & X11 > 0.5 |
| 3 | 1 | Match Target | X1 == 1 & X2==1 | none | none |
| 4 | 5 | Minimize | X1 == 1 & X2==1 | none | X4==1 & X11 > 0.5 |
| 5 | 3 | Random | X1==1&X2==1&X3==1 | X3==1& X4==3 | X4==1 & X11 > 0.5 |
| 6 | 5 | Random | X1 == 1 & X2==1 | X3==1& X4==3 | none |
| 7 | 3 | Maximize | X1==1&X2==1&X3==1 | X3==1& X4==3 | none |
| 8 | 5 | Maximize | X1==1&X2==1&X3==1 | X3==1& X4==3 | X4==1 & X11 > 0.5 |
| 9 | 3 | Match Target | X1 == 1 & X2==1 | none | X4==1 & X11 > 0.5 |
| 10 | 5 | Match Target | X1==1&X2==1&X3==1 | X3==1& X4==3 | X4==1 & X11 > 0.5 |
| 11 | 1 | Minimize | X1==1&X2==1&X3==1 | X3==1& X4==3 | none |
| 12 | 3 | Minimize | X1 == 1 & X2==1 | none | none |

FIG. 61B

| Design Space | Continuous Constraint | Design Creation | Maximize & Remember | Maximize Desirability | Run Size | Reset Factor Settings | Augment Design | Simulated Model | Sensitivity Indicator |
|---|---|---|---|---|---|---|---|---|---|
| 1 | X11 + X12 > 0.5 | If Possible Interactions | Yes | 3X | 32 | Valid settings | No | Few Interactions | On |
| 2 | X11 + X12 > 0.5 | If Possible Interactions | Yes | 3X | 64 | Invalid settings | Yes | Main Effects | On |
| 3 | X11*X12 > 0.8 | Main Effects | No | 3X | 32 | Invalid settings | No | Few Interactions | Off |
| 4 | X11 + X12 > 0.5 | If Possible Interactions | No | 3X | 32 | Invalid settings | Yes | Few Interactions | Off |
| 5 | X11*X12 > 0.8 | Main Effects | No | 1X | 64 | Invalid settings | No | Few Interactions | Off |
| 6 | X11*X12 > 0.8 | Main Effects | No | 1X | 32 | Valid settings | Yes | Many Interactions | Off |
| 7 | X11*X12 > 0.8 | If Possible Interactions | No | 1X | 32 | Invalid settings | Yes | Main Effects | Off |
| 8 | X11 + X12 > 0.5 | Main Effects | No | 3X | 64 | Valid settings | Yes | Many Interactions | On |
| 9 | X11 + X12 > 0.5 | If Possible Interactions | Yes | 1X | 32 | Invalid settings | Yes | Many Interactions | Off |
| 10 | X11*X12 > 0.8 | Main Effects | Yes | 1X | 64 | Valid settings | No | Main Effects | On |
| 11 | X11*X12 > 0.8 | Main Effects | Yes | 1X | 64 | Valid settings | No | Many Interactions | On |
| 12 | X11*X12 > 0.8 | Main Effects | Yes | 3X | 64 | Valid settings | No | Main Effects | On |

FIG. 61C

| Run | X1 | X2 | X3 | X4 | X5 | X6 | X7 | X8 | X9 | X10 | X11 | X12 |
|---|---|---|---|---|---|---|---|---|---|---|---|---|
| 1 | L1 | L3 | L3 | 3 | L2 | L1 | L3 | L2 | 1 | L3 | -1 | L2 |
| 2 | L2 | L3 | L2 | 1 | L2 | L1 | L1 | L2 | -1 | L1 | 1 | L1 |
| 3 | L1 | L1 | L2 | 3 | L1 | L1 | L2 | L3 | 0.2 | L3 | 0.3 | L2 |
| 4 | L3 | L2 | L2 | 2 | L3 | L3 | L2 | L2 | -1 | L3 | 1 | L3 |
| 5 | L3 | L3 | L3 | 3 | L1 | L2 | L1 | L3 | -1 | L3 | -1 | L1 |
| 6 | L3 | L2 | L1 | 3 | L1 | L1 | L1 | L3 | -1 | L2 | -1 | L3 |
| 7 | L2 | L1 | L2 | 2 | L2 | L3 | L3 | L3 | 1 | L3 | -1 | L3 |
| 8 | L2 | L2 | L2 | 1 | L3 | L2 | L3 | L3 | -1 | L2 | -1 | L1 |
| 9 | L3 | L1 | L1 | 1 | L2 | L2 | L3 | L1 | -1 | L1 | -1 | L2 |
| 10 | L2 | L3 | L2 | 3 | L1 | L3 | L1 | L2 | -1 | L2 | -1 | L2 |
| 11 | L2 | L2 | L3 | 2 | L2 | L1 | L1 | L3 | -1 | L3 | -1 | L1 |
| 12 | L3 | L1 | L2 | 1 | L2 | L1 | L1 | L2 | 1 | L2 | -1 | L3 |
| 13 | L3 | L3 | L3 | 2 | L3 | L2 | L3 | L2 | 0.1 | L1 | 0.4 | L2 |
| 14 | L2 | L2 | L3 | 3 | L3 | L3 | L2 | L1 | -1 | L1 | -1 | L2 |
| 15 | L2 | L3 | L2 | 1 | L1 | L1 | L2 | L2 | -1 | L2 | 1 | L3 |
| 16 | L1 | L2 | L2 | 2 | L2 | L1 | L3 | L1 | -1 | L1 | 1 | L3 |
| 17 | L3 | L2 | L1 | 2 | L1 | L1 | L1 | L3 | 1 | L1 | -0.5 | L1 |
| 18 | L3 | L1 | L2 | 3 | L2 | L3 | L1 | L2 | -1 | L1 | 1 | L1 |
| 19 | L1 | L2 | L2 | 2 | L1 | L1 | L2 | L1 | 1 | L1 | -0.5 | L1 |
| 20 | L3 | L1 | L2 | 3 | L3 | L2 | L2 | L3 | -0.3 | L2 | 0.8 | L2 |
| 21 | L2 | L1 | L3 | 1 | L1 | L1 | L3 | L1 | -1 | L1 | -1 | L3 |
| 22 | L3 | L2 | L1 | 1 | L2 | L3 | L3 | L3 | -0.4 | L2 | 0.9 | L2 |
| 23 | L1 | L2 | L1 | 2 | L3 | L2 | L1 | L2 | 1 | L2 | -1 | L2 |
| 24 | L2 | L1 | L3 | 3 | L2 | L1 | L3 | L3 | -0.5 | L2 | 1 | L2 |
| 25 | L2 | L3 | L3 | 2 | L1 | L1 | L2 | L3 | -0.1784 | L1 | 0.6 | L2 |
| 26 | L2 | L1 | L3 | 2 | L2 | L3 | L2 | L1 | 1 | L2 | -1 | L1 |
| 27 | L1 | L3 | L3 | 3 | L3 | L3 | L2 | L3 | -1 | L2 | 1 | L3 |
| 28 | L2 | L1 | L1 | 2 | L1 | L2 | L3 | L2 | 1 | L2 | -0.5 | L3 |
| 29 | L1 | L2 | L1 | 3 | L1 | L3 | L3 | L3 | -1 | L3 | 1 | L1 |
| 30 | L2 | L1 | L1 | 2 | L1 | L3 | L3 | L1 | -1 | L3 | 1 | L3 |
| 31 | L3 | L3 | L3 | 2 | L1 | L2 | L3 | L1 | -1 | L2 | 1 | L1 |
| 32 | L3 | L2 | L3 | 3 | L3 | L1 | L2 | L2 | -1 | L3 | -1 | L3 |

*FIG. 62B*

| Run | X1 | X2 | X3 | X4 | X5 | X6 | X7 | X8 | X9 | X10 | X11 | X12 |
|---|---|---|---|---|---|---|---|---|---|---|---|---|
| 33 | L2 | L2 | L1 | 1 | L3 | L1 | L2 | L1 | -0.5 | L2 | 1 | L2 |
| 34 | L1 | L2 | L2 | 3 | L1 | L2 | L1 | L1 | 1 | L3 | -0.5 | L3 |
| 35 | L3 | L3 | L2 | 3 | L2 | L1 | L3 | L1 | -1 | L2 | -1 | L2 |
| 36 | L3 | L1 | L3 | 1 | L1 | L3 | L2 | L2 | 1 | L2 | -1 | L1 |
| 37 | L3 | L3 | L2 | 2 | L2 | L2 | L2 | L1 | 1 | L3 | -0.5 | L1 |
| 38 | L1 | L3 | L3 | 2 | L2 | L2 | L1 | L2 | -1 | L3 | 1 | L2 |
| 39 | L1 | L1 | L1 | 3 | L1 | L3 | L2 | L1 | 1 | L3 | -1 | L2 |
| 40 | L2 | L2 | L1 | 3 | L2 | L2 | L2 | L2 | -1 | L1 | -1 | L1 |
| 41 | L2 | L2 | L1 | 3 | L2 | L2 | L2 | L3 | 1 | L1 | -0.5 | L3 |
| 42 | L2 | L1 | L2 | 1 | L3 | L2 | L1 | L1 | -1 | L3 | 1 | L1 |
| 43 | L1 | L1 | L1 | 2 | L2 | L3 | L1 | L3 | -1 | L2 | -1 | L2 |
| 44 | L1 | L1 | L3 | 3 | L3 | L1 | L3 | L2 | 1 | L1 | -1 | L1 |
| 45 | L2 | L2 | L2 | 2 | L3 | L3 | L1 | L2 | 1 | L3 | -1 | L2 |
| 46 | L3 | L2 | L2 | 3 | L2 | L3 | L3 | L2 | -0.5 | L1 | 1 | L3 |
| 47 | L1 | L1 | L1 | 3 | L2 | L2 | L2 | L2 | -1 | L1 | 1 | L1 |
| 48 | L3 | L3 | L3 | 1 | L3 | L1 | L1 | L1 | 1 | L1 | -1 | L3 |
| 49 | L3 | L2 | L3 | 1 | L1 | L3 | L1 | L1 | -1 | L1 | 1 | L2 |
| 50 | L1 | L3 | L2 | 2 | L2 | L1 | L2 | L1 | -1 | L2 | -1 | L1 |
| 51 | L3 | L3 | L2 | 3 | L3 | L3 | L3 | L1 | 1 | L2 | -1 | L1 |
| 52 | L1 | L3 | L2 | 3 | L3 | L2 | L3 | L2 | -1 | L1 | -1 | L3 |
| 53 | L2 | L1 | L1 | 3 | L3 | L1 | L1 | L1 | -1 | L3 | 1 | L1 |
| 54 | L1 | L2 | L3 | 2 | L1 | L3 | L3 | L2 | -1 | L2 | -1 | L1 |
| 55 | L3 | L2 | L3 | 1 | L2 | L2 | L2 | L1 | -1 | L3 | -1 | L3 |
| 56 | L2 | L3 | L2 | 1 | L3 | L3 | L1 | L3 | 1 | L1 | -1 | L1 |
| 57 | L1 | L1 | L3 | 2 | L3 | L2 | L1 | L3 | -1 | L2 | 1 | L3 |
| 58 | L2 | L2 | L3 | 3 | L2 | L2 | L1 | L1 | 1 | L2 | -0.5 | L3 |
| 59 | L2 | L2 | L2 | 1 | L1 | L2 | L3 | L2 | -1 | L3 | -1 | L2 |
| 60 | L2 | L3 | L3 | 1 | L2 | L3 | L2 | L3 | 1 | L3 | -1 | L3 |
| 61 | L1 | L1 | L1 | 2 | L3 | L3 | L1 | L1 | -1 | L1 | -1 | L3 |
| 62 | L3 | L1 | L2 | 2 | L1 | L2 | L2 | L3 | -1 | L1 | -1 | L2 |
| 63 | L3 | L1 | L1 | 2 | L1 | L1 | L2 | L2 | -1 | L3 | -1 | L3 |
| 64 | L3 | L2 | L1 | 1 | L3 | L1 | L3 | L3 | 0.2 | L3 | 0.3 | L1 |

| Run | Y1 | Y2 | Y3 |
|---|---|---|---|
| 1 | 1.780785 | 0.944899 | 2.292617 |
| 2 | 0.894415 | 0.935839 | -1.57241 |
| 3 | 4.600592 | 5.015031 | 3.994479 |
| 4 | -3.77108 | -2.49782 | -3.68783 |
| 5 | 1.746353 | 1.824482 | 1.606454 |
| 6 | 2.992781 | 2.246955 | 3.15722 |
| 7 | -0.95059 | -2.63407 | -1.09106 |
| 8 | -6.92576 | -4.95539 | -5.04439 |
| 9 | 0.016535 | -0.34081 | -0.68834 |
| 10 | -2.26713 | -1.85552 | -1.38208 |
| 11 | -2.55463 | 1.086942 | -2.67358 |
| 12 | -0.14118 | 0.301935 | 1.997217 |
| 13 | -1.01591 | -1.4496 | 0.553437 |
| 14 | -0.5021 | -1.45413 | -1.27066 |
| 15 | -2.8259 | -1.67724 | -0.6714 |
| 16 | 2.714848 | 1.191766 | 1.854693 |
| 17 | 5.462152 | 6.036056 | 5.830393 |
| 18 | 3.136362 | 3.759224 | 3.441957 |
| 19 | 3.533506 | 4.130083 | 4.45591 |
| 20 | -0.65726 | 0.193566 | 0.152643 |
| 21 | 0.918026 | 5.128591 | 2.607691 |
| 22 | -3.37904 | -1.02416 | -1.68757 |
| 23 | -1.70166 | -0.44257 | -1.12372 |
| 24 | 1.950749 | 1.839722 | 2.36591 |
| 25 | 0.964577 | 2.180244 | 0.96528 |
| 26 | 1.114705 | -0.40203 | -0.55365 |
| 27 | 2.015673 | 0.925932 | 2.135212 |
| 28 | 0.017629 | -0.76514 | 1.428102 |
| 29 | 6.216424 | 7.435679 | 5.726275 |
| 30 | 4.999832 | 5.524413 | 2.202879 |
| 31 | 0.675149 | 3.088988 | 2.305766 |
| 32 | -0.82872 | -1.92819 | -0.20151 |

| Run | Y1 | Y2 | Y3 |
|---|---|---|---|
| 33 | 0.13283 | -1.75747 | -0.97315 |
| 34 | 5.776091 | 6.518789 | 4.807025 |
| 35 | 0.030729 | -1.20044 | 0.131733 |
| 36 | -0.42502 | 1.073861 | 1.692674 |
| 37 | 0.024982 | -1.73132 | -0.4861 |
| 38 | -1.89304 | 0.016711 | -1.72497 |
| 39 | 3.878174 | 5.005376 | 6.897115 |
| 40 | -2.18396 | -3.59141 | -1.54063 |
| 41 | 0.147766 | -0.41469 | 1.207986 |
| 42 | 2.792757 | 2.721252 | 0.412938 |
| 43 | -0.84397 | -1.04778 | 0.296383 |
| 44 | 7.605592 | 8.202685 | 7.670127 |
| 45 | -1.8699 | -4.43964 | -3.23816 |
| 46 | 1.799056 | 0.286434 | -0.66946 |
| 47 | 4.350292 | 3.34785 | 4.971803 |
| 48 | 5.96832 | 4.990632 | 5.968929 |
| 49 | 2.489289 | 2.525215 | 2.898409 |
| 50 | 0.761502 | 0.012824 | -3.44912 |
| 51 | 3.354471 | 1.588228 | 4.647951 |
| 52 | 0.841028 | 0.62179 | 0.461227 |
| 53 | 8.607548 | 7.550968 | 6.255905 |
| 54 | -1.06709 | -2.41573 | -0.08681 |
| 55 | -3.69929 | -4.74957 | -2.51673 |
| 56 | 1.291014 | 2.681258 | 2.479006 |
| 57 | 1.920638 | 2.816391 | 2.592122 |
| 58 | -0.77687 | -0.25858 | -0.90735 |
| 59 | -7.22205 | -6.05546 | -7.05653 |
| 60 | -3.23694 | -2.23591 | -2.64267 |
| 61 | 6.738414 | 5.906476 | 5.106609 |
| 62 | -2.14178 | -1.9721 | -1.30211 |
| 63 | -1.70836 | -1.52888 | 0.198995 |
| 64 | 2.88551 | 2.962256 | 3.116056 |

*FIG. 62E*

DATA SET GENERATION FOR PERFORMANCE EVALUATION

CROSS-REFERENCE TO RELATED APPLICATIONS

This application claims the benefit of, and priority based on, 35 U.S.C. § 119 to U.S. Provisional Application No. 63/172,354, filed Apr. 8, 2021 and is a continuation-in-part of U.S. application Ser. No. 17/074,022 filed Oct. 19, 2020, which claims the benefit of, and priority based on, 35 U.S.C. § 119 to U.S. Provisional Application No. 63/057,025, filed Jul. 27, 2020, and is a continuation-in-part of U.S. application Ser. No. 16/663,474, filed Oct. 25, 2019, which issued as U.S. Pat. No. 10,878,345 on Dec. 29, 2020, and which claims the benefit of, and priority based on, 35 U.S.C. § 119 to U.S. Provisional Application No. 62/886,162, filed Aug. 13, 2019, and is a continuation-in-part of U.S. application Ser. No. 16/154,332, filed Oct. 8, 2018, which issued as U.S. Pat. No. 10,503,846 on Dec. 10, 2019, and which claims the benefit of, and priority based on, 35 U.S.C. § 119 to U.S. Provisional Application No. 62/681,651, filed Jun. 6, 2018, and U.S. Provisional Application No. 62/661,061, filed Apr. 22, 2018, the disclosures of each of which are incorporated herein by reference in their entirety.

BACKGROUND

New electrical, mechanical, and computer systems may experience errors under certain conditions. When new systems are introduced, an experiment may be useful to validate that the system will work as expected before using the new system. This validation can be difficult if there is no existing data or limited data from which to ensure sufficient coverage of possible options for validating the system.

Experiments may also be conducted on computer models or designed by computer models. As an example, hyperparameters are factors used to control the behavior of a computer model (e.g., hyperparameters can be used to tune or configure a machine learning algorithm). Experiments can be conducted to determine the best inputs to the hyperparameters for a response according to the computer model. Hyperparameters can be an example of a type of continuous factors that can have infinite inputs with a range of candidate inputs for a given hyperparameter.

In some experiments (e.g., ones involving continuous factors), it is useful to distribute design points uniformly across a design space to observe responses in the experiment for different input factors at that design point. Such a design can be considered a space-filling design. For instance, if an experiment tests strain on a physical object like a pitcher, flask or drinking bottle, the design space models the shape of the physical object, and the design points distributed over the design space represents test points for strain. The dimensions of the design space define continuous variables for the design space (e.g., the height, width, and length of the object). The bottle in the experimental test, for example, may be a narrow-necked container made of impermeable material of various sizes to hold liquids of various temperatures.

In some experiments, it also helpful to observe how design options for the design space would influence the experiments. A categorical factor can be used to describe a design option or level at a design point for the design space. A categorical factor for the design space of the bottle could be a material type, with each of the design points taking on one of a set of levels that represent material types in the experiment. The material types for the bottle, for example, may be glass, metal, ceramic, and/or various types of plastic. In those cases where categorical factors are also employed, particularly on a non-rectangular design space like a bottle, it can be difficult to distribute the levels uniformly across the design.

SUMMARY

In an example embodiment, a computer-program product tangibly embodied in a non-transitory machine-readable storage medium is provided. The computer-program product includes instructions operable to cause a computing system to receive a request to generate computer-generated data for an experiment. The computer-generated data comprises generated inputs defining one or more settings for a plurality of factors for a design of the experiment, and generated responses according to the design of the experiment. The generated inputs and generated responses are generated to be representative of a respective design space of multiple different design spaces for the design of the experiment. The computer-program product includes instructions operable to cause a computing system to receive one or more first characteristics for specifying generation of the computer-generated data associated with a first design space of the multiple different design spaces. The first design space defines candidate options for generating inputs according to a first set of factors of the plurality of factors. The computer-program product includes instructions operable to cause a computing system to receive one or more second characteristics for specifying generation of the computer-generated data associated with a second design space of the multiple different design spaces. The second design space defines candidate options for generating inputs according to a second set of factors of the plurality of factors. The computer-program product includes instructions operable to cause a computing system to, responsive to the request, generate a design suite that comprises the computer-generated data that represents, in a first set of design cases of the design suite, settings constrained by the first design space, and represents, in a second set of design cases of the design suite, settings constrained by the second design space. The computer-program product includes instructions operable to cause a computing system to receive one or more resulting responses corresponding to conducting the first set of design cases in the experiment. The computer-program product includes instructions operable to cause a computing system to evaluate the one or more resulting responses according to one or more generated responses of the computer-generated data corresponding to the first set of design cases. The computer-program product includes instructions operable to cause a computing system to output an evaluation of the one or more resulting responses.

In another example embodiment, a computing system is provided. The computing system includes, but is not limited to, a processor and memory. The memory contains instructions that when executed by the processor control the computing system to generate the design suite that comprises the computer-generated data and evaluate the one or more resulting responses according to one or more generated responses of the computer-generated data.

In another example embodiment, a method, is provided, of generating the design suite that comprises the computer-generated data and evaluating the one or more resulting responses according to one or more generated responses of the computer-generated data.

Other features and aspects of example embodiments are presented below in the Detailed Description when read in connection with the drawings presented with this application.

BRIEF DESCRIPTION OF THE DRAWINGS

FIGS. 24A-24F illustrate an example block diagram of design point selection for a non-rectangular design space in at least one embodiment of the present technology.

FIGS. 34A-B illustrate an example graphical user interface for controlling generation of a design suite in at least one embodiment of the present technology.

FIG. 35 illustrates an example of a design suite in at least one embodiment of the present technology.

FIG. 36 illustrates an example of a graphical user interface for controlling an indication of a selected design case in at least one embodiment of the present technology.

FIGS. 43A-E illustrate generating an example test suite for validating a system of operation according to a validation specification in at least one embodiment of the present technology.

FIG. 44 illustrates an example graphical user interface for displaying a response of validating a system of operation according to a validation specification in at least one embodiment of the present technology.

FIGS. 50A-B illustrate example graphical user interfaces for editing validation specifications in at least one embodiment of the present technology.

FIG. 52B illustrates example editing of factor inputs in at least one embodiment of the present technology.

FIG. 52C illustrates example test suite metrics at least one embodiment of the present technology.

FIGS. 56A-56C illustrate example graphical user interfaces for data generation for inputs and outputs for an example software platform in at least one embodiment of the present technology.

FIGS. 57A-57B illustrate example graphical user interfaces for platform-specific data generation for an example software platform in at least one embodiment of the present technology.

FIG. 59 illustrates an example of a graphical user interface for specifying characteristics for design spaces of a design suite in at least one embodiment of the present technology.

FIGS. 61A-61C illustrate an example graphical user interface of a visual summary of a design suite in at least one embodiment of the present technology.

FIGS. 62A-E illustrate example graphical user interfaces for design cases corresponding to a single design space of multiple different design spaces of a design suite in at least one embodiment of the present technology.

DETAILED DESCRIPTION

In the following description, for the purposes of explanation, specific details are set forth in order to provide a thorough understanding of embodiments of the technology. However, it will be apparent that various embodiments may be practiced without these specific details. The figures and description are not intended to be restrictive.

The ensuing description provides example embodiments only, and is not intended to limit the scope, applicability, or configuration of the disclosure. Rather, the ensuing description of the example embodiments will provide those skilled in the art with an enabling description for implementing an example embodiment. It should be understood that various changes may be made in the function and arrangement of elements without departing from the spirit and scope of the technology as set forth in the appended claims.

Specific details are given in the following description to provide a thorough understanding of the embodiments. However, it will be understood by one of ordinary skill in the art that the embodiments may be practiced without these specific details. For example, circuits, systems, networks, processes, and other components may be shown as components in block diagram form in order not to obscure the embodiments in unnecessary detail. In other instances, well-known circuits, processes, algorithms, structures, and techniques may be shown without unnecessary detail in order to avoid obscuring the embodiments.

Also, it is noted that individual embodiments may be described as a process which is depicted as a flowchart, a flow diagram, a data flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed, but could have additional operations not included in a figure. A process may correspond to a method, a function, a procedure, a subroutine, a subprogram, etc. When a process corresponds to a function, its termination can correspond to a return of the function to the calling function or the main function.

Systems depicted in some of the figures may be provided in various configurations. In some embodiments, the systems may be configured as a distributed system where one or more components of the system are distributed across one or more networks in a cloud computing system.

Figure 1:
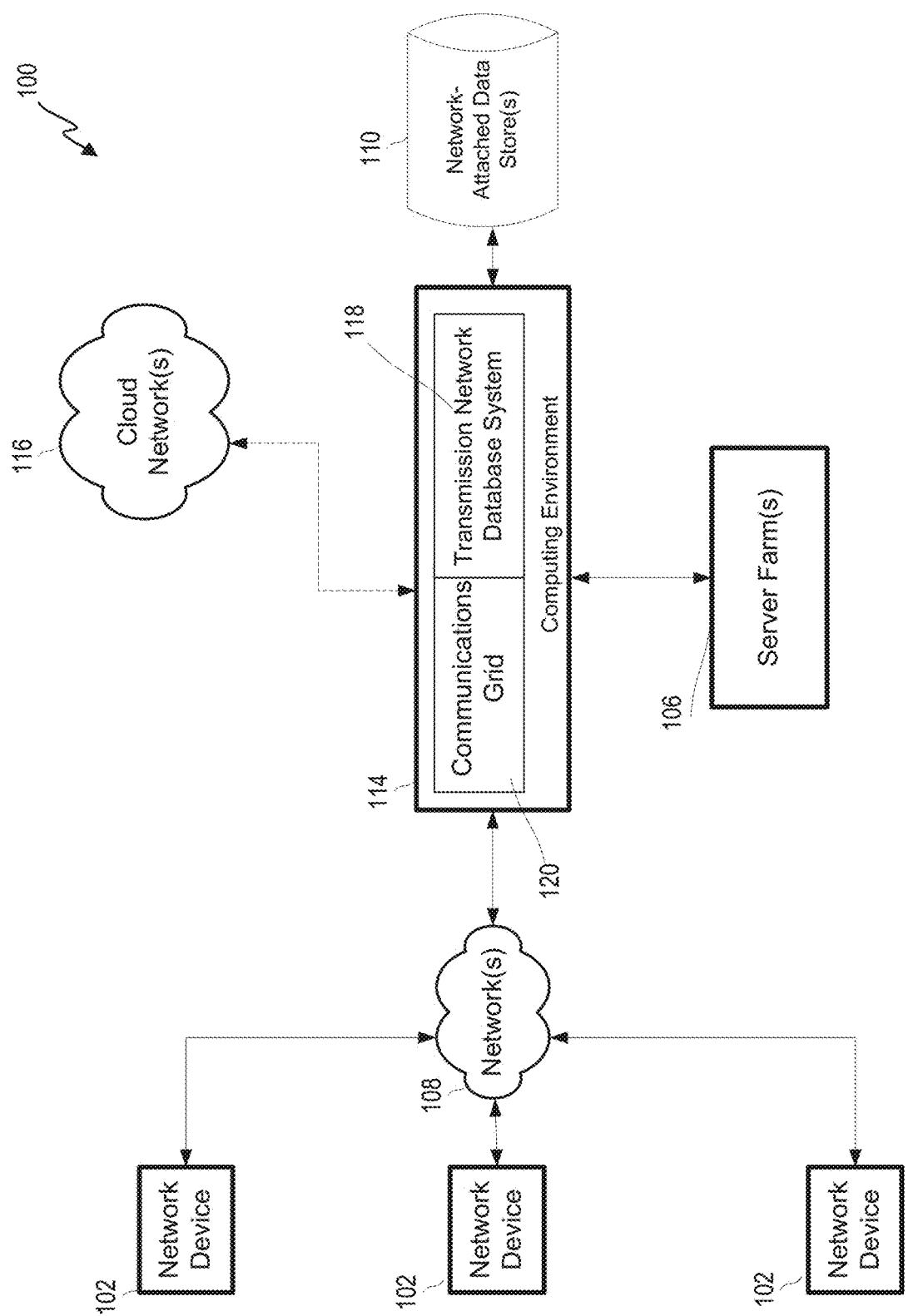
FIG. 1 illustrates a block diagram that provides an illustration of the hardware components of a computing system, according to at least one embodiment of the present technology.

FIG. 1 is a block diagram that provides an illustration of the hardware components of a data transmission network 100, according to embodiments of the present technology. Data transmission network 100 is a specialized computer system that may be used for processing large amounts of data where a large number of computer processing cycles are required.

Data transmission network 100 may also include computing environment 114. Computing environment 114 may be a specialized computer or other machine that processes the data received within the data transmission network 100. Data transmission network 100 also includes one or more network devices 102. Network devices 102 may include client devices that attempt to communicate with computing environment 114. For example, network devices 102 may send data to the computing environment 114 to be processed, may send signals to the computing environment 114 to control different aspects of the computing environment or the data it is processing, among other reasons. Network devices 102 may interact with the computing environment 114 through a number of ways, such as, for example, over one or more networks 108. As shown in FIG. 1, computing environment 114 may include one or more other systems. For example, computing environment 114 may include a database system 118 and/or a communications grid 120.

Figure 8:
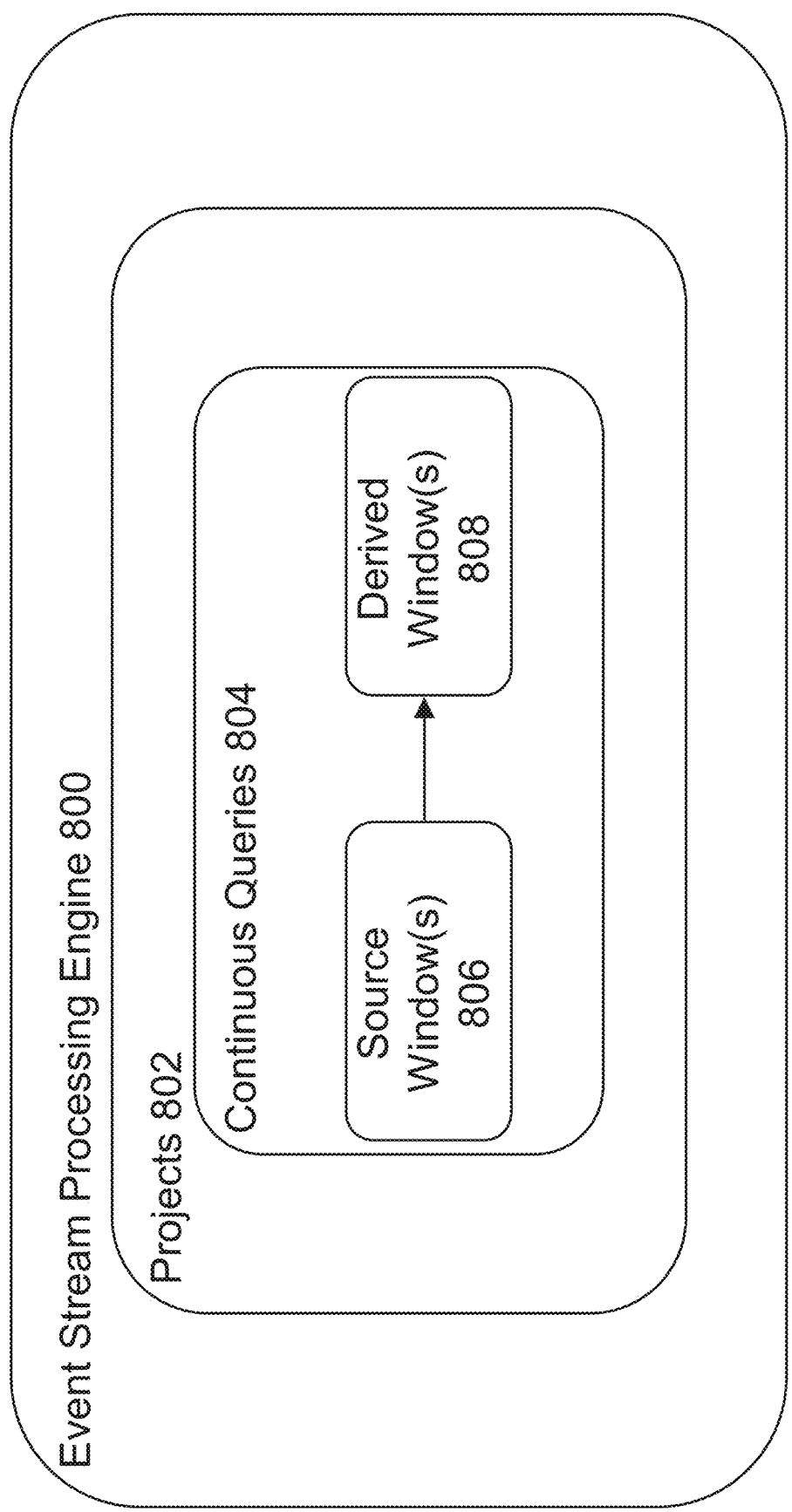
FIG. 8 illustrates a block diagram including components of an Event Stream Processing Engine (ESPE), according to at least one embodiment of the present technology.
Figure 9:
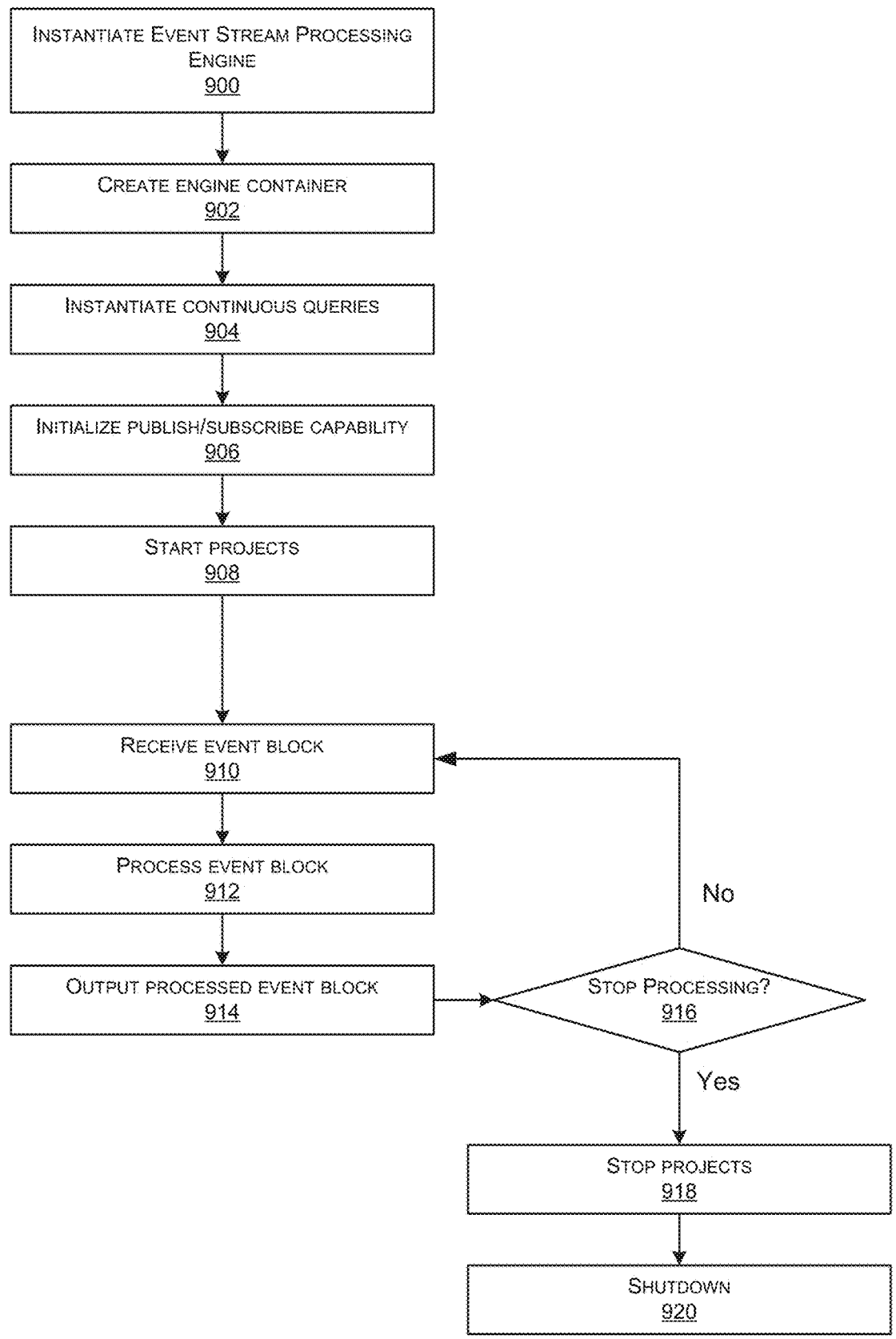
FIG. 9 illustrates a flow chart showing an example process including operations performed by an event stream processing engine, according to at least one embodiment of the present technology.
Figure 10:
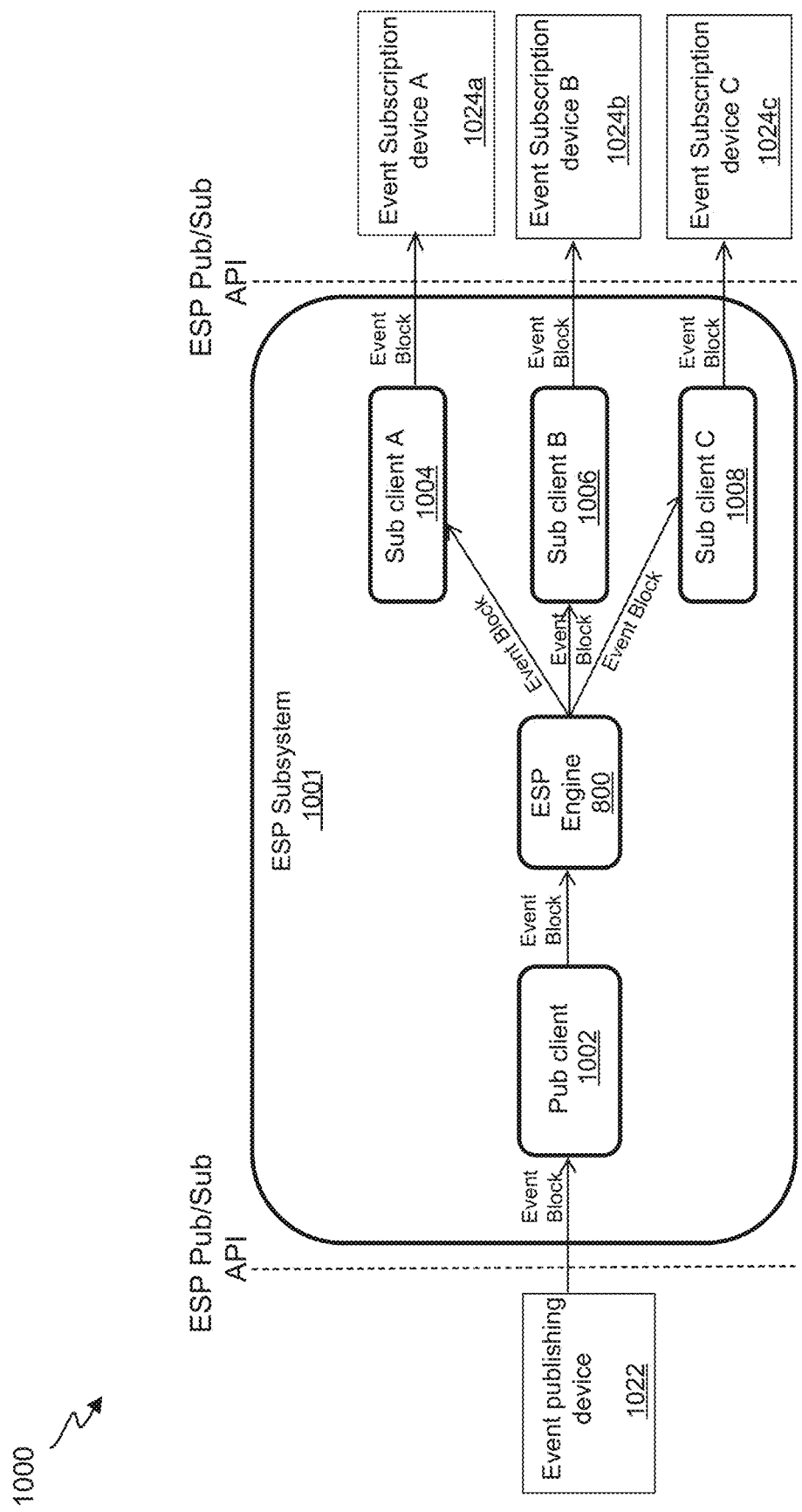
FIG. 10 illustrates an ESP system interfacing between a publishing device and multiple event subscribing devices, according to at least one embodiment of the present technology.

In other embodiments, network devices may provide a large amount of data, either all at once or streaming over a period of time (e.g., using event stream processing (ESP), described further with respect to FIGS. 8-10), to the computing environment 114 via networks 108. For example, network devices 102 may include network computers, sensors, databases, or other devices that may transmit or otherwise provide data to computing environment 114. For example, network devices may include local area network devices, such as routers, hubs, switches, or other computer networking devices. These devices may provide a variety of stored or generated data, such as network data or data specific to the network devices themselves. Network devices may also include sensors that monitor their environment or other devices to collect data regarding that environment or those devices, and such network devices may provide data they collect over time. Network devices may also include devices within the internet of things, such as devices within a home automation network. Some of these devices may be referred to as edge devices and may involve edge computing circuitry. Data may be transmitted by network devices directly to computing environment 114 or to network-attached data stores, such as network-attached data stores 110 for storage so that the data may be retrieved later by the computing environment 114 or other portions of data transmission network 100.

Data transmission network 100 may also include one or more network-attached data stores 110. Network-attached data stores 110 are used to store data to be processed by the computing environment 114 as well as any intermediate or final data generated by the computing system in non-volatile memory. However in certain embodiments, the configuration of the computing environment 114 allows its operations to be performed such that intermediate and final data results can be stored solely in volatile memory (e.g., RAM), without a requirement that intermediate or final data results be stored to non-volatile types of memory (e.g., disk). This can be useful in certain situations, such as when the computing environment 114 receives ad hoc queries from a user and when responses, which are generated by processing large amounts of data, need to be generated on-the-fly. In this non-limiting situation, the computing environment 114 may be configured to retain the processed information within memory so that responses can be generated for the user at different levels of detail as well as allow a user to interactively query against this information.

Network-attached data stores may store a variety of different types of data organized in a variety of different ways and from a variety of different sources. For example, network-attached data storage may include storage other than primary storage located within computing environment 114 that is directly accessible by processors located therein. Network-attached data storage may include secondary, tertiary or auxiliary storage, such as large hard drives, servers, virtual memory, among other types. Storage devices may include portable or non-portable storage devices, optical storage devices, and various other mediums capable of storing, containing data. A machine-readable storage medium or computer-readable storage medium may include a non-transitory medium in which data can be stored and that does not include carrier waves and/or transitory electronic signals. Examples of a non-transitory medium may include, for example, a magnetic disk or tape, optical storage media such as compact disk or digital versatile disk, flash memory, memory or memory devices. A computer-program product may include code and/or machine-executable instructions that may represent a procedure, a function, a subprogram, a program, a routine, a subroutine, a module, a software package, a class, or any combination of instructions, data structures, or program statements. A code segment may be coupled to another code segment or a hardware circuit by passing and/or receiving information, data, arguments, parameters, or memory contents. Information, arguments, parameters, data, etc. may be passed, forwarded, or transmitted via any suitable means including memory sharing, message passing, token passing, network transmission, among others. Furthermore, the data stores may hold a variety of different types of data. For example, network-attached data stores 110 may hold unstructured (e.g., raw) data, such as manufacturing data (e.g., a database containing records identifying products being manufactured with parameter data for each product, such as colors and models) or product sales databases (e.g., a database containing individual data records identifying details of individual product sales).

The unstructured data may be presented to the computing environment 114 in different forms such as a flat file or a conglomerate of data records, and may have data values and accompanying time stamps. The computing environment 114 may be used to analyze the unstructured data in a variety of ways to determine the best way to structure (e.g., hierarchically) that data, such that the structured data is tailored to a type of further analysis that a user wishes to perform on the data. For example, after being processed, the unstructured time stamped data may be aggregated by time (e.g., into daily time period units) to generate time series data and/or structured hierarchically according to one or more dimensions (e.g., parameters, attributes, and/or variables). For example, data may be stored in a hierarchical data structure, such as a ROLAP OR MOLAP database, or may be stored in another tabular form, such as in a flat-hierarchy form.

Data transmission network 100 may also include one or more server farms 106. Computing environment 114 may route select communications or data to the one or more sever farms 106 or one or more servers within the server farms. Server farms 106 can be configured to provide information in a predetermined manner. For example, server farms 106 may access data to transmit in response to a communication. Server farms 106 may be separately housed from each other device within data transmission network 100, such as computing environment 114, and/or may be part of a device or system.

Server farms 106 may host a variety of different types of data processing as part of data transmission network 100. Server farms 106 may receive a variety of different data from network devices, from computing environment 114, from cloud network 116, or from other sources. The data may have been obtained or collected from one or more sensors, as inputs from a control database, or may have been received as inputs from an external system or device. Server farms 106 may assist in processing the data by turning raw data into processed data based on one or more rules implemented by the server farms. For example, sensor data may be analyzed to determine changes in an environment over time or in real-time.

Data transmission network 100 may also include one or more cloud networks 116. Cloud network 116 may include a cloud infrastructure system that provides cloud services. In certain embodiments, services provided by the cloud network 116 may include a host of services that are made available to users of the cloud infrastructure system on demand. Cloud network 116 is shown in FIG. 1 as being connected to computing environment 114 (and therefore having computing environment 114 as its client or user), but cloud network 116 may be connected to or utilized by any of the devices in FIG. 1. Services provided by the cloud network can dynamically scale to meet the needs of its users. The cloud network 116 may include one or more computers, servers, and/or systems. In some embodiments, the computers, servers, and/or systems that make up the cloud network 116 are different from the user's own on-premises computers, servers, and/or systems. For example, the cloud network 116 may host an application, and a user may, via a communication network such as the Internet, on demand, order and use the application.

While each device, server and system in FIG. 1 is shown as a single device, it will be appreciated that multiple devices may instead be used. For example, a set of network devices can be used to transmit various communications from a single user, or remote server 140 may include a server stack. As another example, data may be processed as part of computing environment 114.

Each communication within data transmission network 100 (e.g., between client devices, between a device and connection management system 150, between servers 106 and computing environment 114 or between a server and a device) may occur over one or more networks 108. Networks 108 may include one or more of a variety of different types of networks, including a wireless network, a wired network, or a combination of a wired and wireless network. Examples of suitable networks include the Internet, a personal area network, a local area network (LAN), a wide area network (WAN), or a wireless local area network (WLAN). A wireless network may include a wireless interface or combination of wireless interfaces. As an example, a network in the one or more networks 108 may include a short-range communication channel, such as a Bluetooth or a Bluetooth Low Energy channel. A wired network may include a wired interface. The wired and/or wireless networks may be implemented using routers, access points, bridges, gateways, or the like, to connect devices in the network 114, as will be further described with respect to FIG. 2. The one or more networks 108 can be incorporated entirely within or can include an intranet, an extranet, or a combination thereof. In one embodiment, communications between two or more systems and/or devices can be achieved by a secure communications protocol, such as secure sockets layer (SSL) or transport layer security (TLS). In addition, data and/or transactional details may be encrypted.

Some aspects may utilize the Internet of Things (IoT), where things (e.g., machines, devices, phones, sensors) can be connected to networks and the data from these things can be collected and processed within the things and/or external to the things. For example, the IoT can include sensors in many different devices, and high value analytics can be applied to identify hidden relationships and drive increased efficiencies. This can apply to both big data analytics and real-time (e.g., ESP) analytics. IoT may be implemented in various areas, such as for access (technologies that get data and move it), embed-ability (devices with embedded sensors), and services. Industries in the IoT space may include automotive (connected car), manufacturing (connected factory), smart cities, energy and retail. This will be described further below with respect to FIG. 2.

As noted, computing environment 114 may include a communications grid 120 and a transmission network database system 118. Communications grid 120 may be a grid-based computing system for processing large amounts of data. The transmission network database system 118 may be for managing, storing, and retrieving large amounts of data that are distributed to and stored in the one or more network-attached data stores 110 or other data stores that reside at different locations within the transmission network database system 118. The compute nodes in the grid-based computing system 120 and the transmission network database system 118 may share the same processor hardware, such as processors that are located within computing environment 114.

Figure 2:
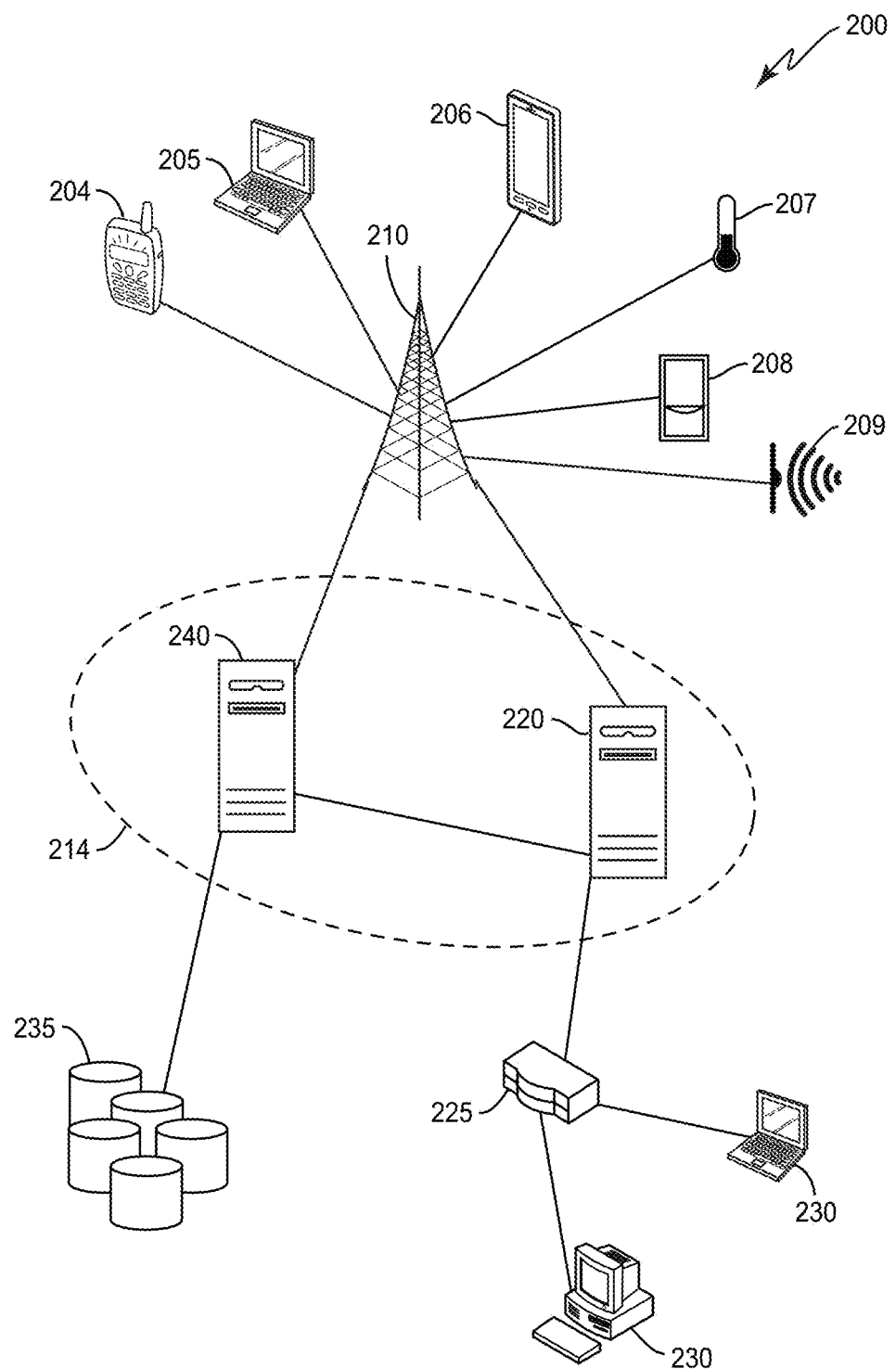
FIG. 2 illustrates an example network including an example set of devices communicating with each other over an exchange system and via a network, according to at least one embodiment of the present technology.

FIG. 2 illustrates an example network including an example set of devices communicating with each other over an exchange system and via a network, according to embodiments of the present technology. As noted, each communication within data transmission network 100 may occur over one or more networks. System 200 includes a network device 204 configured to communicate with a variety of types of client devices, for example client devices 230, over a variety of types of communication channels.

As shown in FIG. 2, network device 204 can transmit a communication over a network (e.g., a cellular network via a base station 210). The communication can be routed to another network device, such as network devices 205-209, via base station 210. The communication can also be routed to computing environment 214 via base station 210. For example, network device 204 may collect data either from its surrounding environment or from other network devices (such as network devices 205-209) and transmit that data to computing environment 214.

Although network devices 204-209 are shown in FIG. 2 as a mobile phone, laptop computer, tablet computer, temperature sensor, motion sensor, and audio sensor respectively, the network devices may be or include sensors that are sensitive to detecting aspects of their environment. For example, the network devices may include sensors such as water sensors, power sensors, electrical current sensors, chemical sensors, optical sensors, pressure sensors, geographic or position sensors (e.g., GPS), velocity sensors, acceleration sensors, flow rate sensors, among others. Examples of characteristics that may be sensed include force, torque, load, strain, position, temperature, air pressure, fluid flow, chemical properties, resistance, electromagnetic fields, radiation, irradiance, proximity, acoustics, moisture, distance, speed, vibrations, acceleration, electrical potential, electrical current, among others. The sensors may be mounted to various components used as part of a variety of different types of systems (e.g., an oil drilling operation). The network devices may detect and record data related to the environment that it monitors, and transmit that data to computing environment 214.

As noted, one type of system that may include various sensors that collect data to be processed and/or transmitted to a computing environment according to certain embodiments includes an oil drilling system. For example, the one or more drilling operation sensors may include surface sensors that measure a hook load, a fluid rate, a temperature and a density in and out of the wellbore, a standpipe pressure, a surface torque, a rotation speed of a drill pipe, a rate of penetration, a mechanical specific energy, etc. and downhole sensors that measure a rotation speed of a bit, fluid densities, downhole torque, downhole vibration (axial, tangential, lateral), a weight applied at a drill bit, an annular pressure, a differential pressure, an azimuth, an inclination, a dog leg severity, a measured depth, a vertical depth, a downhole temperature, etc. Besides the raw data collected directly by the sensors, other data may include parameters either developed by the sensors or assigned to the system by a client or other controlling device. For example, one or more drilling operation control parameters may control settings such as a mud motor speed to flow ratio, a bit diameter, a predicted formation top, seismic data, weather data, etc. Other data may be generated using physical models such as an earth model, a weather model, a seismic model, a bottom hole assembly model, a well plan model, an annular friction model, etc. In addition to sensor and control settings, predicted outputs, of for example, the rate of penetration, mechanical specific energy, hook load, flow in fluid rate, flow out fluid rate, pump pressure, surface torque, rotation speed of the drill pipe, annular pressure, annular friction pressure, annular temperature, equivalent circulating density, etc. may also be stored in the data warehouse.

In another example, another type of system that may include various sensors that collect data to be processed and/or transmitted to a computing environment according to certain embodiments includes a home automation or similar automated network in a different environment, such as an office space, school, public space, sports venue, or a variety of other locations. Network devices in such an automated network may include network devices that allow a user to access, control, and/or configure various home appliances located within the user's home (e.g., a television, radio, light, fan, humidifier, sensor, microwave, iron, and/or the like), or outside of the user's home (e.g., exterior motion sensors, exterior lighting, garage door openers, sprinkler systems, or the like). For example, network device 102 may include a home automation switch that may be coupled with a home appliance. In another embodiment, a network device can allow a user to access, control, and/or configure devices, such as office-related devices (e.g., copy machine, printer, or fax machine), audio and/or video related devices (e.g., a receiver, a speaker, a projector, a DVD player, or a television), media-playback devices (e.g., a compact disc player, a CD player, or the like), computing devices (e.g., a home computer, a laptop computer, a tablet, a personal digital assistant (PDA), a computing device, or a wearable device), lighting devices (e.g., a lamp or recessed lighting), devices associated with a security system, devices associated with an alarm system, devices that can be operated in an automobile (e.g., radio devices, navigation devices), and/or the like. Data may be collected from such various sensors in raw form, or data may be processed by the sensors to create parameters or other data either developed by the sensors based on the raw data or assigned to the system by a client or other controlling device.

In another example, another type of system that may include various sensors that collect data to be processed and/or transmitted to a computing environment according to certain embodiments includes a power or energy grid. A variety of different network devices may be included in an energy grid, such as various devices within one or more power plants, energy farms (e.g., wind farm, solar farm, among others) energy storage facilities, factories, homes and businesses of consumers, among others. One or more of such devices may include one or more sensors that detect energy gain or loss, electrical input or output or loss, and a variety of other efficiencies. These sensors may collect data to inform users of how the energy grid, and individual devices within the grid, may be functioning and how they may be made more efficient.

Network device sensors may also perform processing on data it collects before transmitting the data to the computing environment 114, or before deciding whether to transmit data to the computing environment 114. For example, network devices may determine whether data collected meets certain rules, for example by comparing data or values calculated from the data and comparing that data to one or more thresholds. The network device may use this data and/or comparisons to determine if the data should be transmitted to the computing environment 214 for further use or processing.

Computing environment 214 may include machines 220 and 240. Although computing environment 214 is shown in FIG. 2 as having two machines, 220 and 240, computing environment 214 may have only one machine or may have more than two machines. The machines that make up computing environment 214 may include specialized computers, servers, or other machines that are configured to individually and/or collectively process large amounts of data. The computing environment 214 may also include storage devices that include one or more databases of structured data, such as data organized in one or more hierarchies, or unstructured data. The databases may communicate with the processing devices within computing environment 214 to distribute data to them. Since network devices may transmit data to computing environment 214, that data may be received by the computing environment 214 and subsequently stored within those storage devices. Data used by computing environment 214 may also be stored in data stores 235, which may also be a part of or connected to computing environment 214.

Computing environment 214 can communicate with various devices via one or more routers 225 or other inter-network or intra-network connection components. For example, computing environment 214 may communicate with devices 230 via one or more routers 225. Computing environment 214 may collect, analyze and/or store data from or pertaining to communications, client device operations, client rules, and/or user-associated actions stored at one or more data stores 235. Such data may influence communication routing to the devices within computing environment 214, how data is stored or processed within computing environment 214, among other actions.

Notably, various other devices can further be used to influence communication routing and/or processing between devices within computing environment 214 and with devices outside of computing environment 214. For example, as shown in FIG. 2, computing environment 214 may include a web server 240. Thus, computing environment 214 can retrieve data of interest, such as client information (e.g., product information, client rules, etc.), technical product details, news, current or predicted weather, and so on.

In addition to computing environment 214 collecting data (e.g., as received from network devices, such as sensors, and client devices or other sources) to be processed as part of a big data analytics project, it may also receive data in real time as part of a streaming analytics environment. As noted, data may be collected using a variety of sources as communicated via different kinds of networks or locally. Such data may be received on a real-time streaming basis. For example, network devices may receive data periodically from network device sensors as the sensors continuously sense, monitor and track changes in their environments. Devices within computing environment 214 may also perform pre-analysis on data it receives to determine if the data received should be processed as part of an ongoing project. The data received and collected by computing environment 214, no matter what the source or method or timing of receipt, may be processed over a period of time for a client to determine results data based on the client's needs and rules.

Figure 3:
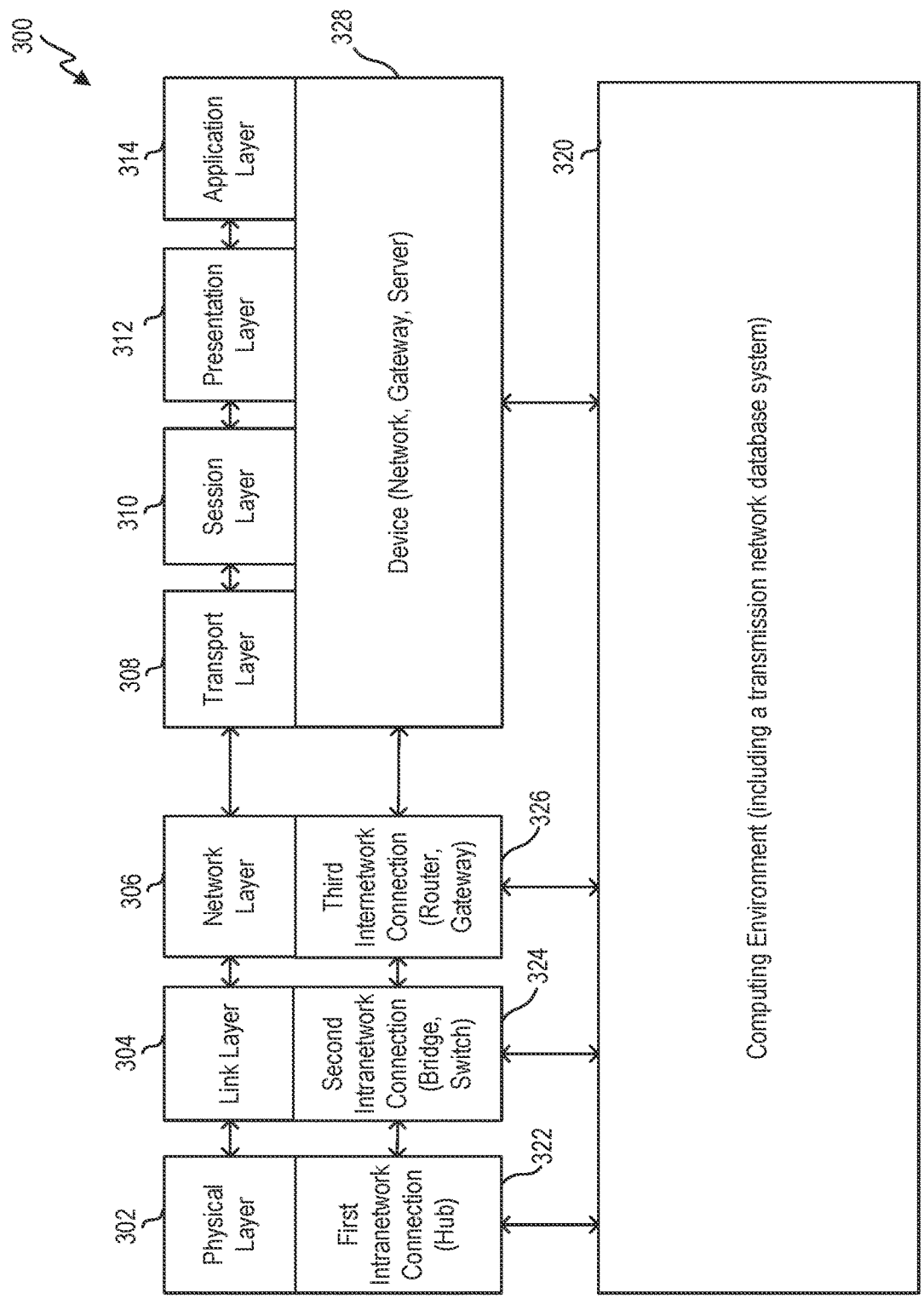
FIG. 3 illustrates a representation of a conceptual model of a communications protocol system, according to at least one embodiment of the present technology.

FIG. 3 illustrates a representation of a conceptual model of a communications protocol system, according to embodiments of the present technology. More specifically, FIG. 3 identifies operation of a computing environment in an Open Systems Interaction model that corresponds to various connection components. The model 300 shows, for example, how a computing environment, such as computing environment 320 (or computing environment 214 in FIG. 2) may communicate with other devices in its network, and control how communications between the computing environment and other devices are executed and under what conditions.

The model can include layers 302-314. The layers are arranged in a stack. Each layer in the stack serves the layer one level higher than it (except for the application layer, which is the highest layer), and is served by the layer one level below it (except for the physical layer, which is the lowest layer). The physical layer is the lowest layer because it receives and transmits raw bites of data, and is the farthest layer from the user in a communications system. On the other hand, the application layer is the highest layer because it interacts directly with a software application.

As noted, the model includes a physical layer 302. Physical layer 302 represents physical communication, and can define parameters of that physical communication. For example, such physical communication may come in the form of electrical, optical, or electromagnetic signals. Physical layer 302 also defines protocols that may control communications within a data transmission network.

Link layer 304 defines links and mechanisms used to transmit (i.e., move) data across a network. The link layer manages node-to-node communications, such as within a grid computing environment. Link layer 304 can detect and correct errors (e.g., transmission errors in the physical layer 302). Link layer 304 can also include a media access control (MAC) layer and logical link control (LLC) layer.

Network layer 306 defines the protocol for routing within a network. In other words, the network layer coordinates transferring data across nodes in a same network (e.g., such as a grid computing environment). Network layer 306 can also define the processes used to structure local addressing within the network.

Transport layer 308 can manage the transmission of data and the quality of the transmission and/or receipt of that data. Transport layer 308 can provide a protocol for transferring data, such as, for example, a Transmission Control Protocol (TCP). Transport layer 308 can assemble and disassemble data frames for transmission. The transport layer can also detect transmission errors occurring in the layers below it.

Session layer 310 can establish, maintain, and manage communication connections between devices on a network. In other words, the session layer controls the dialogues or nature of communications between network devices on the network. The session layer may also establish checkpointing, adjournment, termination, and restart procedures.

Presentation layer 312 can provide translation for communications between the application and network layers. In other words, this layer may encrypt, decrypt and/or format data based on data types known to be accepted by an application or network layer.

Application layer 314 interacts directly with software applications and end users, and manages communications between them. Application layer 314 can identify destinations, local resource states or availability and/or communication content or formatting using the applications.

Intra-network connection components 322 and 324 are shown to operate in lower levels, such as physical layer 302 and link layer 304, respectively. For example, a hub can operate in the physical layer 302 and a switch can operate in the link layer 304. Inter-network connection components 326 and 328 are shown to operate on higher levels, such as layers 306-314. For example, routers can operate in the network layer 306 and network devices can operate in the transport layer 308, session layer 310, presentation layer 312, and application layer 314.

As noted, a computing environment 320 can interact with and/or operate on, in various embodiments, one, more, all or any of the various layers. For example, computing environment 320 can interact with a hub (e.g., via the link layer) so as to adjust which devices the hub communicates with. The physical layer may be served by the link layer, so it may implement such data from the link layer. For example, the computing environment 320 may control which devices it will receive data from. For example, if the computing environment 320 knows that a certain network device has turned off, broken, or otherwise become unavailable or unreliable, the computing environment 320 may instruct the hub to prevent any data from being transmitted to the computing environment 320 from that network device. Such a process may be beneficial to avoid receiving data that is inaccurate or that has been influenced by an uncontrolled environment. As another example, computing environment 320 can communicate with a bridge, switch, router or gateway and influence which device within the system (e.g., system 200) the component selects as a destination. In some embodiments, computing environment 320 can interact with various layers by exchanging communications with equipment operating on a particular layer by routing or modifying existing communications. In another embodiment, such as in a grid computing environment, a node may determine how data within the environment should be routed (e.g., which node should receive certain data) based on certain parameters or information provided by other layers within the model.

As noted, the computing environment 320 may be a part of a communications grid environment, the communications of which may be implemented as shown in the protocol of FIG. 3. For example, referring back to FIG. 2, one or more of machines 220 and 240 may be part of a communications grid computing environment. A gridded computing environment may be employed in a distributed system with non-interactive workloads where data resides in memory on the machines, or compute nodes. In such an environment, analytic code, instead of a database management system, controls the processing performed by the nodes. Data is co-located by pre-distributing it to the grid nodes, and the analytic code on each node loads the local data into memory. Each node may be assigned a particular task such as a portion of a processing project, or to organize or control other nodes within the grid.

Figure 4:
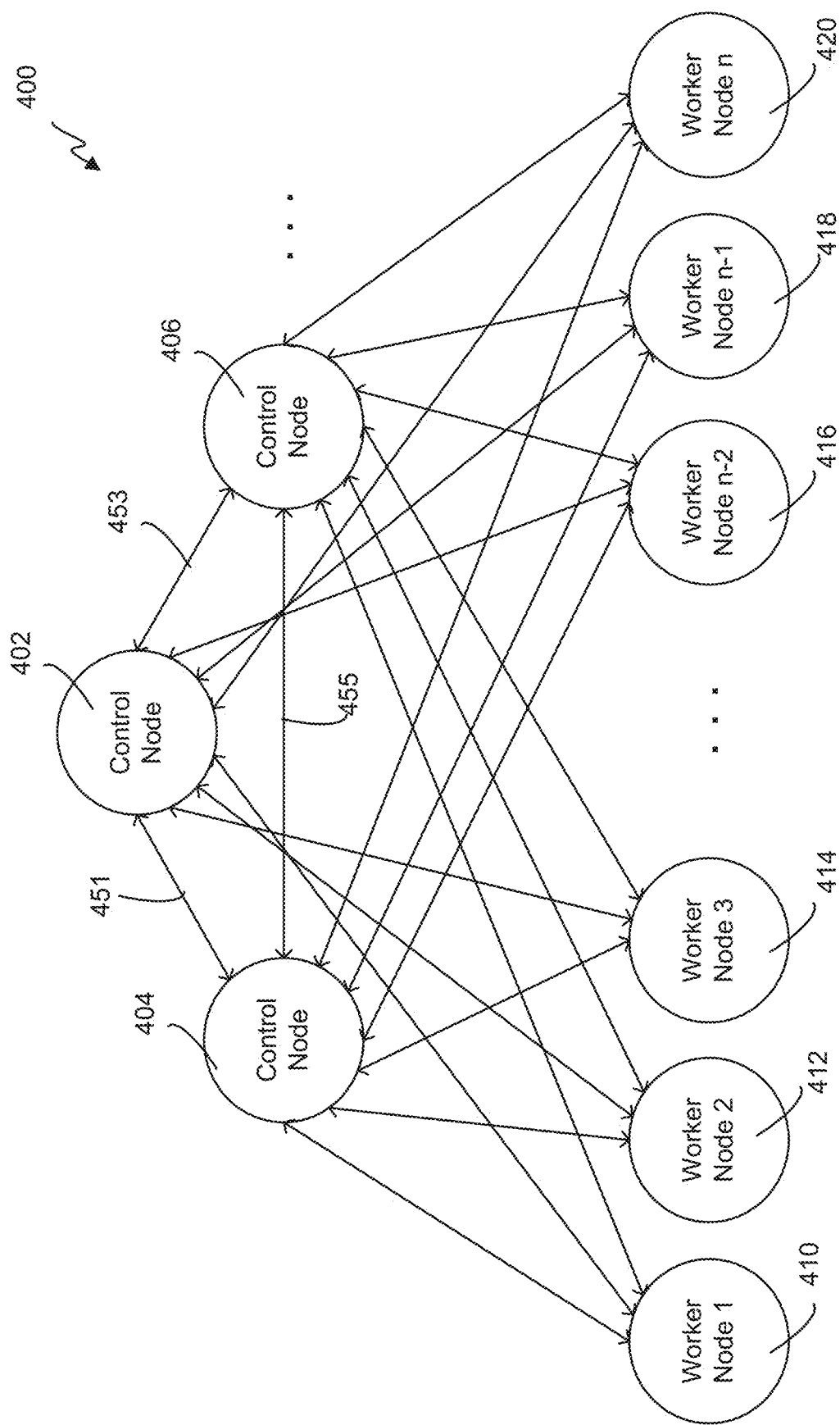
FIG. 4 illustrates a communications grid computing system including a variety of control and worker nodes, according to at least one embodiment of the present technology.

FIG. 4 illustrates a communications grid computing system 400 including a variety of control and worker nodes, according to embodiments of the present technology. Communications grid computing system 400 includes three control nodes and one or more worker nodes. Communications grid computing system 400 includes control nodes 402, 404, and 406. The control nodes are communicatively connected via communication paths 451, 453, and 455. Therefore, the control nodes may transmit information (e.g., related to the communications grid or notifications), to and receive information from each other. Although communications grid computing system 400 is shown in FIG. 4 as including three control nodes, the communications grid may include more or less than three control nodes.

Communications grid computing system (or just "communications grid") 400 also includes one or more worker nodes. Shown in FIG. 4 are six worker nodes 410-420. Although FIG. 4 shows six worker nodes, a communications grid according to embodiments of the present technology may include more or less than six worker nodes. The number of worker nodes included in a communications grid may be dependent upon how large the project or data set is being processed by the communications grid, the capacity of each worker node, the time designated for the communications grid to complete the project, among others. Each worker node within the communications grid 400 may be connected (wired or wirelessly, and directly or indirectly) to control nodes 402-406. Therefore, each worker node may receive information from the control nodes (e.g., an instruction to perform work on a project) and may transmit information to the control nodes (e.g., a result from work performed on a project). Furthermore, worker nodes may communicate with each other (either directly or indirectly). For example, worker nodes may transmit data between each other related to a job being performed or an individual task within a job being performed by that worker node. However, in certain embodiments, worker nodes may not, for example, be connected (communicatively or otherwise) to certain other worker nodes. In an embodiment, worker nodes may only be able to communicate with the control node that controls it, and may not be able to communicate with other worker nodes in the communications grid, whether they are other worker nodes controlled by the control node that controls the worker node, or worker nodes that are controlled by other control nodes in the communications grid.

A control node may connect with an external device with which the control node may communicate (e.g., a grid user, such as a server or computer, may connect to a controller of the grid). For example, a server or computer may connect to control nodes and may transmit a project or job to the node. The project may include a data set. The data set may be of any size. Once the control node receives such a project including a large data set, the control node may distribute the data set or projects related to the data set to be performed by worker nodes. Alternatively, for a project including a large data set, the data set may be receive or stored by a machine other than a control node (e.g., a Hadoop data node).

Control nodes may maintain knowledge of the status of the nodes in the grid (i.e., grid status information), accept work requests from clients, subdivide the work across worker nodes, coordinate the worker nodes, among other responsibilities. Worker nodes may accept work requests from a control node and provide the control node with results of the work performed by the worker node. A grid may be started from a single node (e.g., a machine, computer, server, etc.). This first node may be assigned or may start as the primary control node that will control any additional nodes that enter the grid.

When a project is submitted for execution (e.g., by a client or a controller of the grid) it may be assigned to a set of nodes. After the nodes are assigned to a project, a data structure (i.e., a communicator) may be created. The communicator may be used by the project for information to be shared between the project code running on each node. A communication handle may be created on each node. A handle, for example, is a reference to the communicator that is valid within a single process on a single node, and the handle may be used when requesting communications between nodes.

A control node, such as control node 402, may be designated as the primary control node. A server, computer or other external device may connect to the primary control node. Once the control node receives a project, the primary control node may distribute portions of the project to its worker nodes for execution. For example, when a project is initiated on communications grid 400, primary control node 402 controls the work to be performed for the project in order to complete the project as requested or instructed. The primary control node may distribute work to the worker nodes based on various factors, such as which subsets or portions of projects may be completed most efficiently and in the correct amount of time. For example, a worker node may perform analysis on a portion of data that is already local (e.g., stored on) the worker node. The primary control node also coordinates and processes the results of the work performed by each worker node after each worker node executes and completes its job. For example, the primary control node may receive a result from one or more worker nodes, and the control node may organize (e.g., collect and assemble) the results received and compile them to produce a complete result for the project received from the end user.

Any remaining control nodes, such as control nodes 404 and 406, may be assigned as backup control nodes for the project. In an embodiment, backup control nodes may not control any portion of the project. Instead, backup control nodes may serve as a backup for the primary control node and take over as primary control node if the primary control node were to fail. If a communications grid were to include only a single control node, and the control node were to fail (e.g., the control node is shut off or breaks) then the communications grid as a whole may fail and any project or job being run on the communications grid may fail and may not complete. While the project may be run again, such a failure may cause a delay (severe delay in some cases, such as overnight delay) in completion of the project. Therefore, a grid with multiple control nodes, including a backup control node, may be beneficial.

To add another node or machine to the grid, the primary control node may open a pair of listening sockets, for example. A socket may be used to accept work requests from clients, and the second socket may be used to accept connections from other grid nodes). The primary control node may be provided with a list of other nodes (e.g., other machines, computers, servers) that will participate in the grid, and the role that each node will fill in the grid. Upon startup of the primary control node (e.g., the first node on the grid), the primary control node may use a network protocol to start the server process on every other node in the grid. Command line parameters, for example, may inform each node of one or more pieces of information, such as: the role that the node will have in the grid, the host name of the primary control node, the port number on which the primary control node is accepting connections from peer nodes, among others. The information may also be provided in a configuration file, transmitted over a secure shell tunnel, recovered from a configuration server, among others. While the other machines in the grid may not initially know about the configuration of the grid, that information may also be sent to each other node by the primary control node. Updates of the grid information may also be subsequently sent to those nodes.

For any control node other than the primary control node added to the grid, the control node may open three sockets. The first socket may accept work requests from clients, the second socket may accept connections from other grid members, and the third socket may connect (e.g., permanently) to the primary control node. When a control node (e.g., primary control node) receives a connection from another control node, it first checks to see if the peer node is in the list of configured nodes in the grid. If it is not on the list, the control node may clear the connection. If it is on the list, it may then attempt to authenticate the connection. If authentication is successful, the authenticating node may transmit information to its peer, such as the port number on which a node is listening for connections, the host name of the node, information about how to authenticate the node, among other information. When a node, such as the new control node, receives information about another active node, it will check to see if it already has a connection to that other node. If it does not have a connection to that node, it may then establish a connection to that control node.

Any worker node added to the grid may establish a connection to the primary control node and any other control nodes on the grid. After establishing the connection, it may authenticate itself to the grid (e.g., any control nodes, including both primary and backup, or a server or user controlling the grid). After successful authentication, the worker node may accept configuration information from the control node.

When a node joins a communications grid (e.g., when the node is powered on or connected to an existing node on the grid or both), the node is assigned (e.g., by an operating system of the grid) a universally unique identifier (UUID). This unique identifier may help other nodes and external entities (devices, users, etc.) to identify the node and distinguish it from other nodes. When a node is connected to the grid, the node may share its unique identifier with the other nodes in the grid. Since each node may share its unique identifier, each node may know the unique identifier of every other node on the grid. Unique identifiers may also designate a hierarchy of each of the nodes (e.g., backup control nodes) within the grid. For example, the unique identifiers of each of the backup control nodes may be stored in a list of backup control nodes to indicate an order in which the backup control nodes will take over for a failed primary control node to become a new primary control node. However, a hierarchy of nodes may also be determined using methods other than using the unique identifiers of the nodes. For example, the hierarchy may be predetermined, or may be assigned based on other predetermined factors.

The grid may add new machines at any time (e.g., initiated from any control node). Upon adding a new node to the grid, the control node may first add the new node to its table of grid nodes. The control node may also then notify every other control node about the new node. The nodes receiving the notification may acknowledge that they have updated their configuration information.

Primary control node 402 may, for example, transmit one or more communications to backup control nodes 404 and 406 (and, for example, to other control or worker nodes within the communications grid). Such communications may sent periodically, at fixed time intervals, between known fixed stages of the project's execution, among other protocols. The communications transmitted by primary control node 402 may be of varied types and may include a variety of types of information. For example, primary control node 402 may transmit snapshots (e.g., status information) of the communications grid so that backup control node 404 always has a recent snapshot of the communications grid. The snapshot or grid status may include, for example, the structure of the grid (including, for example, the worker nodes in the grid, unique identifiers of the nodes, or their relationships with the primary control node) and the status of a project (including, for example, the status of each worker node's portion of the project). The snapshot may also include analysis or results received from worker nodes in the communications grid. The backup control nodes may receive and store the backup data received from the primary control node. The backup control nodes may transmit a request for such a snapshot (or other information) from the primary control node, or the primary control node may send such information periodically to the backup control nodes.

As noted, the backup data may allow the backup control node to take over as primary control node if the primary control node fails without requiring the grid to start the project over from scratch. If the primary control node fails, the backup control node that will take over as primary control node may retrieve the most recent version of the snapshot received from the primary control node and use the snapshot to continue the project from the stage of the project indicated by the backup data. This may prevent failure of the project as a whole.

A backup control node may use various methods to determine that the primary control node has failed. In one example of such a method, the primary control node may transmit (e.g., periodically) a communication to the backup control node that indicates that the primary control node is working and has not failed, such as a heartbeat communication. The backup control node may determine that the primary control node has failed if the backup control node has not received a heartbeat communication for a certain predetermined period of time. Alternatively, a backup control node may also receive a communication from the primary control node itself (before it failed) or from a worker node that the primary control node has failed, for example because the primary control node has failed to communicate with the worker node.

Different methods may be performed to determine which backup control node of a set of backup control nodes (e.g., backup control nodes 404 and 406) will take over for failed primary control node 402 and become the new primary control node. For example, the new primary control node may be chosen based on a ranking or "hierarchy" of backup control nodes based on their unique identifiers. In an alternative embodiment, a backup control node may be assigned to be the new primary control node by another device in the communications grid or from an external device (e.g., a system infrastructure or an end user, such as a server or computer, controlling the communications grid). In another alternative embodiment, the backup control node that takes over as the new primary control node may be designated based on bandwidth or other statistics about the communications grid.

A worker node within the communications grid may also fail. If a worker node fails, work being performed by the failed worker node may be redistributed amongst the operational worker nodes. In an alternative embodiment, the primary control node may transmit a communication to each of the operable worker nodes still on the communications grid that each of the worker nodes should purposefully fail also. After each of the worker nodes fail, they may each retrieve their most recent saved checkpoint of their status and re-start the project from that checkpoint to minimize lost progress on the project being executed.

Figure 5:
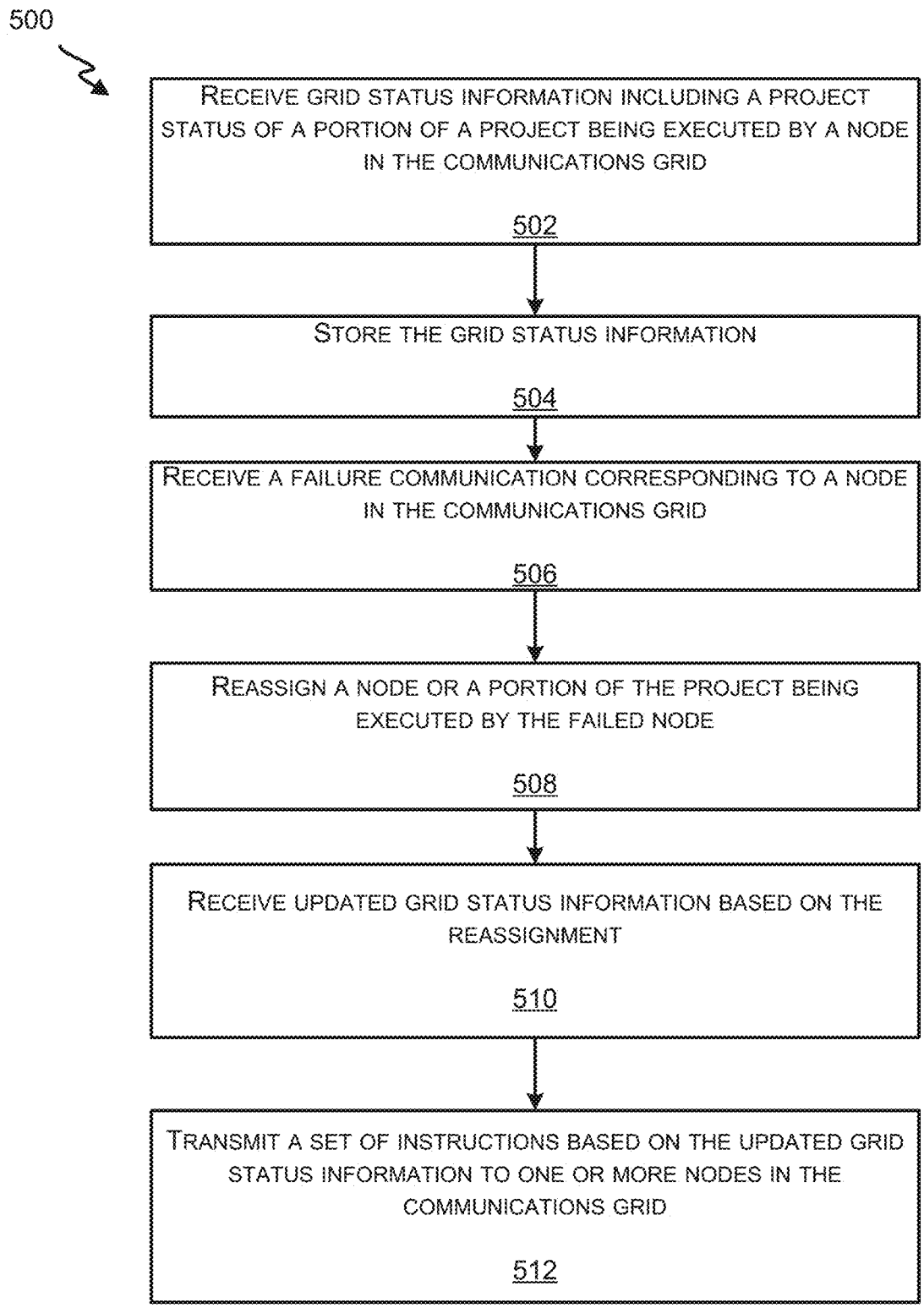
FIG. 5 illustrates a flow chart showing an example process for adjusting a communications grid or a work project in a communications grid after a failure of a node, according to at least one embodiment of the present technology.

FIG. 5 illustrates a flow chart showing an example process for adjusting a communications grid or a work project in a communications grid after a failure of a node, according to embodiments of the present technology. The process may include, for example, receiving grid status information including a project status of a portion of a project being executed by a node in the communications grid, as described in operation 502. For example, a control node (e.g., a backup control node connected to a primary control node and a worker node on a communications grid) may receive grid status information, where the grid status information includes a project status of the primary control node or a project status of the worker node. The project status of the primary control node and the project status of the worker node may include a status of one or more portions of a project being executed by the primary and worker nodes in the communications grid. The process may also include storing the grid status information, as described in operation 504. For example, a control node (e.g., a backup control node) may store the received grid status information locally within the control node. Alternatively, the grid status information may be sent to another device for storage where the control node may have access to the information.

The process may also include receiving a failure communication corresponding to a node in the communications grid in operation 506. For example, a node may receive a failure communication including an indication that the primary control node has failed, prompting a backup control node to take over for the primary control node. In an alternative embodiment, a node may receive a failure that a worker node has failed, prompting a control node to reassign the work being performed by the worker node. The process may also include reassigning a node or a portion of the project being executed by the failed node, as described in operation 508. For example, a control node may designate the backup control node as a new primary control node based on the failure communication upon receiving the failure communication. If the failed node is a worker node, a control node may identify a project status of the failed worker node using the snapshot of the communications grid, where the project status of the failed worker node includes a status of a portion of the project being executed by the failed worker node at the failure time.

The process may also include receiving updated grid status information based on the reassignment, as described in operation 510, and transmitting a set of instructions based on the updated grid status information to one or more nodes in the communications grid, as described in operation 512. The updated grid status information may include an updated project status of the primary control node or an updated project status of the worker node. The updated information may be transmitted to the other nodes in the grid to update their stale stored information.

Figure 6:
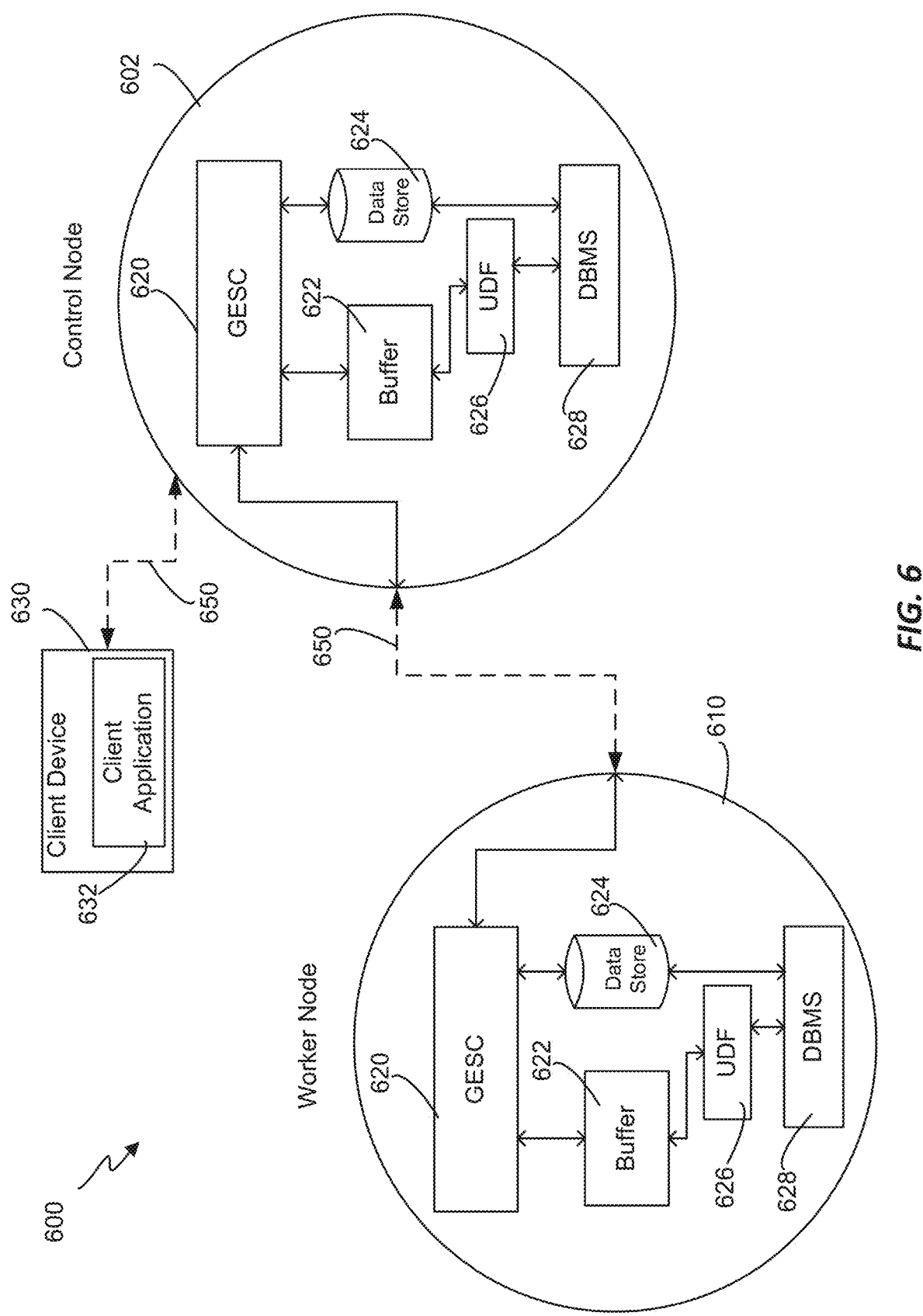
FIG. 6 illustrates a portion of a communications grid computing system including a control node and a worker node, according to at least one embodiment of the present technology.

FIG. 6 illustrates a portion of a communications grid computing system 600 including a control node and a worker node, according to embodiments of the present technology. Communications grid 600 computing system includes one control node (control node 602) and one worker node (worker node 610) for purposes of illustration, but may include more worker and/or control nodes. The control node 602 is communicatively connected to worker node 610 via communication path 650. Therefore, control node 602 may transmit information (e.g., related to the communications grid or notifications), to and receive information from worker node 610 via path 650.

Similar to in FIG. 4, communications grid computing system (or just "communications grid") 600 includes data processing nodes (control node 602 and worker node 610). Nodes 602 and 610 include multi-core data processors. Each node 602 and 610 includes a grid-enabled software component (GESC) 620 that executes on the data processor associated with that node and interfaces with buffer memory 622 also associated with that node. Each node 602 and 610 includes a database management software (DBMS) 628 that executes on a database server (not shown) at control node 602 and on a database server (not shown) at worker node 610.

Each node also includes a data store 624. Data stores 624, similar to network-attached data stores 110 in FIG. 1 and data stores 235 in FIG. 2, are used to store data to be processed by the nodes in the computing environment. Data stores 624 may also store any intermediate or final data generated by the computing system after being processed, for example in non-volatile memory. However in certain embodiments, the configuration of the grid computing environment allows its operations to be performed such that intermediate and final data results can be stored solely in volatile memory (e.g., RAM), without a requirement that intermediate or final data results be stored to non-volatile types of memory. Storing such data in volatile memory may be useful in certain situations, such as when the grid receives queries (e.g., ad hoc) from a client and when responses, which are generated by processing large amounts of data, need to be generated quickly or on-the-fly. In such a situation, the grid may be configured to retain the data within memory so that responses can be generated at different levels of detail and so that a client may interactively query against this information.

Each node also includes a user-defined function (UDF) 626. The UDF provides a mechanism for the DMBS 628 to transfer data to or receive data from the database stored in the data stores 624 that are managed by the DBMS. For example, UDF 626 can be invoked by the DBMS to provide data to the GESC for processing. The UDF 626 may establish a socket connection (not shown) with the GESC to transfer the data. Alternatively, the UDF 626 can transfer data to the GESC by writing data to shared memory accessible by both the UDF and the GESC.

The GESC 620 at the nodes 602 and 620 may be connected via a network, such as network 108 shown in FIG. 1. Therefore, nodes 602 and 620 can communicate with each other via the network using a predetermined communication protocol such as, for example, the Message Passing Interface (MPI). Each GESC 620 can engage in point-to-point communication with the GESC at another node or in collective communication with multiple GESCs via the network. The GESC 620 at each node may contain identical (or nearly identical) software instructions. Each node may be capable of operating as either a control node or a worker node. The GESC at the control node 602 can communicate, over a communication path 652, with a client device 630. More specifically, control node 602 may communicate with client application 632 hosted by the client device 630 to receive queries and to respond to those queries after processing large amounts of data.

DMBS 628 may control the creation, maintenance, and use of database or data structure (not shown) within a nodes 602 or 610. The database may organize data stored in data stores 624. The DMBS 628 at control node 602 may accept requests for data and transfer the appropriate data for the request. With such a process, collections of data may be distributed across multiple physical locations. In this example, each node 602 and 610 stores a portion of the total data managed by the management system in its associated data store 624.

Furthermore, the DBMS may be responsible for protecting against data loss using replication techniques. Replication includes providing a backup copy of data stored on one node on one or more other nodes. Therefore, if one node fails, the data from the failed node can be recovered from a replicated copy residing at another node. However, as described herein with respect to FIG. 4, data or status information for each node in the communications grid may also be shared with each node on the grid.

Figure 7:
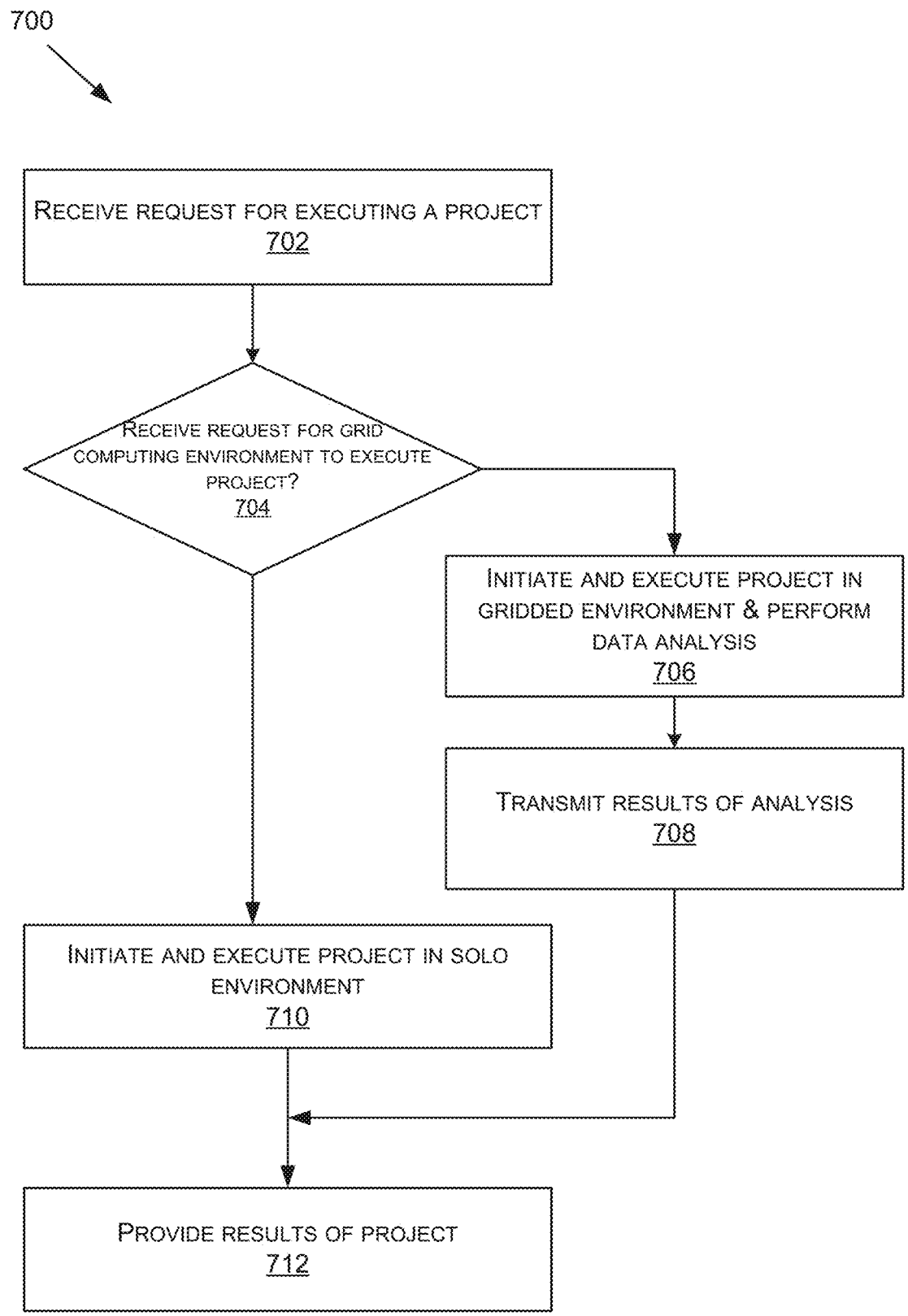
FIG. 7 illustrates a flow chart showing an example process for executing a data analysis or processing project, according to at least one embodiment of the present technology.

FIG. 7 illustrates a flow chart showing an example method for executing a project within a grid computing system, according to embodiments of the present technology. As described with respect to FIG. 6, the GESC at the control node may transmit data with a client device (e.g., client device 630) to receive queries for executing a project and to respond to those queries after large amounts of data have been processed. The query may be transmitted to the control node, where the query may include a request for executing a project, as described in operation 702. The query can contain instructions on the type of data analysis to be performed in the project and whether the project should be executed using the grid-based computing environment, as shown in operation 704.

To initiate the project, the control node may determine if the query requests use of the grid-based computing environment to execute the project. If the determination is no, then the control node initiates execution of the project in a solo environment (e.g., at the control node), as described in operation 710. If the determination is yes, the control node may initiate execution of the project in the grid-based computing environment, as described in operation 706. In such a situation, the request may include a requested configuration of the grid. For example, the request may include a number of control nodes and a number of worker nodes to be used in the grid when executing the project. After the project has been completed, the control node may transmit results of the analysis yielded by the grid, as described in operation 708. Whether the project is executed in a solo or grid-based environment, the control node provides the results of the project in operation 712.

As noted with respect to FIG. 2, the computing environments described herein may collect data (e.g., as received from network devices, such as sensors, such as network devices 204-209 in FIG. 2, and client devices or other sources) to be processed as part of a data analytics project, and data may be received in real time as part of a streaming analytics environment (e.g., ESP). Data may be collected using a variety of sources as communicated via different kinds of networks or locally, such as on a real-time streaming basis. For example, network devices may receive data periodically from network device sensors as the sensors continuously sense, monitor and track changes in their environments. More specifically, an increasing number of distributed applications develop or produce continuously flowing data from distributed sources by applying queries to the data before distributing the data to geographically distributed recipients. An event stream processing engine (ESPE) may continuously apply the queries to the data as it is received and determines which entities should receive the data. Client or other devices may also subscribe to the ESPE or other devices processing ESP data so that they can receive data after processing, based on for example the entities determined by the processing engine. For example, client devices 230 in FIG. 2 may subscribe to the ESPE in computing environment 214. In another example, event subscription devices 1024a-c, described further with respect to FIG. 10, may also subscribe to the ESPE. The ESPE may determine or define how input data or event streams from network devices or other publishers (e.g., network devices 204-209 in FIG. 2) are transformed into meaningful output data to be consumed by subscribers, such as for example client devices 230 in FIG. 2.

FIG. 8 illustrates a block diagram including components of an Event Stream Processing Engine (ESPE), according to embodiments of the present technology. ESPE 800 may include one or more projects 802. A project may be described as a second-level container in an engine model managed by ESPE 800 where a thread pool size for the project may be defined by a user. Each project of the one or more projects 802 may include one or more continuous queries 804 that contain data flows, which are data transformations of incoming event streams. The one or more continuous queries 804 may include one or more source windows 806 and one or more derived windows 808.

The ESPE may receive streaming data over a period of time related to certain events, such as events or other data sensed by one or more network devices. The ESPE may perform operations associated with processing data created by the one or more devices. For example, the ESPE may receive data from the one or more network devices 204-209 shown in FIG. 2. As noted, the network devices may include sensors that sense different aspects of their environments, and may collect data over time based on those sensed observations. For example, the ESPE may be implemented within one or more of machines 220 and 240 shown in FIG. 2. The ESPE may be implemented within such a machine by an ESP application. An ESP application may embed an ESPE with its own dedicated thread pool or pools into its application space where the main application thread can do application-specific work and the ESPE processes event streams at least by creating an instance of a model into processing objects.

The engine container is the top-level container in a model that manages the resources of the one or more projects 802. In an illustrative embodiment, for example, there may be only one ESPE 800 for each instance of the ESP application, and ESPE 800 may have a unique engine name. Additionally, the one or more projects 802 may each have unique project names, and each query may have a unique continuous query name and begin with a uniquely named source window of the one or more source windows 806. ESPE 800 may or may not be persistent.

Continuous query modeling involves defining directed graphs of windows for event stream manipulation and transformation. A window in the context of event stream manipulation and transformation is a processing node in an event stream processing model. A window in a continuous query can perform aggregations, computations, pattern-matching, and other operations on data flowing through the window. A continuous query may be described as a directed graph of source, relational, pattern matching, and procedural windows. The one or more source windows 806 and the one or more derived windows 808 represent continuously executing queries that generate updates to a query result set as new event blocks stream through ESPE 800. A directed graph, for example, is a set of nodes connected by edges, where the edges have a direction associated with them.

An event object may be described as a packet of data accessible as a collection of fields, with at least one of the fields defined as a key or unique identifier (ID). The event object may be created using a variety of formats including binary, alphanumeric, XML, etc. Each event object may include one or more fields designated as a primary identifier (ID) for the event so ESPE 800 can support operation codes (opcodes) for events including insert, update, upsert, and delete. Upsert opcodes update the event if the key field already exists; otherwise, the event is inserted. For illustration, an event object may be a packed binary representation of a set of field values and include both metadata and field data associated with an event. The metadata may include an opcode indicating if the event represents an insert, update, delete, or upsert, a set of flags indicating if the event is a normal, partial-update, or a retention generated event from retention policy management, and a set of microsecond timestamps that can be used for latency measurements.

An event block object may be described as a grouping or package of event objects. An event stream may be described as a flow of event block objects. A continuous query of the one or more continuous queries 804 transforms a source event stream made up of streaming event block objects published into ESPE 800 into one or more output event streams using the one or more source windows 806 and the one or more derived windows 808. A continuous query can also be thought of as data flow modeling.

The one or more source windows 806 are at the top of the directed graph and have no windows feeding into them. Event streams are published into the one or more source windows 806, and from there, the event streams may be directed to the next set of connected windows as defined by the directed graph. The one or more derived windows 808 are all instantiated windows that are not source windows and that have other windows streaming events into them. The one or more derived windows 808 may perform computations or transformations on the incoming event streams. The one or more derived windows 808 transform event streams based on the window type (that is operators such as join, filter, compute, aggregate, copy, pattern match, procedural, union, etc.) and window settings. As event streams are published into ESPE 800, they are continuously queried, and the resulting sets of derived windows in these queries are continuously updated.

FIG. 9 illustrates a flow chart showing an example process including operations performed by an event stream processing engine, according to some embodiments of the present technology. As noted, the ESPE 800 (or an associated ESP application) defines how input event streams are transformed into meaningful output event streams. More specifically, the ESP application may define how input event streams from publishers (e.g., network devices providing sensed data) are transformed into meaningful output event streams consumed by subscribers (e.g., a data analytics project being executed by a machine or set of machines).

Within the application, a user may interact with one or more user interface windows presented to the user in a display under control of the ESPE independently or through a browser application in an order selectable by the user. For example, a user may execute an ESP application, which causes presentation of a first user interface window, which may include a plurality of menus and selectors such as drop down menus, buttons, text boxes, hyperlinks, etc. associated with the ESP application as understood by a person of skill in the art. As further understood by a person of skill in the art, various operations may be performed in parallel, for example, using a plurality of threads.

At operation 900, an ESP application may define and start an ESPE, thereby instantiating an ESPE at a device, such as machine 220 and/or 240. In an operation 902, the engine container is created. For illustration, ESPE 800 may be instantiated using a function call that specifies the engine container as a manager for the model.

In an operation 904, the one or more continuous queries 804 are instantiated by ESPE 800 as a model. The one or more continuous queries 804 may be instantiated with a dedicated thread pool or pools that generate updates as new events stream through ESPE 800. For illustration, the one or more continuous queries 804 may be created to model business processing logic within ESPE 800, to predict events within ESPE 800, to model a physical system within ESPE 800, to predict the physical system state within ESPE 800, etc. For example, as noted, ESPE 800 may be used to support sensor data monitoring and management (e.g., sensing may include force, torque, load, strain, position, temperature, air pressure, fluid flow, chemical properties, resistance, electromagnetic fields, radiation, irradiance, proximity, acoustics, moisture, distance, speed, vibrations, acceleration, electrical potential, or electrical current, etc.).

ESPE 800 may analyze and process events in motion or "event streams." Instead of storing data and running queries against the stored data, ESPE 800 may store queries and stream data through them to allow continuous analysis of data as it is received. The one or more source windows 806 and the one or more derived windows 808 may be created based on the relational, pattern matching, and procedural algorithms that transform the input event streams into the output event streams to model, simulate, score, test, predict, etc. based on the continuous query model defined and application to the streamed data.

In an operation 906, a publish/subscribe (pub/sub) capability is initialized for ESPE 800. In an illustrative embodiment, a pub/sub capability is initialized for each project of the one or more projects 802. To initialize and enable pub/sub capability for ESPE 800, a port number may be provided. Pub/sub clients can use a host name of an ESP device running the ESPE and the port number to establish pub/sub connections to ESPE 800.

FIG. 10 illustrates an ESP system 1000 interfacing between publishing device 1022 and event subscribing devices 1024*a-c*, according to embodiments of the present technology. ESP system 1000 may include ESP device or subsystem 1001, event publishing device 1022, an event subscribing device A 1024*a*, an event subscribing device B 1024*b*, and an event subscribing device C 1024*c*. Input event streams are output to ESP device 1001 by publishing device 1022. In alternative embodiments, the input event streams may be created by a plurality of publishing devices. The plurality of publishing devices further may publish event streams to other ESP devices. The one or more continuous queries instantiated by ESPE 800 may analyze and process the input event streams to form output event streams output to event subscribing device A 1024*a*, event subscribing device B 1024*b*, and event subscribing device C 1024*c*. ESP system 1000 may include a greater or a fewer number of event subscribing devices of event subscribing devices.

Publish-subscribe is a message-oriented interaction paradigm based on indirect addressing. Processed data recipients specify their interest in receiving information from ESPE 800 by subscribing to specific classes of events, while information sources publish events to ESPE 800 without directly addressing the receiving parties. ESPE 800 coordinates the interactions and processes the data. In some cases, the data source receives confirmation that the published information has been received by a data recipient.

A publish/subscribe API may be described as a library that enables an event publisher, such as publishing device 1022, to publish event streams into ESPE 800 or an event subscriber, such as event subscribing device A 1024a, event subscribing device B 1024b, and event subscribing device C 1024c, to subscribe to event streams from ESPE 800. For illustration, one or more publish/subscribe APIs may be defined. Using the publish/subscribe API, an event publishing application may publish event streams into a running event stream processor project source window of ESPE 800, and the event subscription application may subscribe to an event stream processor project source window of ESPE 800.

The publish/subscribe API provides cross-platform connectivity and endianness compatibility between ESP application and other networked applications, such as event publishing applications instantiated at publishing device 1022, and event subscription applications instantiated at one or more of event subscribing device A 1024a, event subscribing device B 1024b, and event subscribing device C 1024c.

Referring back to FIG. 9, operation 906 initializes the publish/subscribe capability of ESPE 800. In an operation 908, the one or more projects 802 are started. The one or more started projects may run in the background on an ESP device. In an operation 910, an event block object is received from one or more computing device of the event publishing device 1022.

ESP subsystem 1001 may include a publishing client 1002, ESPE 800, a subscribing client A 1004, a subscribing client B 1006, and a subscribing client C 1008. Publishing client 1002 may be started by an event publishing application executing at publishing device 1022 using the publish/subscribe API. Subscribing client A 1004 may be started by an event subscription application A, executing at event subscribing device A 1024a using the publish/subscribe API. Subscribing client B 1006 may be started by an event subscription application B executing at event subscribing device B 1024b using the publish/subscribe API. Subscribing client C 1008 may be started by an event subscription application C executing at event subscribing device C 1024c using the publish/subscribe API.

An event block object containing one or more event objects is injected into a source window of the one or more source windows 806 from an instance of an event publishing application on event publishing device 1022. The event block object may be generated, for example, by the event publishing application and may be received by publishing client 1002. A unique ID may be maintained as the event block object is passed between the one or more source windows 806 and/or the one or more derived windows 808 of ESPE 800, and to subscribing client A 1004, subscribing client B 1006, and subscribing client C 1008 and to event subscription device A 1024a, event subscription device B 1024b, and event subscription device C 1024c. Publishing client 1002 may further generate and include a unique embedded transaction ID in the event block object as the event block object is processed by a continuous query, as well as the unique ID that publishing device 1022 assigned to the event block object.

In an operation 912, the event block object is processed through the one or more continuous queries 804. In an operation 914, the processed event block object is output to one or more computing devices of the event subscribing devices 1024a-c. For example, subscribing client A 1004, subscribing client B 1006, and subscribing client C 1008 may send the received event block object to event subscription device A 1024a, event subscription device B 1024b, and event subscription device C 1024c, respectively.

ESPE 800 maintains the event block containership aspect of the received event blocks from when the event block is published into a source window and works its way through the directed graph defined by the one or more continuous queries 804 with the various event translations before being output to subscribers. Subscribers can correlate a group of subscribed events back to a group of published events by comparing the unique ID of the event block object that a publisher, such as publishing device 1022, attached to the event block object with the event block ID received by the subscriber.

In an operation 916, a determination is made concerning whether or not processing is stopped. If processing is not stopped, processing continues in operation 910 to continue receiving the one or more event streams containing event block objects from the, for example, one or more network devices. If processing is stopped, processing continues in an operation 918. In operation 918, the started projects are stopped. In operation 920, the ESPE is shutdown.

As noted, in some embodiments, big data is processed for an analytics project after the data is received and stored. In other embodiments, distributed applications process continuously flowing data in real-time from distributed sources by applying queries to the data before distributing the data to geographically distributed recipients. As noted, an event stream processing engine (ESPE) may continuously apply the queries to the data as it is received and determines which entities receive the processed data. This allows for large amounts of data being received and/or collected in a variety of environments to be processed and distributed in real time. For example, as shown with respect to FIG. 2, data may be collected from network devices that may include devices within the internet of things, such as devices within a home automation network. However, such data may be collected from a variety of different resources in a variety of different environments. In any such situation, embodiments of the present technology allow for real-time processing of such data.

Aspects of the current disclosure provide technical solutions to technical problems, such as computing problems that arise when an ESP device fails which results in a complete service interruption and potentially significant data loss. The data loss can be catastrophic when the streamed data is supporting mission critical operations such as those in support of an ongoing manufacturing or drilling operation. An embodiment of an ESP system achieves a rapid and seamless failover of ESPE running at the plurality of ESP devices without service interruption or data loss, thus significantly improving the reliability of an operational system that relies on the live or real-time processing of the data streams. The event publishing systems, the event subscribing systems, and each ESPE not executing at a failed ESP device are not aware of or effected by the failed ESP device. The ESP system may include thousands of event publishing systems and event subscribing systems. The ESP system keeps the failover logic and awareness within the boundaries of out-messaging network connector and out-messaging network device.

In one example embodiment, a system is provided to support a failover when event stream processing (ESP) event blocks. The system includes, but is not limited to, an out-messaging network device and a computing device. The computing device includes, but is not limited to, a processor and a computer-readable medium operably coupled to the processor. The processor is configured to execute an ESP engine (ESPE). The computer-readable medium has instructions stored thereon that, when executed by the processor, cause the computing device to support the failover. An event block object is received from the ESPE that includes a unique identifier. A first status of the computing device as active or standby is determined. When the first status is active, a second status of the computing device as newly active or not newly active is determined. Newly active is determined when the computing device is switched from a standby status to an active status. When the second status is newly active, a last published event block object identifier that uniquely identifies a last published event block object is determined. A next event block object is selected from a non-transitory computer-readable medium accessible by the computing device. The next event block object has an event block object identifier that is greater than the determined last published event block object identifier. The selected next event block object is published to an out-messaging network device. When the second status of the computing device is not newly active, the received event block object is published to the out-messaging network device. When the first status of the computing device is standby, the received event block object is stored in the non-transitory computer-readable medium.

Figure 11:
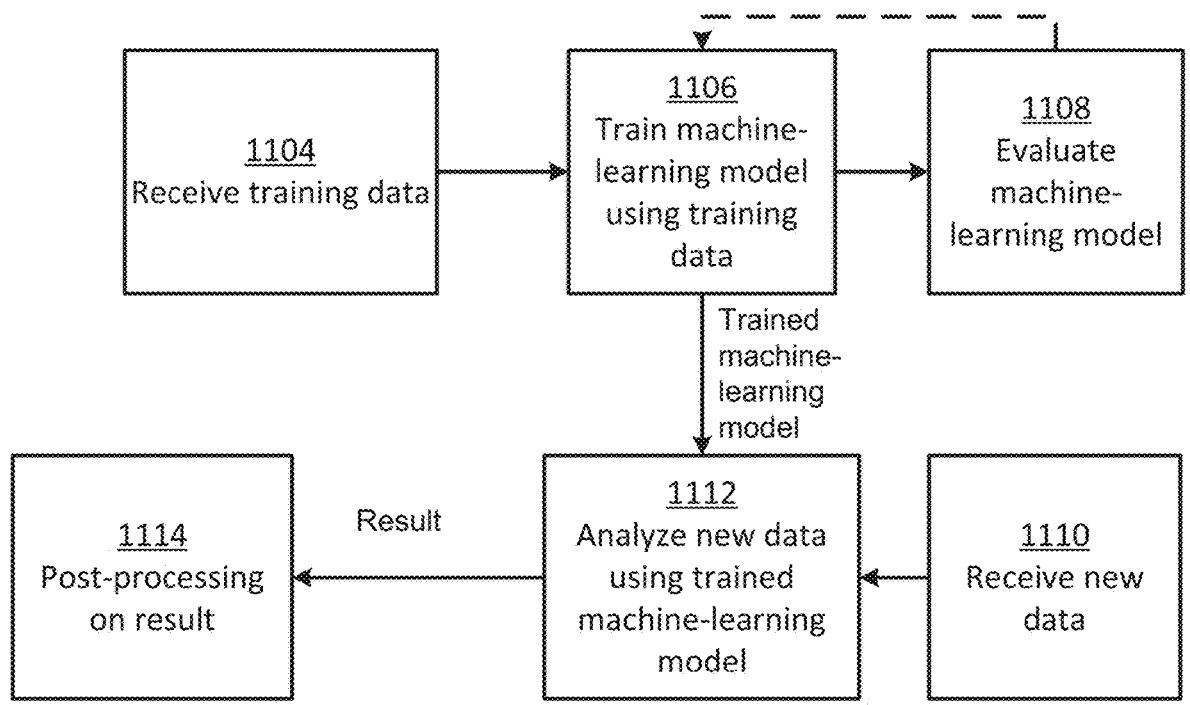
FIG. 11 illustrates a flow chart of an example of a process for generating and using a machine-learning model according to at least one embodiment of the present technology.

FIG. 11 is a flow chart of an example of a process for generating and using a machine-learning model according to some aspects. Machine learning is a branch of artificial intelligence that relates to mathematical models that can learn from, categorize, and make predictions about data. Such mathematical models, which can be referred to as machine-learning models, can classify input data among two or more classes; cluster input data among two or more groups; predict a result based on input data; identify patterns or trends in input data; identify a distribution of input data in a space; or any combination of these. Examples of machine-learning models can include (i) neural networks; (ii) decision trees, such as classification trees and regression trees; (iii) classifiers, such as Naïve bias classifiers, logistic regression classifiers, ridge regression classifiers, random forest classifiers, least absolute shrinkage and selector (LASSO) classifiers, and support vector machines; (iv) clusterers, such as k-means clusterers, mean-shift clusterers, and spectral clusterers; (v) factorizers, such as factorization machines, principal component analyzers and kernel principal component analyzers; and (vi) ensembles or other combinations of machine-learning models. In some examples, neural networks can include deep neural networks, feed-forward neural networks, recurrent neural networks, convolutional neural networks, radial basis function (RBF) neural networks, echo state neural networks, long short-term memory neural networks, bi-directional recurrent neural networks, gated neural networks, hierarchical recurrent neural networks, stochastic neural networks, modular neural networks, spiking neural networks, dynamic neural networks, cascading neural networks, neuro-fuzzy neural networks, or any combination of these.

Different machine-learning models may be used interchangeably to perform a task. Examples of tasks that can be performed at least partially using machine-learning models include various types of scoring; bioinformatics; cheminformatics; software engineering; fraud detection; customer segmentation; generating online recommendations; adaptive websites; determining customer lifetime value; search engines; placing advertisements in real time or near real time; classifying DNA sequences; affective computing; performing natural language processing and understanding; object recognition and computer vision; robotic locomotion; playing games; optimization and metaheuristics; detecting network intrusions; medical diagnosis and monitoring; or predicting when an asset, such as a machine, will need maintenance.

Any number and combination of tools can be used to create machine-learning models. Examples of tools for creating and managing machine-learning models can include SAS® Enterprise Miner, SAS® Rapid Predictive Modeler, and SAS® Model Manager, SAS Cloud Analytic Services (CAS)®, SAS Viya® of all which are by SAS Institute Inc. of Cary, N.C.

Machine-learning models can be constructed through an at least partially automated (e.g., with little or no human involvement) process called training. During training, input data can be iteratively supplied to a machine-learning model to enable the machine-learning model to identify patterns related to the input data or to identify relationships between the input data and output data. With training, the machine-learning model can be transformed from an untrained state to a trained state. Input data can be split into one or more training sets and one or more validation sets, and the training process may be repeated multiple times. The splitting may follow a k-fold cross-validation rule, a leave-one-out-rule, a leave-p-out rule, or a holdout rule. An overview of training and using a machine-learning model is described below with respect to the flow chart of FIG. 11.

In block 1104, training data is received. In some examples, the training data is received from a remote database or a local database, constructed from various subsets of data, or input by a user. The training data can be used in its raw form for training a machine-learning model or pre-processed into another form, which can then be used for training the machine-learning model. For example, the raw form of the training data can be smoothed, truncated, aggregated, clustered, or otherwise manipulated into another form, which can then be used for training the machine-learning model.

In block 1106, a machine-learning model is trained using the training data. The machine-learning model can be trained in a supervised, unsupervised, or semi-supervised manner. In supervised training, each input in the training data is correlated to a desired output. This desired output may be a scalar, a vector, or a different type of data structure such as text or an image. This may enable the machine-learning model to learn a mapping between the inputs and desired outputs. In unsupervised training, the training data includes inputs, but not desired outputs, so that the machine-learning model has to find structure in the inputs on its own. In semi-supervised training, only some of the inputs in the training data are correlated to desired outputs.

In block 1108, the machine-learning model is evaluated. For example, an evaluation dataset can be obtained, for example, via user input or from a database. The evaluation dataset can include inputs correlated to desired outputs. The inputs can be provided to the machine-learning model and the outputs from the machine-learning model can be compared to the desired outputs. If the outputs from the machine-learning model closely correspond with the desired outputs, the machine-learning model may have a high degree of accuracy. For example, if 90% or more of the outputs from the machine-learning model are the same as the desired outputs in the evaluation dataset, the machine-learning model may have a high degree of accuracy. Otherwise, the machine-learning model may have a low degree of accuracy. The 90% number is an example only. A realistic and desirable accuracy percentage is dependent on the problem and the data.

In some examples, if the machine-learning model has an inadequate degree of accuracy for a particular task, the process can return to block 1106, where the machine-learning model can be further trained using additional training data or otherwise modified to improve accuracy. If the machine-learning model has an adequate degree of accuracy for the particular task, the process can continue to block 1110.

In block 1110, new data is received. In some examples, the new data is received from a remote database or a local database, constructed from various subsets of data, or input by a user. The new data may be unknown to the machine-learning model. For example, the machine-learning model may not have previously processed or analyzed the new data.

In block 1112, the trained machine-learning model is used to analyze the new data and provide a result. For example, the new data can be provided as input to the trained machine-learning model. The trained machine-learning model can analyze the new data and provide a result that includes a classification of the new data into a particular class, a clustering of the new data into a particular group, a prediction based on the new data, or any combination of these.

In block 1114, the result is post-processed. For example, the result can be added to, multiplied with, or otherwise combined with other data as part of a job. As another example, the result can be transformed from a first format, such as a time series format, into another format, such as a count series format. Any number and combination of operations can be performed on the result during post-processing.

Figure 12:
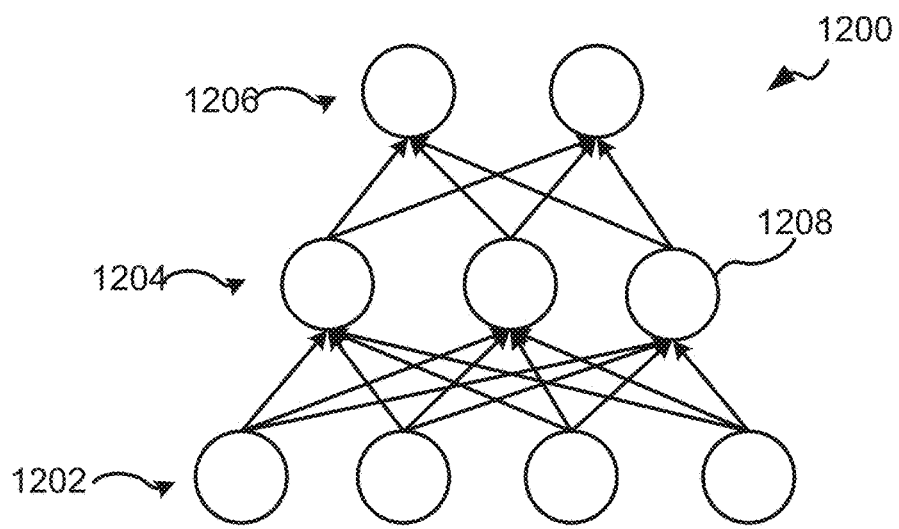
FIG. 12 illustrates an example of a machine-learning model as a neural network.

A more specific example of a machine-learning model is the neural network 1200 shown in FIG. 12. The neural network 1200 is represented as multiple layers of interconnected neurons, such as neuron 1208, that can exchange data between one another. The layers include an input layer 1202 for receiving input data, a hidden layer 1204, and an output layer 1206 for providing a result. The hidden layer 1204 is referred to as hidden because it may not be directly observable or have its input directly accessible during the normal functioning of the neural network 1200. Although the neural network 1200 is shown as having a specific number of layers and neurons for exemplary purposes, the neural network 1200 can have any number and combination of layers, and each layer can have any number and combination of neurons.

The neurons and connections between the neurons can have numeric weights, which can be tuned during training. For example, training data can be provided to the input layer 1202 of the neural network 1200, and the neural network 1200 can use the training data to tune one or more numeric weights of the neural network 1200. In some examples, the neural network 1200 can be trained using backpropagation. Backpropagation can include determining a gradient of a particular numeric weight based on a difference between an actual output of the neural network 1200 and a desired output of the neural network 1200. Based on the gradient, one or more numeric weights of the neural network 1200 can be updated to reduce the difference, thereby increasing the accuracy of the neural network 1200. This process can be repeated multiple times to train the neural network 1200. For example, this process can be repeated hundreds or thousands of times to train the neural network 1200.

In some examples, the neural network 1200 is a feed-forward neural network. In a feed-forward neural network, every neuron only propagates an output value to a subsequent layer of the neural network 1200. For example, data may only move one direction (forward) from one neuron to the next neuron in a feed-forward neural network.

In other examples, the neural network 1200 is a recurrent neural network. A recurrent neural network can include one or more feedback loops, allowing data to propagate in both forward and backward through the neural network 1200. This can allow for information to persist within the recurrent neural network. For example, a recurrent neural network can determine an output based at least partially on information that the recurrent neural network has seen before, giving the recurrent neural network the ability to use previous input to inform the output.

In some examples, the neural network 1200 operates by receiving a vector of numbers from one layer; transforming the vector of numbers into a new vector of numbers using a matrix of numeric weights, a nonlinearity, or both; and providing the new vector of numbers to a subsequent layer of the neural network 1200. Each subsequent layer of the neural network 1200 can repeat this process until the neural network 1200 outputs a final result at the output layer 1206. For example, the neural network 1200 can receive a vector of numbers as an input at the input layer 1202. The neural network 1200 can multiply the vector of numbers by a matrix of numeric weights to determine a weighted vector. The matrix of numeric weights can be tuned during the training of the neural network 1200. The neural network 1200 can transform the weighted vector using a nonlinearity, such as a sigmoid tangent or the hyperbolic tangent. In some examples, the nonlinearity can include a rectified linear unit, which can be expressed using the following equation:

$$y=\max(x,0)$$

where y is the output and x is an input value from the weighted vector. The transformed output can be supplied to a subsequent layer, such as the hidden layer 1204, of the neural network 1200. The subsequent layer of the neural network 1200 can receive the transformed output, multiply the transformed output by a matrix of numeric weights and a nonlinearity, and provide the result to yet another layer of the neural network 1200. This process continues until the neural network 1200 outputs a final result at the output layer 1206.

Other examples of the present disclosure may include any number and combination of machine-learning models having any number and combination of characteristics. The machine-learning model(s) can be trained in a supervised, semi-supervised, or unsupervised manner, or any combination of these. The machine-learning model(s) can be implemented using a single computing device or multiple computing devices, such as the communications grid computing system 400 discussed above.

Implementing some examples of the present disclosure at least in part by using machine-learning models can reduce the total number of processing iterations, time, memory, electrical power, or any combination of these consumed by a computing device when analyzing data. For example, a neural network may more readily identify patterns in data than other approaches. This may enable the neural network to analyze the data using fewer processing cycles and less memory than other approaches, while obtaining a similar or greater level of accuracy.

Some machine-learning approaches may be more efficiently and speedily executed and processed with machine-learning specific processors (e.g., not a generic CPU). Such processors may also provide an energy savings when compared to generic CPUs. For example, some of these processors can include a graphical processing unit (GPU), an application-specific integrated circuit (ASIC), a field-programmable gate array (FPGA), an artificial intelligence (AI) accelerator, a neural computing core, a neural computing engine, a neural processing unit, a purpose-built chip architecture for deep learning, and/or some other machine-learning specific processor that implements a machine learning approach or one or more neural networks using semiconductor (e.g., silicon (Si), gallium arsenide (GaAs)) devices. Furthermore, these processors may also be employed in heterogeneous computing architectures with a number of and a variety of different types of cores, engines, nodes, and/or layers to achieve various energy efficiencies, processing speed improvements, data communication speed improvements, and/or data efficiency targets and improvements throughout various parts of the system when compared to a homogeneous computing architecture that employs CPUs for general purpose computing.

Figure 13:
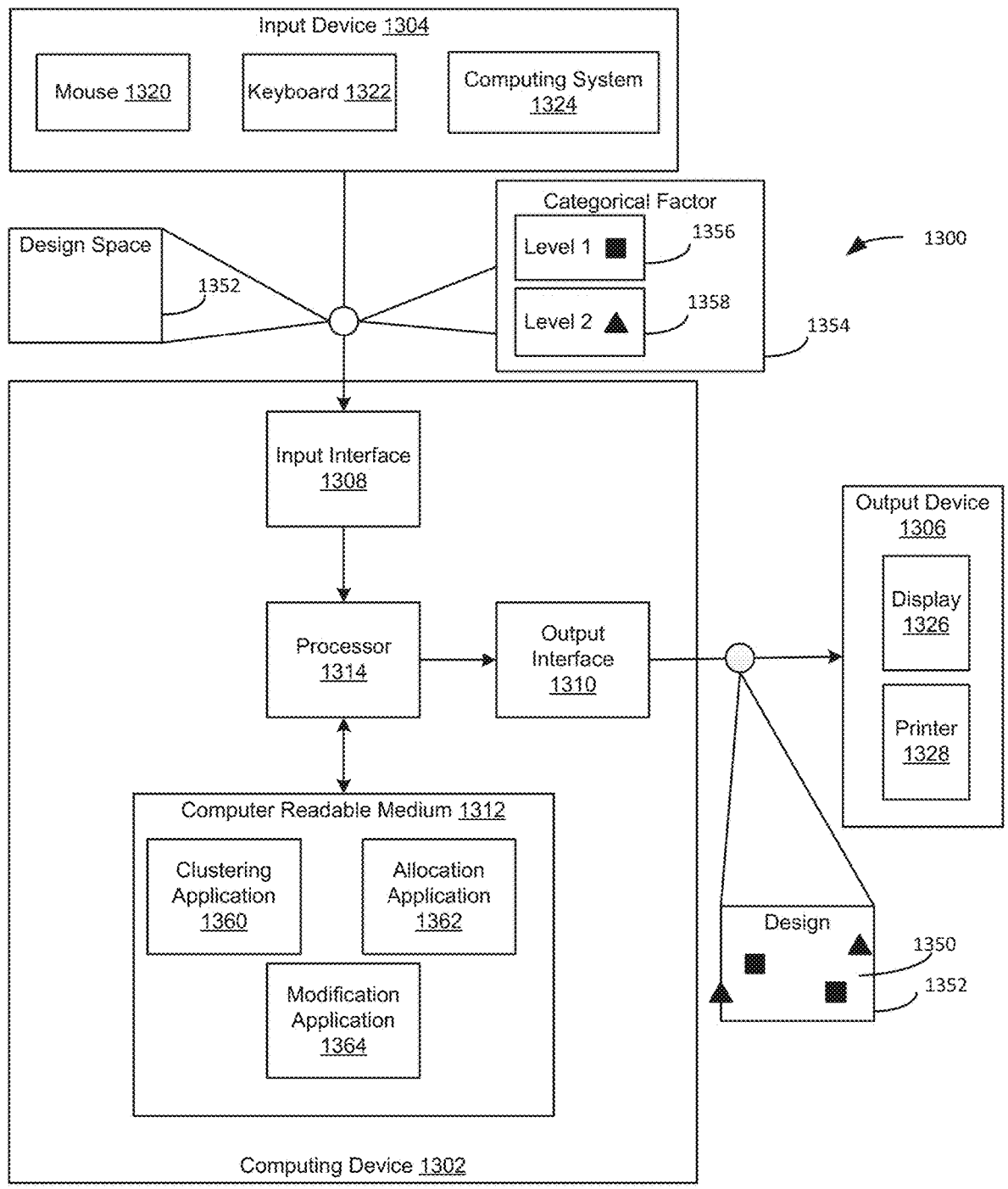
FIG. 13 illustrates an example block diagram of a system for outputting a design for a design space in at least one embodiment of the present technology.

FIG. 13 shows a block diagram of a system 1300 in at least one embodiment of the present technology. The system 1300 includes a computing device 1302, an input device 1304, and an output device 1306. The system is configured to exchange information between the computing device 1302 and input device 1304 and between the computing device 1302 and output device 1306 (e.g., via wired and/or wireless transmission). For example, a network (not shown) can connect one or more devices of system 1300 to one or more other devices of system 1300. In one or more embodiments, the system 1300 is useful for outputting to output device 1306 a design 1350 to output device 1306 for a design space 1352. In some embodiments, the output device 1306 may be one or more of a display device 1326, a printer 1328 or another device not shown (e.g., storage device or buffer).

Computing device 1302 includes an input interface 1308, an output interface 1310, a computer-readable medium 1312, and a processor 1314. In other embodiments, fewer, different, and additional components can be incorporated into computing device 1302.

The computing device 1302 receives information from input device 1304 via input interface 1308. For instance, as shown in FIG. 13 the information received by input interface 1308 includes information describing, representing or defining design space 1352 (e.g., a boundary for design space 1352). Alternatively or additionally, the information received by input interface 1308 includes information describing, representing, or defining a categorical factor 1354 for the design space. A categorical factor describes a design option at a design point for a design space. A categorical factor can have different design options represented by a level (e.g., a first level 1356 and a second level 1358). Of course categorical factor 1354 can have other levels not shown in FIG. 13. In other embodiments, multiple categorical factors could be received by input interface 1308 for the design space 1352, with one or more levels for each of the categorical factors.

In one or more embodiments, the input device 1304 is one or more devices for user entry (e.g., entry of a formula to define the boundary of the design space 1352) into the system 1300. For instance, the input device 1304 could include one or more of a mouse 1320 or a keyboard 1322. Alternatively or additionally, the input device 1304 includes a display, a track ball, a keypad, one or more buttons, a sensor, a phone, etc. Input interface 1308 in the same or different embodiments further provides an interface for receiving information from another device or machine such as a computing system 1324.

The computing device 1302 outputs information to output device 1306 via output interface 1310. Output interface 1310 provides an interface for outputting information (e.g., information representing design 1350) for review by a user and/or for use by another application or device or multiple applications or devices. For example, output interface 1310 interfaces with various output technologies including, but not limited to, display 1326 and a printer 1328. In the same or different embodiments, output interface 1310 with a device for data storage of output information.

In an alternative embodiment, the same interface supports both input interface 1308 and output interface 1310. For example, a touch screen provides a mechanism for user input and for presentation of output to the user. Alternatively, the input interface 1308 has more than one input interface that uses the same or different interface technology. Alternatively or additionally, the output interface 1310 has more than one output interface that uses the same or different interface technology.

Computer-readable medium 1312 is an electronic holding place or storage for information so the information can be accessed by processor. Computer-readable medium 208 can include, but is not limited to, any type of random access memory (RAM), any type of read only memory (ROM), any type of flash memory, etc. such as magnetic storage devices (e.g., hard disk, floppy disk, magnetic strips), optical disks (e.g., compact disc (CD), digital versatile disc (DVD)), smart cards, flash memory devices, etc.

Processor 1314 executes instructions (e.g., stored at the computer readable medium 1312). The instructions can be carried out by a special purpose computer, logic circuits, or hardware circuits. In one or more embodiments, processor 1314 is implemented in hardware and/or firmware. Processor 1314 executes an instruction, meaning it performs or controls the operations called for by that instruction. The term "execution" is the process of running an application or the carrying out of the operation called for by an instruction. The instructions can be written using one or more programming language, scripting language, assembly language, etc. Processor 1314 operably couples with input interface 1308, with output interface 1310 and with computer readable medium 1312 to receive, to send, and to process information. Processor 1314 in one or more embodiments can retrieve a set of instructions from a permanent memory device and copy the instructions in an executable form to a temporary memory device that is generally some form of RAM.

In one or more embodiments computer-readable medium 1312 stores instructions for execution by processor 1314. For example, computer-readable medium 1312 could comprise instructions for a clustering application 1360 for forming clusters of potential design points in the design space 1352, allocation application 1362 for allocating levels assigned to categorical factors in the design space, and modification application 1364 for modifying design points in the design space. In other embodiments, fewer, different, or additional applications can be stored in computer-readable medium 1312. For instance, applications could be stored to generate information, relevant to the designs space 1352 or categorical factor 1354 rather than or in addition to receiving information from input device 1304.

In one or more embodiments, one or more applications stored on computer-readable medium 1312 are implemented in software (e.g., computer-readable and/or computer-executable instructions) stored in computer-readable medium 1312 and accessible by processor 1314 for execution of the instructions. The applications can be written using one or more programming languages, assembly languages, scripting languages, etc. The one or more application can be integrated with other analytic tools. In one example, clustering application 1360, allocation application 1362, and modification application 1364 are integrated data analytics software application and/or software architecture such as that offered by SAS Institute Inc. of Cary, N.C., USA. Merely for illustration, the applications are implemented using or integrated with one or more SAS software tools such as JMP®, Base SAS, SAS® Enterprise Miner™ SAS/STAT®, SAS® High Performance Analytics Server, SAS® Visual Data Mining and Machine Learning, SAS® LASR™ SAS® In-Database Products, SAS® Scalable Performance Data Engine, SAS® Cloud Analytic Services, SAS/OR®, SAS/ETS®, SAS® Inventory Optimization, SAS® Inventory Optimization Workbench, SAS® Visual Analytics, SAS® Viya™, SAS In-Memory Statistics for Hadoop®, SAS® Forecast Server, and SAS/IML® all of which are developed and provided by SAS Institute Inc. of Cary, N.C., USA.

One or more applications stored on computer-readable medium 1312 can be implemented as a Web application. For example, an application can be configured to receive hypertext transport protocol (HTTP) responses and to send HTTP requests. The HTTP responses may include web pages such as hypertext markup language (HTML) documents and linked objects generated in response to the HTTP requests. Each web page may be identified by a uniform resource locator (URL) that includes the location or address of the computing device that contains the resource to be accessed in addition to the location of the resource on that computing device. The type of file or resource depends on the Internet application protocol such as the file transfer protocol, HTTP, H.323, etc. The file accessed may be a simple text file, an image file, an audio file, a video file, an executable, a common gateway interface application, a Java applet, an extensible markup language (XML) file, or any other type of file supported by HTTP.

The design 1350 has continuous variables for the design space 1352 represented graphically as the two-dimensions of the design 1350 and can have one or more categorical factors for the design space, represented graphically by the levels 1356 and 1358 distributed in the design 1350. Factors and variables are used interchangeably herein. In one or more examples, a categorical factor has different levels that represent discrete values or options for the design space in contrast to a continuous variable that describes a range of possible values or options. The range can be infinite (e.g., taking on infinite values in a bounded dimension by the constraints of an experiment such as the total length, width, or height of an object for an experiment).

In one or more embodiments, the system 1300 implements a method as described herein (e.g., a method shown in FIGS. 14A-14B, 15 and 17) for outputting or storing a design (e.g., design 1350).

Figure 14A:
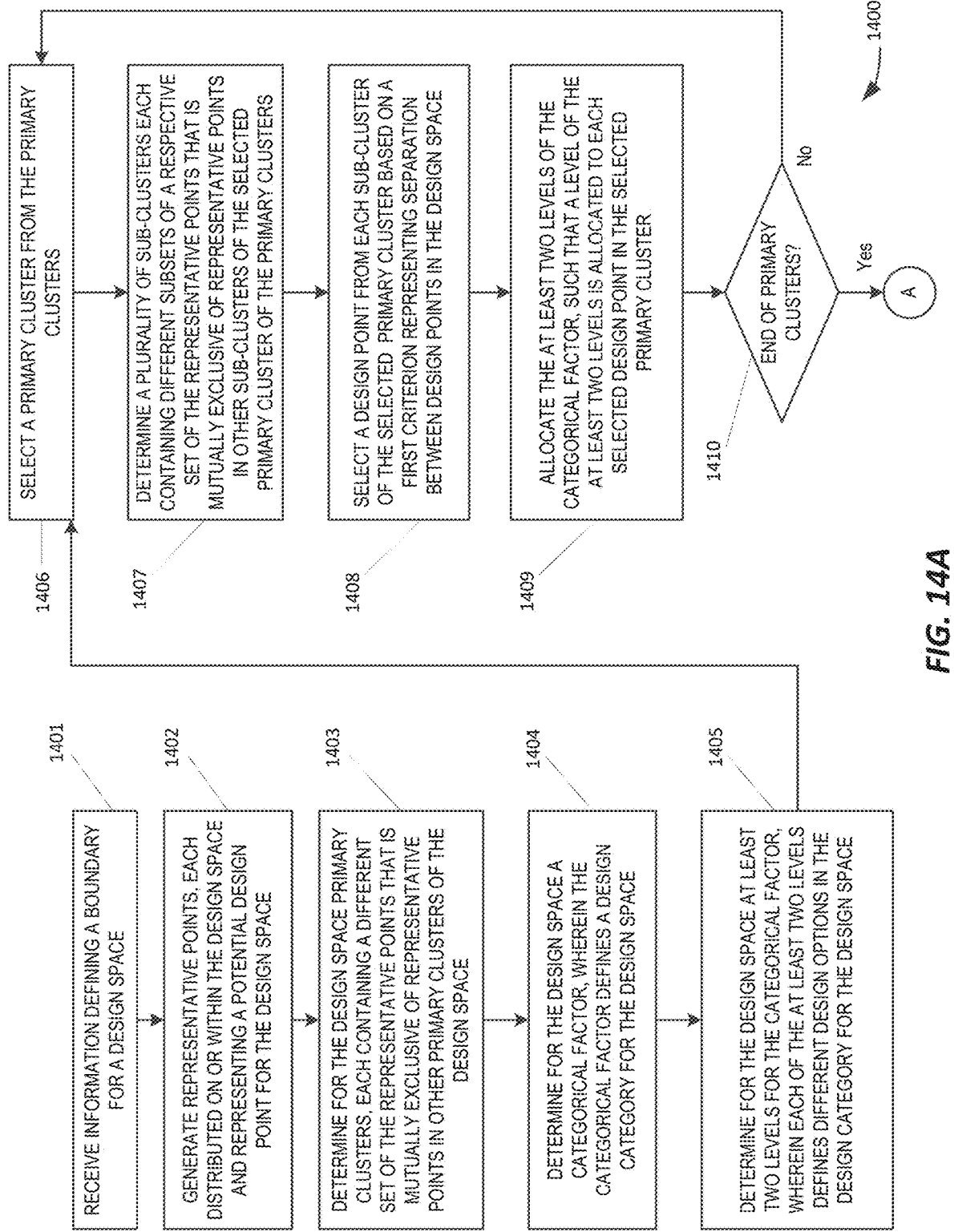
FIGS. 14A-14B illustrate an example flow diagram for a design space in at least one embodiment of the present technology.
Figure 14B:
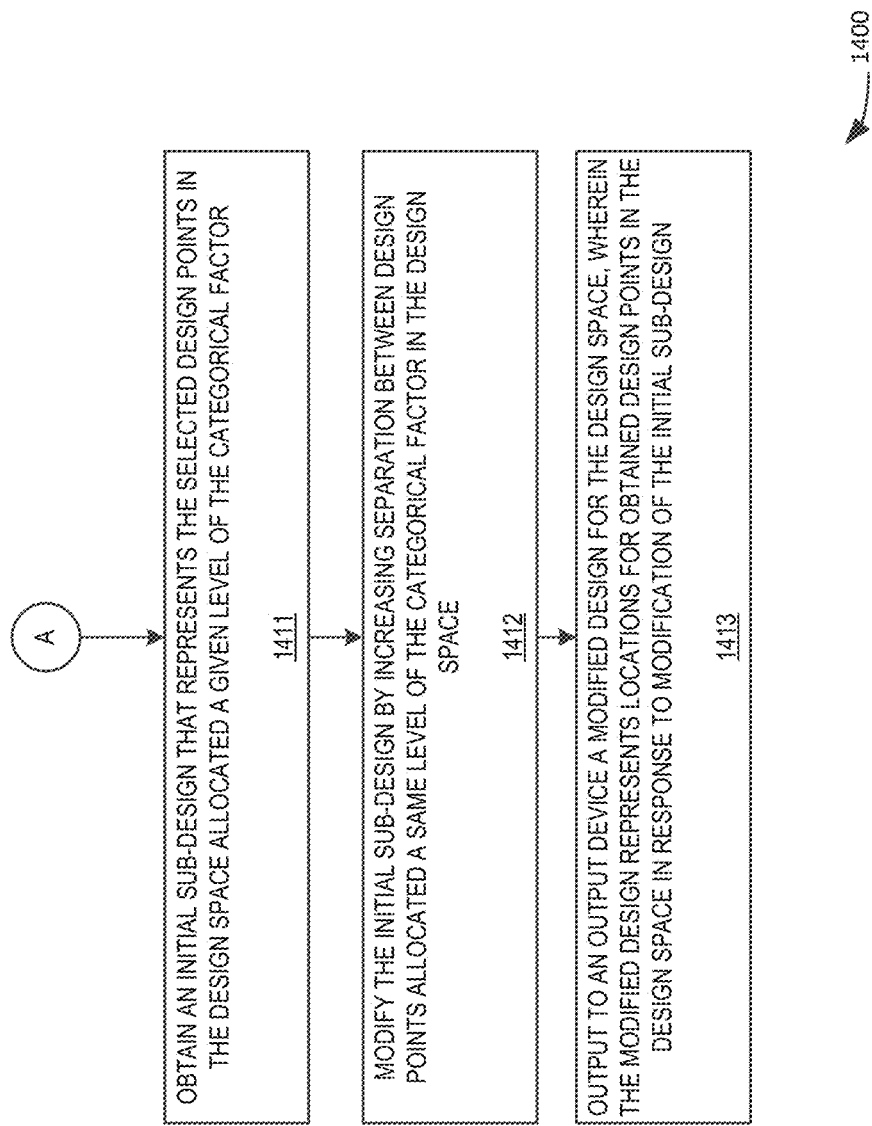

FIGS. 14A-14B illustrates a flow diagram for a computer-implemented method 1400 that can be used to select design points in various design space. For example, the method 1400 could be used to select design points in design space 1352 of FIG. 13, design space 1600 of FIGS. 16A-J, or design space 1800 of FIGS. 18A-F. The method 1400 of FIG. 14A will be described with reference to FIGS. 16A-J as an example implementation of method 1400.

The method 1400 illustrates an operation 1401 in which information defining a boundary for a design space (e.g., design space 1600) is received (e.g., at computing device 1302 of FIG. 13). Information defining a boundary for a design space could explicitly or implicitly define the boundary or define all or a portion of the boundary. For example, the information could be one or more formula explicitly defining all or a portion of the points on the boundary of a design space. In another example, the information could include information about the design space for implicitly defining the boundary (e.g., a shape of the design space, such as a rectangle, a length of a side of the design space and/or a total volume of the design space). More example embodiments of information defining a boundary for a design space are defined herein.

Figure 16A:
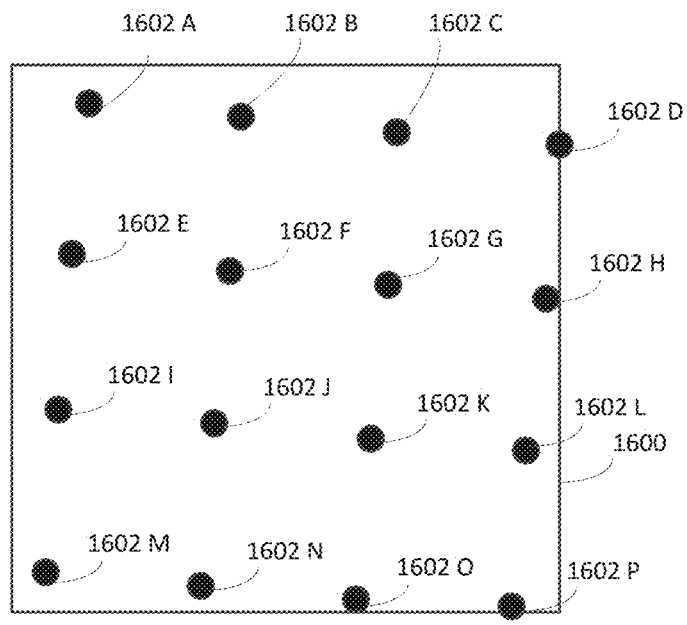
FIGS. 16A-16J illustrate an example block diagram of design point selection in at least one embodiment involving level swapping.

In an operation 1402, representative points are generated (e.g., 1602 A-P) as illustrated in FIG. 16A. Each representative point is distributed on and/or within the design space and represents a potential design point for the design space. In one or more embodiments, the representative points may be distributed randomly in the design space.

In operations 1403-1405 various features or properties are determined for the design space. For instance, representative points can be assigned or otherwise placed in one or more groups, which can be denoted as clusters. One of ordinary skill in the art will appreciate that these operations could be performed in any order or could be performed earlier in the method 1400.

Figure 16B:
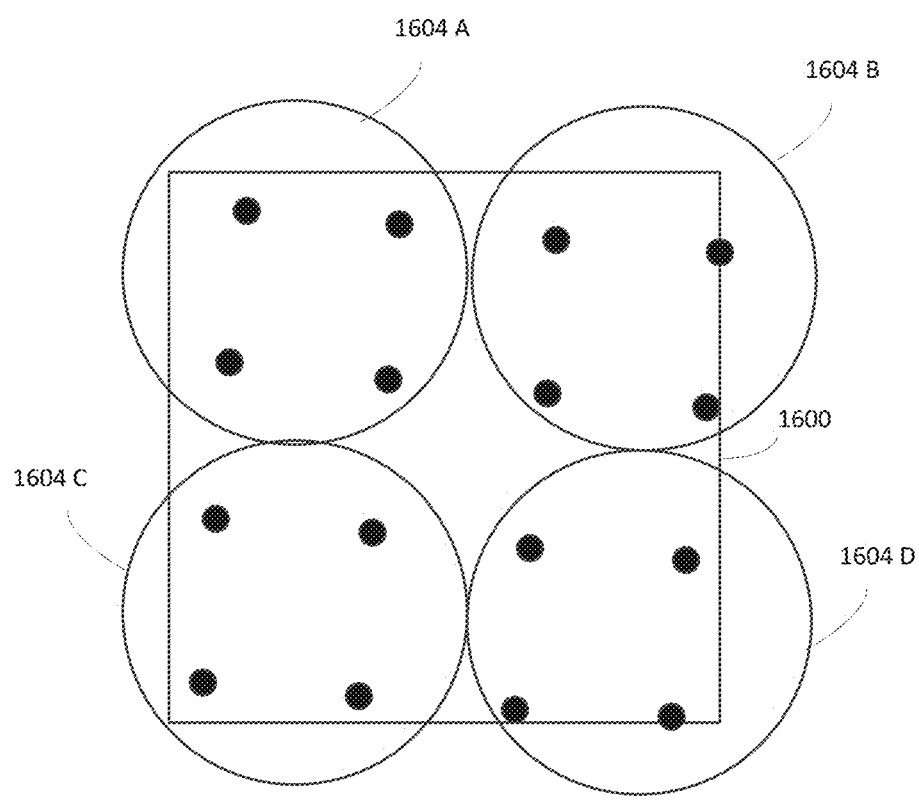

In an operation 1403, primary clusters are determined. The primary clusters are each groups of the representative points (e.g., each primary cluster contains a different set of the representative points). For instance, as described in operation 1403, the different sets of representative points may be different because they are mutually exclusive of representative points in other primary clusters of the design space. FIG. 16B shows as an example the representative points 1602A-P of design space 1600 grouped into four primary clusters 1604A-D with different sets of representative points that are mutually exclusive. Of course, the representative points could be grouped differently (e.g., in different amounts of primary clusters and/or with different numbers of representative points). These clusters are referred to as primary clusters in this example method 1400 and in other embodiments herein only for ease of explanation. Of course, one of ordinary skill in the art will appreciate that the primary clusters could be referred to differently. Further, these primary clusters are the first grouping in method 1400. However, representative points could have been grouped previously (e.g., a design space could itself be defined by a cluster of representative points) or a design space could have additional or different clustering defined for representative points in a design space.

In an operation 1404, a categorical factor for the design space is determined. As explained above, a categorical factor has different levels that represent discrete values or options for the design space. The determined categorical factor defines a design category for the design space, which means that the discrete values or options will be within this design category. For instance, in the background example of a bottle, a design category could be material types for the bottle, with different options including glass, metal, ceramic, and/or plastic. Method 1400 is described with reference to a single categorical factor as an example, but one of ordinary skill in the art will appreciate that in other embodiments additional categorical factors are determined. More examples of categorical factors will be described in the context of other example embodiments below.

In one or more embodiments, a categorical factor is already input or otherwise generated for the design space and determining the categorical factor includes determining it for an operation in the method 1400. In one or more embodiments, a categorical factor is determined, input or otherwise generated earlier in method 1400. For example, the number of categorical factors and/or the number of levels for the categorical factors can be used to determine a total number of primary clusters determined in 1403. Alternatively, in other embodiments, the categorical factor is determined, input, or otherwise generated later in method 1400, e.g., for operations of method 1400 described below.

In an operation 1405, at least two levels for the categorical factor for the design space are determined. Each of the levels defines different design options in the design category for the design space. As explained above if the categorical factor is a material type for a bottle, one level could be plastic and another level could be glass. More examples of levels will be described in the context of other example embodiments below. In one or more embodiments, a level for a categorical factor is already input or otherwise generated for the design space and determining the level includes determining it for an operation in the method 1400. In one or more embodiments, a level is determined, input or otherwise generated earlier in method 1400. Alternatively, in other embodiments, the level is determined, input, or otherwise generated later in method 1400, e.g., for operations of method 1400 described below.

In one or more embodiments, the representative points are greater than the number of desired design points for the design space. Operations 1406-1410 describe a series of operations for each of respective or selected primary cluster of the primary clusters to select the design points in the design space out of the representative points.

Figure 16C:
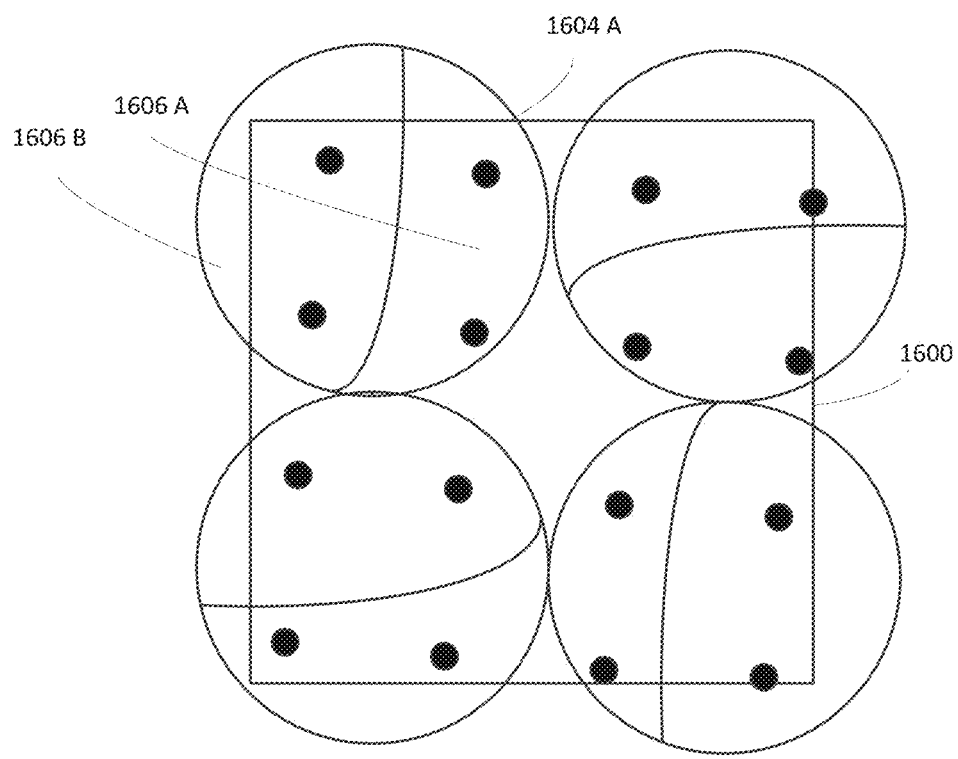

In operation 1406, a primary cluster from the primary clusters is selected. In operation 1407, a plurality of sub-clusters containing different subsets of a respective set of the representative points is determined. For instance, as described in operation 1407, the different sets of representative points are different because they are mutually exclusive of representative points in other sub-clusters of a selected primary cluster of the primary clusters. For example, as shown in FIG. 16C, primary cluster 1604A has sub-clusters 1606A and 1606B. In one or more embodiments, the total number of sub-clusters within a primary cluster is the maximum number of levels for any of the categorical factors defined for the design space.

Figure 16D:
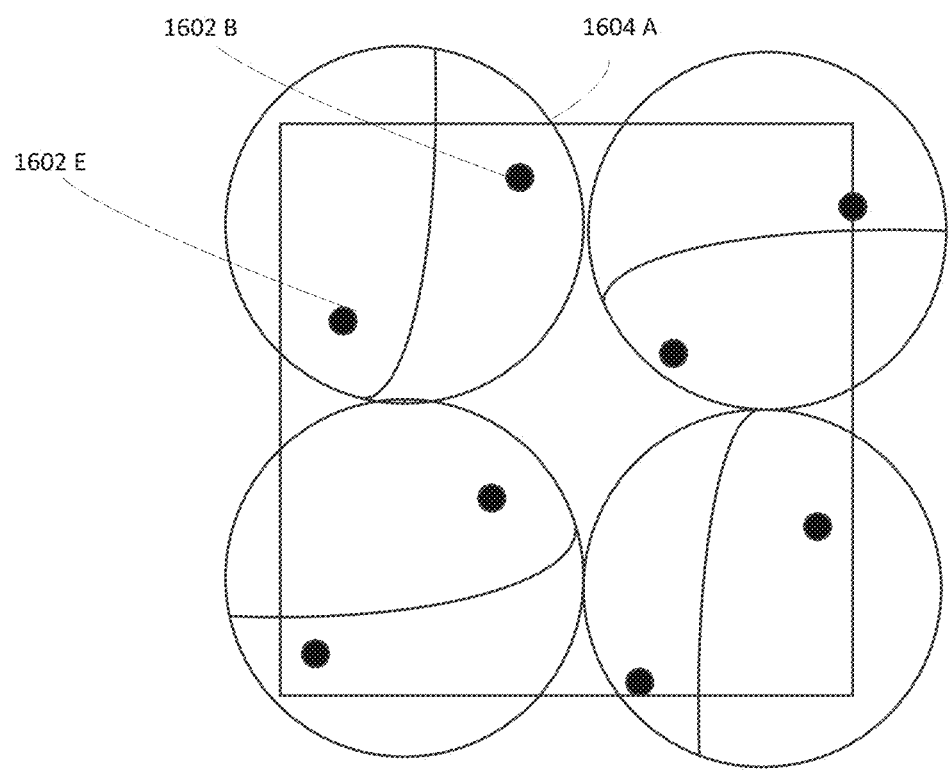

In operation 1408, a design point is selected from each sub-cluster of the selected primary cluster based on a first criterion representing separation distance between design points in the design space. For example, as shown in FIG. 16D, representative points 1602B and 1602E are selected as the design points for sub-clusters 1606A and 1606B, respectively of cluster 1604A. One example of a first criterion representing separation between design points is a centroid criterion, which places a design point at the center of each sub-cluster. Another example of a first criterion is a MaxPro criterion (this will be explained in more detail later in the application) that finds a design point in a sub-cluster that minimizes the MaxPro Criterion.

Figure 16E:
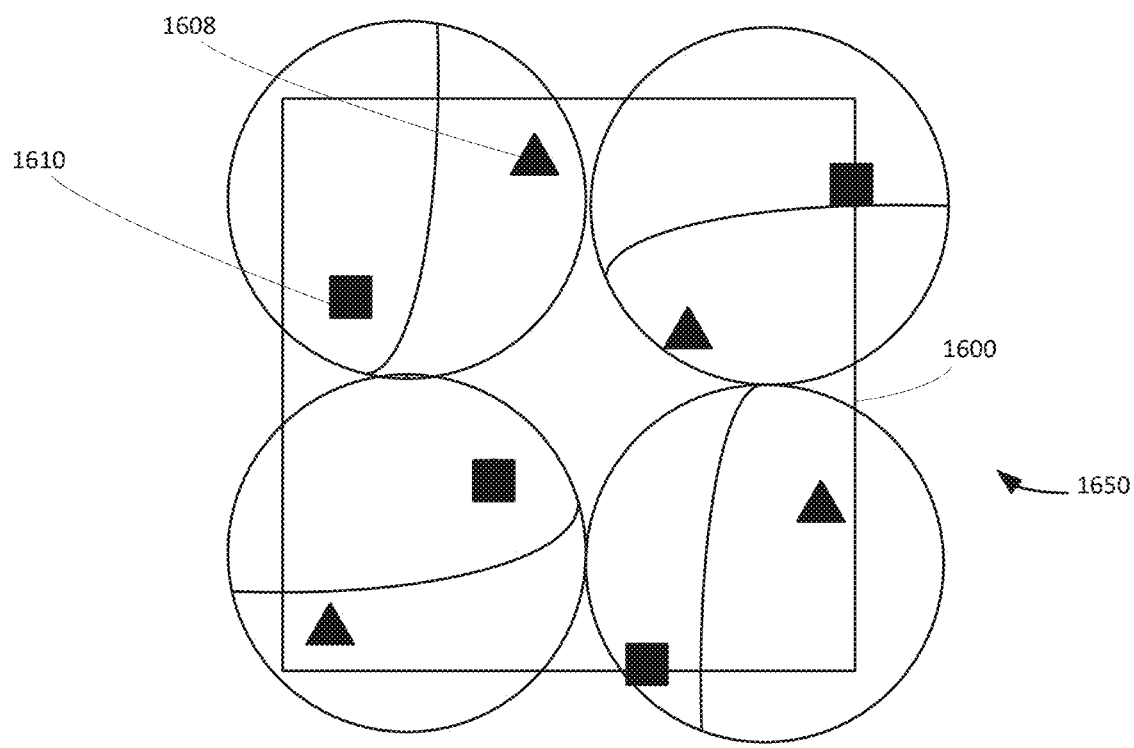

In operation 1409, the levels of the categorical factor are allocated to each selected design point in the selected primary cluster. For example, as shown in FIG. 16E there is a first level 1608 (represented by a triangle) assigned to design point 1602B and a second level 1610 (represented by a square) assigned to design point 1602E.

Operation 1410 is used to determine whether there are more primary clusters remaining for completing the operations 1406-1409. If there are still remaining primary clusters, the method returns to operation 1406 to select a different primary cluster of the remaining primary clusters. If the operations reach the end of the primary clusters, the method precedes as shown in FIG. 14B. If there are k primary clusters and m sub-clusters, the operations should produce km design points.

The initial allocation of the levels to the design points of the primary cluster can be random. The use of random assignment means that design points with the same level for a categorical factor can end up too close to each other than would be desired.

FIG. 14B shows a method for modifying a sub-design of a level for a categorical factor to improve the separation distance between design points with the same level for a categorical factor.

As shown in FIG. 14B, in operation 1411, an initial sub-design that represents the selected design points in the design space allocated a given level of the categorical factor is obtained. In operation 1412, the initial sub-design is modified by increasing the separation distance between design points allocated a same level of the categorical factor in the design space. For example, the modification could involve level swapping, which is described in more detail in reference to FIGS. 15 and 16A-J. Alternatively, or additionally the modification could involve design point replacement, which is described in more detail in reference to FIGS. 17 and 18A-F. In operation 1413, a modified design for the design space is output. The modified design represents locations for obtained design points in the design space in response to modification of the initial sub-design.

The method 1400 can be carried out by system 1300 or other systems not shown. In one or more embodiments involving methods described herein, additional, fewer, or different operations can be performed depending on the embodiment. For instance, the method 1400 could include receiving (e.g., via user input) one or more categorical factors for the design space before operation 1401 or later in the method 1400 (e.g., prior to operation 1407).

Although some of the operational flows in methods described herein are presented in sequence, the various operations may be performed in various repetitions, concurrently (in parallel, for example, using threads and/or a distributed computing system) and/or in other orders than those that are illustrated. For example, operation 1404 could occur before operation 1402.

Figure 15:
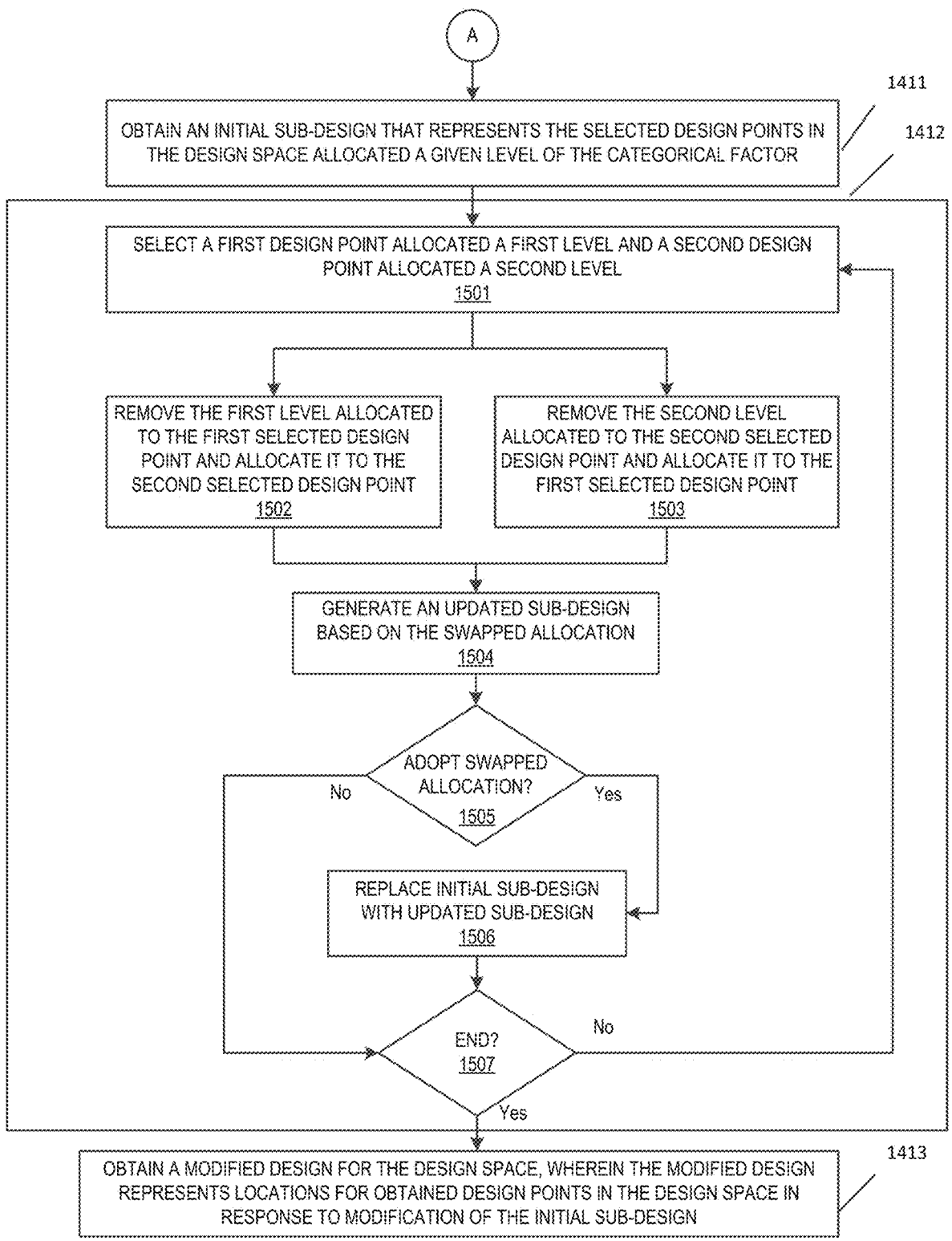
FIG. 15 illustrates an example flow diagram in at least one embodiment involving level swapping.

FIG. 14A and FIG. 15 illustrate a flow diagram of a method 1400 in at least one embodiment involving level swapping. As shown in FIG. 15, the operation 1412 can involve a series of operations for modifying an initial sub-design by swapping a first level allocated to a first selected design point and a second level allocated to a second selected design point of a primary cluster of the design space. Level swapping then, for instance, involves replacing the first level allocated to the first selected design point and allocating it to the second selected design point; and replacing the second level allocated to the second selected design point and allocating it to the first selected design point. Level swapping can be considered modifying, switching, replacing, or otherwise changing a level associated with a design point.

As shown in FIG. 15, operation 1501 involves selecting candidate design points for level swapping, i.e., a first design point allocated a first level and a second design point allocated a second level. Operations 1502 and 1503 involve swapping the levels by removing the first level allocated to the first selected design point and allocating it to the second selected design point (1502), and removing the second level allocated to the second selected design point and allocating it to the first selected design point (1503). As shown the operations could occur in parallel or alternatively sequentially. In operation 1504, an updated sub-design is generated based on the swapped allocation. A choice is made in operation 1505 as to whether to adopt the swapped allocation, and if so, replace the initial sub-design with the updated sub-design in operation 1506.

In operation 1507, a choice is made as to whether to end the process or continue picking candidate design points in the design space for level swapping. This choice can be automated or manual. For instance, in one or more embodiments, conditions are set to automatically decide when to end the process. In other embodiments, a user can manually stop the process (e.g., via user input).

Operations 1501-1507 could be used to find candidate design points in each primary cluster of the design space and to determine whether to change a level allocated to a design point of a sub-cluster of each of the primary clusters of the design space. A condition could be set to iterate a fixed number of times (e.g., 10 iterations) or through each primary cluster a fixed number of times.

Alternatively or additionally, a condition could be set to perform operations 1501-1507 until no improvement is found. In one embodiment, improvement is determined by determining an initial average representing separation of design points in the design space. For instance, for each of the levels of the categorical factor, computing an initial computed criterion representing the separation distance between design points allocated a same level in the design space to obtain a plurality of computed criterion, one for each of the levels of the categorical factor and then averaging the initial computed criterion.

In one or more embodiments, improvement is determined by comparing an updated average when levels are swapped to the initial average. For instance, the updated average is performed by determining a first candidate design point and a second candidate design point of selected design points of a primary cluster in the design space. A swapped allocation is obtained for the design space by replacing a level allocated to the first candidate design point for the categorical factor with a level allocated to the second candidate design point for the categorical factor. An updated sub-design is determined based on the swapped allocation. An updated average representing the separation of design points in the design space according to the swapped allocation is obtained. If a difference between the updated average and the initial average indicates, the updated sub-design achieves a greater separation of design points of a same level than the initial sub-design, the initial sub-design of the design space is modified by replacing the initial sub-design with the updated sub-design; and replacing the initial average with the updated average. In one or more embodiments, level-swapping advantageously allows improved modeling on a particular sub-design level. In one or more other embodiments, level swapping allows for improvement of the full design such that the updated design achieves a greater separation distance for a majority of selected design points in the design space even though it may diminish separation distance for some of the selected design points in the design space.

FIGS. 16A-16J illustrates a block diagram of design point selection in at least one embodiment involving level swapping (e.g., in the method 1400 described in FIGS. 14A-14B and FIG. 15). As explained the method 1400 of FIG. 14A can be used to obtain a design for a design space (e.g., design 1650 shown in FIG. 16E). FIGS. 16F-16J show an example of level swapping by moving through each primary cluster of the design space 1600 to increase or improve the separation distance between design points allocated a same level of the categorical factor in the design space 1600.

Figure 16F:
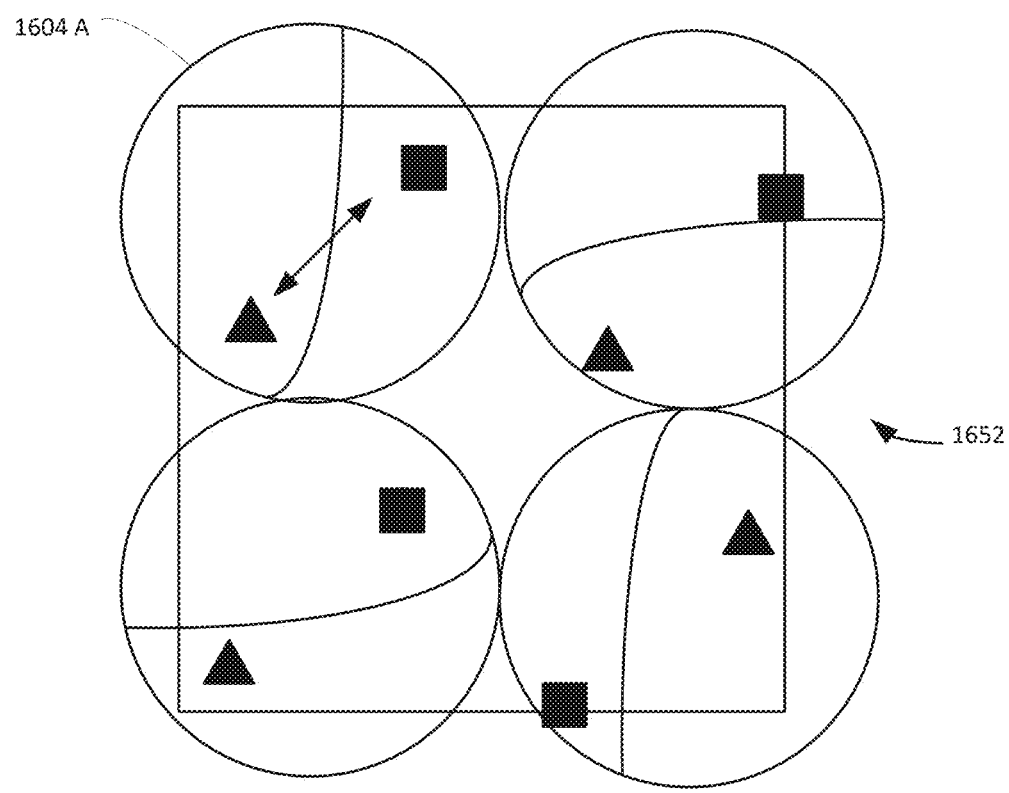
Figure 16G:
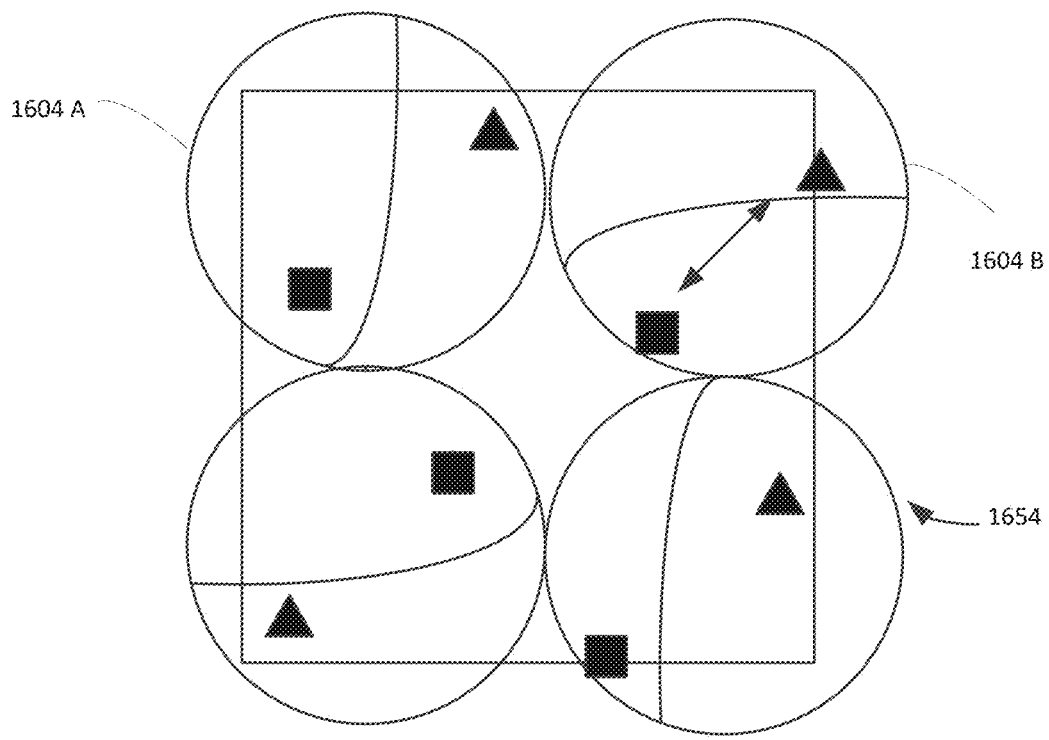

As shown in FIG. 16F, the levels allocated to the subclusters in cluster 1604A are swapped producing the swapped allocation 1652. FIG. 16G shows an example where it is determined that this swapped allocation 1652 did not improve the separation distance, so in FIG. 16G the swapped allocation 1654 shows that the levels in cluster 1604A have returned to their form in FIG. 16E and levels are swapped in cluster 1604B.

Figure 16H:
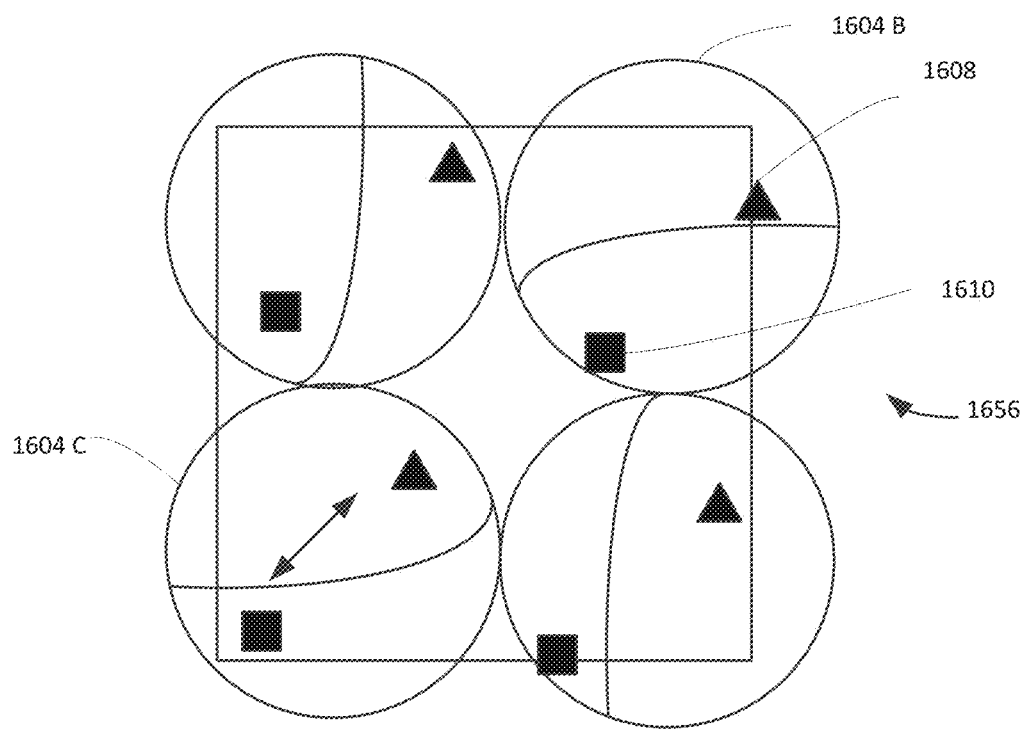

FIG. 16H shows an example where it is determined that the swapped allocation 1654 did improve the separation distance, so in FIG. 16H the swapped allocation 1656 shows that the levels in cluster 16048 have adopted the levels shown in FIG. 16G and levels are swapped in cluster 1604C. This swapped allocation 1656 has resulted in a modification of two different sub-designs, one for level 1608 and one for level 1610.

Figure 16I:
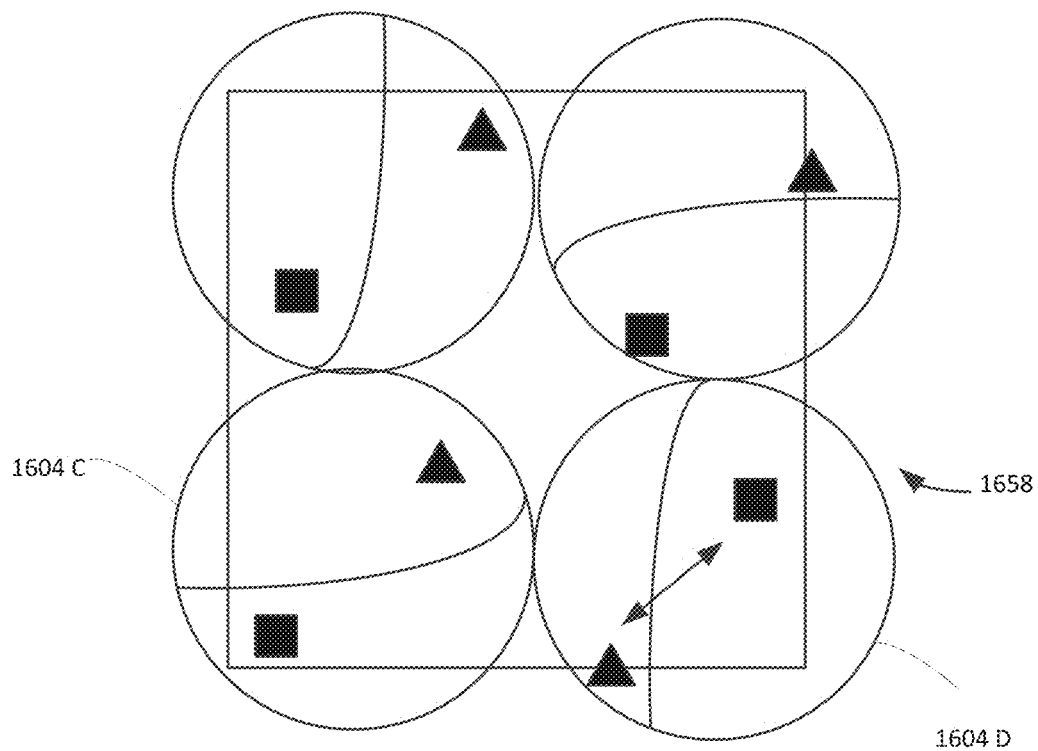

FIG. 16I shows an example where it is determined that the swapped allocation 1656 did improve the separation distance, so in FIG. 16I the swapped allocation 1658 shows that the levels in cluster 1604C have adopted the levels shown in FIG. 16H and levels are swapped in cluster 1604D.

Figure 16J:
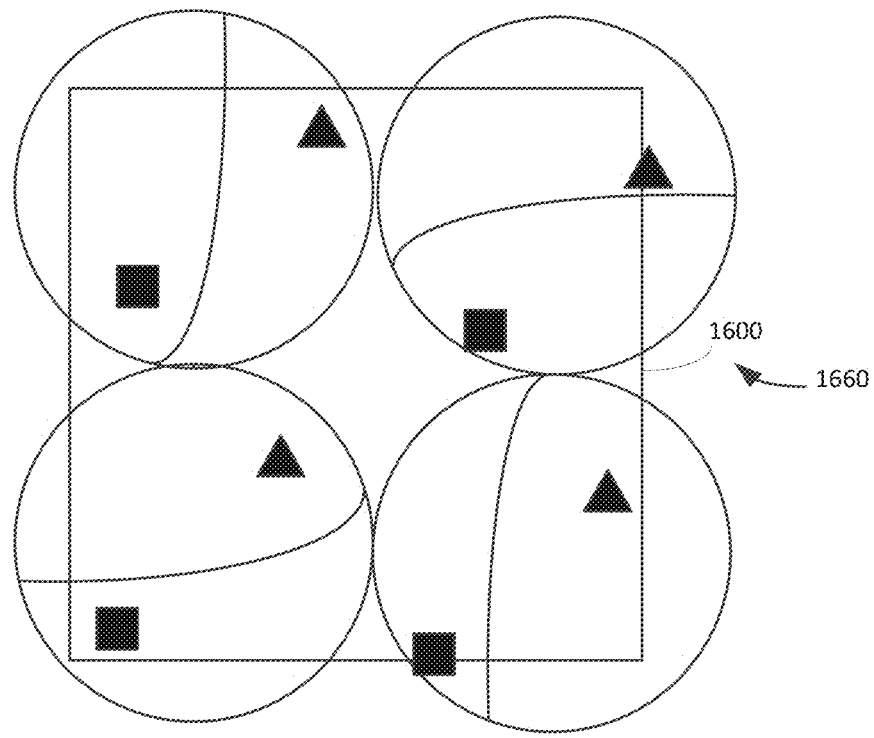

FIG. 16J shows a representation of an output modified design 1660 for the design space 1600. The modified design represents locations for obtained design points in the design space in response to modification of the initial sub-designs for level 1608 and level 1610.

Level swapping as described with reference to FIGS. 14A, 15, 16A-J is just one way to modify an initial sub-design by increasing separation between design points allocated a same level of the categorical factor in the design space. In one or more embodiments, it effectively concerns itself first with the space-fillingness of the overall design for the continuous factors, and then works on the sub-designs for each level of the categorical factors. Alternatively, or additionally the modification could involve design point replacement.

Figure 17:
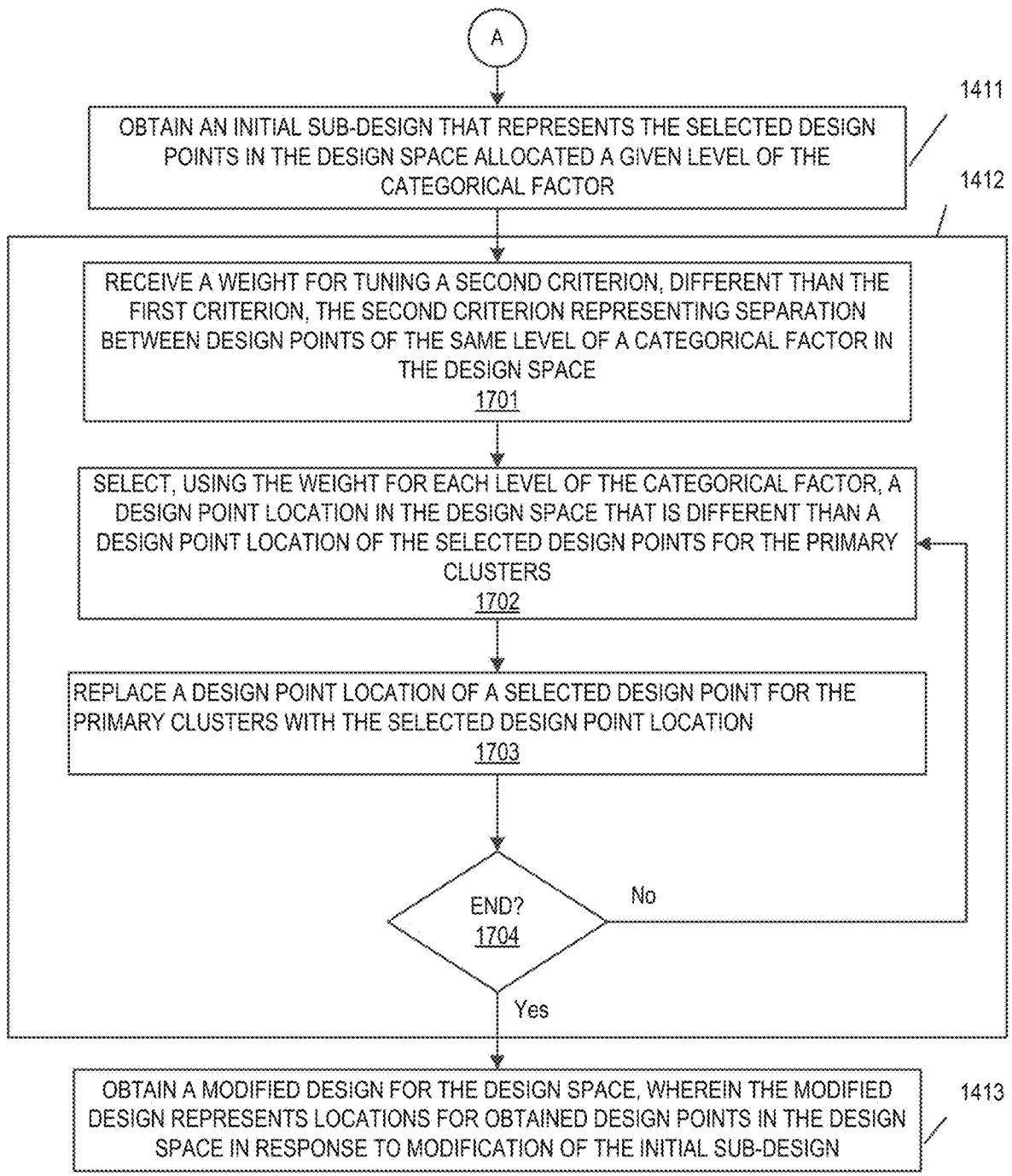
FIG. 17 illustrates an example flow diagram in at least one embodiment involving design point replacement.

FIG. 17 illustrates a flow diagram of a method 1400 in at least one embodiment involving design point replacement. As shown in FIG. 17, the method 1400 can modify an initial sub-design from operation 1411 by, for a primary cluster, reselecting one or more design points of the representative points to replace corresponding ones of design points in the initial sub-design. In one or more embodiments, the design point replacement minimizes a second criterion representing the separation distance between design points allocated a given level. In one or more embodiments, the first and second criterion can be considered a distance metric because they represent the separation distance between design points.

In one or more embodiments, the second criterion is different than the first criterion in operation 1408. For example, the first criterion is a MaxPro criterion and the second criterion is a modified MaxPro criterion that accounts for a received weight.

In one or more embodiments, the MaxPro criterion is represented by:

$$\min_{D} \psi(D) = \left\{ \frac{1}{\binom{n}{2}} \sum_{i=1}^{n-1} \sum_{j=i+1}^{n} \frac{1}{\prod_{l=1}^{p} (x_{il} - x_{jl})^2} \right\}^{1/p}$$

where: $\psi(D)$ is the MaxPro criterion;
i, j, l are integer counters;
n is an integer number of primary clusters for the design space;
p is an integer number of continuous variables for the design space; and
$x_{ab}$ is an entry in row a and column b of a matrix.

In one or more embodiments, the modified MaxPro criterion accounts for a received weight w and is represented by:

$$\min_{D} \psi(D)_w = \left\{ \frac{1}{\binom{n}{2}} \sum_{i=1}^{n-1} \sum_{j=i+1}^{n} \frac{I_w(c_i = c_j)}{\prod_{l=1}^{p} (x_{il} - x_{jl})^2} \right\}^{1/p}$$

where: $\psi(D)_w$ is the second criterion that is a modified MaxPro criterion;
i, j, l are integer counters;
n is an integer number of primary clusters for the design space;
p is an integer number of continuous variables for the design space;
$x_{ab}$ is an entry in row a and column b of a matrix; and
$I_w(c_{d1}=c_{d2})$ is an indicator variable that is w if a categorical level $c_{d1}$ allocated to a design point d1 and a categorical level $c_{d2}$ allocated to a design point d2 are the same, and 1 otherwise.

In one or more embodiments, a matrix is used for either or both criterion to map the design space onto a matrix with rows and columns. For example, a row of a matrix represents a design point in the design space and the columns represents a value in a particular dimension for each of the design points. For example, if a design space is in a three dimensional space with points (0,0,0), (0,1,0), and (1,1,1), the matrix X could be represented as:

$$X = \begin{bmatrix} 0 & 0 & 0 \\ 0 & 1 & 0 \\ 1 & 1 & 1 \end{bmatrix}$$

Of course, one of ordinary skill in the art will appreciate that the rows and columns for the matrix X can be reversed and that other criterion can be used for the first and second criterion (e.g., a centroid approach can be used for the first criterion). Furthermore, the matrix may have various dimensions.

In operation 1701, a weight is received for tuning the second criterion (e.g., a modified MaxPro criterion as described herein).

In operation 1702, using the received weight, for each level of the categorical factor, a design point location is selected in the design space that is different than a design point location of the selected design points for the primary clusters.

In operation 1703, a design point location of a selected design point for the primary clusters is replaced with the selected design point location.

In operation 1704, a choice is made as to whether to end the process or continue picking candidate design points in the design space for design point replacement. This choice can be automated or manual. For instance, in one or more embodiments, conditions are set to automatically decide when to end the process. For instance, operations 1702-1704 could be used to find candidate design points in each primary cluster of the design space and to determine whether to select a replacement design point location for a design point in a selected primary cluster that increases the separation distance between design points allocated a level of the categorical factor in the design space. A condition could be set to iterate a fixed number of times (e.g., 10 iterations) or through each primary cluster a fixed number of times. Alternatively or additionally, a condition could be set to perform operations 1702-1704 until no improvement is found as explained herein.

The MaxPro criterion for operation 1408 when considering the continuous factors has advantageous over other criterion including (1) that points are non-collapsing (no replication of points in lower dimensions); (2) the criterion forces points apart in each dimension because of the $(x_{il}-x_{jl})^2$ term in the denominator; (3) the criterion has good lower-order projections across dimensions; and (4) faster computation.

Assuming a MaxPro criterion, the design when looking at just the continuous factors should ideally have a small MaxPro value and for each level of a categorical factor, the sub-design for the continuous factors should have a small MaxPro value.

From a practical standpoint, if a categorical factor is included, it is not uncommon that the categorical factor is of particular interest. For the approach described with level swapping, the emphasis is firstly on the overall space-fillingness of the continuous factors. However, when emphasis should be placed on the categorical factors, a practitioner is also concerned that sub-designs on each level be as space-filling as possible, and they are willing to sacrifice a bit on the overall design. If each sub-design is created separately and combined together, one would end up with points too close to each other sacrificing too much of the overall design. One could try to optimize the MaxPro criterion for each design separately, while at the same time minimizing the overall MaxPro criterion, but computationally it is advantageous to have a single criterion computation. This technical advantage speeds up computations, and does not require considering each subdesign separately. The design point replacement approach with modified MaxPro allows one criterion to handle the choice of design points, but also allow flexibility to put weights on what is more important: the overall design or the projected sub-designs.

Figure 18A:
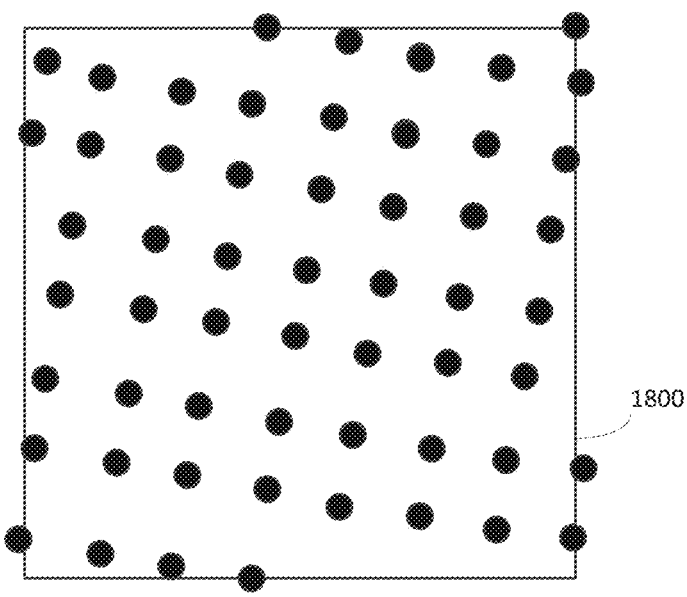
FIGS. 18A-18F illustrate an example block diagram of design point selection in at least one embodiment involving design point replacement.
Figure 18B:
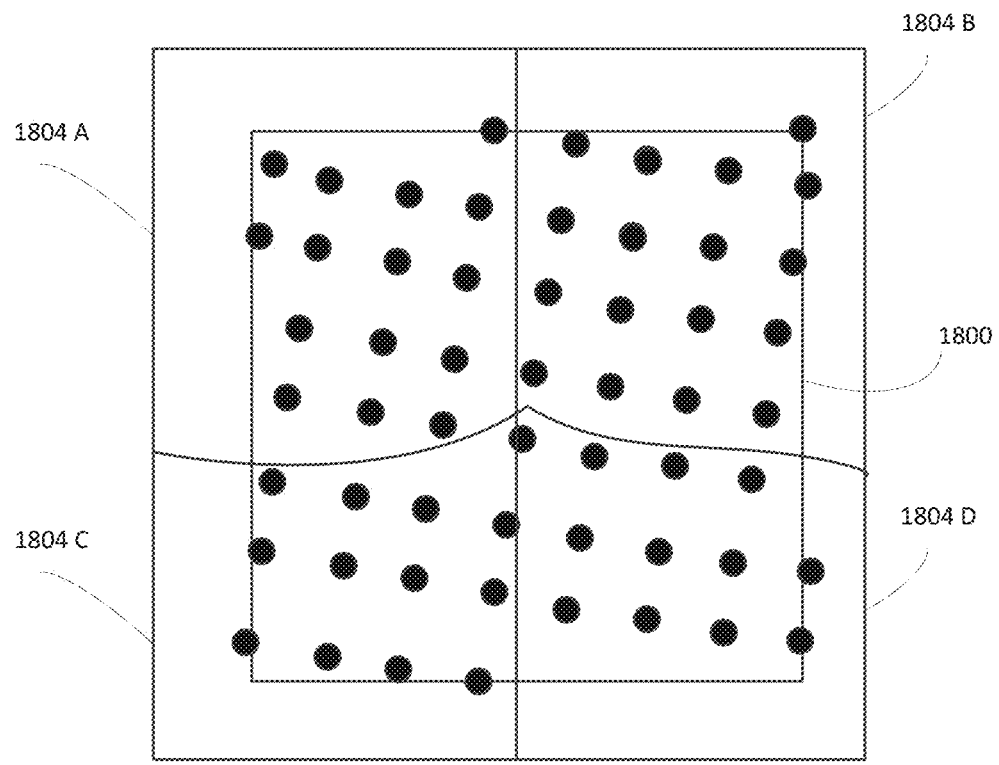

FIGS. 18A-18 illustrates a block diagram of design point selection in at least one embodiment involving design point replacement. FIG. 18A shows generated representative points distributed in the design space 1800. FIG. 18B shows the representative points in design space 1800 clustered into primary clusters 1804A-1804D. With either design point replacement or level swapping, the clustering can produce primary clusters with different amounts of representative points as shown in FIG. 18B or the same amount of representative points as shown in FIG. 16B.

Figure 18C:
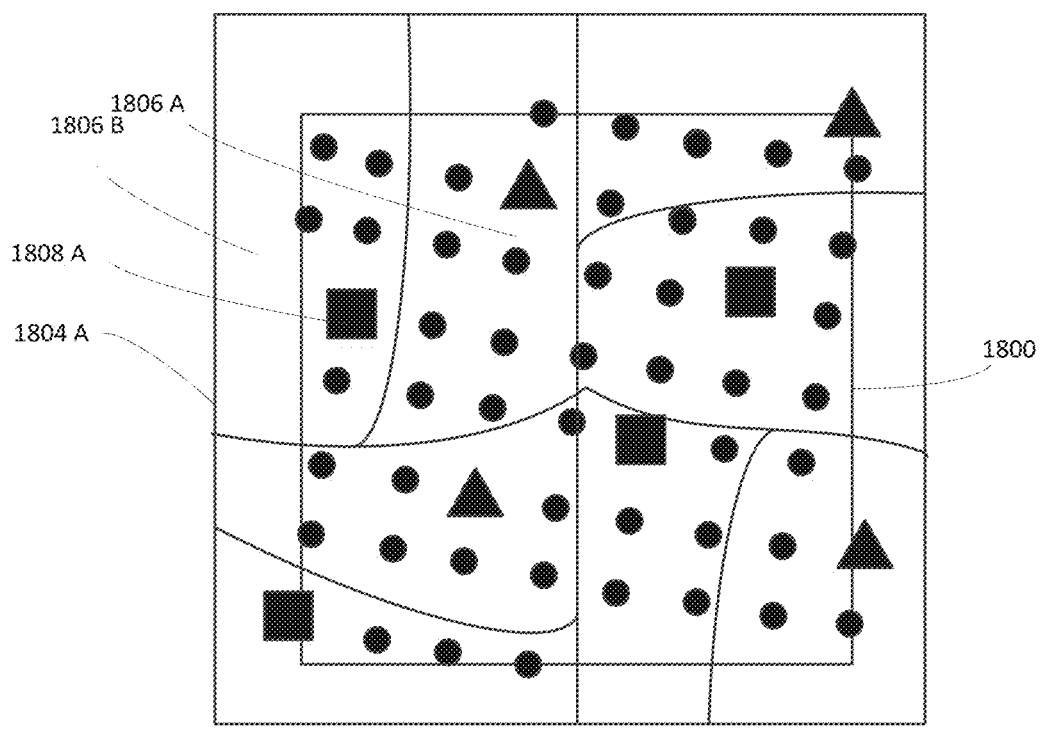

As shown in FIG. 18C, the primary clusters 1804 A-D of design space 1800 are separated into sub-clusters for allocation of two levels of a categorical factor to each of the primary clusters. For example, primary cluster 1804 A is separated into sub-clusters 1806A and 1806B. A design point is selected from the representative points in each of the sub-clusters and allocated one of the two levels. For example, design point of level 1 1808 A is selected in sub-cluster 1806 B.

Figure 18D:
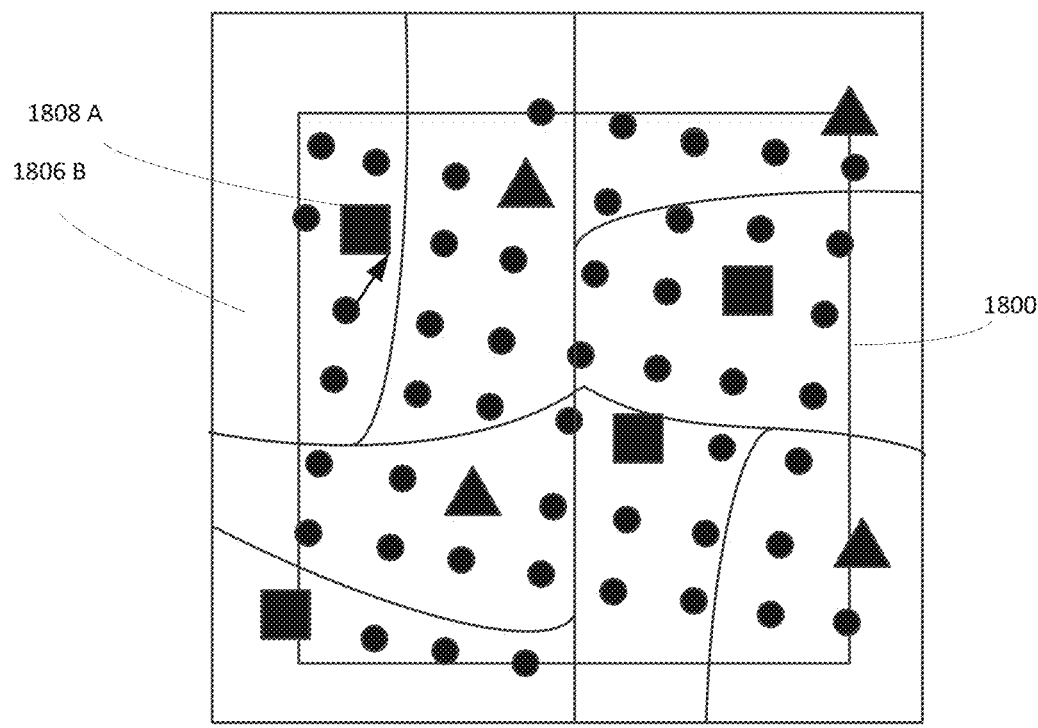
Figure 18E:
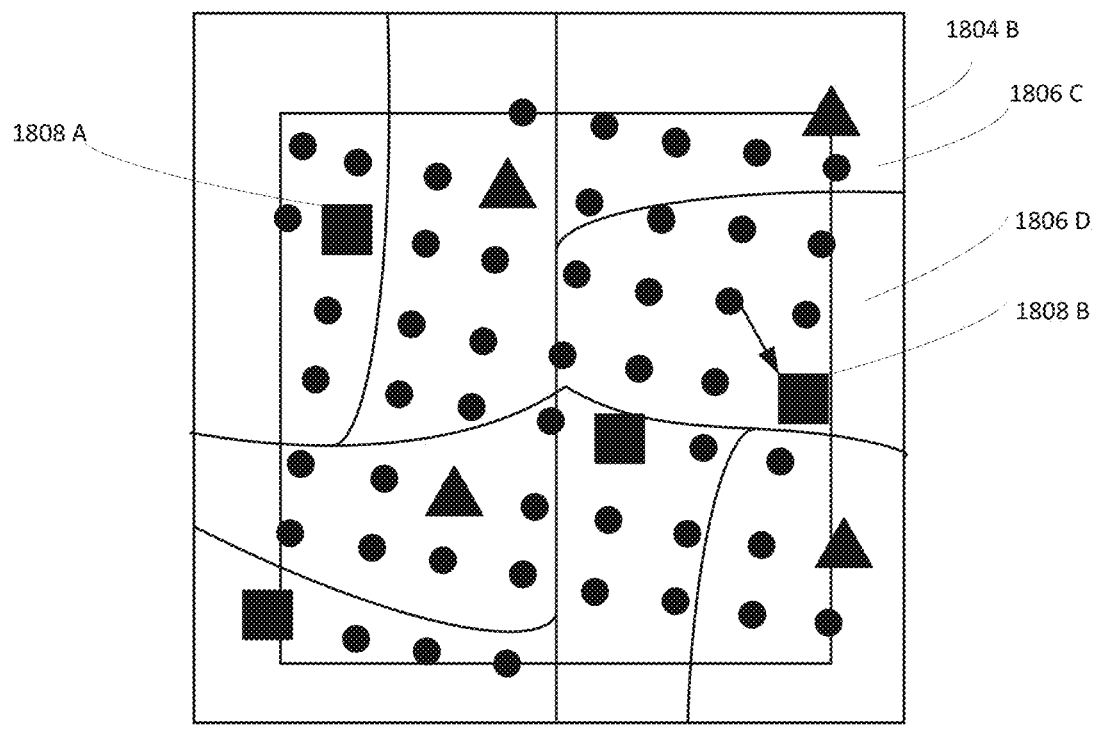
Figure 18F:
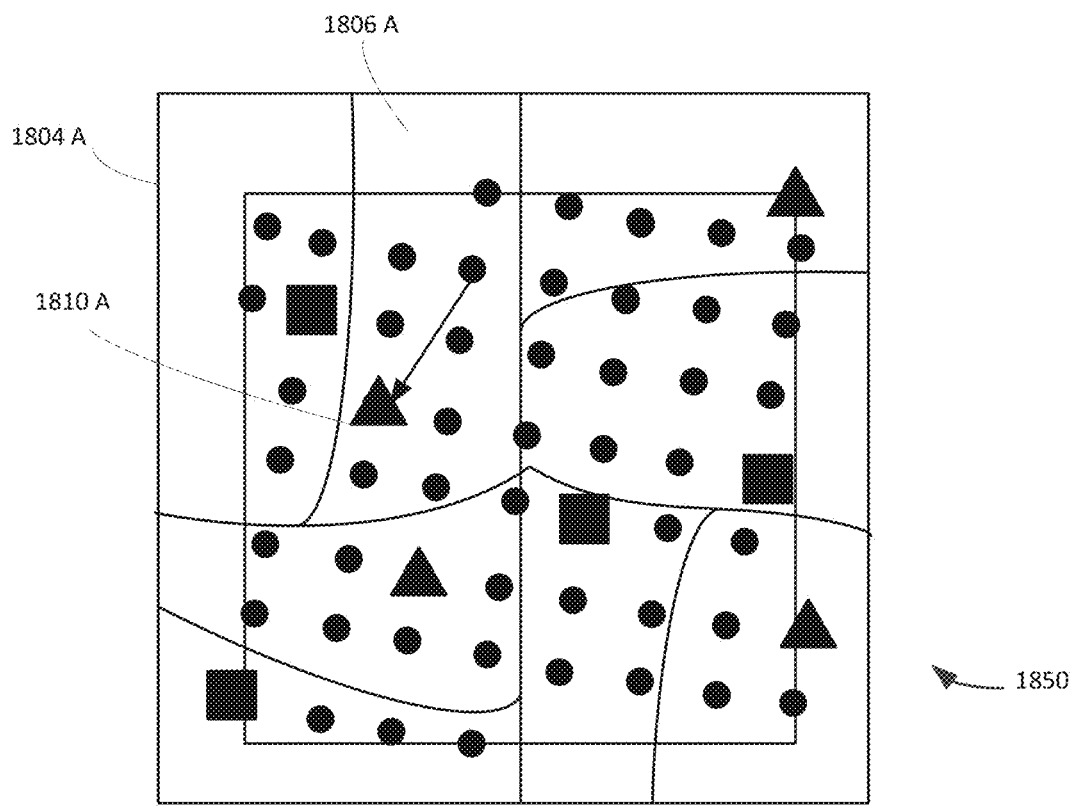

As shown in FIG. 18D, the location of design point of level 1 1808 A is moved to a different location of a representative point in design space 1800 (e.g., in the same sub-cluster 1806 B). In one or more embodiments, each reselected design point replaces a corresponding initial design point in a same sub-cluster. As shown in FIG. 18E since the reselected design point 1808 A increases or improves the separation of design points allocated of level 1 in a sub-design for level 1, the modified sub-design is selected and another design point of level 1 1808 B is selected in sub-cluster 1806 D of cluster 1804 B. Alternatively, or additionally modification could involve modifying another sub-design for a different level. FIG. 18F shows modification of a design point allocated a different level (level 2) 1810 A in sub-cluster A.

Figure 19A:
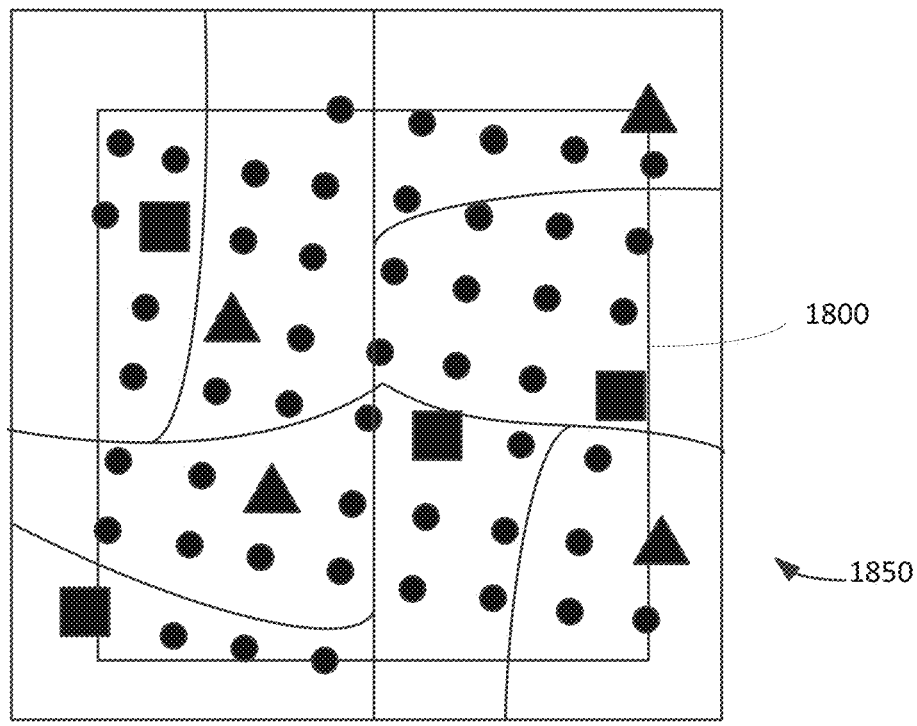
FIGS. 19A-19B illustrate an example block diagram of design point selection in at least one embodiment involving level swapping and design point replacement.
Figure 19B:
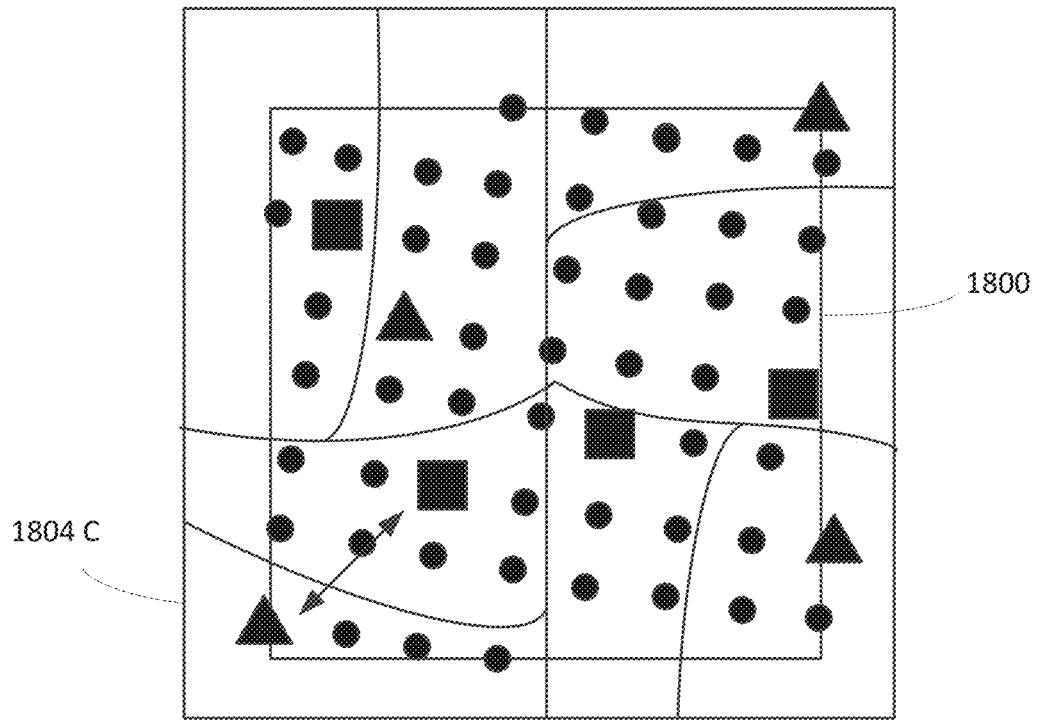

As shown in FIGS. 19A-B, design point replacement can be used in conjunction with level swapping. For example, FIG. 19A shows a design 1850 from the design point replacement as shown in FIGS. 18A-F. FIG. 19B shows level swapping in primary cluster 1804 C from the allocation produced by design point replacement shown in FIG. 19A.

Figure 20A:
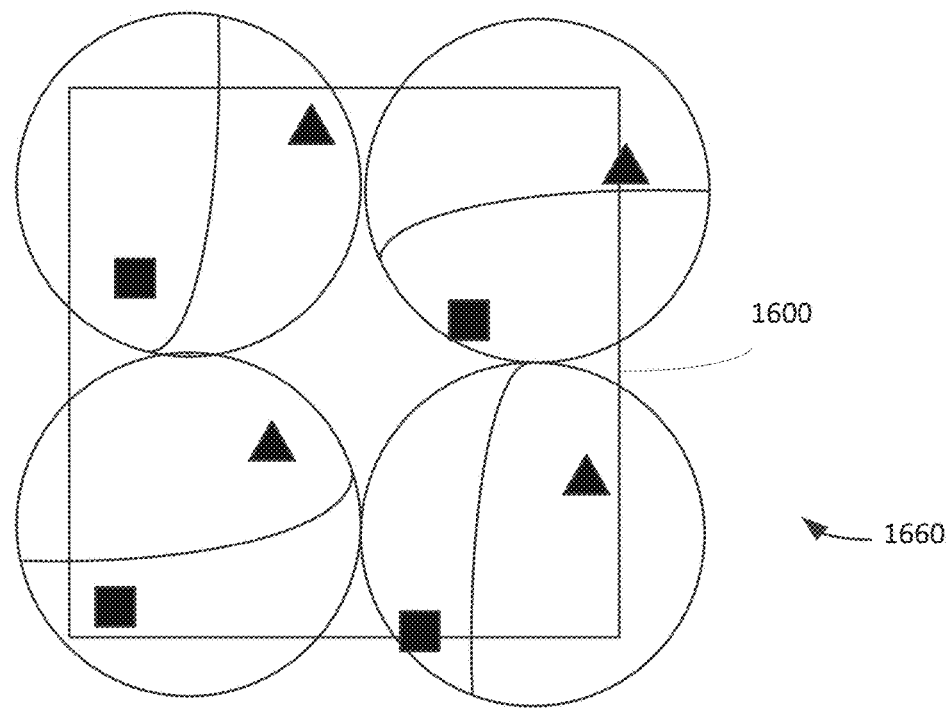
FIGS. 20A-20B illustrate an example block diagram of design point selection in at least one embodiment involving level swapping and design point replacement.
Figure 20B:
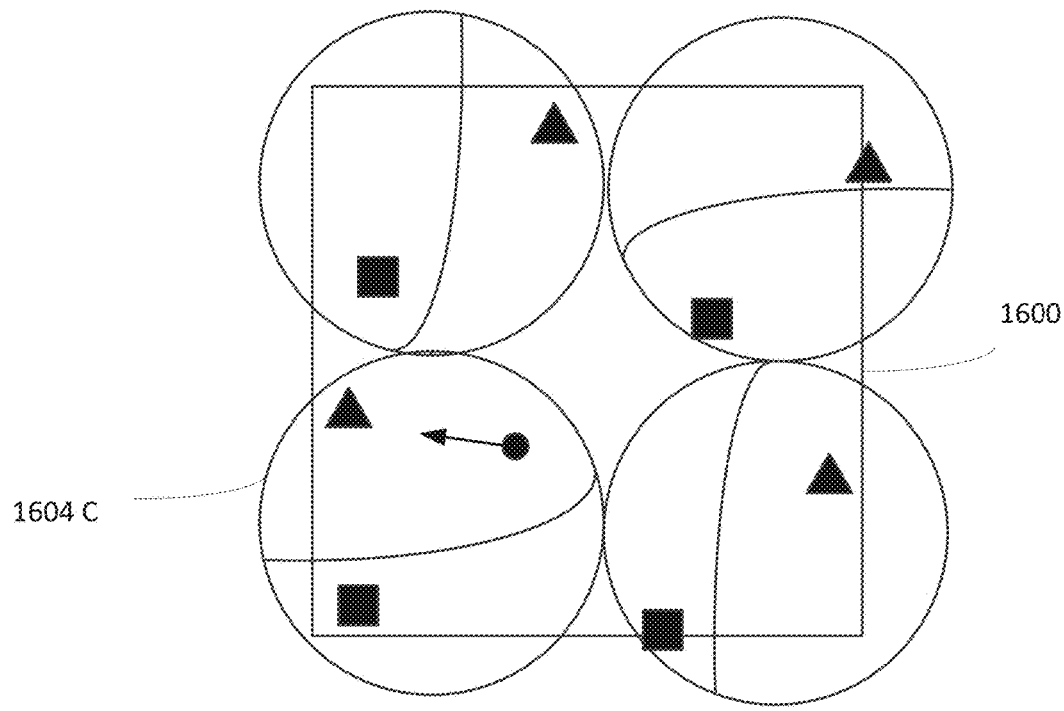

FIGS. 20A-20B show an alternative way to use design point replacement in conjunction with level swapping. FIG. 20A shows a design 1600 for design space 1600 from level swapping as shown in FIGS. 16A-16J. FIG. 20B shows design point replacement for primary cluster 1604 C from the allocation produced by the level swapping. Of course, one of ordinary skill in the art will appreciate other ways to use design point replacement in conjunction with level swapping (e.g., alternating between these techniques). In one or more embodiments, a modification of an initial sub-design involves performing two modifications one of level-swapping and one of design point replacement.

Figure 21:
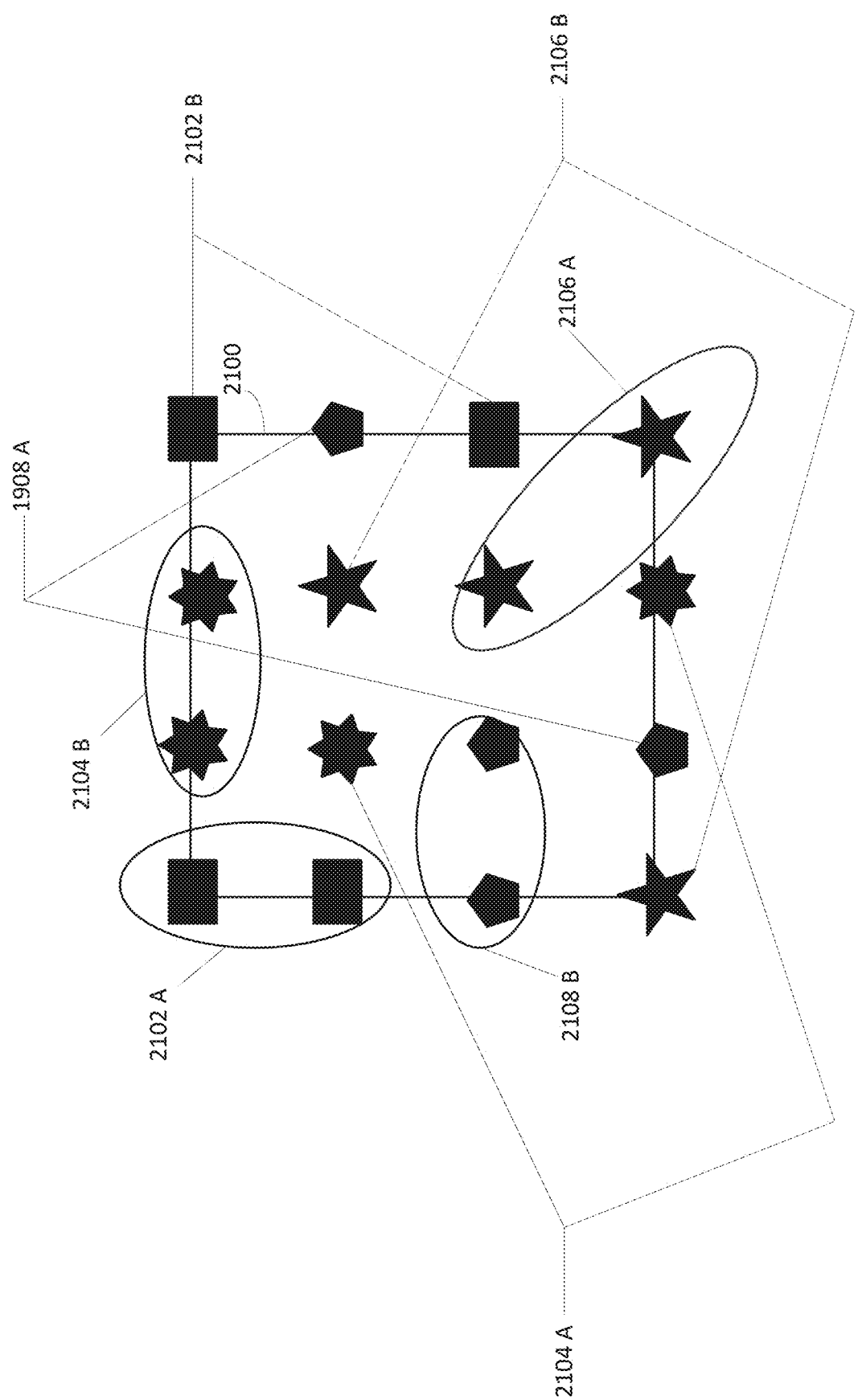
FIG. 21 illustrates example clustering in at least one embodiment of the present technology.

In one or more embodiments, representative points are clustered into primary clusters and sub-clusters. FIG. 16A and FIG. 18A show clustering representative points close in proximity. FIG. 21 shows an alternative manner of clustering, in which the clustering results in intertwined clusters. FIG. 21 shows four different clusters 2102, 2104, 2106 and 2108 in design space 2100 with some sections of a cluster close together (e.g., representative points in an A section or B section) and some sections of the cluster separated (e.g., sections A and B are separated from each other).

There are many techniques that can be employed for clustering herein. One example, is using hierarchical clustering. The hierarchical clustering method starts with each observation forming its own cluster. At each step of the hierarchical clustering method, the distance between each pair of clusters is computed, and clusters are combined that are closest together. This process continues until all the observations are contained in a particular number of clusters (e.g., the required number of primary clusters). Hierarchical clustering is also called agglomerative clustering because of the combining approach that it uses.

Another example include k-means clustering. In k-means clustering, a specified number of clusters are constructed using an iterative algorithm that partitions the observations. The method, called k-means, partitions observations into clusters so as to minimize distances to cluster centroids. One of ordinary skill in the art will appreciate other means of clustering including (e.g., normal mixtures, partitioning methods, fuzzy clustering, density-based clustering, model-based clustering and other clustering described herein).

Figure 22:
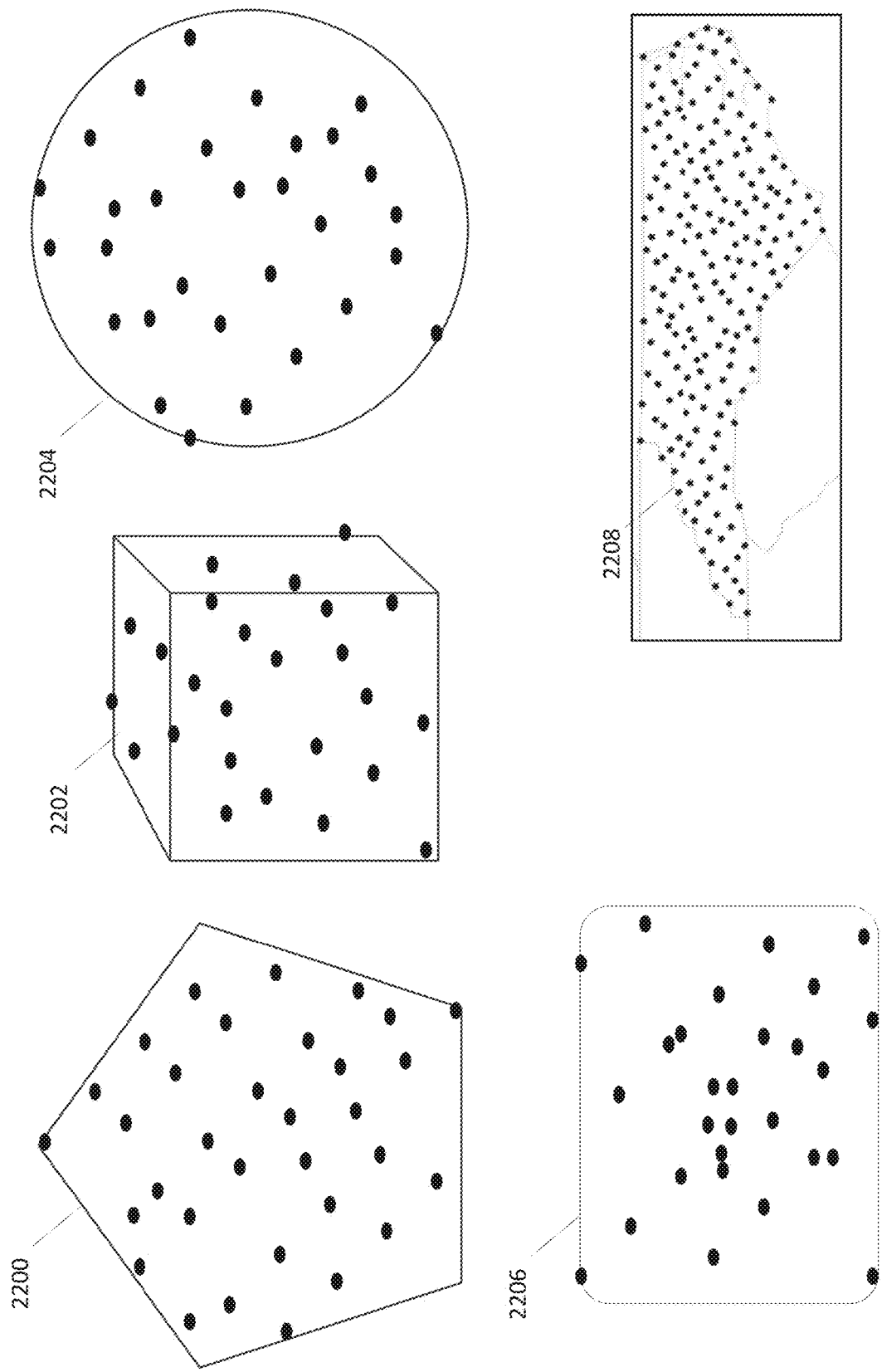
FIG. 22 illustrates an example of design spaces in some embodiments of the present technology.

FIG. 22 shows different example design spaces for one or more embodiments described herein. The design spaces 2200, 2204, 2206, and 2208 are examples of design spaces that are non-rectangular. Design space 2202 has borders of sides that are rectangular for a three dimensional shape. In one or more embodiments, a computing device (e.g., computing device 1302 of FIG. 13) displays, on a display device (e.g., display 1326) a graphical user interface for user entry of information defining the boundary for the design space. For instance, the user in one or more embodiments enters information that may represent a formula for one or more portions of the boundary of a design space. Alternatively, the graphical user interface provides various selections (e.g., a circle, a pentagon) for a design space and the user can select a design space. Alternatively, the graphical user interface allows a user to upload a file with individual user points or an image (e.g., an image of the boundary of the State of North Carolina) that a computing device then translates into a boundary for the design space.

Figure 23A:
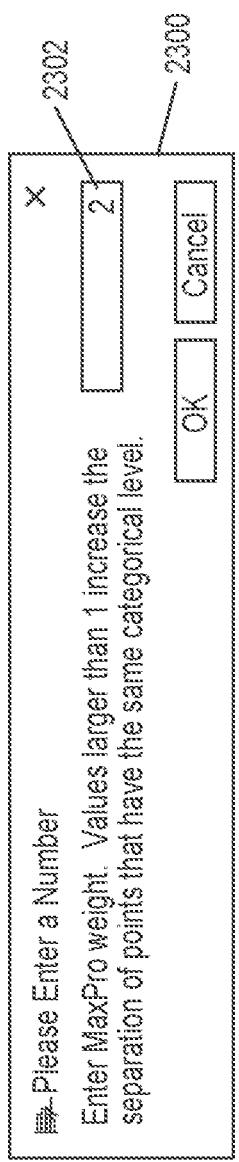
FIGS. 23A-23B illustrate examples of graphical interfaces in at least one embodiment of the present technology.
Figure 23B:
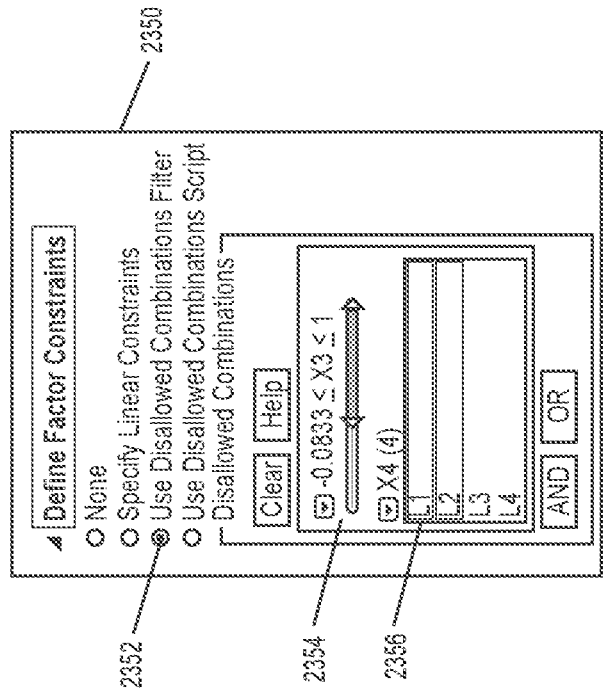

FIGS. 23A-23B shows other example graphical user interfaces for selection of criteria related to one or more categorical factors and/or levels associated with a categorical factor for the design space. For instance, the selection could describe all the categorical factors. As shown in FIG. 23A, the graphical user interface 2300 displays a text box 2302 for entry of a weight to describing tuning of design points that have a same categorical level. In one or more embodiments, the selection is related to the representative design points that will be allocated a level of a categorical factor. In one or more embodiments, the selection is related to controlling the particular categorical factors or levels. For example, as shown in FIG. 23B a graphical user interface 2350 allows a user to select categorical factors of combinations that are not allowed in particular situations (e.g., certain values of a categorical factor that cannot be used when a continuous variable is within a certain range). For example, as shown in FIG. 23B, the user has selected a disallowed combinations filter, criteria 2352. A level selection 2356 in FIG. 23B allows a user to specify the levels for a categorical factor X4 for the space that cannot be used when continuous variable X3 has the values selected using the spectrum 2354. The spectrum 2354 allows the user to adjust the range for a continuous variable X3 in this disallowed combination. Alternatively, a user could use a "Disallowed Combinations" script to upload a script to automatically choose points in the allowable design space rather than use user entry of continuous or categorical factors. One of ordinary skill in the art will appreciate different selections that could be presented to selected or otherwise describe criteria related to aspects of the design space (e.g., continuous variables, categorical factors, and/or levels associated with a categorical factor for the design space).

FIG. 24A shows an example embodiment involving a design space 2400 with a non-rectangular boundary (i.e., the boundary of the State of North Carolina). The design space 2400 is two dimensional with two continuous variables for design 2401 defining the latitude and longitude of the design space. The design 2401 has two sub-designs, one for each level (L1, L2) of a categorical factor (categorical factor X3) in which level swapping is used. Design space 2400 is useful for experiments in the State of North Carolina. For example, design space 2400 in one or more embodiments is used for an experiment in which air quality is tested across the State of North Carolina. It would be good to distribute air quality sensors distributed uniformly across North Carolina both within and at the border of the state. There may be more than one type or supplier of air quality sensors, and it would be good to also evenly distribute the different types of air quality sensors across the state without having overlapping air quality sensors of different types. Alternatively or additionally, an experiment using the model could have physical aspects (e.g., collecting data with physical sensors) and computer-simulated aspects (e.g., collecting data with simulators). The type of the air quality sensor or the method of data collection (physical or computer simulator) could then be categorical factor X3 for the design 2401 with the different types allocated a level 1 (L1) and a level 2 (L2). Thus, design 2401 is useful for an experiment with categorical factors combined with continuous variables. Two aspects are considered for the design. First, the design when looking at just the continuous factors should have good space-filling properties. Second, for each level of a categorical factor, the sub-design for the continuous factors should have good space-filling properties. Design 2401 was produced using a level-swapping approach according to one or more embodiments described herein.

FIG. 24B shows the sub-designs separated with sub-design 2402 showing just the distribution of design points allocated level 1 (L1) for a categorical factor X3 and sub-design 2404 showing just the distribution of design points allocated level 2 (L2) for a categorical factor X3. Generally, the sub-designs have achieved good distribution of the design points. However, as shown, in regions 2406, 2408 and 2410 there are still some regions of the design space that have clumped together creating coverage holes in the distribution.

FIG. 24C shows an example embodiment in which design point replacement is used for the same design space 2400. The modified MaxPro Criterion and a received weight of 4 is used to produce the design 2411. FIG. 24D shows the sub-designs for design 2411 separated with sub-design 2412 showing just the distribution of design points allocated level 1 (L1) for a categorical factor and sub-design 2414 showing just the distribution of design points allocated level 2 (L2) for a categorical factor X3. Regions 2406, 2408 and 2410 in this example show a better distribution for each of the sub-designs than in FIG. 24B that used one level swapping approach. In different embodiments, the level-swapping approach could produce a better distribution than design point replacement or a combination of approaches could provide a better distribution than either approach alone.

Figure 24E:
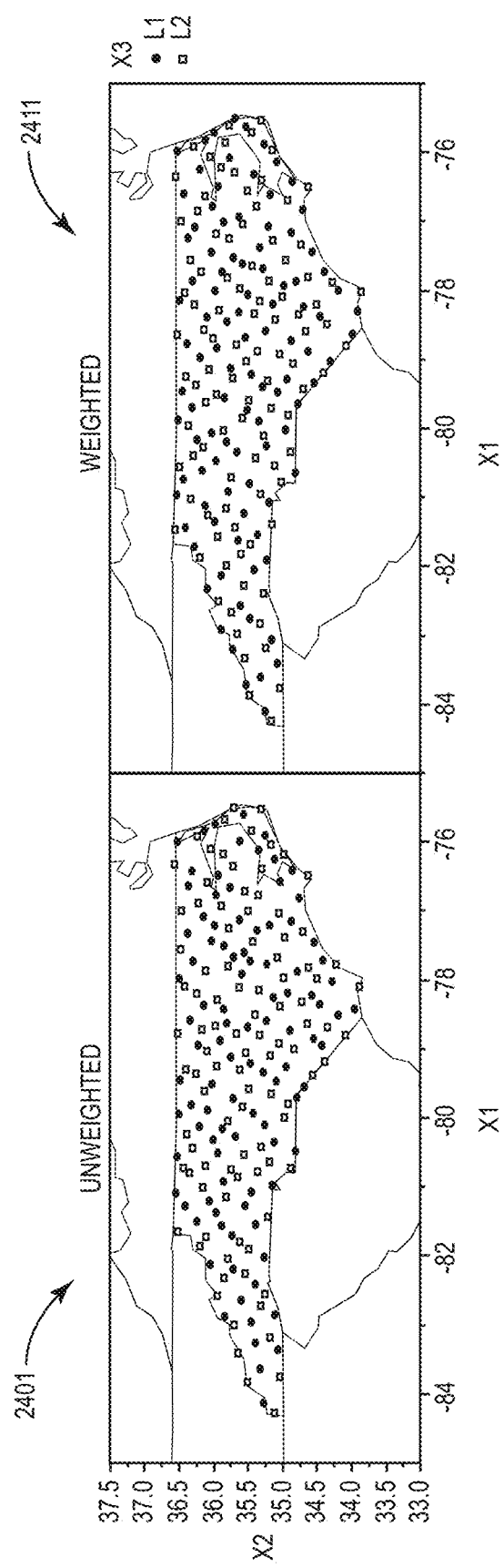
Figure 24F:
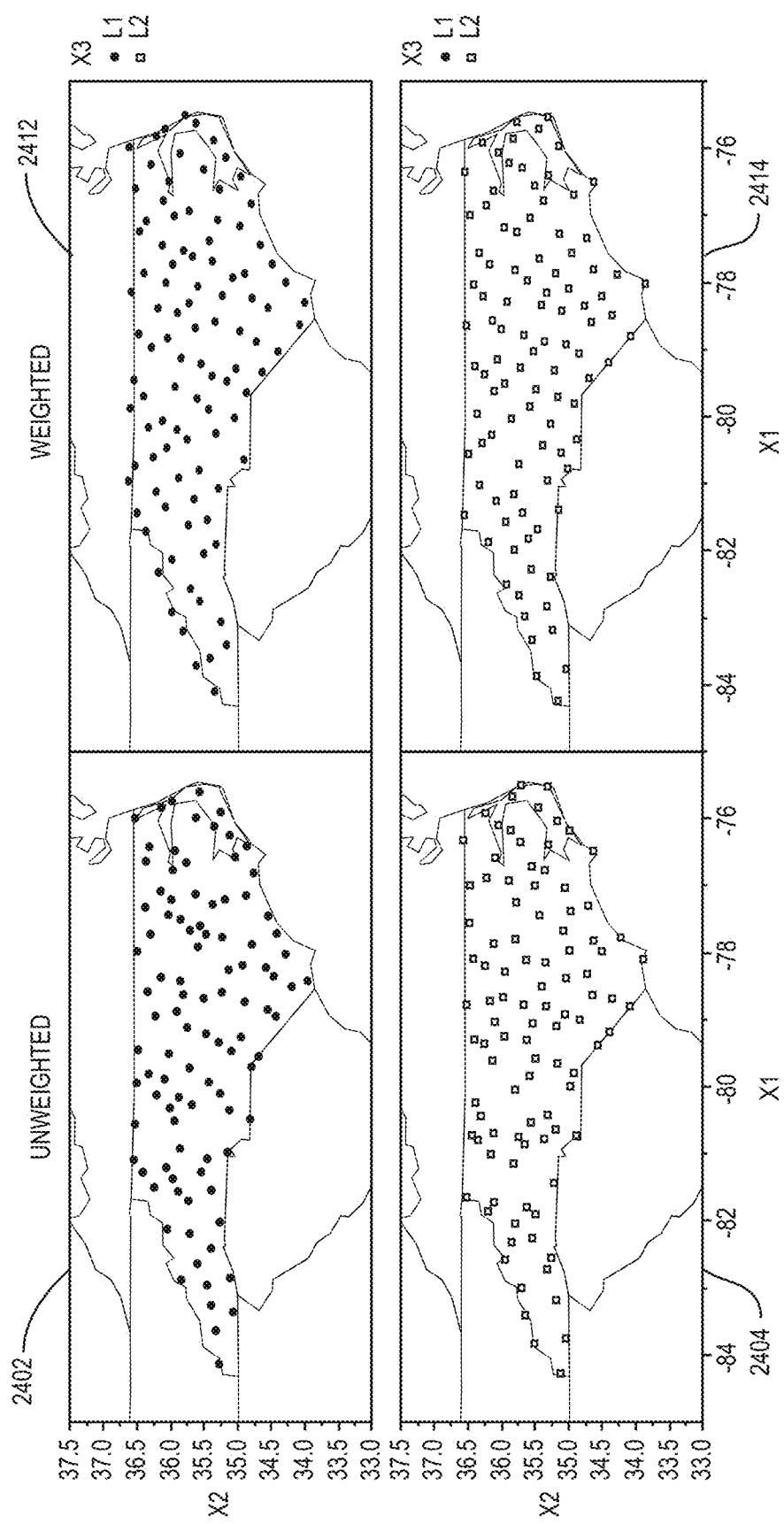

FIG. 24E shows a side-by-side comparison of the design 2401 and design 2411. Since design 2411 was produced with level swapping and the modified MaxPro criterion, it can be referred to as a weighted design in distinction from design 2401, which can be considered unweighted. FIG. 24F shows a side-by-side comparison of the sub-designs 2402, 2412, 2404 and 2414 of FIGS. 24B and 24D.

Figure 25A:
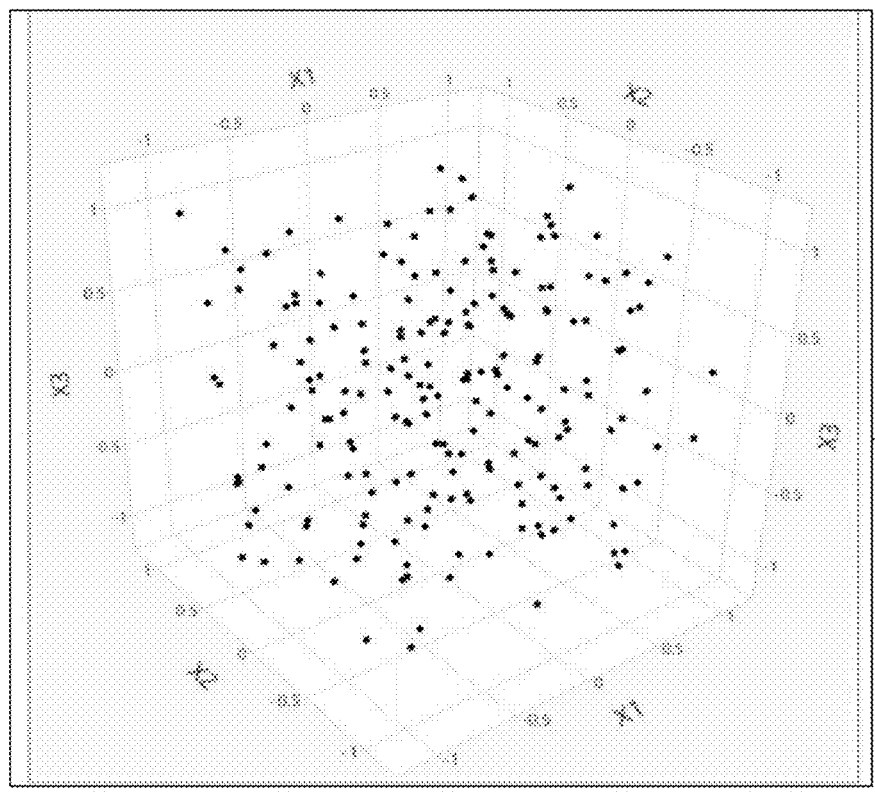
FIGS. 25A-25B illustrate examples of a design space in at least one embodiment of the present technology.
Figure 25B:
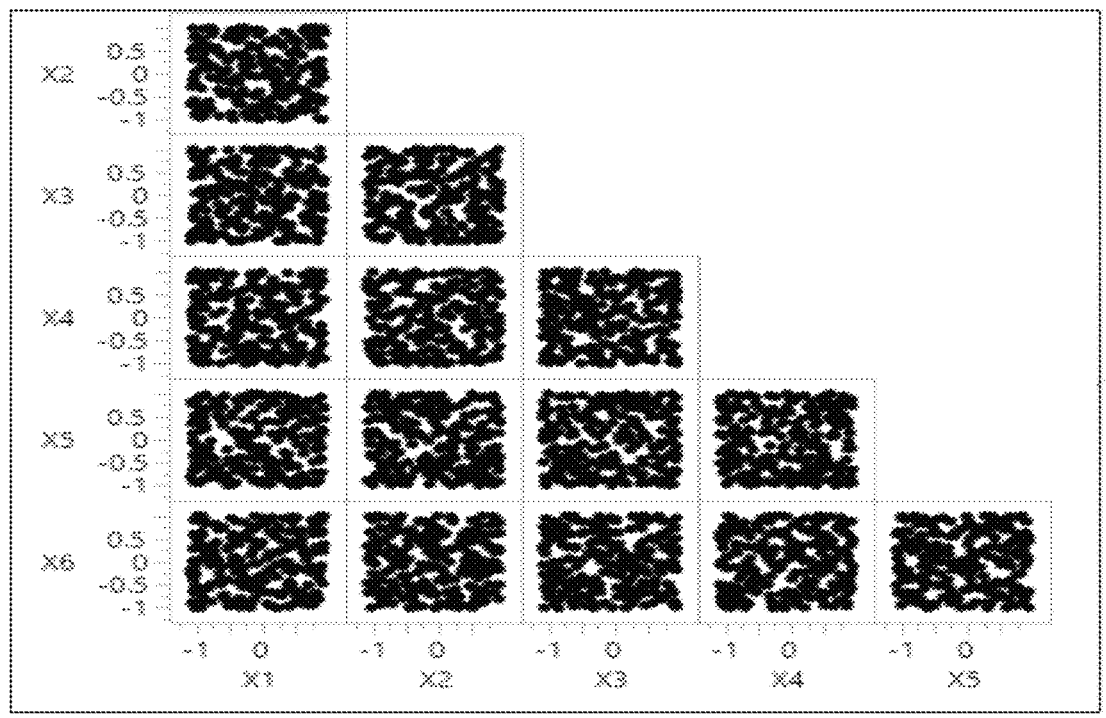

One or more embodiments herein are useful for multi-dimensional design spaces that test multiple continuous factors. FIGS. 25A-25B show an example of a space-filling design for 200 design points or computational runs with 6 continuous factors (X1-X6) and a two-level categorical factor. The distribution of points in each of the dimensions can be represented graphically by two-factor projections of the full design shown in FIG. 25B. FIG. 25A shows a scatterplot 2500 for a three-dimensional projection for the full design. Examples of continuous factors for an experiment are experiment dependent (e.g., physical dimensions, time, hardness, clarity, brightness, etc.).

Figure 26A:
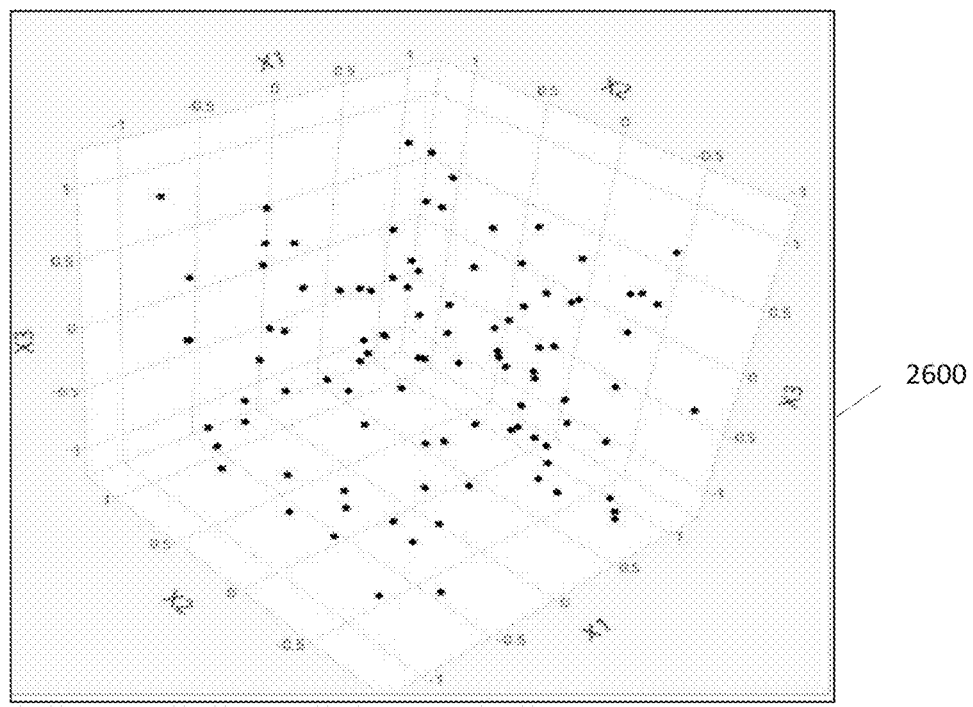
FIGS. 26A-26D illustrate examples of sub-designs in at least one embodiment of the present technology.
Figure 26B:
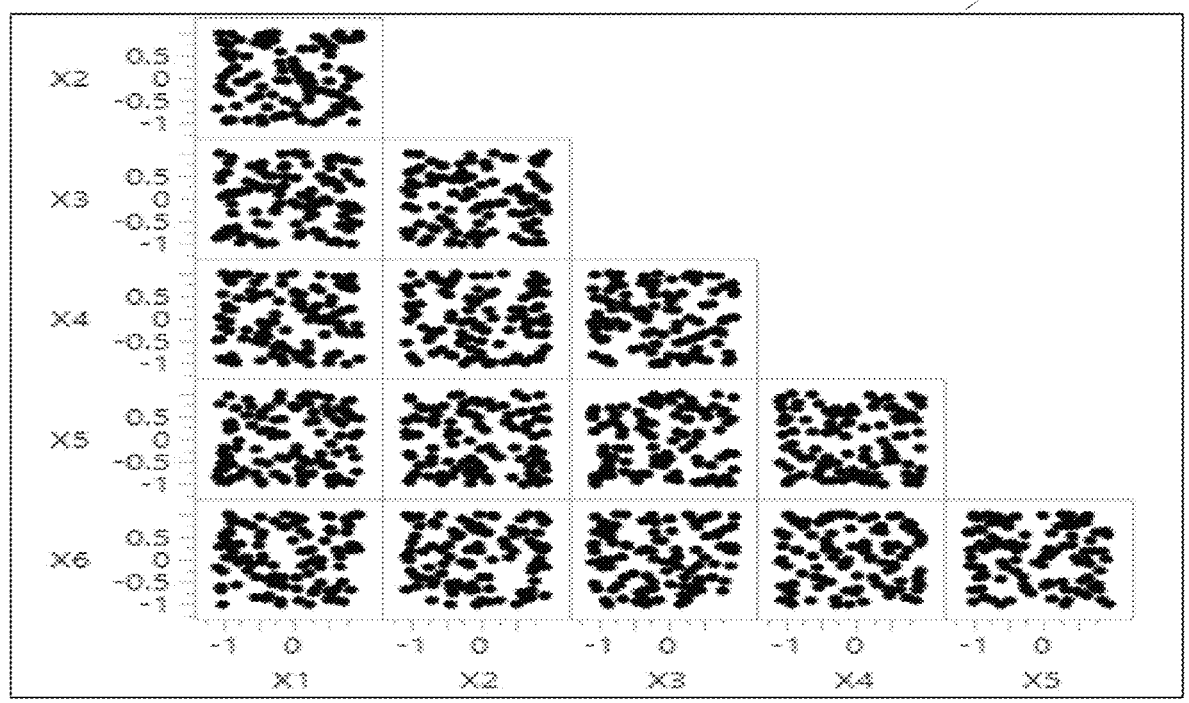
Figure 26C:
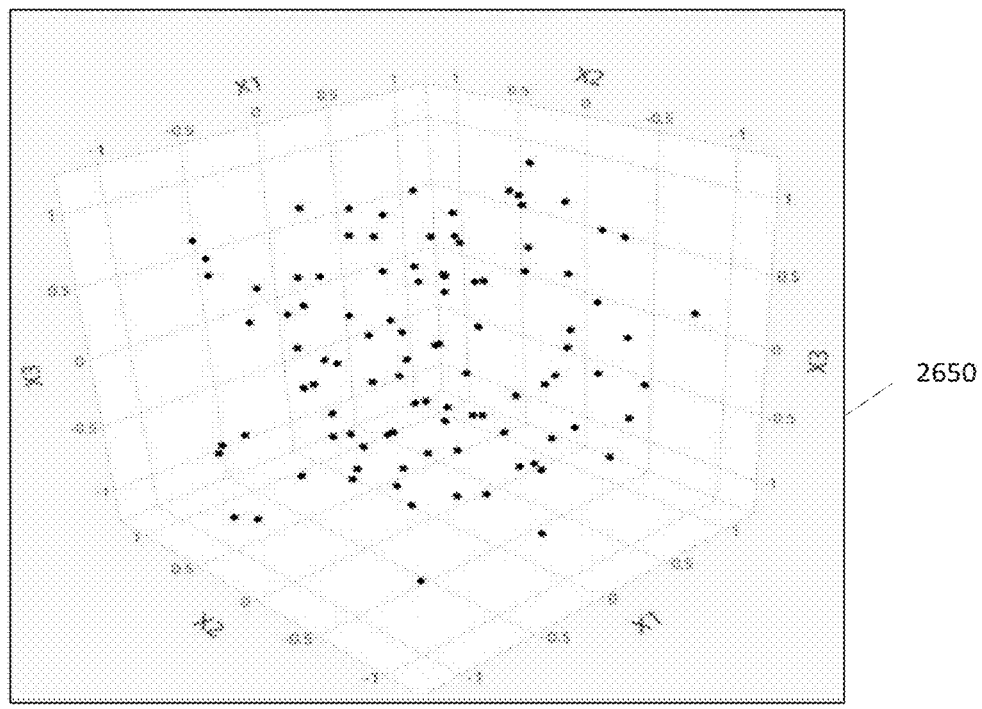
Figure 26D:
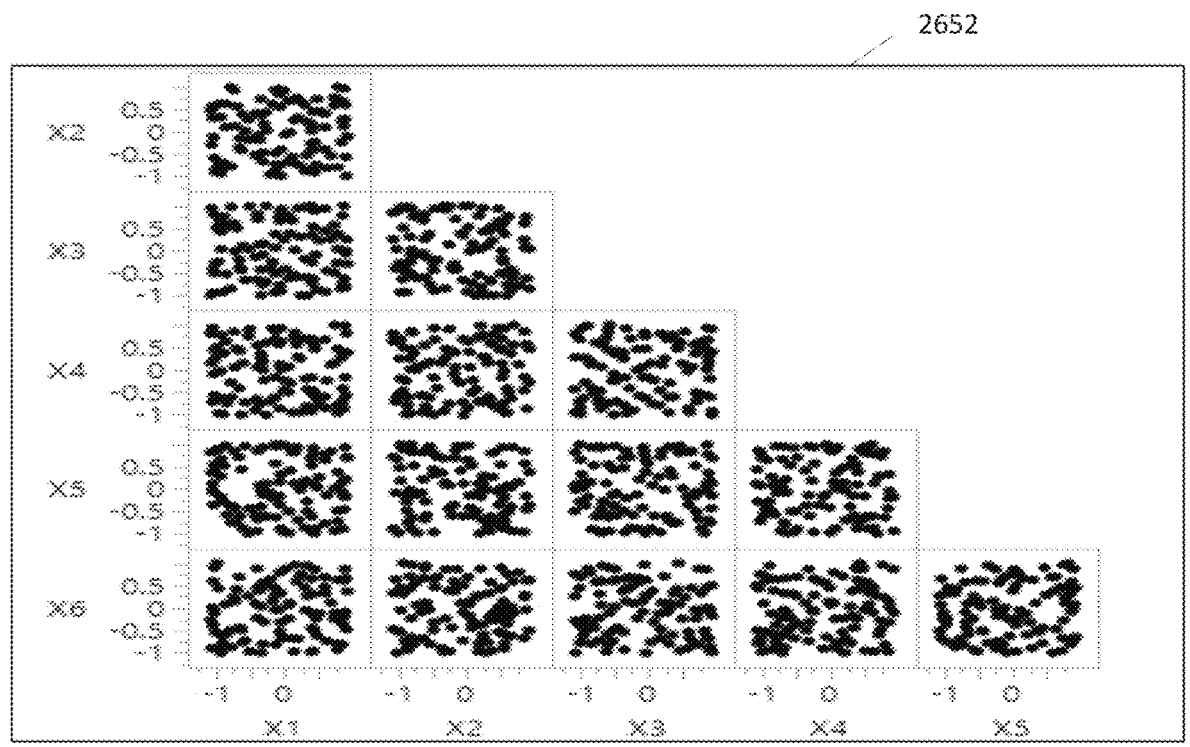

FIGS. 26A-26D shows each of the sub-designs for the example in FIG. 25A-25B. FIG. 26A represents a sub-design for a first level graphically as a scatterplot 2600 for a three-dimensional projection for the sub design. FIG. 26B represents a sub-design for a first level graphically as a scatterplot 2602 with two-factor projections for the sub-design. FIG. 26C represents a sub-design for a first level graphically as a scatterplot 2650 for a three-dimensional projection for the sub design. FIG. 26D represents a sub-design for a first level graphically as a scatterplot 2652 with two-factor projections for the sub-design.

Figure 27:
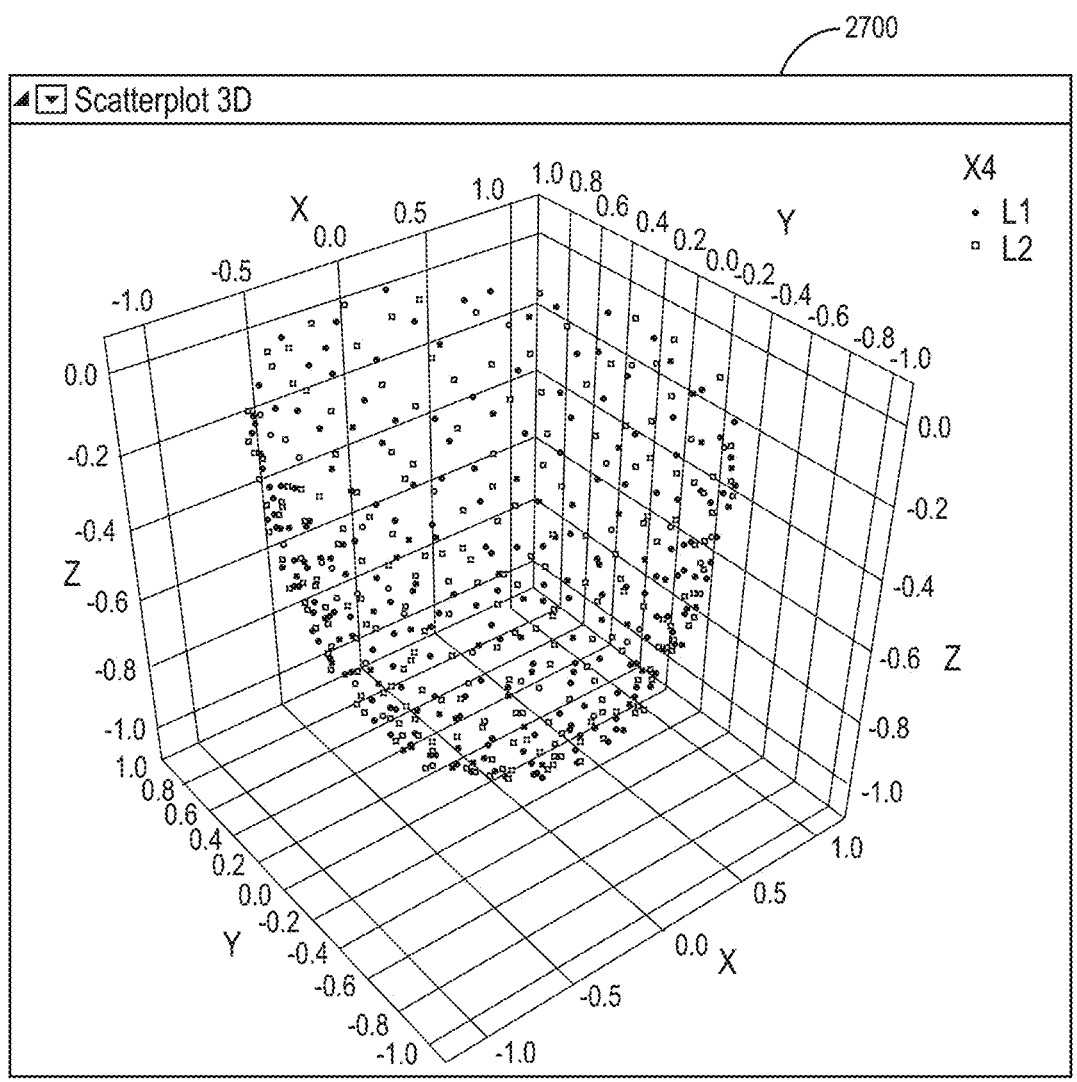
FIG. 27 illustrates an example of a design space in at least one embodiment of the present technology.
Figure 28A:
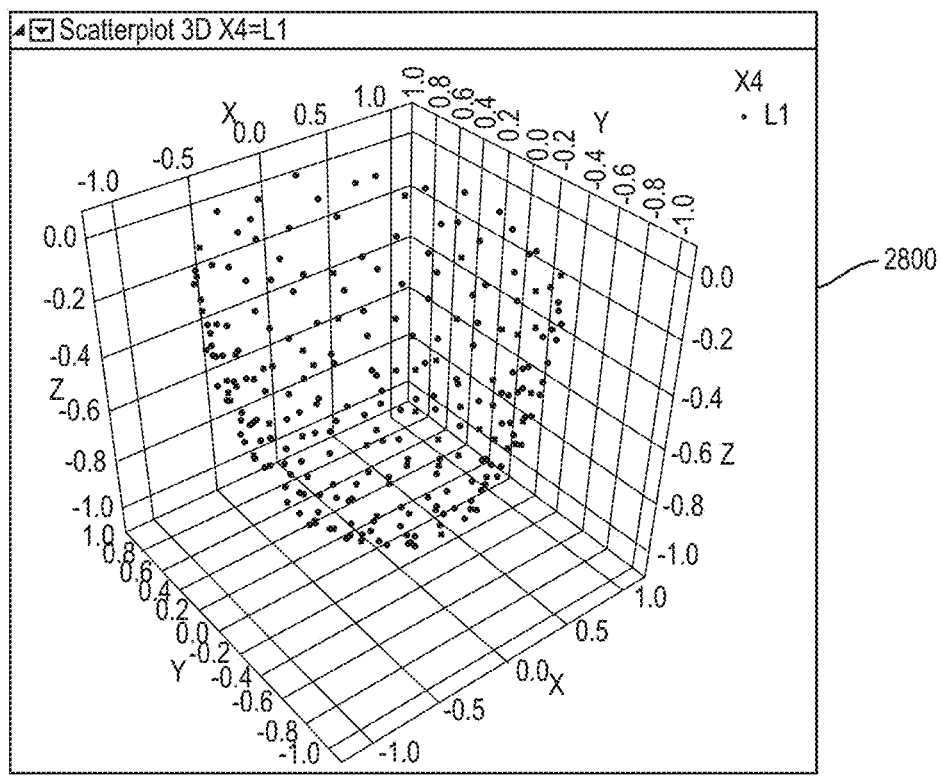
FIGS. 28A-28B illustrate examples of sub-designs in at least one embodiment of the present technology.
Figure 28B:
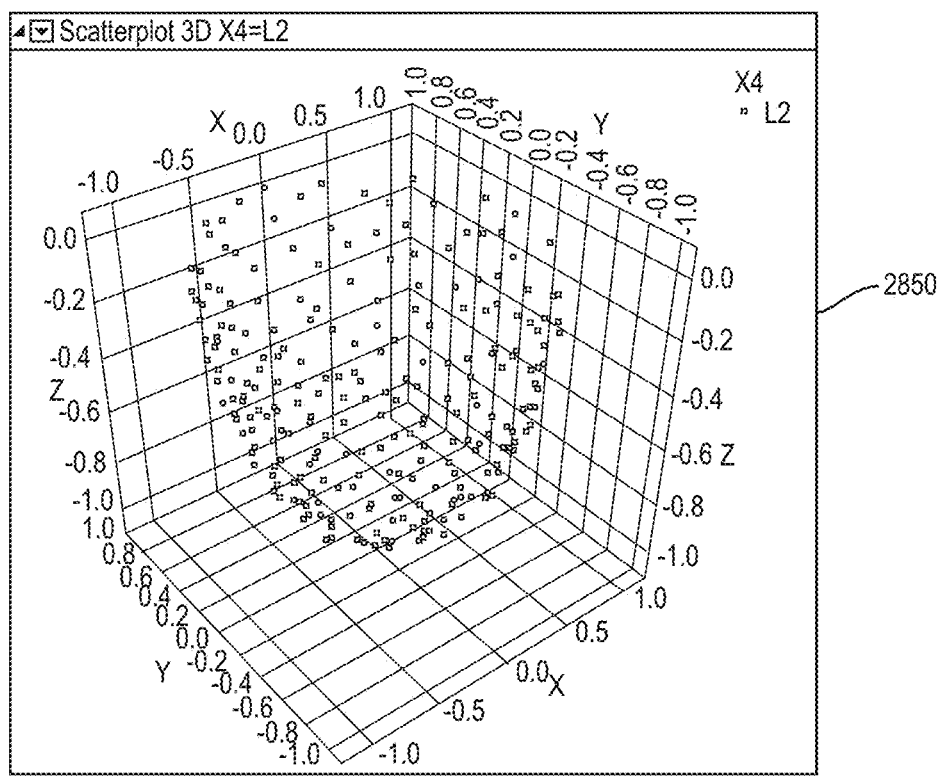

One or more embodiments are useful for space filling a model of a three-dimensional physical object like a physical bowl as shown by the scatterplot 2700 in FIG. 27 with a categorical factor X4 of two levels L1 and L2. FIG. 28A shows the sub-design 2800 for L1, and FIG. 28B shows the sub-design 2850 for L2. This is useful for designing experiments on a physical object or model of a physical object (e.g., testing strain on a physical object, such as a physical bowl). Experiments on physical objects are useful for a variety of applications. For instance, space-filling designs for modeling heat transfer in an object are useful for building diagnostics, inspection of automotive and airplane parts (e.g., finding and quantifying defects), medical screening, inspection of artwork and historical monuments. For example, in the agriculture segment, space-filling designs are useful for modeling of produce objects which can be helpful for screening agriculture products (e.g., based on heat transfer, biological variability, fungi infestations, etc.).

One or more embodiments herein describe approaches that would be useful for designing a design space (e.g., for the experiment in FIGS. 24A-24F). In particular, one or more embodiments herein are useful for specifying categorical factors for allowable regions of a nonregular region (e.g., the State of North Carolina). One or more embodiments herein are useful for quickly designing a design space. From a processing standpoint, one or more criterion used herein are cheap to compute because they require less processing. For instance, with design point replacement using a modified or weighted MaxPro criterion, in considering moving a current design point with another point in a primary cluster, a method only needs to consider the other design points and the change in the weighted MaxPro criterion, which can be done in linear time. This also allows it to be threaded—each potential point can be considered separately and passed with the current design. This method can be combined with other techniques such as hierarchical clustering using the Fast Ward method of JMP® to achieve greater speed.

One or more embodiments herein achieve greater efficiency for known techniques of distributing design points. For example, instead of trying to optimize each subdesign and the full design simultaneously and deciding on appropriate weights in that regard, the modified MaxPro criterion uses a single tuning parameter for the weight, whereby a user can balance which is more important—the space-fillingness on the full design or the space-fillingness on the sub-designs.

One or more embodiments herein allow flexibility in run size (e.g., specifying the number of design points in the region) or in weighted or otherwise valuing distribution of categorical factors over overall distribution.

One or more embodiments allow flexibility in constraining the design space by allowing constraints on the design space, continuous variables for the design space, and categorical factors as described herein.

One or more embodiments herein provide advantages over other approaches for distributing design points in a design space. For example, general sliced Latin hypercube is an approach that approximates a design as a rectangle or cube with multiple layers, at each of which there are multiple Latin hypercube designs that can be sliced into smaller Latin hypercube designs at the next layer. Due to constraints based on this approaches underlying mathematical computations, this approach is inflexible for run size because a certain amount of runs is required to perform the computations, is not amenable to nonregular or rectangular regions, and cannot place weight on valuing distribution of a sub-design over the overall design.

A useful metric for comparing the performance of general sliced Latin Hypercube (SLHD) to an approach described herein which can be referred to as fast flexible filling (FFF) is shown below.

$$Mm_q = \min_r \left( \frac{1}{\binom{n}{2}} \sum_{i=1}^{n-1} \sum_{j=i+1}^{n} \frac{1}{d_{qr}^{2q}(x_i, x_j)} \right)^{-\frac{1}{2q}}$$

where: $Mm_q$ is a maximum measure for projection dimension q;
r is the worst-case projection of dimension q
$d_{qr}$ is the Euclidean distance between $x_i$ and $x_j$ in the r projection of dimension
q; and
n is the number of design points or run designs.

Figure 29:
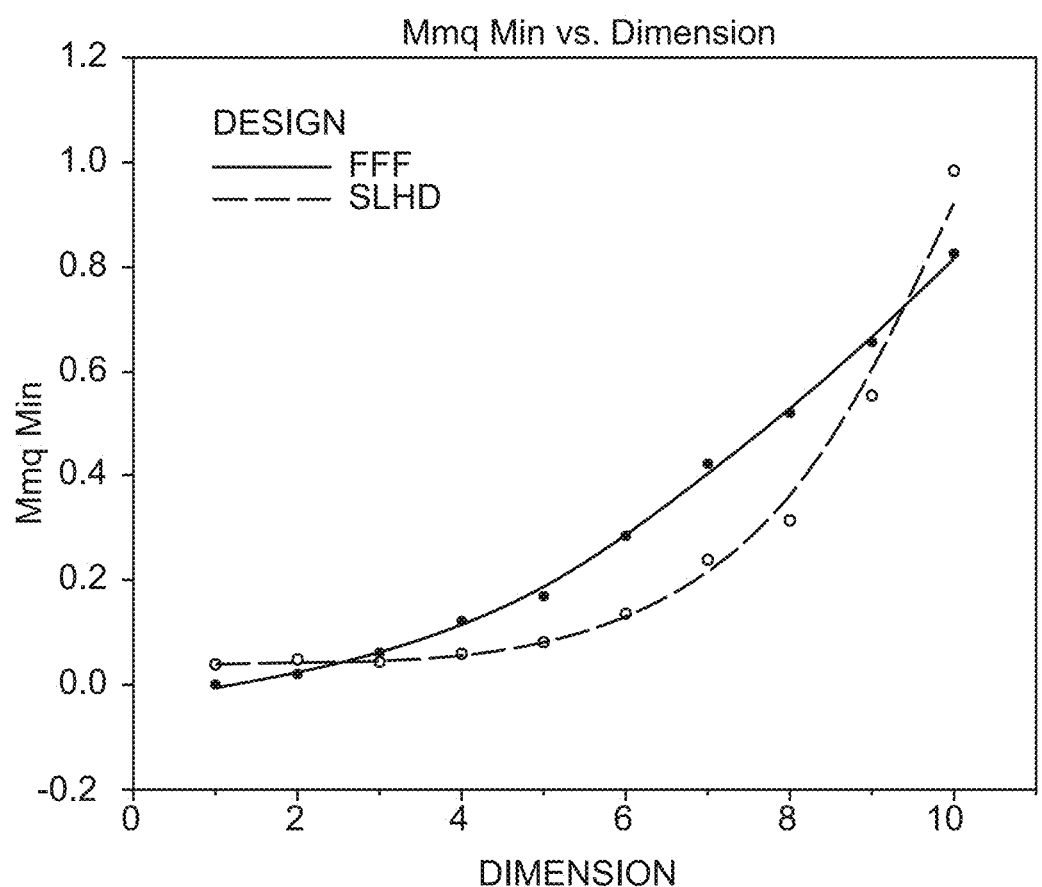
FIG. 29 illustrates an example of a comparison of performance in at least one embodiment of the present technology compared to sliced hypercube design.

FIG. 29 shows a graphical comparison 2900 of the $Mm_q$ values for FFF unweighted and SLHD. When comparing approaches, a larger value of $Mm_q$ is preferred. Both approaches are applied to a 200-run design with 10 continuous factors and a 4-level categorical factor across design spaces of different dimensions ranging from 1 to 10. Only in dimensions 1 and 10, does SLHD performs better.

Figure 30:
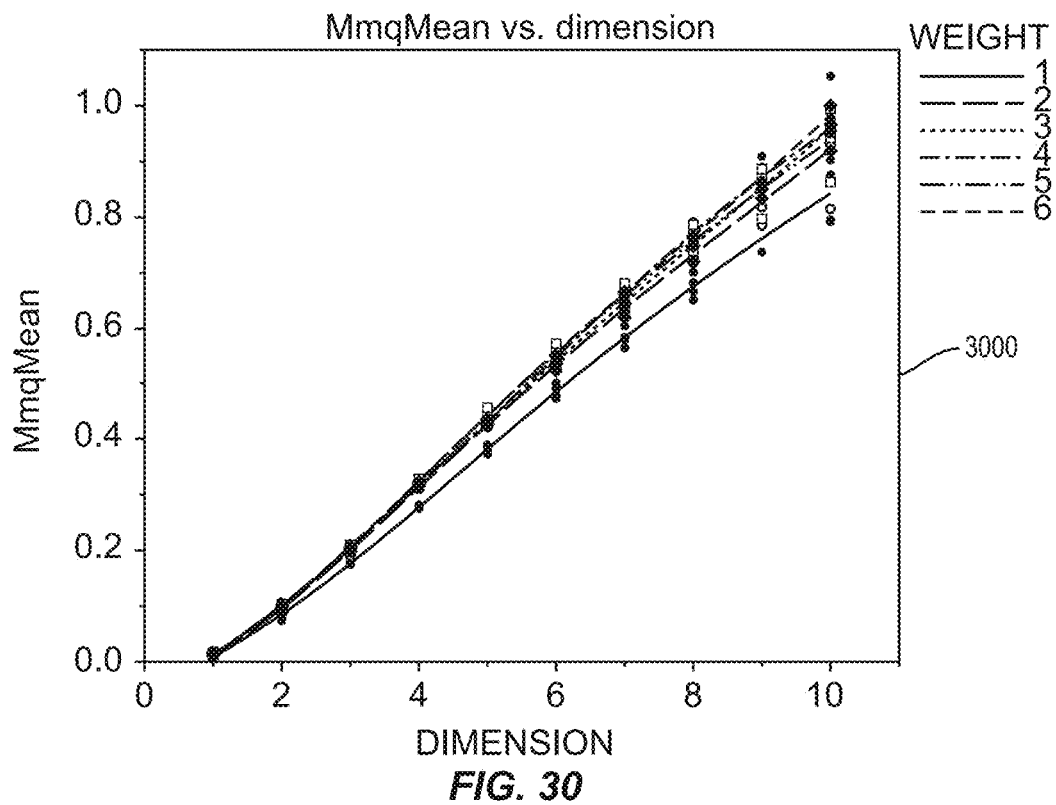
FIG. 30 illustrates an example of a comparison of performance of different weights for a sub-design in at least one embodiment involving design point replacement.

FIG. 30 shows a graphical comparison 3000 of the average $Mm_q$ values for all the sub-designs for SLHD and FFF weighted with weights ranging from 1 to 6. Both approaches are applied to a 200-run design with 10 continuous factors and a 4-level categorical factor across design spaces of different dimensions ranging from 1 to 10. A smoother is applied to the line's connecting the plotted points to get an idea of the fit. For the sub-designs, using a weight of 1 is notably worse than putting any weight on improving sub-designs (i.e. a weight>1).

Figure 31:
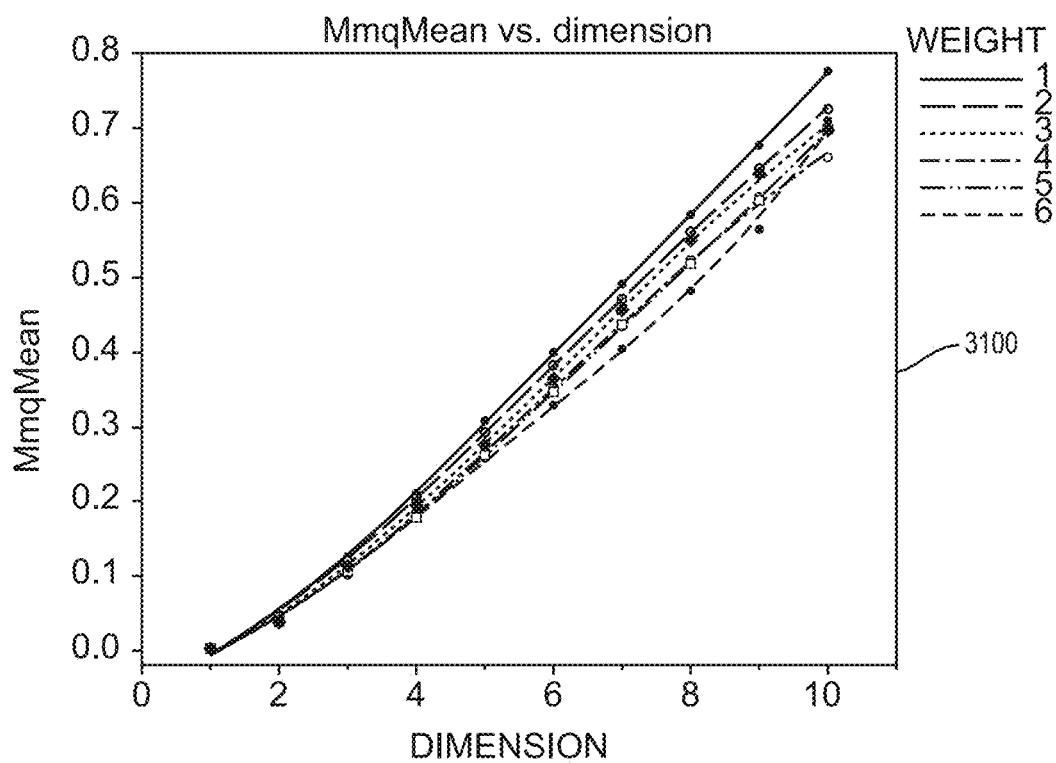
FIG. 31 illustrates an example of a comparison of performance of different weights for a design in at least one embodiment involving design point replacement.

FIG. 31 shows a graphical comparison 3100 of the $Mm_q$ value for the overall design for SLHD and FFF weighted with weights ranging from 1 to 6. Both approaches are applied to a 200-run design with 10 continuous factors and a 4-level categorical factor across design spaces of different dimensions ranging from 1 to 10. For the overall-design, a weight of 1 is best, as expected since this does not favor the sub-designs over the designs, but if the categorical factor is considered important, the tradeoff is not extreme.

As shown in FIGS. 29-31, one or more embodiments improve traditional computer approaches to space-filling designs for experiments. Computations of $Mm_q$ allow experimenters to try differing weights and compare the designs to decide what tradeoffs are preferable in optimizing the overall space-filling design or the space-filling design of individual sub-designs.

Space-filling designs are typically employed for experiments to select several different inputs for a given factor distributed across the design space. For example, if the experiment is a strain experiment on a bottle, the design space may be a model of a bottle, and a factor for the experiment could be a location on the bottle to apply a test strain. The researcher will want to design the experiment to test several different locations to apply the strain on the bottle. Each of design points of the space-filling design could then correspond to a design case in a design suite for designing the experiment according to the space-filling design.

In other applications, it may be useful to provide a design that narrows the design of a system (i.e. a designed system) to a particular design case or a limited number of the design cases. One or more embodiments are directed to outputting a design case using a space-filling design as a starting point for selecting the design case. A design case can be selected that optimizes some criteria of interest for the system (e.g., based on an evaluation of a response for the system). This approach is particularly helpful when the possible options for a factor are very high (e.g., when a factor can be assigned a value from one of a range of continuous values).

Figure 32:
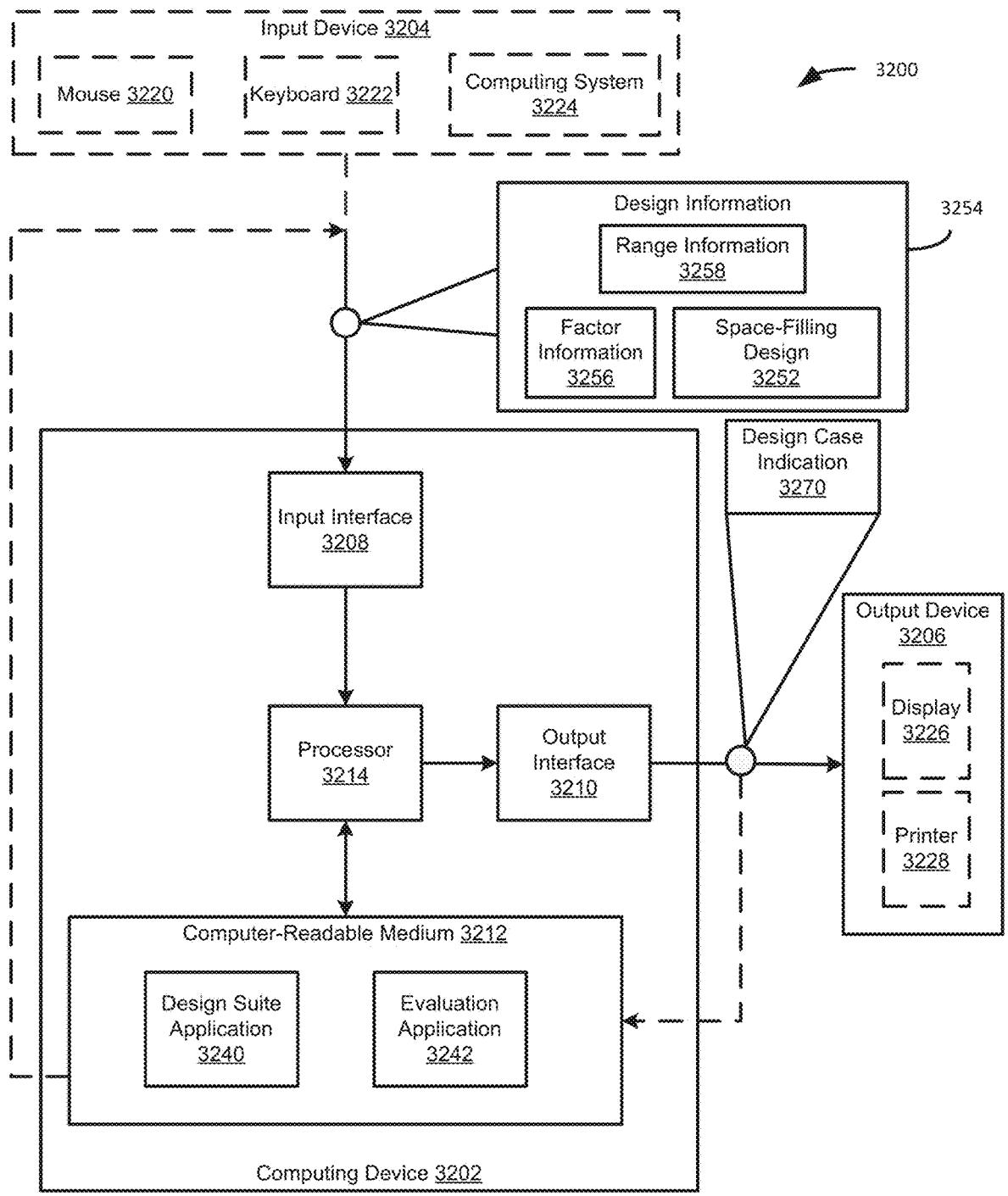
FIG. 32 illustrates an example block diagram of a system for outputting a selected design case in at least one embodiment of the present technology.

FIG. 32 illustrates a block diagram of a system 3200 for outputting an indication 3270 of a selected design case using a space-filling design 3252 (e.g., generated using a traditional or improved approach to space-filling designs described herein). The system 3200 includes a computing device 3202 useful for outputting an indication 3270 of a selected design case. In one or more embodiments, the computing device 3202 is the same or different from computing devices described herein (e.g., computing device 1302). The indication 3270 of the selected design case could be used to design a designed system (not shown in FIG. 32).

The system 3200 is configured to exchange information related to designing a designed system between devices (e.g., output device 3206) in the system 3200 (e.g., via wired and/or wireless transmission) and/or devices in other systems described herein (e.g., system 1300). For example, a network (not shown) can connect one or more devices of system 3200 to one or more other devices of system 1300. In one or more embodiments, fewer, different, and/or additional components than shown can be incorporated into the system 3200 (e.g., components of system 1300).

In one or more embodiments, the computing device 3202 receives design information 3254 related to designing a designed system (not shown in FIG. 32). For example, in one or more embodiments, the design information 3254 comprises factor information 3256 indicating multiple factors for designing a system. The design of the system is designed by assigning one of respective possible options to each of the multiple factors. In one example, a user of the system 3200 is designing a factory or computer model of a factory with products moving on a conveyor belt. The user designing the factory system many need to determine how fast a conveyer belt in the factory operates or how many units go through a check point station before a quality check. In another example, the designed system could be a system employing an algorithm with values assigned for the factors affecting how the algorithm is structured or used. One example of an algorithm is a machine learning algorithm where hyperparameters define the system by controlling the behavior of the machine learning system employing the machine learning algorithm.

In one or more embodiments, the design information 3254 comprises range information 3258 indicating a range for respective possible options for the multiple factors. For example, a factor may be continuous like the speed at which the products move on the conveyer belt, but constrained to within certain reasonable speeds to ensure quality production. For example, the possible options for the speed could be a value between 1 meter per second (m/s) to 2 m/s. A factor may be discrete. For example, a categorical factor is a discrete factor where levels correspond to different options within the category of the categorical factor. An example, of a categorical factor is different types of products on the conveyer belt, and the different levels could correspond to different product types (e.g., metal, plastic, paper) and be within a range. An example of a nominal categorical discrete factor could be the number of units that pass through before a quality inspection and could be constrained to a range with discrete numbers between 100 and 200 units.

In one or more embodiments, the range information 3258 defines a design space. For example, if a factor defines a dimension of a design space, the range information for that factor limits the expanse of that dimension. Representative design points along that dimension correspond to possible options for that factor.

In one or more embodiments, the design information 3254 comprises a space-filling design 3252 for the design space (e.g., a space-filling design constructed as described herein in which design points are selected from representative points within the design space). A space-filling design as described herein indicates selected design points in the design space. For instance, the space-filling design could itself provide design cases corresponding to the selected design points. Each of the selected design points represents assigned options assigned to the multiple factors. The assigned options are assigned within the ranges defined in the range information 3258.

As described in more detail above, in a space-filling design, points are spread out within the design space (e.g., in all dimensions). Points may be spread out or separated from one another in the design space based on a criterion for separating the selected design points in the design space.

In one or more embodiments, the input interface 3208 comprises one or more features of an input interface described herein or is an input interface described herein (e.g., input interface 1308). In one or more embodiments, the system 3200 comprises one or more devices from which to receive or obtain the design information 3254. For example, the design information 3254 could be received from a user of the system 3200. For example, it is received via one or more input devices 3204 (e.g., using a mouse 3220, keyboard 3222 and/or computing system 3224) or other input devices for providing information to a computing device.

Additionally or alternatively, the design information 3254 is obtained from one or more default values stored in the computing device 3202 (e.g., in computer-readable medium 3212) or generated by the computing device 3202. For example, in one or more embodiments, the computing device 3202 itself generates or stores a space-filling design 3252 as described herein. In the case of the machine learning algorithm, the hyperparameters that control the machine learning algorithm may be known or executed by the computing device 3202 and default factors and ranges for those factors could be stored at the computing device 3202. For example, if the machine learning algorithm uses a tree algorithm a factor might indicate the maximum depth of a tree. Default values for this factor could be a discrete nominal value between 3 and 9. The input interface 3208 may be an internal input interface or may receive the design information 3254 by receiving from the user of the system 3200 accept an indication of one or more default factors or ranges stored at the computer-readable medium 3212.

In one or more embodiments, the computer-readable medium 3212 comprises one or more features of one or more computer-readable mediums described herein or is one of computer-readable mediums described herein (e.g., computer-readable medium 1312). In one or more embodiments, the computing device 3202 has a processor 3214 (e.g., processor 1314). For instance, the processor 3214 comprises one or more features of one or more processors described herein or is one of processors described herein (e.g., processor 1314).

In one or more embodiments, computer-readable medium 3212 stores instructions for execution by processor 3214. For example, computer-readable medium 3212 comprises instructions for generating a design suite, generating evaluations of design cases of the design suite, and outputting an indication of a selected design case.

For example, in one or more embodiments, the computer-readable medium 3212 comprises a design suite application 3240 that obtains a space-filling design 3252 for a design space and generates, based on the space-filling design, a design suite (e.g., an initial design suite). For instance, an initial design suite provides initial design cases corresponding to one or more of selected design points of the space-filling design 3252 or other indications of design cases for the initial design suite. Each element of a respective design case of the initial design suite is one of the assigned options represented by a selected design point of the one or more selected design points. For example, if a design point for a factory design corresponds to a conveyor belt speed of 1.75 m/s, 125 units before a quality inspection, and a metal product line, then the design case would have an element representing the assigned speed of 1.75 m/s, an element representing the 125 units, and a level associated with metal product line.

Alternatively or additionally, the computer-readable medium 3212 comprises an evaluation application 3242 for generating evaluations of design cases of a design suite (e.g., an initial design suite). In one example, the design cases are evaluated by modeling respective responses of a simulated designed system according to each of the design cases. Each of the responses corresponds to an operation of the system defined by each element of a given respective initial design case of the initial design suite. A case can then be selected from these evaluations that are predicted to optimize the response according to some measure of interest. For example, in the context of a machine learning algorithm, the modeling may be used to evaluate the predictions of the machine learning algorithm. One metric that can be computed is a coefficient of determination ($R^2$) that provides the indication of the fit of a set of predictions by the machine learning algorithm to actual values. This metric traditionally provides a value between 0 for no fit and 1 for a perfect fit. A coefficient of determination could be computed for each of the design cases, and one or more design cases that are closest to a perfect fit or above some threshold set by an optimality criterion can be selected for further evaluation or for output. Alternatively or additionally, this information is used to generate a design suite.

In one or more embodiments, the computing device 3202 outputs an indication 3270 of a selected design case. The selected design case can be based on the evaluations of design cases by the computing device 3202. The indication could be the output design itself. For example, the output design could indicate or set each of design options for multiple factors of the selected design case. As another example, the indication could indicate a design case identification (e.g., a design case number) to identify a particular selected design cases in a set or suite of design cases. Output interface 3210 and output device 3206 could be one of or comprise features of output interfaces (e.g., output interface 1310) and output devices (e.g., output device 1306) described herein. For example, output device 3206 may comprise a display 3226 or a printer 3228 for communicating the selected design case to a user of the system 3200.

Alternatively or additionally, the output interface 3210 is an internal interface and feeds information back to the computing device 3202 for further evaluation or for setting or modifying design information 3254.

Figure 33:
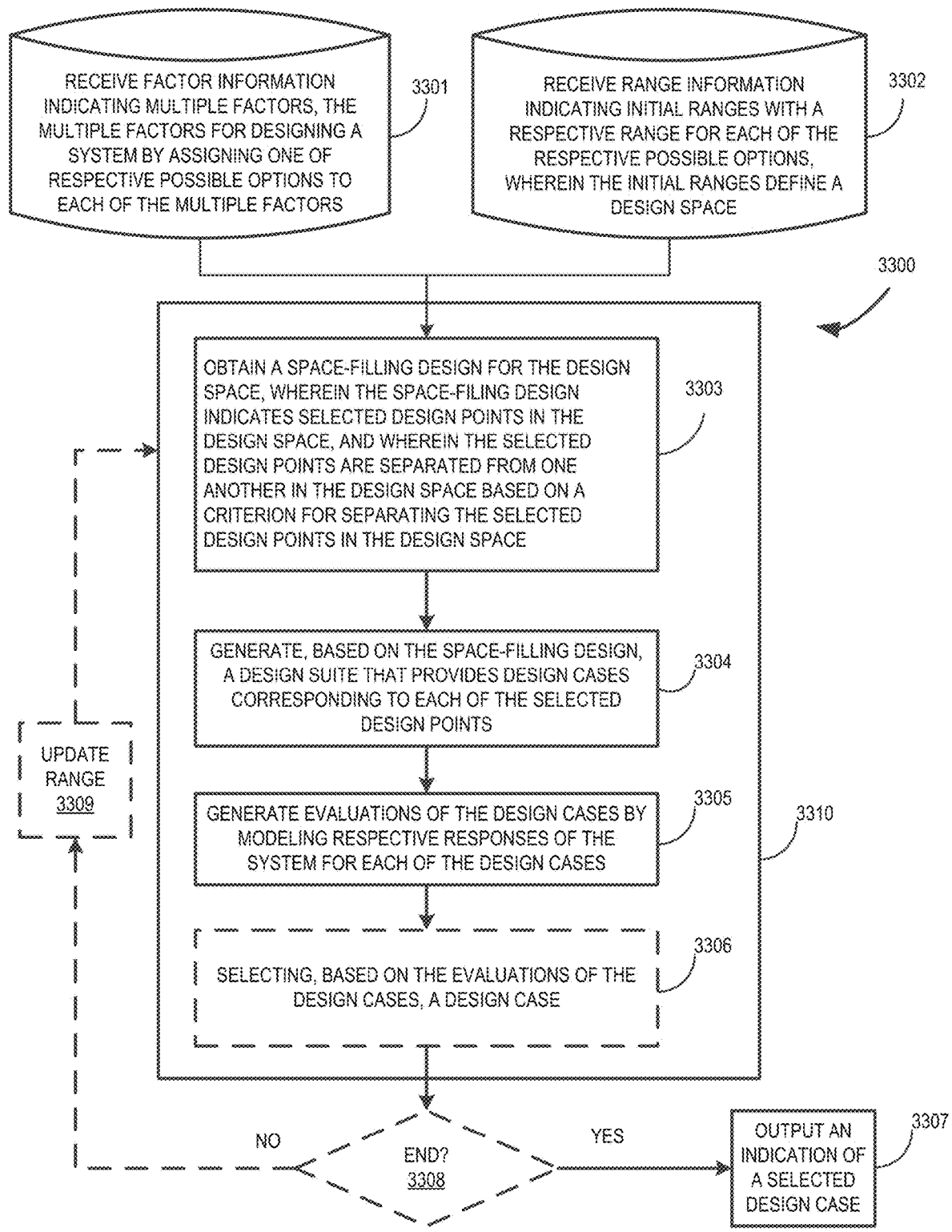
FIG. 33 illustrates an example flow diagram for outputting a selected design case in at least one embodiment of the present technology.

In one or more embodiments, the system 3200 implements a method as described herein (e.g., method 3300 shown in FIG. 33 for selecting a design case).

FIG. 33 illustrates a flow diagram for outputting a selected design case. An operation 3301 of method 3300 comprises receiving factor information indicating multiple factors. The multiple factors are for designing a system by assigning one of respective possible options to each of the multiple factors. An operation 3302 of method 3300 comprises receiving range information indicating initial ranges with a respective range for each of the respective possible options. The initial ranges define a design space.

In one or more embodiments, at least one of the multiple factors is a continuous factor that defines continuous values within a given range of the initial ranges. Alternatively or additionally, the multiple factors comprise a factor with discrete options. For example, the multiple factors comprise a categorical factor defining discrete design options for the system within a category of the categorical factor. For example, the category is product material and the discrete design options comprise different materials (e.g., metal, plastic, paper, etc.). As another example of factors with discrete options, the multiple factors could comprise a partitioned factor that is a continuous factor partitioned into partitions using, for instance, equivalence partitioning or taking nominal values within the continuous range. In these cases, a computing device, can assign level values to each of the discrete design options. The assigned level values can be nominal values within a respective initial range.

An operation 3303 of method 3300 comprises obtaining a space-filling design for the design space. The space-filing design indicates selected design points in the design space. The selected design points are separated from one another in the design space based on a criterion for separating the selected design points in the design space.

Initially, each of the selected design points represents assigned options assigned to the multiple factors where the assigned options are assigned from the initial ranges. In one or more embodiments, the initial ranges are refined or updated (e.g., using the method 3300).

An operation 3304 of method 3300 comprises generating, based on the space-filling design, an initial design suite that provides initial design cases corresponding to one or more of the selected design points. Each element of a respective design case of the initial design suite is one of the assigned options represented by a selected design point of the one or more of the selected design points.

An operation 3305 of method 3300 comprises generating evaluations of the initial design cases by modeling respective initial responses of the system for each of the initial design cases. Each of the respective initial responses corresponds to an operation of the system defined by each element of a given respective initial design case of the initial design suite.

An operation 3306 of method 3300 optionally comprises selecting, based on the evaluations of the design cases, a design case. An operation 3307 of method 3300 comprises outputting, based on the evaluations of the initial design cases, an indication of a selected design case.

In other embodiments, a design case is not selected or is only temporarily selected in order for further refinement and evaluation before outputting an indication of a selected design case.

An operation 3308 of method 3300 optionally comprises determining whether to end the operations in the evaluations period 3310 in the method 3300. If the evaluation period 3310 is ended, an output of an indication of a selected design case is performed in operation 3707. If the evaluation period 3310 is repeated, one or more ranges can be updated from the initial range in an operation 3309 of method 3300.

For example, if the range information received in operation 3301 indicates a first range of the initial ranges for an experimental factor of the multiple factors, the operation 3306 can comprise selecting, based on the evaluations of an initial design cases in operation 3305, a first design case with a first design option for the experimental factor. The operation 3309 comprises determining an updated range for the experimental factor. The updated range comprises the first design option and the updated range is a subset of the first range.

In this way, the method 3300 can be used to explore or experiment with design options around a particular factor or factors of a design case. For example, the range information received in operation 3301 or in a separate operation could be used to obtain a predefined percentage for each respective initial range. Then operation 3309 comprises determining the updated range for the experimental factor by using the predefined percentage to determine the subset of the first range around the first design option.

Operation 3309 is described as updating a range for a given factor, but an updated range can be selected for more than one or all of the factors of the multiple factors such that each of respective updated ranges for the factors is a subset of an initial range corresponding to the same factor.

One of ordinary skill in the art will appreciate that these operations could be performed in a different order than presented here without departing from the method. For example, operation 3301 could occur before, after or simultaneously with operation 3302. An operation 3308 to determination whether to end the evaluation period 3310 could be performed after or simultaneously with an operation 3309. In addition operations described herein could be combined or broken into intermediate operations.

In one or more embodiments, method 3300 is used to update ranges to narrow the possible design space in operation 3303. For example, in one or more embodiments where a range is updated for at least one factor (e.g., an experimental factor), the operation 3303 comprises determining an updated design space defined by the updated range for the experimental factor. A space-filling design is then obtained that is an updated space-filling design based on a criterion for separating selected design points in the updated design space.

In the same or different embodiment, where a range is updated for at least one factor (e.g., an experimental factor), the operation 3304 comprises generating an updated design suite that provides updated design cases for the system according to the updated range or ranges. For example, the operation 3304 comprises generating the updated design suite based on the updated space-filling design. Each element of an updated design case corresponds to one of the multiple factors. If the range is updated for the experimental factor, one element of each of the updated design cases corresponds to the experimental factor and is selected from the updated range for the experimental factor.

Operation 3305 can be used to generate evaluations of the updated design cases by modeling respective updated responses of the system for each of the updated design cases. Each of the respective updated responses corresponds to an operation of the system defined by each element of a given updated design case of the updated design suite.

In this case where further refinement is executed to produce updated design cases, the operation 3307 can be used to output the indication of the selected design case, based on the evaluations of the updated design cases as well. In this way, the evaluation period 3310 can be used iteratively to select a design case.

For example, operation 3308 can be used to determine how many iterations of the evaluation period 3310 are left for refining a range of initial ranges received in the range information in operation 3302. The operation 3309 can be used in conjunction with operation 3308 to set a refined range that is a subset of a range of a previous updated design suite. In this way the method 3300 can be used to iterate through the evaluation period 3310 to evaluate a further updated design suite. For example, the evaluation period 3310 can be used to generate a further updated design suite that provides design cases for the system according to the refined range and generate evaluations of the further updated design cases by modeling respective responses of the system for each of the further updated design cases. Each respective response corresponds to an operation of the system defined by each element of a further updated design case of a further updated suite. The operation 3306 of evaluation period 3310 can be used to select, based on the evaluations of the further updated design cases, a design case. After each iteration of the evaluation period 3310, it can be determined whether to update the refined range based on the selected design case and output, based on the updated design suite, an indication of a selected design case by outputting an indication of a selected design from the further updated design cases.

The number of iterations can be determined by one or more of the following ways. A computing device (e.g., computing device 3202) can set the iterations by obtaining an indication of a number of iterations for updating the initial design suite. For example, a user or the computing device may determine limitations on how much processing capabilities to devote to searching for an optimal design case. Alternatively or additionally, the number of iterations is set based on obtaining a threshold for evaluating a response of the system defined by updated options of each of the design cases of the further updated design suite. For example, there may be an evaluation of a design case that is good enough that no further refinement is really needed, and it would save processing capabilities to end the evaluation period 3310. Other examples of how to set the number of iterations are possible (e.g., as described in more detail in the examples that follow).

In one or more embodiments, a computing device (e.g., computing device 3202) is configured to display, on a display device, a graphical user interface for user entry or modification of user information in the graphical user interface. For example, the user information could include one or more of factor information, range information; and a number of design cases for a given design suite. The computing device, receives, from a user of the graphical user interface (e.g. via one or more input devices) user input indicating the user information.

For example, FIGS. 34A-B illustrate an example of a graphical user interface 3400 for controlling generation of a design suite. The graphical user interface 3400 is used in the context of designing a system for a machine learning algorithm. This is merely an example, and the graphical user interface 3400 could be used for designing other systems. Given its application, the factors 3404 are hyperparameters which are parameters whose settings affect the learning algorithm. In this case, selecting a design case is used as part of hyperparameter tuning, which involves finding an optimal set of options or values for the hyperparameters for a given problem.

An objective 3402 is set for the machine learning algorithm. In this case, a regression with squared loss is selected for the learning task objective. This could be an objective provided by XGBoost. XGBoost is an optimized distributed gradient boosting library that implements machine learning algorithms under the Gradient Boosting framework. XGBoost can be run in distributed environments (e.g., a parallel processing database provided by Hadoop®).

Current or default options 3406 are assigned for each of the factors 3404. For example, the maximum depth of a tree is assigned a value of 6. In one or more embodiments, these are default hyperparameter values stored in a computing system. For example, the window in graphical user interface 3400 could be presented with a launch dialog for XGBoost (e.g., after selecting responses, inputs and validation column(s)). Embodiments described herein can be implemented using or integrated with data analytics software application(s) and/or software architecture such as software tools offered by SAS Institute Inc. of Cary, N.C., USA described herein (e.g., JMP®).

In one or more embodiments, a selection can be made in the graphical user interface 3400 to control a computing device to find better parameters (e.g., by checking the tuning design checkbox 3450). In the examples shown in FIGS. 34A-34B, only the main set of hyperparameters are shown for this machine learning algorithm, but one could extend this to any number of additional hyperparameters or apply these techniques to a different algorithm that requires a different set of hyperparameters.

Clicking the tuning design checkbox 3450 may cause the graphical user interface 3400 to present default ranges for each of the hyperparameters specifying the minimum and maximum under consideration. The text boxes in this graphical user interface 3400 can be editable for users to modify. In an alternative embodiment, one or more hyperparameters may be prevented from modification (e.g., a setting controlled by a checkbox if an administrator does not want the value to change). Similarly, restrictions can be placed on the number of levels that can be taken on by a hyperparameter. For example, there may be a maximum spread between the minimum and maximum values to control the size of a design space and therefore processing time to select a design case.

Under traditional approaches to exploring options for factors within a defined hyperparameter space, practitioners took a grid approach (i.e. checking different values within the range at regular intervals) or random sampling (i.e. randomly selecting values within the range). One or more embodiments, improve this by taking a design of experiments approach (e.g., by using space-filling designs to choose the options for the hyperparameters). In this example, where the factors had continuous input options, a fast flexible space-filling design using the MaxPro criterion can be used to generate a space-filling design.

For example, the computing device (e.g., computing device 3202) can obtain a space-filling design by mapping the design space onto a matrix with rows and columns. The computing device can determine primary clusters for the design space, each containing a different set of representative design points that is mutually exclusive of representative design points in other primary clusters of the design space. The computing device can select the selected design points by selecting a representative design point from each primary cluster that minimizes a MaxPro criterion based on:

$$\min_{D} \psi(D) = \left\{ \frac{1}{\binom{n}{2}} \sum_{i=1}^{n-1} \sum_{j=i+1}^{n} \frac{1}{\prod_{l=1}^{p} (x_{il} - x_{jl})^2} \right\}^{1/p}$$

where $\psi(D)$ is the criterion; i, j, l are integer counters; n is an integer number of primary clusters for the design space; p is an integer number of continuous variables for the design space; and $x_{ab}$ is an entry in row a and column b of the matrix.

Alternatively, other approaches could be used to determine a space-filling design. If there are categorical factors for example, a space-filling design can be constructed using techniques described herein (e.g., a modified MaxPro criterion). Alternatively approaches to space-filling designs include minimax or maximin Latin hypercube designs or designs using any other space-filling criterion besides a MaxPro criterion. In this example, a MaxPro criterion is selected due to its better projection properties for lower-dimensional projections. That is, if a smaller subset of hyperparameters has a larger impact on the algorithm, a MaxPro design does a better job of spreading out design points in that projection.

In one or more embodiments, a user is able to specify a minimum and a maximum of a range 3452 for one or more of the inputs. For example, as shown in FIG. 34B, the user can edit range 3452A and 3452B. These ranges will define the design space. Additionally, or alternatively, more than one range could be selected for a factor. For example, the range 3452B could include multiple ranges (e.g., a range from 1-4 and a range from 8-10).

Figure 34C:
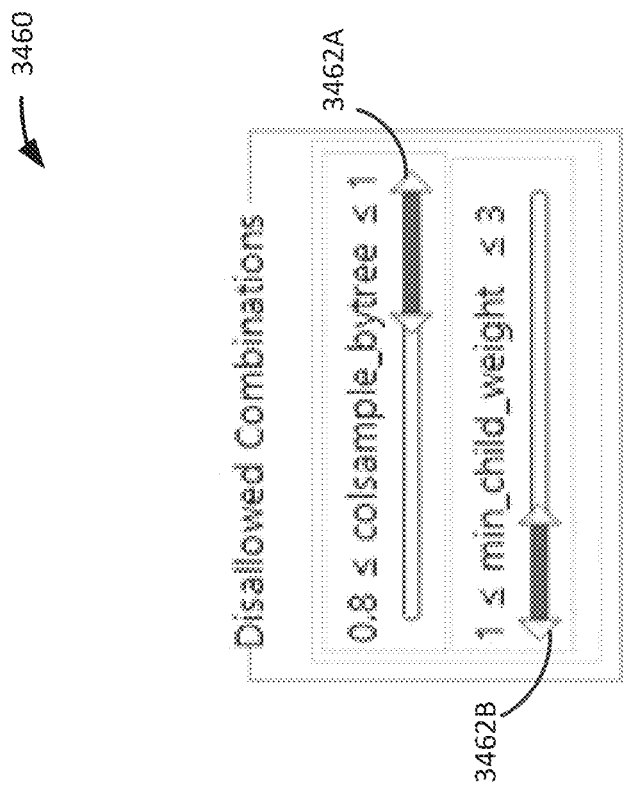
FIG. 34C illustrates an example graphical user interface for disallowing combinations in at least one embodiment of the present technology.

Alternatively or additionally, a computing device can receive restriction information indicating disallowed options within a given respective range of the range information; and obtain the space-filling design by restricting potential design points of the design space that represent disallowed options in the design space. For example, a disallowed combinations option 3454 may be selected to provide instructions to a computing device (e.g., script from a user) disallowing combinations involving two or more factors. FIG. 34C shows an example of a graphical user interface 3460 for using a slide bar 3462 to input disallowed combinations within the range 3452A for factor colsample_bytree and range 3452B for factor min_child_weight. In the example shown in FIG. 34C, when factor colsample_bytree is assigned a value between 0.8 and 1, factor min_child_weight is not allowed to be assigned a value between 1 and 3.

In one or more embodiments, a user is able to indicate a number of design cases to generate for a design suite. In this example, the graphical user interface 3400 comprises an editable run field 3456 for a user to select the number of design cases.

A button can be selected to indicate the user is ready to generate a design. In this case when the user hits the "Go" button 3458, a computing device generates a design with the specified number of runs (i.e. the number of combinations of hyperparameters to evaluate) in the run field 3456. For example, when the tuning design checkbox 3450 is checked, the "Go" button initiates the creation of a design suite and uses the hyperparameter settings from the design cases of the design suite to invoke XGBoost for each run or design case of the design suite.

FIG. 35 illustrates a display 3550 with an example of a portion of a design suite 3500 generated according to one or more techniques described herein. Each row of the design suite 3500 represents different design cases with different options selected for each of the factors. For this example, only 17 cases are shown of the 20 cases selected in the run field 3456. Further, for simplicity, the selected options are shown as rounded values. Each of the design cases have been modeled for a response of the machine learning algorithm according to the options provided in the design suite 3500. The design cases can be modeled using one or more modeling techniques including gradient boosted tree, a Gaussian process, or a neural network and evaluations 3502 provided for each of the models. Other modeling techniques can be used (e.g., provided by JMP® and XGBoost). A response, such as validation R-square, is used to evaluate the model.

FIG. 36 illustrates an example of a graphical user interface 3600 for controlling an indication of a selected design case. A portion of design suite 3500 is shown with less rounding of options compared to the display 3550. One or more embodiments provide a graphical user interface 3600 with space-filling design control 3602 to allow control of the space-filling design (e.g. to select how the space-filing design is generated). Alternatively or additionally a computing device can select or provide a default space-filling design technique.

In the same or different embodiments, the graphical user interface 3600 provides a factor control 3604 to control the factors implemented in the modeling (e.g., to exclude factors that the user is less concerned about impacting the response). In the same or different embodiments, the graphical user interface 3600 provides a design case control 3606 to control the design cases implemented in the design suite (e.g., to exclude design cases that a user anticipates will not produce desirable responses or select design cases that a user anticipates will produce desirable responses).

In one or more embodiments, one or more design cases can be selected from the design suite 3500 based on the evaluation of the responses.

In the same or different embodiments, a computing device (e.g., computing device 3202) determines, based on the evaluations of the initial design cases, the first design case by generating a generated design case different than all of the design cases of the design suite. For instance, the design suite can be used as a starting point for another hyperparameter optimization technique such as AUTOTUNE.

Figure 37:
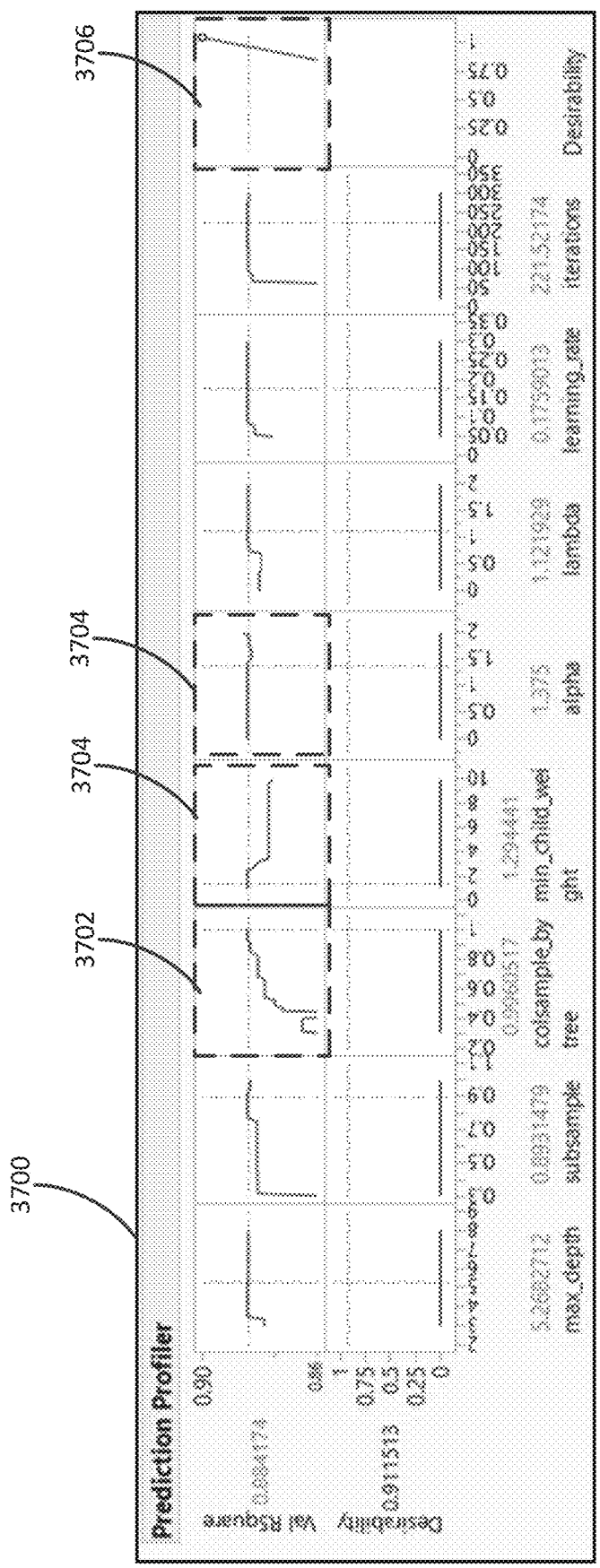
FIG. 37 illustrates an example of model results for individual factors in at least one embodiment of the present technology.

FIG. 37 illustrates an example of model results predicted, in a prediction profiler 3700 from XGBoost, for individual factors of design suites based on model responses of the design suite. As shown in FIG. 37, design options for a new design case different than the design cases of the design suite is selected that maximize a desirability of the response, plotted in graph 3706.

For instance, a correlation of individual design options and the evaluations of the initial design cases is determined to help select design case(s). For instance, as shown in graph 3702 at higher values for the factor colsample_bytree there is a correlation with a predicted higher response value. In graph 3704, lower values of factor min_child_weight show a correlation with a predicted higher response values. Therefore, a design case may be generated that has higher values for factor colsample_bytree and lower values for min_child_weight.

In the same or different embodiment, it may be useful to select more than one design case. For example, as shown in graph 3702, there are high predicted response values for values at the edges of the range of options for the factor alpha. In this case it might be useful to select, based on the evaluations of the design cases, a subset of the initial design cases or multiple generated design cases (e.g., generated from this subset). Design suites can be generated for each of the selected design cases for evaluating respective responses of the system defined by updated options of each of the generated design suites. A design case can be selected or generated from one of the different design suites based on an evaluation of one or more of the design suites. This may be useful for exploring different design points or aspects of a range in parallel (e.g., different edges of a range).

Figures 38A, 38B:
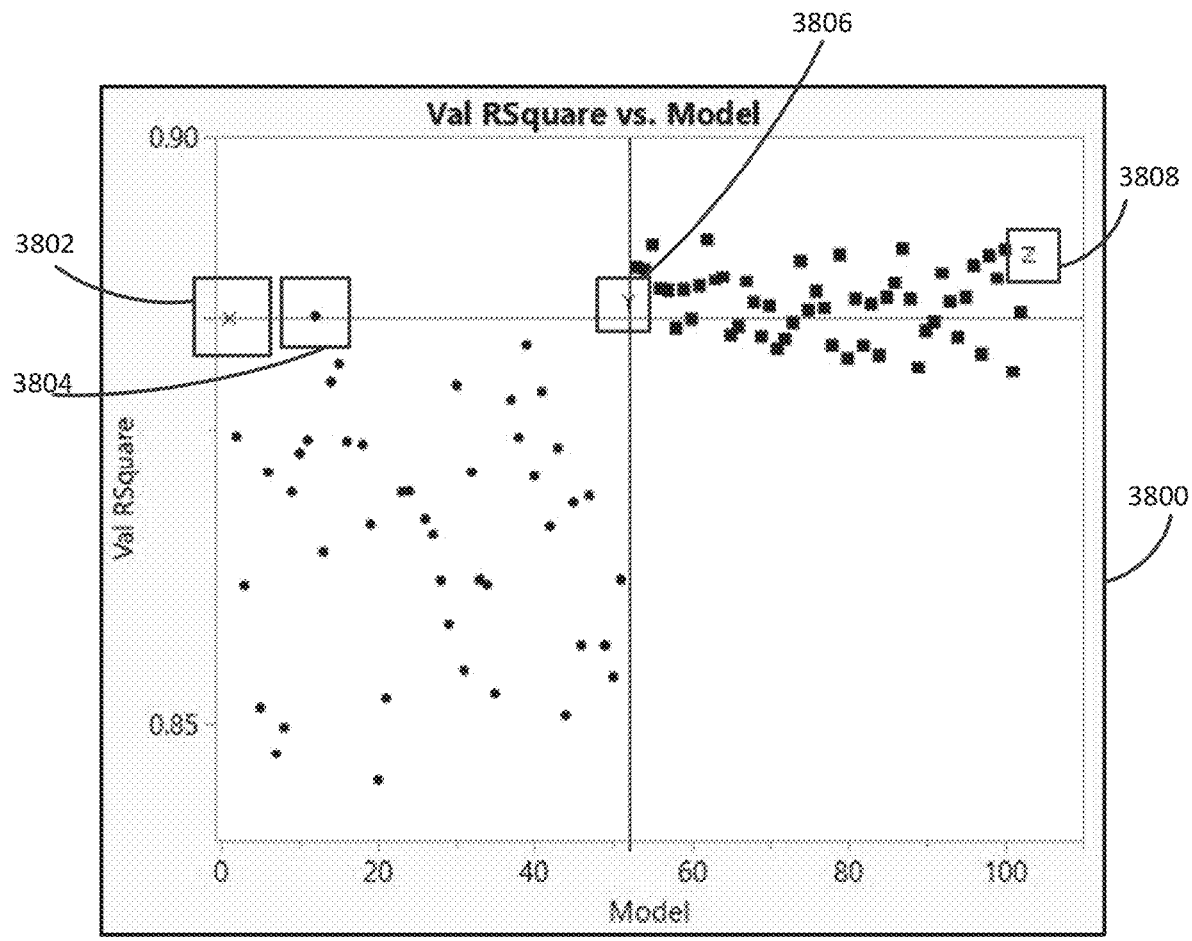
FIGS. 38A-B illustrates an example of model results for design suites in at least one embodiment of the present technology.

FIGS. 38A-B illustrates an example of model results or prediction for multiple iterations of evaluating design suites.

While the original space-filling design is intended to search over the larger hyperparameter space, as shown in FIGS. 38A-38B, a computing device can use the best hyperparameter settings from the original design to construct another space-filling design over a narrower region. This leads to an iterative process, where one would narrow the range for each parameter for each iteration (e.g. until there is no further improvement). While this may be time consuming if the model is expensive to fit, for cases where multiple iterations are feasible, one could let the iterative process continue for the available time.

FIG. 38A shows a first model at point X in location 3802 based on the default set of values for designing the system. FIG. 38B shows a portion of the corresponding responses 3852 for each of the models in a graphical user interface 3850 for comparing model evaluations. Fifty models (models 2-51) were generated based on model 1 for further testing using a space-filling design. The evaluations for these models are plotted in FIG. 38A. As shown in FIG. 38B, the best model from this set is model 12 and is plotted at a point in location 3804 in FIG. 38A.

Model 52 is generated from using XGBoost on Val Rsquare from Models 1-51. A combination of design options for all elements of this design case corresponding to Model 52 are different from any combination of design options for elements of the design cases of the initial design suite. Model 52 is plotted at point Y in location 3806 and results in a slightly better evaluation than model 12, so it is selected as a starting point for generating a new design suite for models 53-102 roughly centered about Model 52 (ad hoc).

Model 103 is generated from using XGBoost on Models 1-102. Model 103 is plotted at point Z in location 3808. A different range of models could be used to generate models 52 and 103 (e.g. only models 52-102 to generate model 103 or model results could be ad hoc excluded by a user).

Accordingly, FIG. 38A plots the model results for an interactive process with the following steps: (1) fit the original default hyperparameters; (2) use a space-filling design with the default ranges; (3) use XGBoost (or some other modeling technique) with the desired objective function based on the hyperparameters and maximize desirability with the profiler (or other optimization operation); (4) Use a space-filling design centered around the best hyperparameter settings from step 3 but with smaller ranges; (5) repeat steps 3 and 4 for a specified number of times, or until no improvement is found to the objective function.

In one or more embodiments, there are further possible refinements of this approach. The ranges in (4) can be dictated by importance metrics derived by the modeling. Other possibilities are to add additional validation columns in additional iterations through (5) or using (4) centered around a few different points that look promising, and to consider more than one type of evaluation for each model (e.g., different metrics).

From FIG. 38A, the original tuning table or design suite only has one point that is close to the default hyperparameter settings. The predicted optimal model 52 ends up being better than anything observed in the set of models 2-51. In the second tuning table or design suite (models 53-102), many of the observed models are better than the default model in that they resulted in higher evaluations of value R Square (Val RSquare). By performing a second iteration, an improved region for options is found. However, the further iteration in this case yielded no significant improvement for this example.

In one or more embodiments, a computing device can compute a comparison result by comparing the evaluation of a design case (e.g. model 103) to one or more models of evaluations of previous design cases (e.g., models in the set 1-102). The number of iterations of generating design suites and evaluations can be set based on the comparison result. In this case, no further iterations are likely to produce better results given the number of observed models that resulted in better or roughly equal evaluations as a generated design case. Additionally, or alternatively, a graphical user interface can display an improved region for options for a user to decide whether to perform another iteration of refinement of the ranges for selecting a design case.

Figure 39:
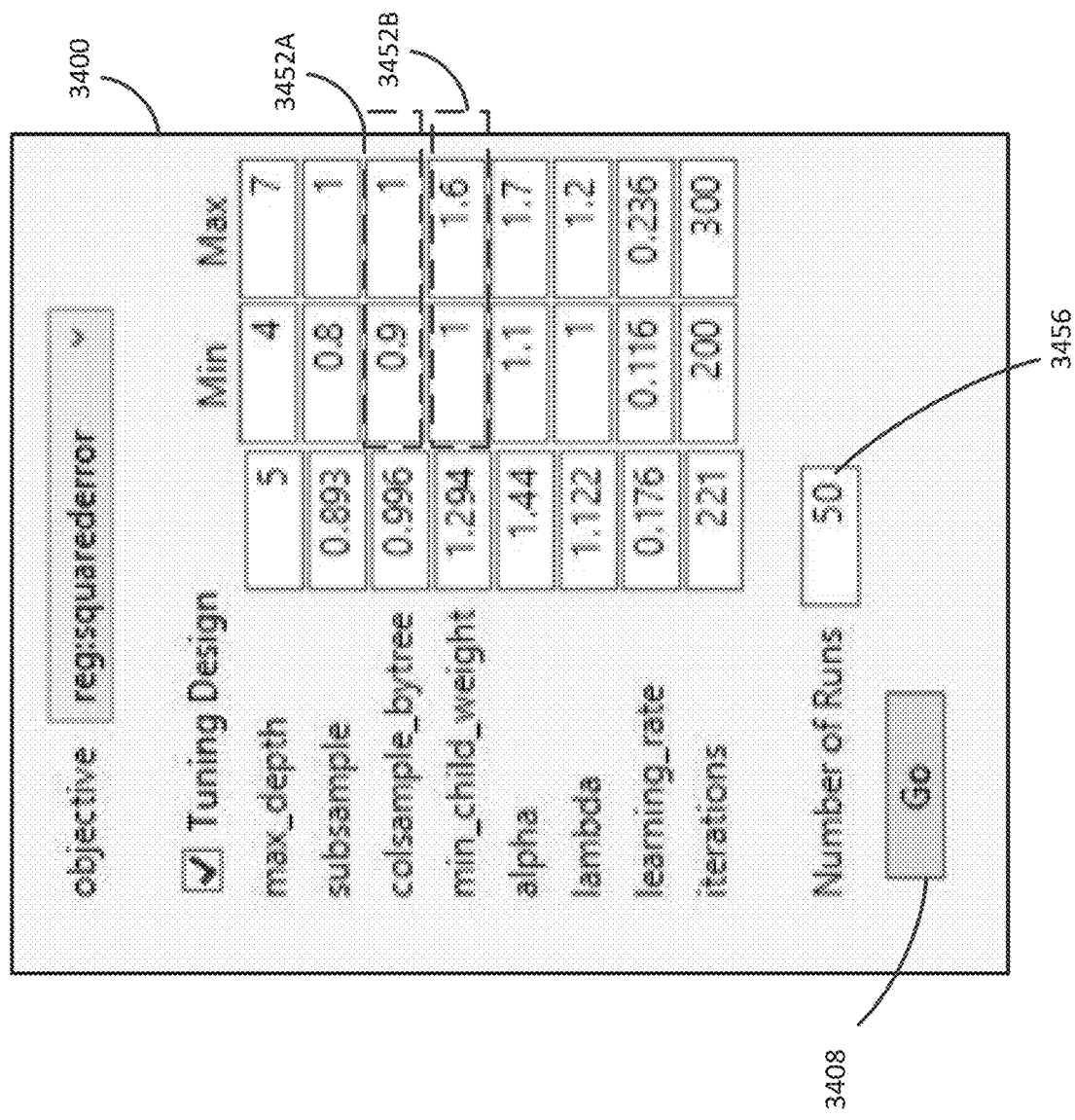
FIG. 39 illustrates an example of a graphical user interface for controlling generation of a design suite in at least one embodiment of the present technology.

FIG. 39 illustrates an example of the graphical user interface 3400 for controlling generation of a design suite. Ranges 3452 have been updated and narrowed as a result of previous tuning. For example, range 3452A shows narrowing around the upper range shown in FIG. 34B, and range 3452B shows narrowing around the lower range shown in FIG. 34B. This comports with the improvements shown in the correlations of FIG. 37.

The user can select runs in run field 3456 for the amount of design cases to generate. In this example, the user has entered a greater amount of runs in run field 3456 than the original iteration shown in FIG. 34B, but the user could have entered less runs or the same number of runs.

Using one or more devices or processes described herein a user can explore an optimal design case for designing a system.

Another goal of a test engineer is to determine if an algorithm or software meets its stated requirements or does what the tester expects it to do (e.g., a configuration validation for a machine learning algorithm). Producers of software also want to validate software to uncover issues with the software before users or customers do. Quality statements about software from manual testing may be incomplete, and a user does not know if the software has been tested for their typical use cases, the type of data they have, and their measure of expectation from the software. A user may even do their own manual testing before software can be distributed to their scientists and engineers.

Complex software systems (e.g., XGBoost a widely used open source gradient boosting library supported in software platforms by SAS Institute Inc. of Cary, N.C.) may have components or algorithms in the software system developed independently by several different development groups and then integrated together (e.g., into a library). Although implementation of the individual algorithms may have been rigorously tested by individual development groups, it may be infeasible to validate an integrated system as rigorously. Furthermore, the software system may provide a set of parameters (e.g., hyperparameters) that allows users to configure a particular algorithm at run time. It may infeasible to rigiously test the configuration space. XGBoost offers thirty-four hyperparameters, some of which are continuous values and so the configuration validation space is infinitely large.

One or more embodiments provide a more reliable, efficient, and easier method for algorithm or software validation by finding any deviations from an expected result without having to test every possible input.

Figure 40:
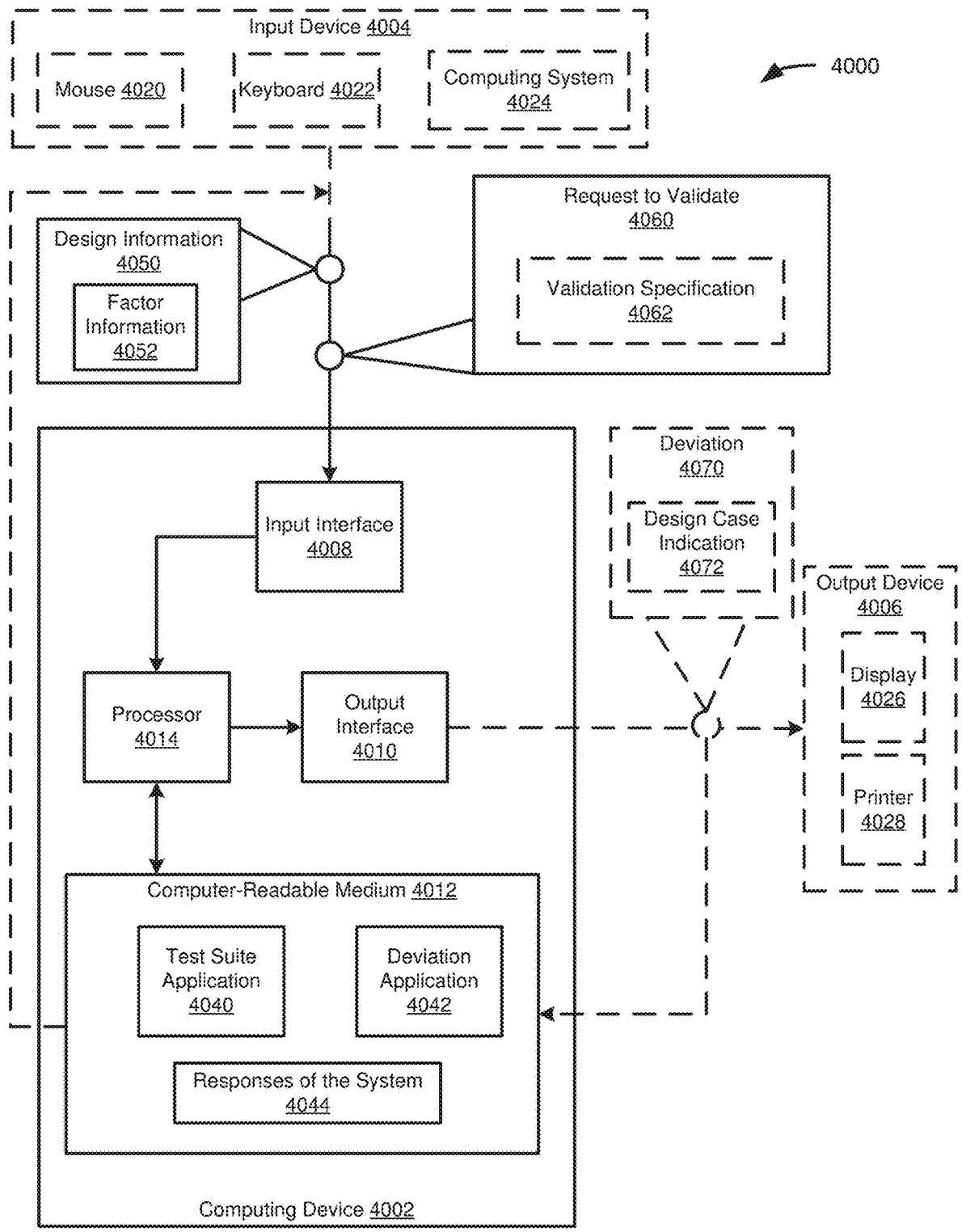
FIG. 40 illustrates an example block diagram of a validation system for locating deviation from a specified result of a validation specification in at least one embodiment of the present technology.

FIG. 40 illustrates an example block diagram of a validation system 4000 for locating deviation from a specified result of a validation specification. For instance, a test engineer testing a system may not want or expect the tested system to stop operating in response to an input. The validation specification for the tested system in operation could be a validation that the tested system will not stop operating. The validation system 4000 includes a computing device 4002 for locating any deviation (e.g., any inputs that would cause a system crash). In one or more embodiments, the computing device 4002 is the same or different from computing devices described herein (e.g., computing device 1302 or computing device 3202). For instance, a test engineer may want to explore a design space to find optimal settings using techniques described herein, and also want to look at edge cases for the inputs that may be problematic (e.g., that cause a crash, processing delays, or poor outputs). The test engineer may want to test for combinations of inputs that induce failures in this regard.

The validation system 4000 is configured to exchange information between devices (e.g., one or more input devices 4004 and/or one or more output devices 4006) in the validation system 4000 (e.g., via wired and/or wireless transmission) and/or devices in other systems described herein (e.g., system 1300 and system 3200). For example, a network (not shown) can connect one or more devices of validation system 4000 to one or more other devices of validation system 4000. In one or more embodiments, fewer, different, and/or additional components than shown can be incorporated into validation system 4000 (e.g., components of system 1300 and/or system 3200).

In one or more embodiments, the computing device 4002 receives design information 4050 related to a system of operation (e.g., for designing a system or operating a designed system described herein and not shown in FIG. 40). For example, in one or more embodiments, the design information 4050 comprises factor information 4052 indicating one or more factors for the system. The system of operation can operate according to a respective input of respective candidate inputs for each factor of the one or more factors. For instance, the system of operation could be a model receiving inputs or a physical system with components or settings according to the inputs. In one example explained herein, the system in operation could be a system employing an algorithm with values assigned for the factors affecting how the algorithm is structured or used. One example of an algorithm is a machine learning algorithm where hyperparameters control operation of the machine learning system. The user designing the system many need to determine what settings for these hyperparameters may lead to a delay in processing in that system. Design information 4050 could comprise other design information described herein (e.g., design information 3254). Alternatively, or additionally, design information 4050 comprises other information related to design objectives, requirements, or constraints (e.g., a number of test runs).

Alternatively, or additionally, the computing device receives a request 4060 to validate a response of the system of operation. For instance, the request 4060 may be according to a validation specification 4062 (e.g., the software crashing, length of time to run a system, questionable system results, etc.). The validation specification 4062 may be for the initial design space. For instance, the validation specification 4062 may be for validating all of an initial set of design points for the system of operation according to the respective candidate inputs for each factor of the multiple factors. The validation specification may relate to determining deviation from a specified result in response to testing one or more candidate inputs of the design space for each factor of the multiple factors (e.g., exceeding a threshold or a percentage increase). The specified result may be an oracle or expected result.

The computing device 4002 could receive information or requests from one or more input devices 4004 (e.g., mouse 4020, keyboard 4022, computing system 4024 or other input devices described herein). For instance, a user may use the input devices 4004 to enter or select a request or validation specification type. Alternatively, or additionally, computing device 4002 may generate the information or requests (e.g., based on defaults stored in computer-readable medium 4012). For instance, JMP® provided by SAS Institute Inc. of Cary, N.C. can generate a list of hyperparameters and possible input values, but also allow users to add additional inputs or factors.

In one or more embodiments, the computing device 4002 receives information or requests via one or more input interface(s) 4008. The input interface(s) 4008 could comprise one or more features of an input interface described herein or is an input interface described herein (e.g., input interface 1308 or input interface 3208). For instance, the input interface(s) 4008 could receive input received from an external device or internally within computing device 4002.

In one or more embodiments, the computer-readable medium 4012 comprises one or more features of one or more computer-readable mediums described herein or is one of computer-readable mediums described herein (e.g., computer-readable medium 3212 or computer-readable medium 1312). In one or more embodiments, the computing device 4002 has a processor 4014. For instance, the processor 4014 comprises one or more features of one or more processors described herein or is one of processors described herein (e.g., processor 1314 or processor 3214).

In one or more embodiments, computer-readable medium 4012 stores instructions for execution by processor 4014. For example, in one or more embodiments, the computer-readable medium 4012 comprises a test suite application 4040 for generating a test suite that provides test cases for testing the system of operation. Each test case of the test suite comprises test conditions for each factor of the multiple factors. Each test condition corresponds to a given one of the respective candidate inputs for each factor of the multiple factors. The test suite application 4040 may determine an initial design space for generating the test suite. For instance, the initial design space may define an initial set of design points for the system of operation according to respective candidate inputs for each factor. Alternatively, or additionally, the test suite application 4040 may determine a subset design space that defines a subset of the initial set of design points based on constraints on the initial design space (e.g., received design constraints like disallowed combinations). The test suite application 4040 may generate this test suite in a strategic way so that not every input needs to be tested. For instance, the test suite application 4040 may generate data representing a covering array of strength t with all combinations, for design points defined by the initial design space or the subset design space, involving t factors of the multiple factors. Alternatively, or additionally, the data may comprise test cases based on other types of testing protocols (e.g., combinatorial, pseudo-exhaustive, random, or adaptive random approach). Alternatively, or additionally, the data may comprise test cases from previous tests or user-defined test cases.

Alternatively, or additionally, the computer-readable medium 4012 comprises a deviation application 4042 for locating a deviation from a specified result of the validation specification. The deviation application 4042 may validate results for hyperparameters inputs given by a covering array generated by the test suite application. For instance, the deviation application 4042 may comprises instructions for obtaining a response 4044 of the system of operation according to one or more test cases of the test suite. For instance, a test engineer may test a physical system and input the responses using input device(s) 4004. Alternatively, or additionally, the test suite application 4040 may obtain or generate a computer model for generating a response of the system of operation according to a test case of the test suite. The computer-readable medium 4012 obtains the responses 4044 of the system of operation based on the test suite application 4040 generating the response according to the computer model. The responses 4044 could include for instance a failure region in the design space or statistics for the design. For example, a user might want to keep track of execution time, and declare that if any set of factors causes an algorithm to run for more than 300 seconds, then that set of factors has precipitated a failure in the algorithm. Alternatively, or additionally, the deviation application 4042 may comprises instructions for generating an output indicating a deviation from the specified result (e.g., a time over 300 seconds and/or the factors that lead to the deviation).

In one or more embodiments, the test suite application 4040 or deviation application 4042 may be performed in response to the request 4060 to validate the response of the system of operation (e.g., to return a response to a user requesting the validation).

In one or more embodiments, the computing device 4002 outputs to an output device 4006 a deviation 4070. This could be indicated for instance by a design case indication 4072 indicating the design or test case that precipitated the deviation (e.g., a set of each design option for factors of a test case, or a design case identification as described herein). Output interface 4010 and output device 4006 could be one of or comprise features of output interfaces (e.g., output interface 3210 and/or output interface 1310) and output devices (e.g., output device 1306 and output device 3206 described herein). For example, output device 4006 may comprise a display 4026 or a printer 4028 for communicating the deviation to a user of the validation system 4000. Alternatively, or additionally, the output interface 4010 is an internal interface and feeds information back to the computing device 4002 for further evaluation or for setting or modifying design information 4050.

Figure 41A:
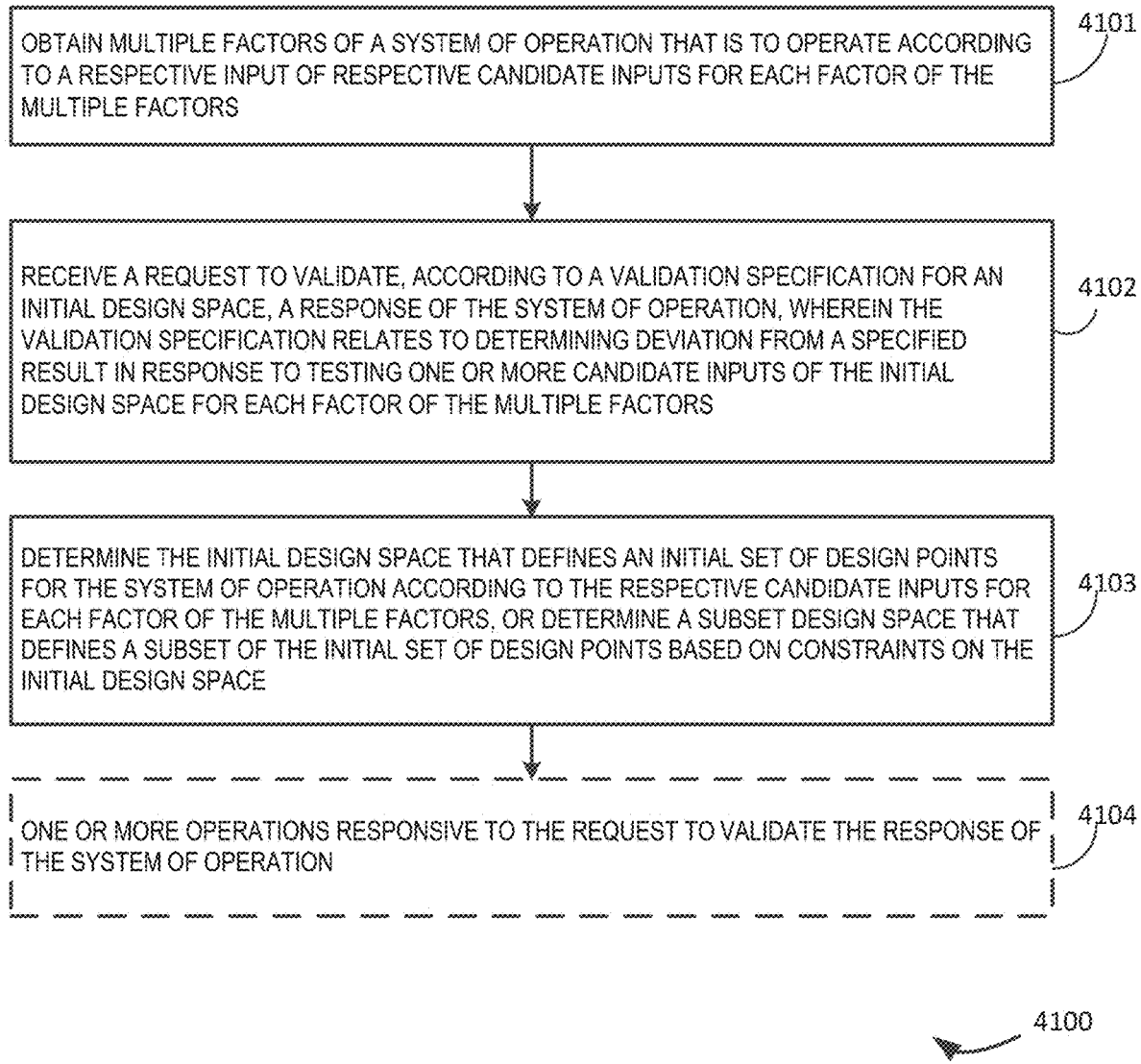
FIG. 41A illustrates an example flow diagram of a method for receiving a request to validate according to a validation specification in at least one embodiment of the present technology.
Figure 41B:
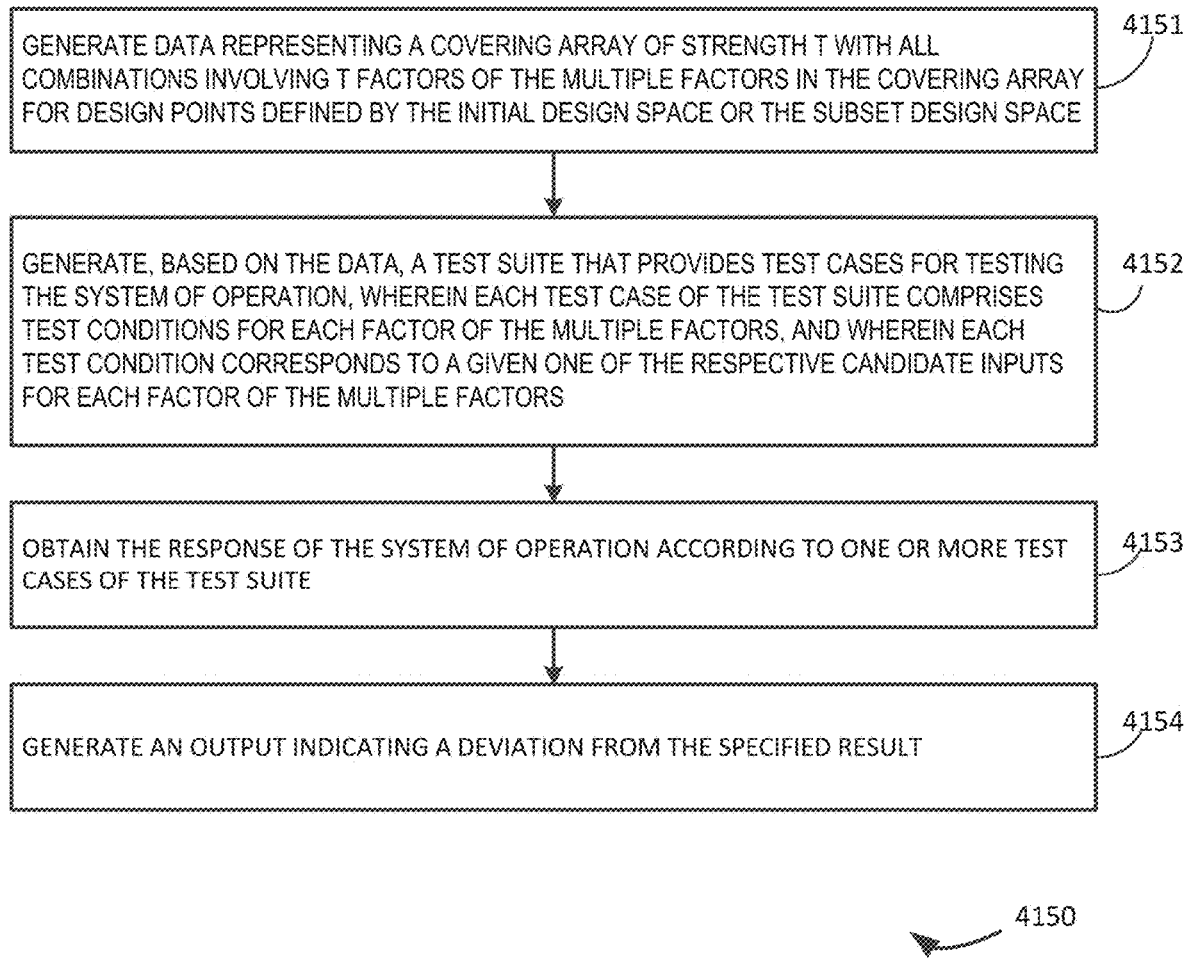
FIG. 41B illustrates an example flow diagram of a method for locating deviation from a specified result of a validation specification in at least one embodiment of the present technology.

In one or more embodiments, the validation system 4000 implements a method as described herein (e.g., methods shown in FIGS. 41A-B).

FIG. 41A illustrates an example flow diagram of a method 4100 for receiving a request to validate according to a validation specification. The method could be implemented by one or more devices of validation system 4000 (e.g., computing device 4002). Example embodiments (e.g., for devices, systems or methods described herein) will be described in the context of indicating a deviation from a specified result for hyperparameters of a machine learning algorithm. Those of ordinary skill in the art will appreciate other applications for embodiments described herein.

An operation 4101 of the method 4100 comprises obtaining multiple factors of a system of operation that is to operate according to a respective input of respective candidate inputs for each factor of the multiple factors. In one or more embodiments, the computing system receives one or more custom factors. Alternatively, or additionally, the factors may be default factors for the system of operation.

An operation 4102 of the method 4100 comprises receiving a request to validate, according to a validation specification for the initial design space, a response of the system of operation. The validation specification relates to determining deviation from a specified result in response to testing one or more candidate inputs of the initial design space for each factor of the multiple factors.

Figure 42:
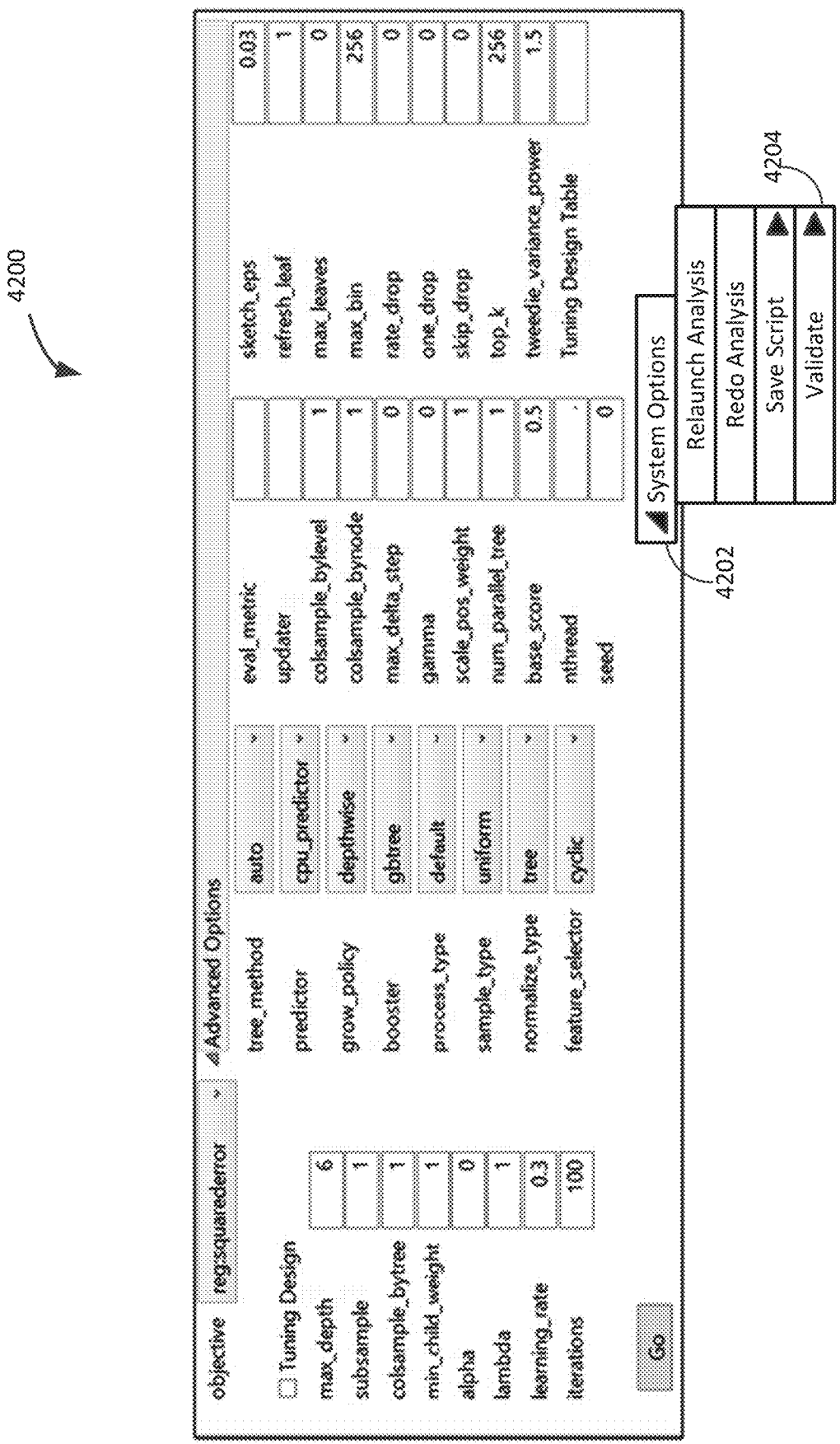
FIG. 42 illustrates an example graphical user interface for validating a system of operation according to a validation specification in at least one embodiment of the present technology.

FIG. 42 illustrates an example graphical user interface 4200 for validating a system of operation according to a validation specification for a machine learning algorithm. The graphical user interface 4200 in this example has a checkbox 4206 for tuning the design as described in embodiments herein. With hyperparameter tuning, a design space is explored to find good settings for some objective for the algorithm. Embodiments herein also offer additionally, or alternatively validation options 4204 (e.g., as part of system options 4202 such as system options of XGBoost provided by SAS Institute Inc. of Cary, N.C.). Validation is different than hyperparameter tuning in that edge cases are explored for inputs that may be problematic. A purpose of validation testing is to test for combinations of inputs that induce deviation from a validation specification (e.g., failures). This can be particularly difficult in situations where there are many factors or infinite inputs for those factors (like hyperparameters which can include continuous factors or "Advanced Options" factors).

An operation 4103 of the method 4100 comprises determining an initial design space that defines an initial set of design points for the system of operation according to the respective candidate inputs for each factor of the multiple factors, or determine a subset design space that defines a subset of the initial set of design points based on constraints on the initial design space.

An operation 4104 of the method 4100 comprises one or more operations responsive to the request to validate the response of the system of operation. For instance, one or more operations of a method 4150 in FIG. 41B for locating deviation from a specified result of a validation specification. For instance, method 4150 could be used to find a value for a hyperparameter that would cause the machine learning algorithm to take too long to execute.

An operation 4151 of the method 4150 comprises generating data representing a covering array of strength t with all combinations involving t factors of the multiple factors of the covering array for design points defined by the initial design space or the subset design space. An operation 4152 of the method 4150 comprises generating, based on the data, a test suite that provides test cases for testing the system of operation. Each test case of the test suite comprises test conditions for each factor of the multiple factors. Each test condition corresponds to a given one of the respective candidate inputs for each factor of the multiple factors. For instance, the test suite could comprise all or some test cases corresponding to a covering array generated according to operation 4151. Alternatively, or additionally, the test suite comprises additional test cases or test cases derived from testing according to a test suite. The economic run size of covering arrays lends itself to being an efficient tool that may be used to validate in even situations where there are large numbers of factors or inputs (e.g., the hyperparameter space of a machine learning algorithm).

An operation 4153 of the method 4150 comprises obtaining the response of the system of operation according to one or more test cases of the test suite. For instance, the obtaining comprises generating the responses (e.g., from a model of the system of operation) or receiving the responses (e.g., from testing a physical system).

An operation 4154 of the method 4150 comprises generating an output indicating a deviation from the specified result.

FIGS. 43A-E illustrate an example test suite for validating a system of operation according to a validation specification (e.g., in response to a request to validate via the graphical user interface 4200 in FIG. 42). As shown, some of the factors are continuous factors which is treated differently than categorical because continuous factors have either an infinite range, or many more values than a tester would be expected (or want) to test. As shown in the graphical user interface 4300 in FIG. 43A, a computing system (e.g., one or more devices of the validation system 4000) responsive to the request to validate the response of the system of operation (e.g., a machine learning algorithm) can generate a first set of candidate inputs for the first factor by discretizing a continuous range of candidate inputs for a factor into discrete options within the continuous range of candidate inputs for the factor. For instance, max_depth factor has a role of continuous in the graphical user interface 4300, but has been discretized into values 3 or 9. The initial design space can be restricted by constraints related to the discrete options.

Continuous factors can be discretized by applying, for instance, equivalence partitioning to partition the range of such factors or other techniques described herein. The continuous factors can be automatically partitioned by the computing system or augmented in response to user instructions. FIG. 43E shows the roles of the partitioned continuous factors changed to categorical with specified input values in the graphical user interface 4380.

FIGS. 43B-D demonstrate a test suite for validating the factors in graphical user interface 4300 of FIG. 43A. In this case, a covering array was used of strength t equal to 2. A covering array of strength t comprises all combinations involving t factors of the multiple factors. The design space for the covering array was already constrained by, for instance, lower and upper bounds for continuous factors. In this case, the design space for the covering array has been further restricted by constraints according to in the discretized factors in FIG. 43E.

The computing system responsive to a request to validate a response of the system, discretized the continuous range of candidate inputs for a given factor into a set of candidate inputs with discrete options within the continuous range of candidate inputs for the factor and the test suite. The test suite shown in FIGS. 43B-D comprises one or more inputs from the first set of candidate inputs. For instance, max_depth is a continuous factor as shown in FIG. 43A and discrete values are given for this value of 3 or 9. The resulting test suite in FIGS. 43B-D show values of 3 or 9 assigned in the test suite.

The generated test suite (e.g., the covering array in FIGS. 43B-D) could automatically execute testing according to the covering array (e.g., executing an XGBoost platform for each run of the covering array). Alternatively, the test suite could be provided as a data table, with a script, that could be used to invoke testing when the user chooses to execute the script (e.g., by executing the XGBoost platform for each row of the data table). The script technique is useful if the user wants to add some additional tests or make modifications to the test suite. Alternatively, the test suite could be provided as a data table for manually testing a machine and receiving inputs for tests according to the test suite.

In this example, the strength of the test suite was only 2 to provide a compact test suite, but higher strength test suites can be conducted. For instance, JMP® software provided by SAS Institute Inc of Cary, N.C. can construct covering arrays of strength 6 or full factorial covering arrays. Covering arrays are a useful underlying construct used for combinatorial testing. They have the property that, for any subset of t factors, all combinations of settings for the factors occur at least once. Software failures, from a wide variety of domains, are often due to the combination of relatively few factors and so combinatorial testing is a highly efficient and effective way to validate software systems.

As stated by Boris Beizer colloquially, "Bugs lurk in corners and congregate at boundaries." The boundaries that Beizer refers to reflect software failures induced by edge cases; whereas the corners are the values of two or more inputs that induce a failure. By using covering arrays, one or more embodiments efficiently look at the "corners" of the inputs by looking at the interactions between inputs. The boundaries for continuous factors can occur due to logical statements in the underlying code.

A tester may have specialized knowledge that a particular factor is likely to lead to a deviation (e.g., based on testing other systems). In one or more embodiments, graphical user interface 4300 can be used to denote or receive an indication of prioritized factors. Prioritized factors can be used to generate a test suite focused on these prioritized factors. For instance, the test suite may be generated with a variable strength covering array whereby portions of the variable strength covering array involving one or more prioritized factors have a greater strength than other factors of the multiple factors in the test suite.

Figure 44:
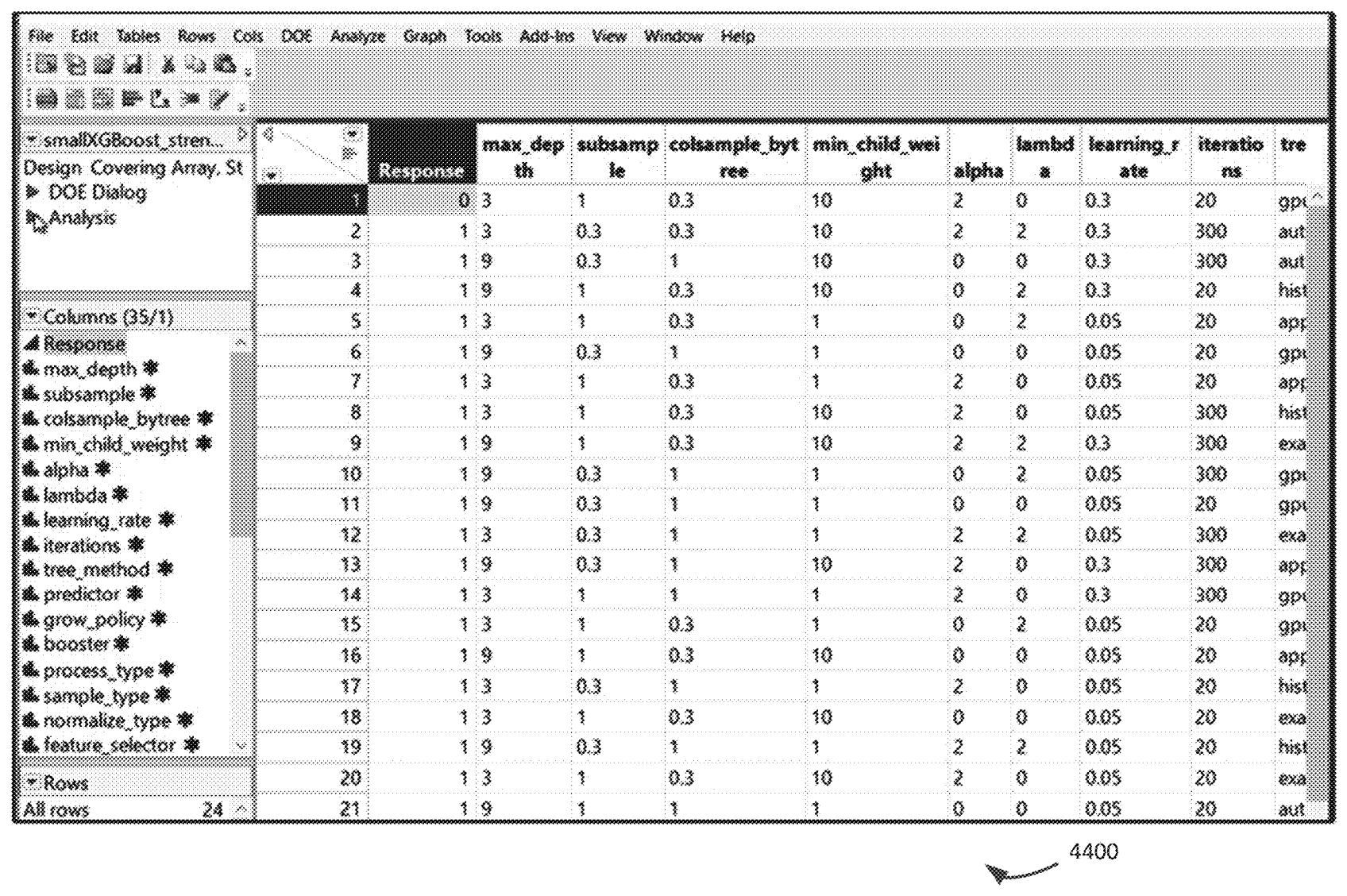

FIG. 44 illustrates an example graphical user interface 4400 for displaying a response of validating a system of operation according to a validation specification. In this example, the validation specification relates to inputs that would cause a failure, and only one test case resulted in a failure (or response 0).

Figure 45:
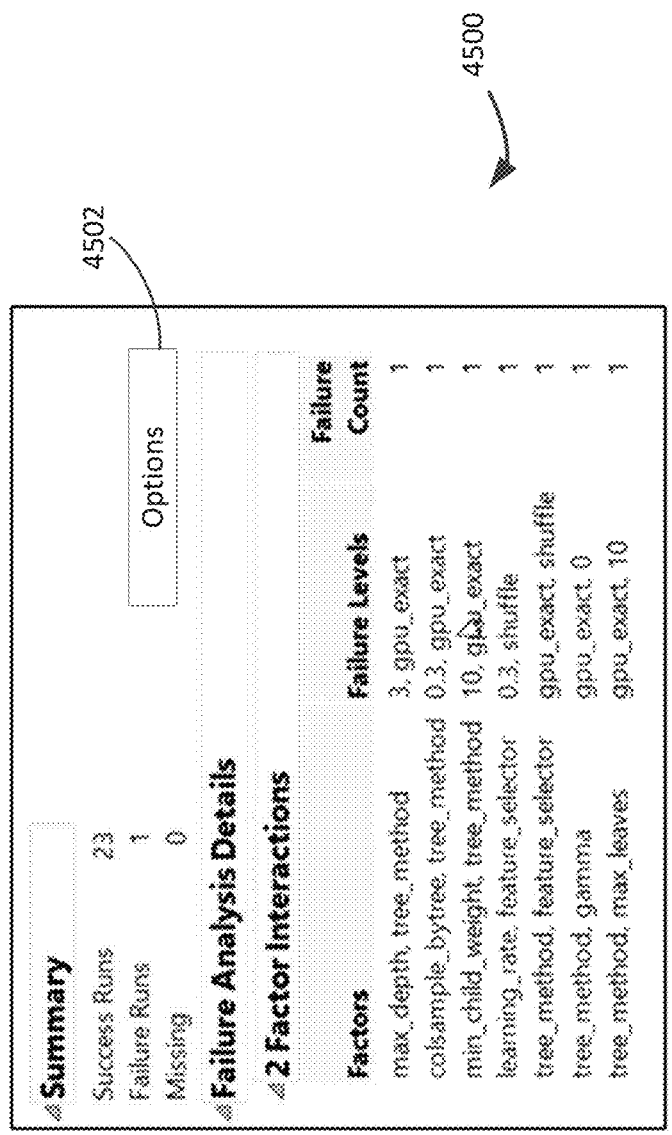
FIG. 45 illustrates an example graphical user interface for displaying potential causes in response to a single test case failure in at least one embodiment of the present technology.

In one or more embodiments, a computing system generates a set of potential causes for each failure mode based on the test suite. FIG. 45 illustrates an example graphical user interface 4500 for displaying potential causes in response to a single test case failure.

Potential causes can be tested. For example, causes for failures in the context of hyperparameters can be tested by running the machine learning algorithm varying only the potential causes. Multiple causes can be tested at a time (e.g., by creating tests that attempt to halve the potential causes). This approach is easier when there is a set of baseline factors that is known to pass (e.g., known hyperparameters or inputs that passed testing). Options 4502 can be used for further testing of the potential causes.

Figures 46A, 46B:
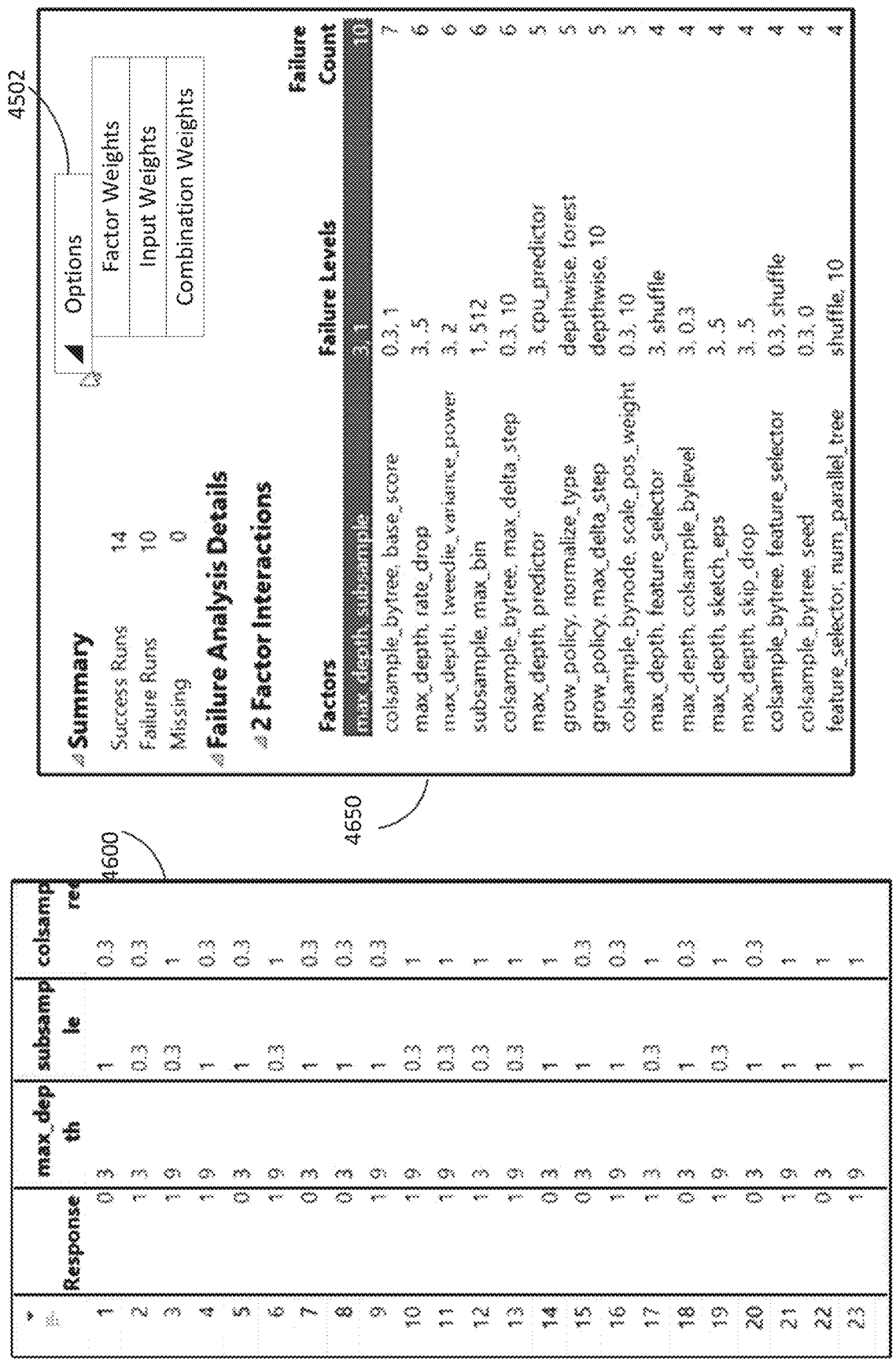
FIGS. 46A-B illustrate example graphical user interfaces for displaying potential causes in response to multiple test case failures in at least one embodiment of the present technology.

In some cases, multiple responses of the system deviate from the specified result. For instance, FIGS. 46A-B illustrate example graphical user interfaces for displaying potential causes in response to multiple test case failures. In FIG. 46A, the graphical user interface 4600 shows multiple responses that had a value of 0 indicating a failure.

In this case, the computing system can determine commonalities between test cases that resulted in multiple responses of the system deviating from a specified result.

The computing system can generate, based on the commonalities, multiple cause indicators. Each cause indicator of the multiple cause indicators represents a likelihood that a test condition or combination of test conditions caused the deviation from the specified result. The computing system can generate an output indicating the deviation by outputting an indication of a most likely potential cause based on the multiple cause indicators.

FIG. 46B shows an ordered ranking of one or more potential causes for further testing (e.g., based on cause indicators). In this example, each potential cause of the one or more potential causes comprises one or more factors of the multiple factors with assigned input according to a test case of the test suite that resulted in a response that deviated from the specified result. The ranking can be based on for instance commonalities between test cases (e.g., based on failure count).

Additionally, or alternatively, the ranking can be based on other options 4502 (e.g., factor, input or combination weights).

Figure 47A:
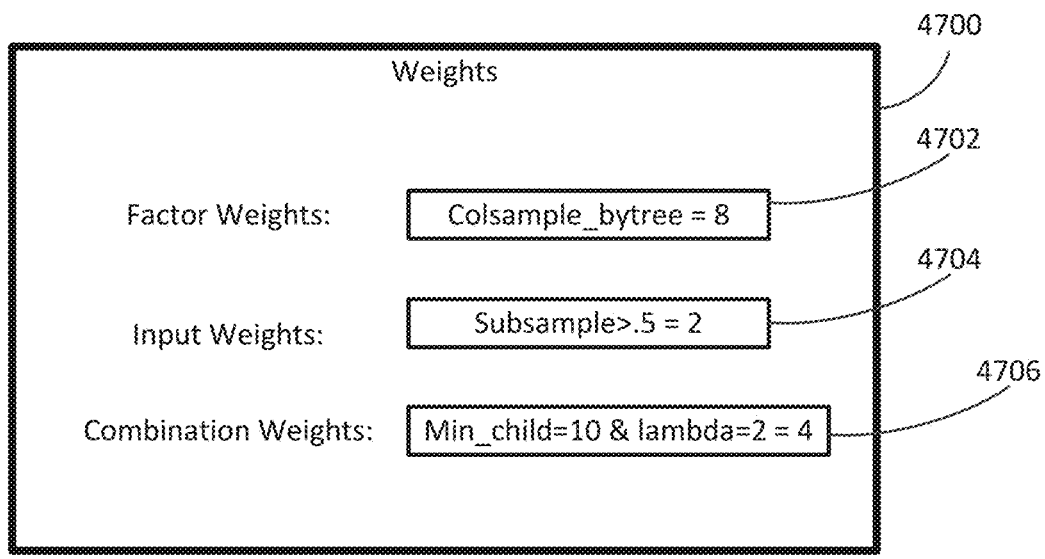
FIGS. 47A-B illustrate example graphical user interfaces for displaying potential causes ranked based on weights and commonalities in at least one embodiment of the present technology.
Figure 47B:
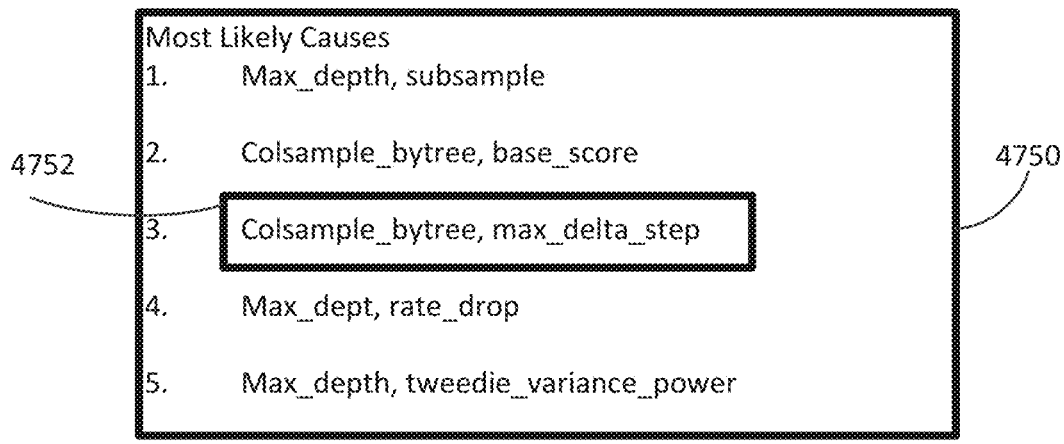

FIGS. 47A-B illustrate example graphical user interfaces for displaying potential causes ranked based on weights and commonalities.

In FIG. 47A graphical user interface 4700 can be used for a computing system to receive an indication of one or more prioritized factors in the multiple factors (e.g., prioritized factor has a factor weight 4702). These weights can be received from a user. For instance, a tester may have specialized knowledge that a particular factor is likely to lead to a deviation or could be generated by the computing system (e.g., based on testing other systems). In one or more embodiments, the prioritized factors can be weighted (e.g., given a factor weight of 8 in this example) and potential causes involving this factor can be promoted in ranking for testing.

The computing system can receive multiple weights (e.g., in addition to or alternatively to a factor weight). For instance, as shown the computing system can receive an input weight 4704 for a candidate input. In this case, test cases with values greater than 0.5 for the factor sub_sample are given a weight of 2 in this example. Test cases or potential causes involving these inputs can be prioritized.

A combinatorial weight 4706 can be used to account for a combination of candidate inputs for respective factors of the multiple factors. For instance, test cases with a value of 10 for factor min_child and an assigned value of 2 for factor lambda are given a weight of 4 in this examples.

Other weights or multiple types of weights could be used.

In one or more embodiments, a computing system generates, based on the multiple weights, multiple cause indicators, wherein each cause indicator of the multiple cause indicators represents a likelihood that a test condition or combination of test conditions caused the deviation from the specified result; and generates the output indicating the deviation by outputting an indication of a most likely potential cause based on the multiple cause indicators.

For instance, as shown in FIG. 47B, the graphical interface 4750 shows updated most likely potential causes in accordance with the weights. A cause 4752 related to factors colsample_bytree and max_delta step has been promoted to the third most likely cause based on the weighting compared to the ranking in FIG. 46B.

In one or more embodiments, more testing can be performed based on the potential causes (e.g., the computing system can generate an updated test suite based on the one or more potential causes; and obtain a response of the system of operation according to one or more test cases of the updated test suite).

For instance, one method for further testing would be a "binary-type" search where the potential causes are split in 2 each time. In a first step, a minimal set of new test cases is generated. The new cases incorporate all potential causes where the potential causes are split evenly among the new test cases. That is, if there are 12 potential causes, 2 test cases are generated that contain 6 potential causes each. The new set is run for testing, removing from the set of potential causes any in those test cases that pass. This process can be repeated until only one potential cause remains. A tester may have some further intuition for likely potential causes for reducing testing. One of ordinary skill in the art will appreciate other protocols for testing once potential causes are identified and/or ranked as shown herein.

Figure 48A:
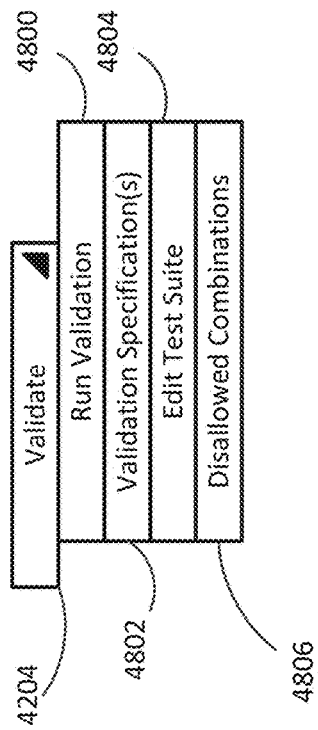
FIGS. 48A-B illustrate example graphical user interfaces for editing a test suite in at least one embodiment of the present technology.
Figure 48B:
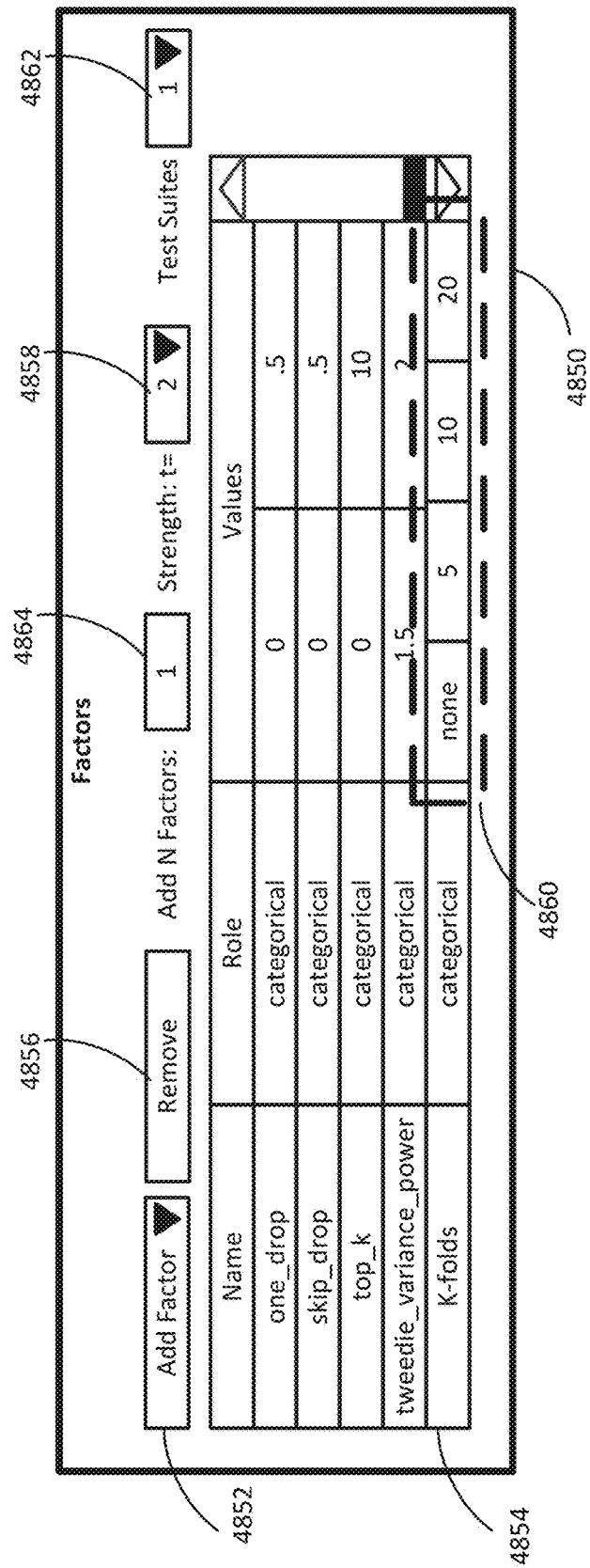

FIGS. 48A-B illustrate example graphical user interfaces for editing a test suite (e.g., a test suite or an updated test suite).

In FIG. 48A, the validate options 4204 shown in FIG. 42 in graphical user interface 4200 could include an option to run validation 4800 (e.g., to generate a test suite). Alternatively, or additionally, the run validation 4800 comprises an edit test suite option 4804 for editing a test suite.

For instance, FIG. 48B shows an example graphical user interface 4850 for editing a test suite. For instance, as shown the computing system, can display the graphical user interface 4850 for adding or removing factors for the test suite. In this case, the factors comprise the hyperparameters and the user is using the add factor option 4852 to add an additional factor (K-folds factor 4854). The add factor option 4852 can have options (e.g., in a drop down) for selecting the role of the factor (e.g., categorical, or continuous) or for augmenting the number of inputs (e.g., adding more inputs for continuous factors). In this case, the user has selected categorical and has specified four discrete candidate inputs 4860 for the K-folds factor 4854 (none, 5, 10, 20).

Adding additional factors, test cases or test suites can be useful for accounting for nondeterministic results (e.g., accounting for blocking factors). In a deterministic system, a test case that induces a failure will consistently do so. However, other factors may lead to non-deterministic results (e.g., different test engineers conducting the experiment). These type of factors may be blocking factors that do not define components of the system of operation under test but may still have an effect on the outcome of an experiment for that system in operation. Some examples of blocking factors would be different test engineers, days of the week of testing, or different computers performing the testing. The impact of blocking factors can vary independently of each other or be related (e.g., test engineer 1 has more failures on Tuesdays because she plays basketball on Monday nights). One or more embodiments make the blocking factors obvious to a user and allow the option of producing test suites for each level of the blocking factor. This is useful for blocks such as test engineers as it would be beneficial to send a test suite representing the test suite specific to each test engineer. For instance, an aggregated test suite could be of strength t+1 and each test engineer could get a test suite of strength t. Sending a test suite allows for more efficient testing and aids in fault localization.

The computing system can generate the test suite to include one or more blocking factors to determine if they have an impact on the response of the system of operation. In this example blocking factor, K-folds are used as an example. Other or additional factors could have been added as blocking factors to the test suite. K-folds can be used in different test regimes such as for testing a machine learning algorithm by assigning different training data sets to generate the machine learning algorithm according to the hyperparameter factors and using a hold-out from the training data set to test the machine learning algorithm. This testing could be performed multiple times in an experiment as indicated by the discrete candidate inputs 4860.

A remove option 4856 can be used to remove a factor (e.g., one not expected to have an effect on the outcome of testing). Counters can be used to keep track of added and removed factors. For instance, a counter 4864 can be used to keep track of the added factors. The adding and removing of factors can be performed in other ways (e.g., using XGBoost or a special jsl command).

Alternatively, or additionally, the user can specify a number of test cases generated (e.g., in test suites option 4862). A user may want different test cases (e.g., to give to different test engineers).

In one or more embodiments, the user specifies the strength of a generated covering array (e.g., in a strengths option 4858). Alternatively, or additionally, the user could influence the strength indirectly such as by providing other information like a number of test cases. The computing system can set the strength based on user indicators (e.g., the strength t is a highest strength for the design space and the total number of allowed test cases for the test suite).

As shown in FIG. 48A, the user in one or more embodiments can edit other aspects of the computing system (e.g., the validation specification(s) option 4802 can be used to provide or view one or more validation specifications or the disallowed combinations options 4806 can be used to provide or view one or more disallowed combination for a design space of the test suite).

When using test suites designed from covering arrays, continuous factors are discretized to allow the covering array to be constructed. Other techniques for constructing covering arrays only allowed for categorical factors and required the user to manually convert continuous factors into categorical factors and could not account for disallowed combinations. With disallowed combinations, a first set of values are restricted from being assigned to the first factor from a first set of candidate inputs for the first factor, if a second factor is assigned one of a second set of values from the second set of candidate inputs for the second factor. For instance, certain sets of values for these factors may make a model too complex or time-consuming to generate. Values may be assigned to one factor without assigning values to another factor (e.g., to constrain a process metric for the system of operation).

Disallowed combinations are also used for categorical factors. For instance, options for one factor (e.g., a continuous or categorical factor) may be inapplicable for the system of operation if a particular value is selected for another factor. If disallowed combinations are needed, in other techniques, the user would manually transform any disallowed combination clause that involves a continuous factor to the categorical factor space.

One or more embodiments, improve upon this technique by accounting for subclauses of the disallowed combination expression that the continuous factor participates in. For example, consider a covering array which involves X1, X2, and X3 factors. In this example, X1 is a level factor, X2 and X3 are continuous, and the following disallowed combination is provided:
X1=="L2" && (X2>=0 && X2<=1)||X2>=−0.5 && X2<=5 && (X3>=&& X3<=1).

In this example, X2 participates in the subclauses: X1=="L2" && (X2>=0 && X2<=1) and X2>=−0.5 && X2<=0.5 && (X3>=0.5 && X3<=1). Since X2 participates in two subclauses, the computing system accounts for the boundaries from each subclause that X2 is involved in and so the boundaries −0.5, 0, 0.5, 1 define the partitions for X2. The factors of the covering array then become:
X1: 2 levels (i.e. "L1" and "L2")
X2: 4 levels (i.e. [−1, −0.5), [−0.5, 0), [0, 0.5), [0.5, 1], which become "L1", "L2", "L3" and "L4")
X3: 2 levels (i.e. [−1, 0), [0, 1], which become "L1" and "L2")

The disallowed combination for Covering Array in categorical factor space then becomes:
X1=="L2" && X2=="L3"||X1=="L2" && X2=="L4"||X2=="L2" && X3=="L1"||X2=="L2" && X3<="L2"||X2=="L3" && X3=="L1"||X2=="L3" && X3<="L2", In one or more embodiments, the complexity of the disallowed combination may prevent generating the covering array of a specified strength t (e.g., a default or user defined strength 4858 in FIG. 48B). For instance, there may be missing values in the covering array due to testing so many different options in a continuous range. In this case the computing system can be used to advantageously modify a given disallowed combination of the one or more disallowed combinations to generate the test suite to comprise the covering array of the strength t.

Figure 49A:
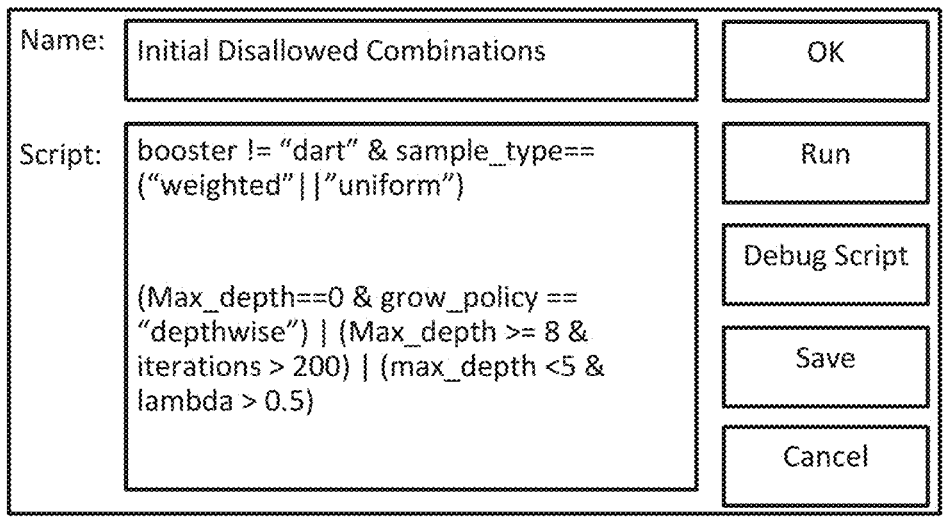
FIGS. 49A-C illustrate example graphical user interfaces for editing disallowed combinations in at least one embodiment of the present technology.
Figure 49B:
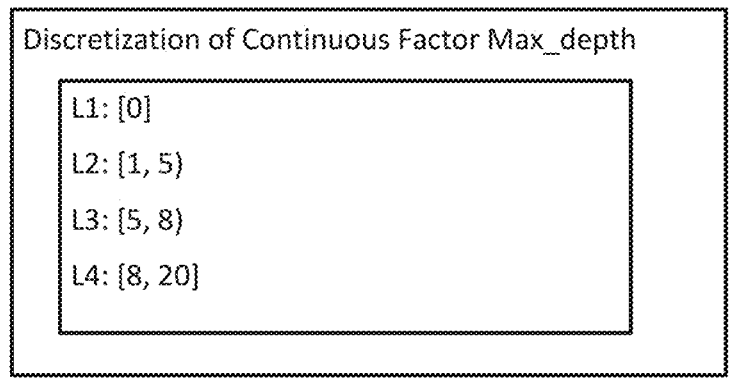
Figure 49C:
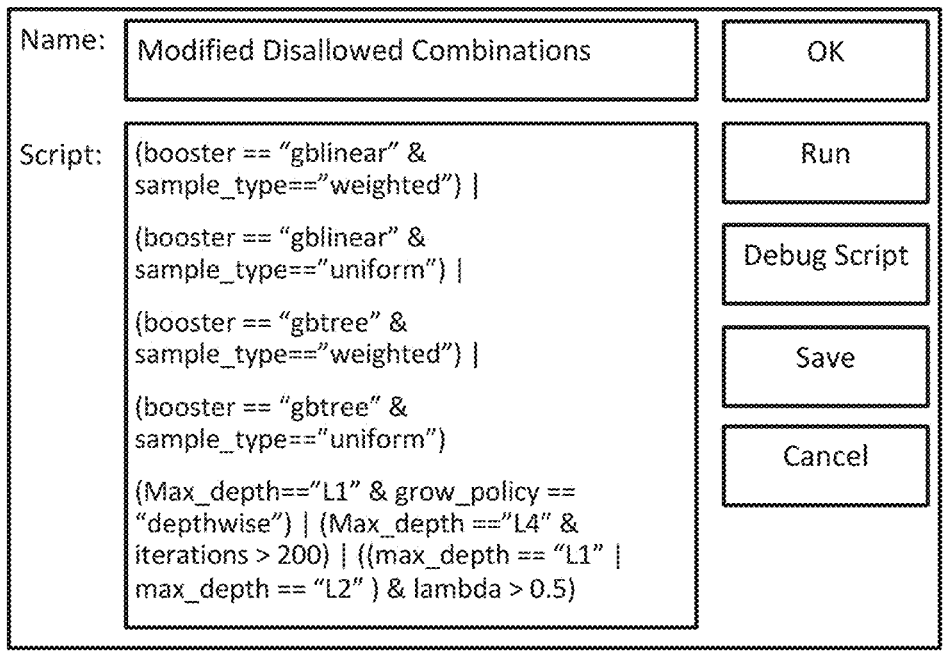

FIGS. 49A-C illustrate example graphical user interfaces for providing disallowed combinations in the context of an example involving hyperparameters.

In pseudo-code form a set of actions for a factor such as a hyperparameter can be expressed as:
If(Hyperparameter1==a){do thing1}
Else if(Hyperparameter1<a){do thing2}
Else if(Hyperparameter1>a){do thing3}

Hyperparameters could be continuous and/or categorical in nature as in the above example. FIG. 49A shows in a graphical user interface 4900 a disallowed combination that is categorical in nature and one that is continuous in nature.

In a first scenario, the disallowed combination is categorical in nature. If the "booster" is at level "dart" (with other levels "gblinear" and "gbtree", then the input "sample_type" is not relevant. FIG. 49A shows a script for a disallowed combination for this scenario where the booster factor is not assigned or does not equal (!=) "dart" and & sample_type factor is assigned or equals (==) "weighted" or (||) "uniform".

In one or more embodiments, the computing system may simplify these categorical disallowed combinations for determining the design space. For instance, as shown in FIG. 49C, the scenario is reduced to a simpler form for processing by the computing system:
(booster=="gblinear" & sample_type=="weighted")|
(booster=="gblinear" & sample_type=="uniform")|
(booster=="gbtree" & sample_type=="weighted")|
(booster=="gbtree" & sample_type=="uniform")

In a second scenario, the disallowed combination is continuous in nature. The factor max_depth is continuous. It can take values of 0 to infinity, but in this example was bounded to a range of 0 to 20 with a default of 6. When max_depth has a value of 0, grow_policy factor cannot take the category of "depthwise". When max_depth factor is assigned a large value, it makes the model more complex and time-consuming, so other factors may be used to limit processing iterations.

For lambda, increasing the value will make the model more conservative, but a practitioner would not want the model to be too conservative when max_depth is small.

A plausible disallowed combination taking this into account these designs considerations is shown in FIG. 49A: (Max_depth==0 & grow_policy=="depthwise")| (Max_depth>=8 & iterations>200)|(max_depth<5 & lambda>0.5).

In one or more embodiments, a computing system discretizes a continuous factor to have discrete options by determining a boundary between restricted and allowed values. The restricted values may be a first set of values that are disallowed according to the disallowed combination and are part of the candidate inputs for that factor in a system of operation. For instance, the determining boundaries of the first set of values may comprise the computing system extracting all indicated values pertaining to the continuous factor from the one or more disallowed combinations (e.g., 0, 5, and 8).

FIG. 49B shows in a graphical user interface 4930 levels assigned for a 4-level categorical scheme for the continuous factor max_depth that has been discretized into integer values:

L1: [0]
L2: [1, 5)
L3: [5, 8)
L4: [8, 20]

In this example, the computing system determined multiple value bins, each corresponding to a level, based on a total number of determined boundaries of the first set of values. In this case, there were 3 values and at least 3 bins were generated. More or less bins could be generated in response to the indicated values or a total number of bins (e.g., based on how many boundaries the user wanted to account for). More bins could also be added to account for interactions with a categorical factor. For instance in this case a bin is set for the case when just L1 is 0 to account for (Max_depth==0 & grow_policy=="depthwise"). Additionally, for validation, a user may want to allow that some continuous inputs add extra levels a slight amount above and/or below the boundary values. Instead of having the user specify each of these above/below/equals individually, the computing system could generate multiple values or value bins based on just the boundary value.

In this example, the computing system extracted all indicated values pertaining to the continuous factor from the one or more disallowed combinations. The computing system determined the multiple value bins by merging extracted indicated values with possible candidate inputs. A minimum value for all the value bins corresponds to a minimum value of the first set of candidate inputs (e.g., L1=0). A maximum value for all the value bins corresponding to a maximum value of the first set of candidate inputs (e.g., L4 can be 20). A minimum for a respective value bin is set based on the indicated values (e.g., L3=5). A maximum for a respective value bin is set based on the indicated values (e.g., L3<8). This defines a partitioning scheme for max_depth: [0, 1, 5, 8, 20].

This disallowed combination can be modified to show the new levels (e.g., as shown in graphical user interface 4960 of FIG. 49C).

A value is selected from each of the value bins for generating a test suite (e.g., a midpoint or an end point in the value bin). Accordingly, a design space for the test suite is constrained by the disallowed combination or a modification of the disallowed combination (e.g., when a script for the disallowed combination is run by the computing system).

FIGS. 50A-B illustrate example graphical user interfaces for validation specifications.

In one or more embodiments, the validation specification comprises multiple validations or multiple criteria. A computing system can then generate output indicating the deviation from the specified result by outputting the deviation corresponding to one or more criteria. In the example shown in FIG. 50A, the graphical user interface 5000 shows a validation specification comprising a first criteria 5010 indicating a crash of the system of operation. The validation specification comprises a second criteria 5020 indicating a divergence from a specified response value for a response of the system of operation. In this example, the specified response was a R squared value which is a statistical measure for a model. If the value is less than 0.5 than approximately half of observed outputs can be explained by a model's inputs. A third criteria 5030 indicates a divergence from a specified processing metric of the system of operation. In this example, the specified processing metric is 300 seconds and any time period longer than this would be an unwanted deviation. An excessively long processing time may be as bad as a crash if the system is hung-up in processing.

The user may be able to specify the response type (e.g., a threshold or match target type). For instance, a validation specification may comprise a request to identify a set of inputs that will exceed a threshold for a response of the system of operation according to a test case of a test suite. In FIG. 50B, a test suite 5050 shows test cases for recording responses according to each of the criteria shown in graphical user interface 5000 (e.g., if the threshold is passed or a target is reached). The responses may be specified by the user (e.g., to record pass or fail for displaying to a user). In this example a covering array of strength 2 is selected for a subset of the hyperparameters not involved in advanced options shown in FIG. 42.

Rankings with multiple validation specifications can be provided. For instance, the user may also assign an importance 5040 to each criteria for weighting test cases. Alternatively, certain criteria may have default weightings (e.g., crash may be set to have the highest importance).

Output indicating the deviation may also comprise a set of test conditions indicated as potential causes for the system of operation to exceed the threshold (e.g., the potential cause ranking shown in FIG. 46B). The potential cause ranking or an updated test suite may be based on the ranking (e.g., importance 5040) within multiple validation specifications.

One or more embodiments are useful for generating test cases to account for blocking factors. A blocking factor may define different test scenarios for testing the system of operation. In the context of testing software, blocks could be different test engineers, operating systems, different computers, or different days of the week for testing. That is, differences in how a software system behaves may be attributable to the underlying operating systems or underlying hardware differences, or changes during development to the software system throughout the week may exhibit a day-of-the-week effect.

In the case of test engineers, there may be variability in how different test engineers approach testing. These differences are often because engineers are inclined to notice different issues while testing. For example, a particular test engineer may be more likely to notice numeric issues, while another may focus more on user interface or graphical issues. In testing software, different test engineers may choose different data, and this difference would likely further exacerbate the differences between test engineer results.

One strategy of assigning test suites among different test engineers is to partition the components of the system into groups, assign each test engineer a group, and have each test engineer test the set of components assigned to them, placing emphasis on individual components one at a time. Whereas this strategy may ensure that individual components work as intended, in effect, it treats each test engineer as an independent agent and so fails to take into account efficiencies that could accrue if the entire testing effort was treated as a designed experiment. As a result, although such a testing strategy may appear reasonable, it is not an efficient strategy. Another strategy of assigning test suites amongst different test engineers is to use test engineer strengths or preferences for assignment which may localize a problem to an engineer and not account for the test engineer's role in a result.

One or more embodiments, ensure that test suites for different test scenarios (e.g., different test engineers) are different. They can be different in such a way that, when aggregated, the overall set of test cases increases coverage by treating test scenarios as a blocking factor (e.g., in test suites generated in response to a validation request described herein).

Figure 51:
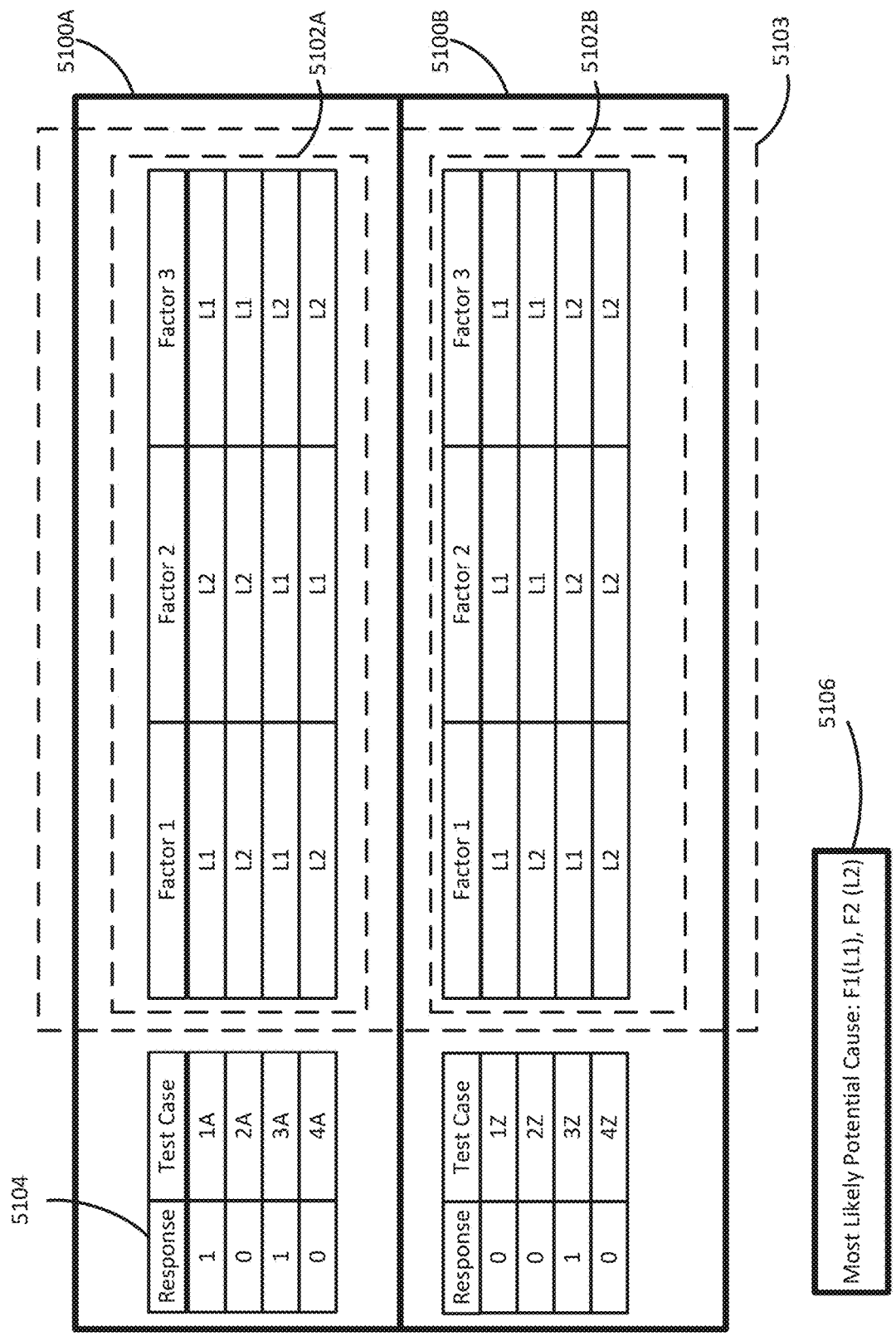
FIG. 51 illustrates example test suites in at least one embodiment of the present technology.

FIG. 51 illustrates example test suites 5100. In this example a computing system (e.g., one or more devices of validation system 4000) generates a representation of multiple covering arrays of strength t. For instance, FIG. 51 shows that each test suite 5100 has an example covering array 5102 of strength 2 for factors each taking as input one of two levels (L1 or L2). In this case, the computing system determines a covering array of strength t+1. For instance, FIG. 51 shows an example of a covering array 5103 of strength 3. As shown multiple covering arrays comprise different combinations of t+1 factors of the covering array of strength t+1. The covering array 5103 is an aggregate of the data of the multiple covering arrays 5102. In this case there were v levels of blocking factor related to a test scenario (i.e., v is two for two different test engineers), so the t+1 covering array is v times as large. The covering array could be a different aggregation. For instance, some test rows could have been repeated in each of the covering arrays 5102. In this case the covering array of strength t+1 will be larger than v. The aggregate covering array could also be a different strength (e.g., strength t, t+2, or variable strength). For instance, a variable strength covering array could be set to be t+m, m>1, by which the software inputs would be specified to have a higher strength than subsets involving the blocking factors. In the example in FIG. 51, the covering arrays are orthogonal in that each possible combination of t inputs occurs the same amount of times (e.g., only once). Covering arrays described herein can be orthogonal but need not be.

The computing system can generate test suites 5100 to provide test cases for testing the system of operation. Each test suite can be assigned to each test scenario of the multiple different test scenarios (e.g., assigning each test suite to a different engineer or to be performed on a different operating system or day of the week). The computing system can obtain a response 5104 of the system of operation according to each of the at least two different test suites.

In one or more embodiments, the computing system can generate an output indicating a deviation from the specified result based on the response of the system of operation according to each of the different test suites. For instance, the response could indicate a failure ("1" in different test cases). Alternatively, or additionally, the computing system could output a most likely potential cause 5106 informed by variations between responses in the different test cases. In this case, looking only at test case 5100A would suggest an input of L1 for Factor 1 leads to failures, but in combination with 51008 the computing system make narrow the most likely potential cause 5106 to a combination of input of L1 for Factor 1 and input of L2 for Factor 2. The anomaly in the response 5104 of test case 5100A is likely due to the test scenario or environment rather than the system itself. This can help focus efforts on further testing or fixing system problems.

In this scenario more than one test condition could be considered and different test cases made for those scenarios (e.g., test engineers and day of the week). Alternatively, or additionally, factors within the test case could also include blocking factors as described herein (e.g., assigning different test cases to different test engineers and including as a factor different test data sets that the engineers will use).

Figure 52A:
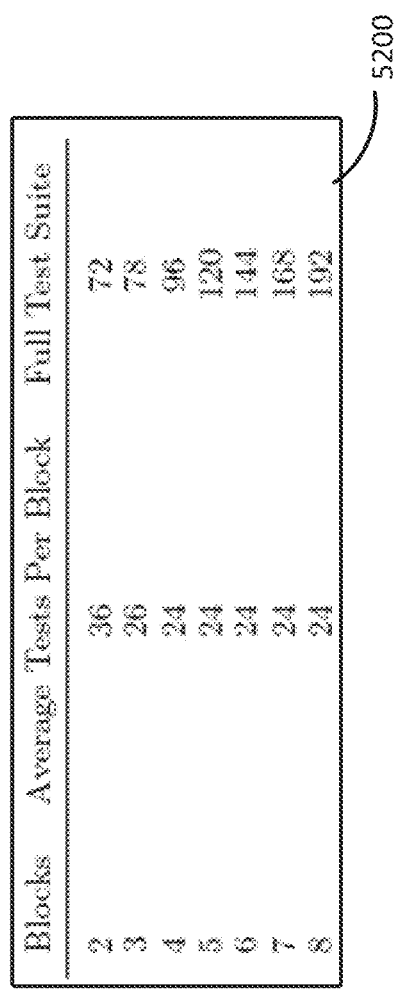
FIG. 52A illustrates example test suite metrics at least one embodiment of the present technology.

FIG. 52A illustrates example test suite metrics 5200 pertaining to test suites derived for a system of operation pertaining to an XGBoost software library. Test suites are derived to validate thirty-four hyperparameters with inputs shown in FIG. 43.

The continuous factors with bounded ranges shown in FIG. 43A are discretized into categorical inputs of only two levels as shown in FIG. 43E. For categorical factors there is one 6-level factor, one 4-level factor, one 3-level factor, and thirty-one 2-level factors. In this example, disallowed combinations were not used. However, as described herein, disallowed combinations (also sometimes called forbbidden edges or disallowed sets of inputs) can be considered in determining a subset design space (e.g., during design construction or in received design information) for generating the test suite.

In this example, the blocking factor is test engineers, but other blocking factors could have been used. There is a pool of eight test engineers available, and it is desirable to weigh how many test engineers to assign to this testing effort while balancing their workload. The goal is to provide each test engineer a set of test cases that is a covering array of strength 2, while the aggregated covering array for all test engineers is strength 3. FIG. 52A shows the average number of tests per block for two to eight test engineers (blocks) for the inputs and factors shown in FIG. 43E. Each of the designs were created using the covering array implementation in JMP® Software, with 10,000 iterations of a post-optimization technique that tries to minimize the size of the covering array. To achieve a strength 2 covering array, the theoretical lower bound on the number of tests is 24 (due to one 6-level and one 4-level factor). Similarly, for a strength 3 covering array, the lower bound is 72. The JMP® software was able to create a design with no blocking factor that achieves the minimum run size for both strength 2 and 3. Based on these results, only for two and three blocks would test engineers require additional tests beyond the minimum for a covering array of strength 2. While the lower bound for a strength 4 covering array in this case is 144, the smallest strength 4 design had 266 runs, which is much greater than the number of runs shown in the table using an aggregate strength 3 covering array. However, the strength 3 design still provides good coverage for 4-input combinations. For instance, in the case of 8 test suites, while it does not achieve 100 percent 4-coverage (i.e., the percentage of 4-input combinations that appear in the test suite), it has 99.77% 4-coverage and 96.86% for 5-coverage. Even for 4 blocks, the 4-coverage is 98.24% and 87.77%. As a result, even if there exists a failure-inducing combination involving four inputs, it is most likely covered by the test suite.

FIG. 52B shows an example of editing factors of a test suite. In this example, the first 8 factors and inputs shown in FIG. 43E are augmented by the user in graphical user interface 5230 (e.g., to add additional inputs known to be more important to the tester or to expand the range of tested inputs). Four of these additional factors are at 5 levels and four at 4 levels. In this setup, there is one 6-level factor, four 5-level factors, five 4-level factor, one 3-level factor, and twenty-three 2-level factors. While the theoretical lower bound for a strength 2 covering array is 30 runs, the smallest unblocked design constructed by the JMP® software had 37 runs. For strength 3, the lower bound is 150 runs, while the smallest unblocked design the JMP® software constructed had 244 runs. With the factors and levels in this case, a substantially larger number of tests are needed as can be seen in test suite metrics 5260 shown in FIG. 52C.

In the simpler example, in nearly every case, each test suite block contained the minimum number of tests for a strength 2 covering array. Increasing the number of blocks in this case increased the size of the test suite, thereby increasing the 4-coverage. In the more complex case, the increase in the size of the full test suite is smaller relative to the reduction in the number of tests per block. The ease of adding a block to a set of inputs allows test engineers to explore different block sizes to decide the best allocation of their resources. By using the blocking approach to covering arrays described herein, a test suite assigned to a test engineer can be controlled so that each test engineer is examining all possible two-way combinations of important inputs.

Once a failure is observed according to the test suite, a test engineer wants to isolate the failure-inducing combination. Due to the run size economy of combinatorial testing, when faced with a failure, a test engineer may have a large list of potential causes (i.e. possible failure-inducing combinations) to investigate. As in the hierarchy principle for factorial effects, a test engineer wants to focus on the simplest explanations, the potential causes involving the fewest number of inputs. As an example, related to the factors in FIG. 43E as augmented to include more inputs in FIG. 52B, if the combination of tree method set to auto and feature selector set to thrifty induces a failure, the test engineer has eight potential two-way combinations to investigate. A test engineer then must go about determining which of those potential causes induces a failure.

In the case where test engineers is the blocking factor, if a failure is induced in the strength t subset of a particular test engineer, then the engineer knows that all other test engineers have those t-input combinations contained within their test suite. If the definition of failure is consistent among test engineers, then all test engineers should find the failure. For the types of failures that are known to be consistently checked, this implies that the results from all test engineers can be considered as a whole. Any failure-inducing combinations involving fewer than t+1 inputs will be easily induced and isolated and those due to at least t+1 inputs can be studied using fault localization techniques.

There are failures less obvious to test engineers. In the XGBoost example, there may be a plot that is incorrect, or a statistic that not every test engineer has checked. In this situation, the advantage of blocking is that each test engineer has tested all combinations of t inputs, so failures that rely on a test engineer's individual specialties will be covered. If a test engineer uncovers a failure that is not being tested among all test engineers, they can generate a set of potential causes based on their test suite. They can then coordinate with other test engineers to check for the failure condition in one or more test cases that contain the potential cause or the computing system can compare received responses. This can speed up the fault localization effort, as if it is due to a t-input combination, one of the other test engineers will induce the same failure. To reduce the burden of investigating all the different potential causes, it is advantageous to use any information about the failures and inputs to start with potential causes more likely to induce a failure (e.g., most likely potential cause 5106 of FIG. 51). If no other test engineer observes the same failure, then it can be concluded that the failure is due to a combination involving t+1 or more inputs.

Another example for a block is workday, such as day of the week. For software development organizations, there may be a number of changes that are made to the code base daily. A test engineer wants to catch any failures introduced by newly submitted code as soon as possible. With time and resource constraints, there may be limits to the amount of tests that can be performed on a given day, and a limit to the number of tests to be created. Using the blocking approach described herein with a strength t+1 covering array for the full test suite, if a test engineer observes a failure on a particular day, they know that for the previous day all t-input combinations were tested. If there were no failures the previous day (or any failures were deemed fixed), then the observed failure is most likely either due to a new failure-inducing combination involving less than t+1 factors, or a recently introduced fault that resulted in a failure that was induced by more than t inputs that has not been tested in the previous few days. To determine which situation it is, it is simply a matter of running the failure-inducing test on the previous day's version of the software. If the test still fails, then it is due to a failure-inducing combination from t+1 or more inputs and can be tracked back to the day it started to fail. If it does not fail the previous day, then the failure is due to a new change, and can be investigated (e.g., using the hierarchy principle). In this case, a test engineer can combine tests from previous versions that exhibit the failure with the particular test to aid in fault localization.

One or more embodiments are useful for validating a system in operation and for further analysis if the system in operation fails to meet validation specifications. The blocking approach to test suites allows for the testing team to achieve the coverage benefits of covering arrays while harnessing the testing strengths of individual test engineers. The blocking approach also aids in fault localization, where test engineers need to isolate failure-inducing combinations when failures are uncovered during testing.

When validating a system (e.g., a software system, an electrical system, a mechanical system, and a complex system), sometimes there is data or settings available for testing the system. For instance, a tester of a software system may find a dataset in literature or data sets that have caused problems in the past. However, with this approach the tester would then need to search for existing data that contain the necessary testing structures or create their own. These approaches are resource intensive. Further, if data is taken from public or customer sources, or created by a user without a computer-generated approach described herein, there is no guarantee of sufficient coverage over the entire range of possible data structures. If there is not sufficient coverage, certain factors or factors of a dataset that cause issues may be overlooked. This is particularly true where there are a lot of potential sources of error coming from multiple factors in a very complex system (e.g., FIG. 42 has 34 different user options for hyperparameter tuning). Sufficient and efficient coverage may be particularly difficult when the investigator needs to investigate different design tests. In this case, the software may need to process aggregate data structure or data sets. If a complex system is intended to handle a variety of different situations or data sets, insufficient coverage of test cases can lead to a system failing to work as intended by a user or investigator when used outside of a test case from the investigation or validation.

One or more embodiments provide an effective and efficient way to generate different data sets that explore a variety of different situations for both inputs and outputs. Users can specify different types of input factors, number of runs, ways to generate response(s), etc. This is an improvement over data generation approaches that may just generate random data for a very specific set of inputs or generate random responses. A computing system can then use the generated datasets to test the performance of different systems or algorithms to see how they perform under different varieties of datasets. The computing system can be integrated or communicatively coupled with one or more platforms or environments for executing a system. For instance, if the platform is used to execute a software system, one or more options within the platform can be prespecified and integrated within a test suite that also includes data generation. In some embodiments, scripts can be generated automatically for execution of a system under a data set or system options (e.g., for testing a platform according to a design suite).

Figure 53:
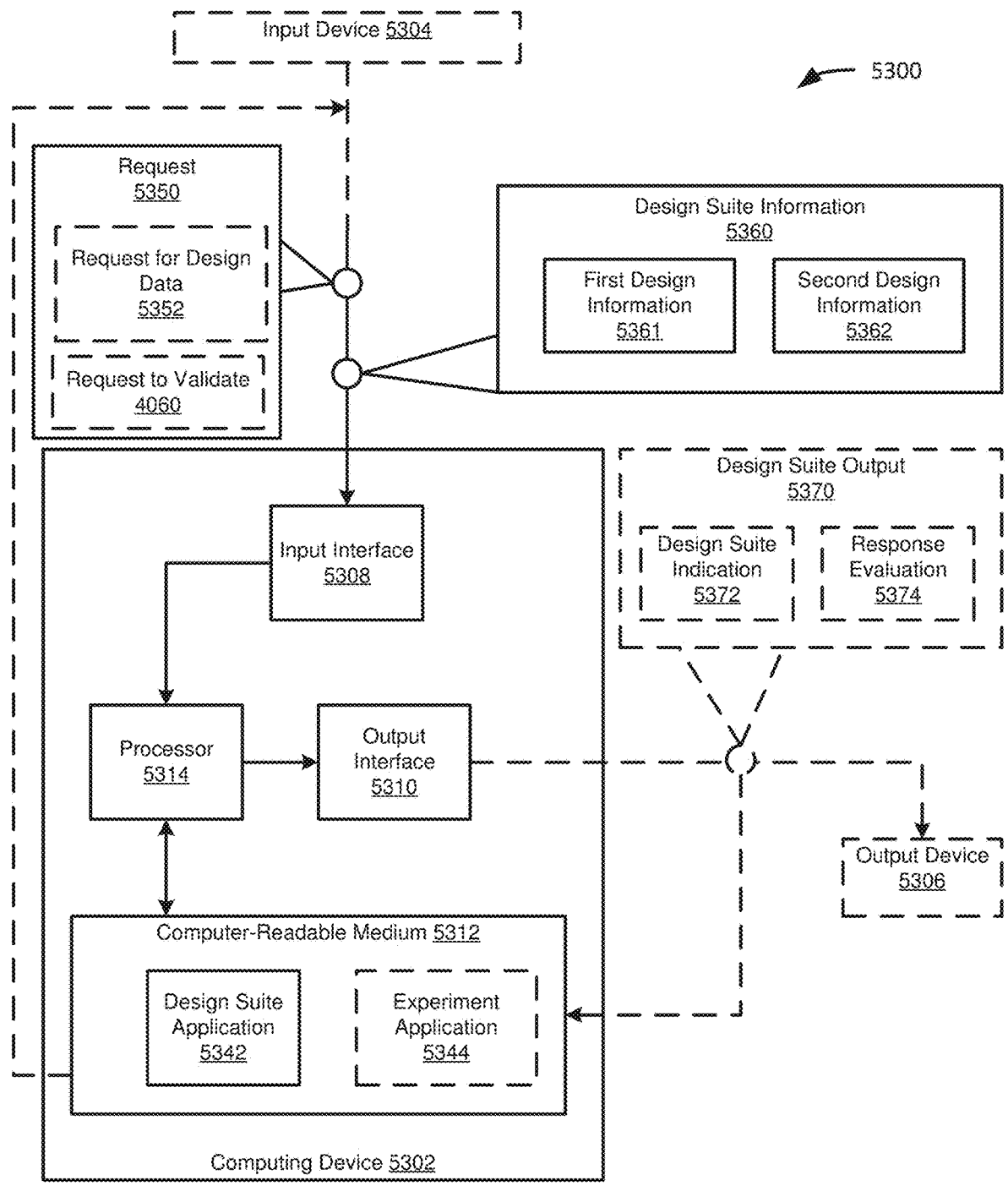
FIG. 53 illustrates an example block diagram of a system for generating data for a design suite in at least one embodiment of the present technology.

FIG. 53 illustrates an example block diagram of a computing device 5302 for generating data for a design suite. In one or more embodiments, the computing device 5302 is the same, has similar features, or is different from computing devices described herein (e.g., computing device 1302, computing device 3202, and computing device 4002).

For instance, the computing device 5302 can be configured to exchange (e.g., via wired and/or wireless transmission) information related to generating data for the design suite between devices in a system 5300 (e.g., output device 5306 and input device 5304) and/or devices in other systems described herein (e.g., system 1300, system 3200, and validation system 4000). For example, a network (not shown) can connect one or more devices of system 5300 to one or more other devices of system 1300, system 3200, and/or validation system 4000 (e.g., for receiving and sending messages).

In one or more embodiments, the computing device 5302 receives a request 5350 to generate computer-generated data for an experiment. For instance, the request 5350 may comprise a request for design data 5352 for a design suite (e.g., to explore settings for an electrical, mechanical, or computer system not shown). Additionally, or alternatively, the request 5350 may be a request to validate 4060 as described herein (e.g., whether software will crash under certain conditions or whether the software is providing expected results in a timely manner). The generated data in response to the request can comprise inputs defining one or more settings for a plurality of factors for a design of an experiment. For example, if the experiment is to validate that an engine system will not fail, the factors could be environmental (e.g., temperatures or humidity and the inputs could be the degrees and humidity level respectively) or the factors could be related to the engine itself (e.g., the factor could be fuel and the inputs different types of gasoline that would go into the engine). Additionally, the generated data can comprise generated responses according to the design of the experiment (e.g., how long the engine is predicted to run under these conditions). For instance, the responses can be generated based on a model developed for generating a response for the generated inputs (e.g., a simulation predicted time) or based on desired responses from a validator (the car needs to run for at least this long before switching from battery operation to gas).

An experimenter may have multiple goals for an experiment. For instance, a validator for an engine system may be interested in ensuring the system does not fail and also in considering maximum speeds the engine can produce. These design goals may have the same or other factors that influence that result (e.g., how fast did a vehicle comprising the system go during testing). In this case, there could be multiple different design spaces in which the validator would like to ensure coverage of in designing an experiment (e.g., the candidate inputs in respective design spaces related to failure and engine performance may differ in the number of factors, ranges for those factors, and whether the factors are continuous or categorical). In one or more embodiments, the generated inputs and generated responses are generated to be representative of a respective design space of multiple different design spaces for the design of the experiment.

In one or more embodiments, the computing device 5302 receives design suite information 5360 (e.g., for defining different design spaces for the design suite). For example, the design suite information could comprise design information 4050 described with respect to FIG. 40. In the example in FIG. 52, some design information may be already known or implicitly known by the computing device 5302 based on the nature of the experiment. For example, the experiment may test a software platform provided by the computing device 5302, so the range of inputs to that software platform may be already known to the computing device 5302 operating the software platform.

Some information or requests may be provided by the user or modified by a user (e.g., providing a disallowed combination or specifying one or more factors using input device 5304). As an example, the computing device 5302 may receive first design information 5361 comprising one or more first characteristics (e.g., a quantity of factors or a quantity of runs) for specifying generation of computer-generated data associated with a first design space of multiple design spaces. The first design space can define candidate options for generating inputs according to a first set of factors of factors in an experiment. The computing device 5302 may receive second design information 5362 comprising one or more second characteristics (e.g., a quantity of factors and the mix of categorical and continuous) for specifying generation of the computer-generated data associated with a second design space of the multiple different design spaces. The second design space defines candidate options for generating inputs according to a second set of factors of the plurality of factors. The design suite information 5360 could comprise information pertaining to more design spaces or only one design space. Two design spaces are given here only as an example.

The computing device 5302 could receive information or requests from input device 5304 or one or more other input devices described herein (e.g., input devices 4004). For instance, a user may use the input devices 5304 to enter or select a request or design space information. Alternatively, or additionally, computing device 5302 may generate the information or requests (e.g., based on defaults stored in computer-readable medium 5312 or information known about the experiment). As an example, JMP® provided by SAS Institute Inc. of Cary, N.C. can generate a list of hyperparameters and possible input values, but also allow users to add additional inputs or factors to define a design space related to a machine learning algorithm configured by the hyperparameters.

In one or more embodiments, the computing device 5302 receives information or requests via one or more input interface(s) 5308. The input interface(s) 5308 could comprise one or more features of an input interface described herein or is an input interface described herein (e.g., input interface 1308, input interface 3208, and input interface 4008). For instance, the input interface(s) 5308 could receive input received from an external device or internally within computing device 5302.

In one or more embodiments, the computer-readable medium 5312 comprises one or more features of one or more computer-readable mediums described herein or is one of computer-readable mediums described herein (e.g., computer-readable medium 4012, computer-readable medium 3212, and computer-readable medium 1312). In one or more embodiments, the computing device 5302 has a processor 5314. For instance, the processor 5314 comprises one or more features of one or more processors described herein or is one of processors described herein (e.g., processor 1314, processor 3214, and processor 4014).

In one or more embodiments, computer-readable medium 5312 stores instructions for execution by processor 5314. For example, in one or more embodiments, the computer-readable medium 5312 comprises a design suite application 5353 for generating a design suite that provides design cases for an experiment. The design suite can comprise the computer-generated data that represents settings constrained by different design spaces. As an example, one design suite could comprise a design with different experiment goals (e.g., whether an engine will fail and how fast can an engine drive a car) or the same goal for different sets of design cases but points of analysis (e.g., different factors that may contribute to engine failure). The generated design suite can include computer-generated data that represents, in a first set of design cases of the design suite, settings constrained by a first design space (e.g., based on first design information 5361), and represents, in a second set of design cases of the design suite, settings constrained by a second design space (e.g., based on second design information 5362).

Alternatively, or additionally, the computer-readable medium 5312 comprises an experiment application 5344 for conducting an experiment or evaluating an experiment according to the design suite. For instance, the experiment application 5344 can receive one or more resulting responses corresponding to conducting a first set of design cases and/or a second set of design cases. The experiment application 5344 can receive the resulting responses by generating (e.g., by testing a platform on the computing device 5302), input from another system (e.g., from sensors on an electrical or mechanical system being tested), or input from a user that conducted the experiments (e.g., environmental measurements). Alternatively, or additionally, the experiment application 5344 can evaluate one or more resulting responses according to one or more generated responses. For instance, the experiment application 5344 can compare a generated response to a response according to the experiment.

In one or more embodiments, the design suite application 5342 or experiment application 5344 may be performed in response to the request 5350. For instance, the design suite output 5370 may comprise a design suite indication 5372 (e.g., settings, features, or a summary of a design suite for conducting an experiment). Additionally, or alternatively, the design suite output 5370 may comprise a response evaluation 5374 comprising one or more evaluations of responses according to conducted experiments for a generated design suite. In one or more embodiments, the computing device 5302 outputs to an output device 5306 a design suite output 5370.

Output interface 5310 and output device 5306 could be one of or comprise features of output interfaces (e.g., output interface 4010, output interface 3210 and output interface 1310) and output devices (e.g., output device 4006, output device 1306 and output device 3206 described herein). For example, output device 5306 may comprise a display or a printer for communicating an evaluation or design suite to a user. Alternatively, or additionally, the output interface 5310 is an internal interface and feeds information back to the computing device 5302 (e.g., for conducting an experiment on the computing device 5302).

In one or more embodiments, fewer, different, and/or additional components than shown can be incorporated into the system 5300 than shown in FIG. 53 (e.g., components of system 1300, system 3200, validation system 4000 or one or more devices of a particular platform for which data is generated). For instance, components of input device 5304, computing device 5302 and/or output device 5306 can be incorporated into a particular platform device for validating performance or functionality of that platform.

Figure 54:
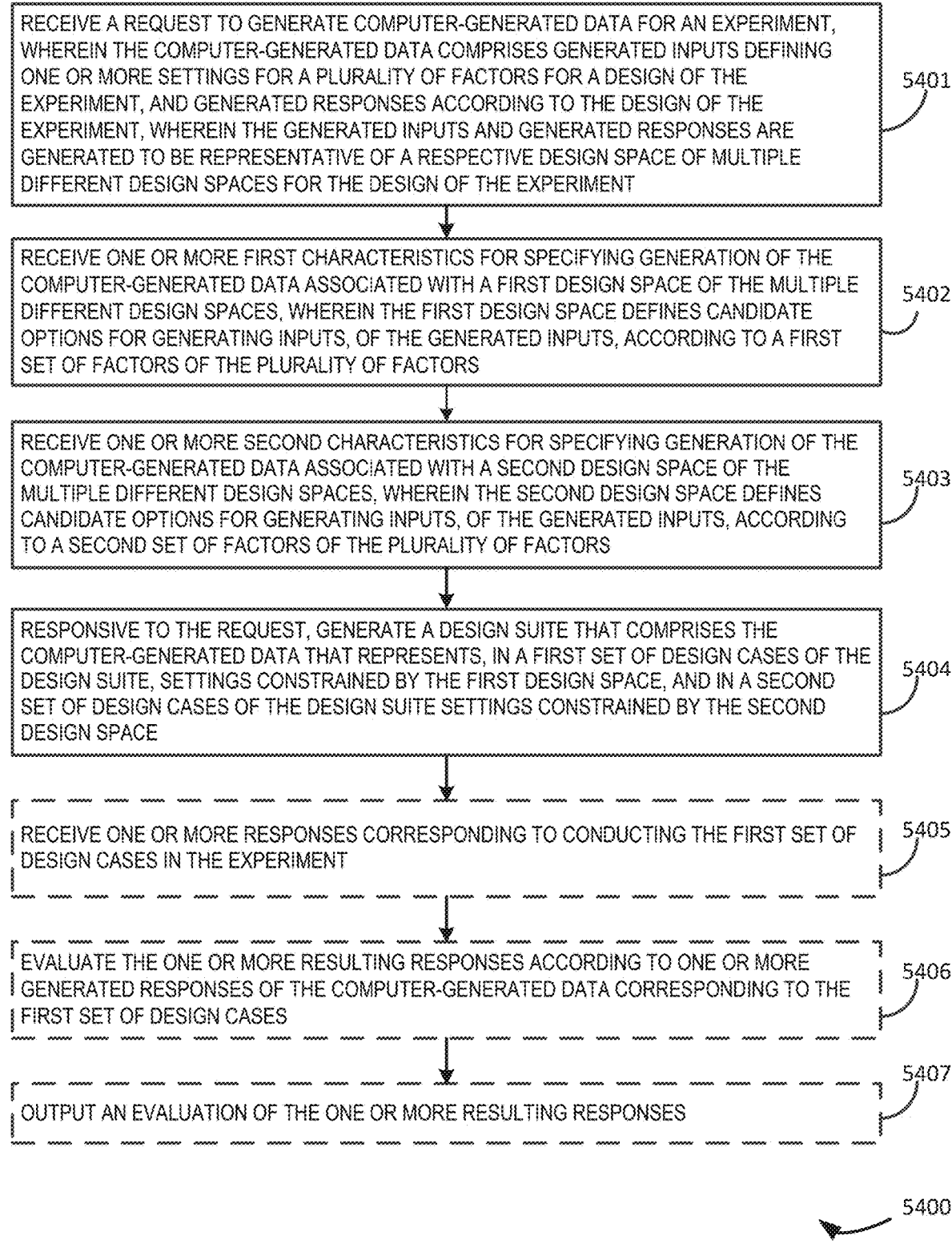
FIG. 54 illustrates an example flow diagram of a method for generating data for a design suite in at least one embodiment of the present technology.

In one or more embodiments, the system 5300 implements a method as described herein (e.g., a method 5400 shown in FIG. 54).

FIG. 54 illustrates an example flow diagram of a method 5400 for generating data for a design suite. An operation 5401 of the method 5400 comprises receiving a request to generate computer-generated data for an experiment. For instance, the request could be one related to a performance evaluation for a system (e.g., how well a system would perform under certain conditions or what inputs may cause a failure). The computer-generated data comprises generated inputs defining one or more settings for a plurality of factors for a design of the experiment, and generated responses according to the design of the experiment. In the example in FIG. 54, the generated inputs and generated responses are generated to be representative of a respective design space of multiple different design spaces for the design of the experiment. For instance, the request could be a user indication to validate, according to one or more validation specifications for the multiple design spaces. For example, if a validation specification relates to validating that inputs would not cause a failure for a system, the generated inputs may be distributed across candidate inputs of a design space for the system. The generated inputs and generated responses can be used to evaluate responses conducted according to an experiment performed for the system. For example, if a validation specification relates to determining if a system performed with a certain expected result or result tolerance, the generated responses could indicate an anticipated or allowed deviation based on testing one or more generated inputs.

An operation 5402 of the method 5400 comprises receiving one or more first characteristics for specifying generation of the computer-generated data associated with a first design space of the multiple different design spaces. The first design space defines candidate options for generating inputs, of the generated inputs, according to a first set of factors of the plurality of factors. For example, a computing system could display a graphical user interface prompting a user to specify one or more bounds for generation of the computer-generated data associated with a first design space (e.g., a quantity of factors of the first design space, a quantity of runs for design cases for the first design space, a disallowed combination restricting certain candidate inputs based on assigned inputs for other factors of the first design space, and/or bounds on how responses can be generated). Alternatively, or additionally some design constraints may be pre-defined, or computer generated (e.g., based on pre-defined constraints of a testing platform).

An operation 5403 of the method 5400 comprises receiving one or more second characteristics for specifying generation of the computer-generated data associated with a second design space of the multiple different design spaces. The second design space defines candidate options for generating inputs, of the generated inputs, according to a second set of factors of the plurality of factors. For example, one or more of the design spaces may differ in a quantity of factors. For instance, the one or more first characteristics may comprise a first quantity of factors constraining the first design space, and the one or more second characteristics may comprise a second quantity of factors constraining the second design space and the second quantity of factors is different from the first quantity of factors. Additionally, or alternatively, the nature of the factors for one or more of the different design spaces may be different. For instance, the one or more first characteristics comprise an indication that a first factor of the first set of factors comprises a first categorical factor with a first quantity of categories which defines candidate options in the first design space, and the one or more second characteristics comprise an indication that a first factor of the second set of factors comprises a different factor (e.g., a continuous factor, or a second categorical factor with a second quantity of categories different from the first quantity of categories and which defines candidate options in the second design space). A design suite can be generated that accommodates these different factor sets. For instance, the computing system can generate a design suite that comprises a full factorial design for factors of the first design space, or a fractional factorial design with a subset of candidate inputs from a full factorial design for the first design space. Additionally, the generated design suite can also comprise a full factorial design for factors of the second design space, or a fractional factorial design with a subset of candidate inputs from a full factorial design for the second design space.

An operation 5404 of the method 5400 comprises, responsive to the request, generating a design suite that comprises the computer-generated data that represents, in a first set of design cases of the design suite, settings constrained by the first design space, and in a second set of design cases of the design suite settings constrained by the second design space. For instance, the design suite may comprise a first set of factors according to a first quantity of factors and a second set of factors according to a second different quantity of factors. Alternatively, or additionally, where a given factor has different natures in the different design spaces, the design suite can comprise selected inputs selected from candidate inputs for a first categorical factor according to a first design space and selected inputs selected from candidate inputs for a continuous factor or a second categorical factor according to a second design space. Accordingly, one or more embodiments can transform specified characteristics for a respective design space into specific settings in a design suite that a user can use to conduct an experiment according to the settings. Further, the design suite is an improvement over traditional random computer-generated design suites, in that design suites generated according to method 5400 can better account for characteristics or user goals pertaining to multiple different design spaces.

More or fewer operations could be used to generate a design suite according to the method 5400 shown in FIG. 54. For instance, operations could be combined, performed in a different order, or performed simultaneously. For example, receiving one or more first characteristics and receiving one or more second characteristics could be received simultaneously after submission of data entered into a graphical user interface, or submission of a data message or computer instruction comprising fields pertaining to the characteristics. A computing system may receive a request to generate computer-generated data by receiving one or more of these characteristics for different design spaces and determining that the characteristics implicitly indicate a request to generate computer-generated data.

Further, in this example in FIG. 54, only two sets of characteristics are provided as illustration, but more characteristics for specifying generation could be provided that are the same or different from the ones described herein. Accordingly, the design suite could comprise multiple different designs. Further, the characteristics could relate to different generation features as described in more detail with respect to examples herein.

In some embodiments, a generated design suite can be applied to conduct an experiment. For instance, in this example, an optional operation 5405 of the method 5400 comprises receiving one or more responses corresponding to conducting the first set of design cases in the experiment. For instance, the generated inputs of the design suite may comprise synthetic inputs created by the computing system for designing the experiment without real-world or simulated data. Generated responses can be generated according to the generated inputs. The synthetic inputs can then be used for an experiment to generate real-world or simulated responses which can then be evaluated. Additionally, or alternatively, the generated inputs may comprise generated inputs based on or informed by one or more previous experiments of one or more of synthetic inputs, real-world data, and simulated data. For example, the generated design suite may comprise some pre-existing data and some supplemental synthetic data. Received responses could be computer-generated according to a simulation of a test system or observed responses of a test system.

In some embodiments, an optional operation 5406 of the method 5400 comprises evaluating the one or more resulting responses according to one or more generated responses of the computer-generated data corresponding to the first set of design cases. For instance, a computing system can compare respective responses of one or more design cases to the generated responses. Additionally, or alternatively, evaluations may be provided or account for one or more resulting responses according to one or more generated responses of the computer-generated data corresponding to the second set of design cases.

In some embodiments, an optional operation 5407 of the method 5400 comprises outputting an evaluation of the one or more resulting responses. For instance, in one or more embodiments a graphical user interface displays a visual summary of the one or more first characteristics and the one or more second characteristics. The visual summary may indicate overall or individual performance information for design cases associated with the characteristics (e.g., overall performance for a first set of design cases for the first design space and an overall performance for a second set of design cases for the second design space). For instance, the set of design cases may be used to determine whether a system will fail with a variety of inputs and the overall performance for those design cases may be a verdict indicating the system "passed" the tests or may indicate the system ran for over one hour without failure for the set of design cases. Failure could be a system crash or could be more subtle such as a deviation from a performance goal or computed metric. Generated data for design suites may be particularly useful when a new system or software is introduced. The system can be validated before being used for user data. This is especially helpful if the user must follow certain guidelines or regulations when conducting its business with the system or software.

Figure 55:
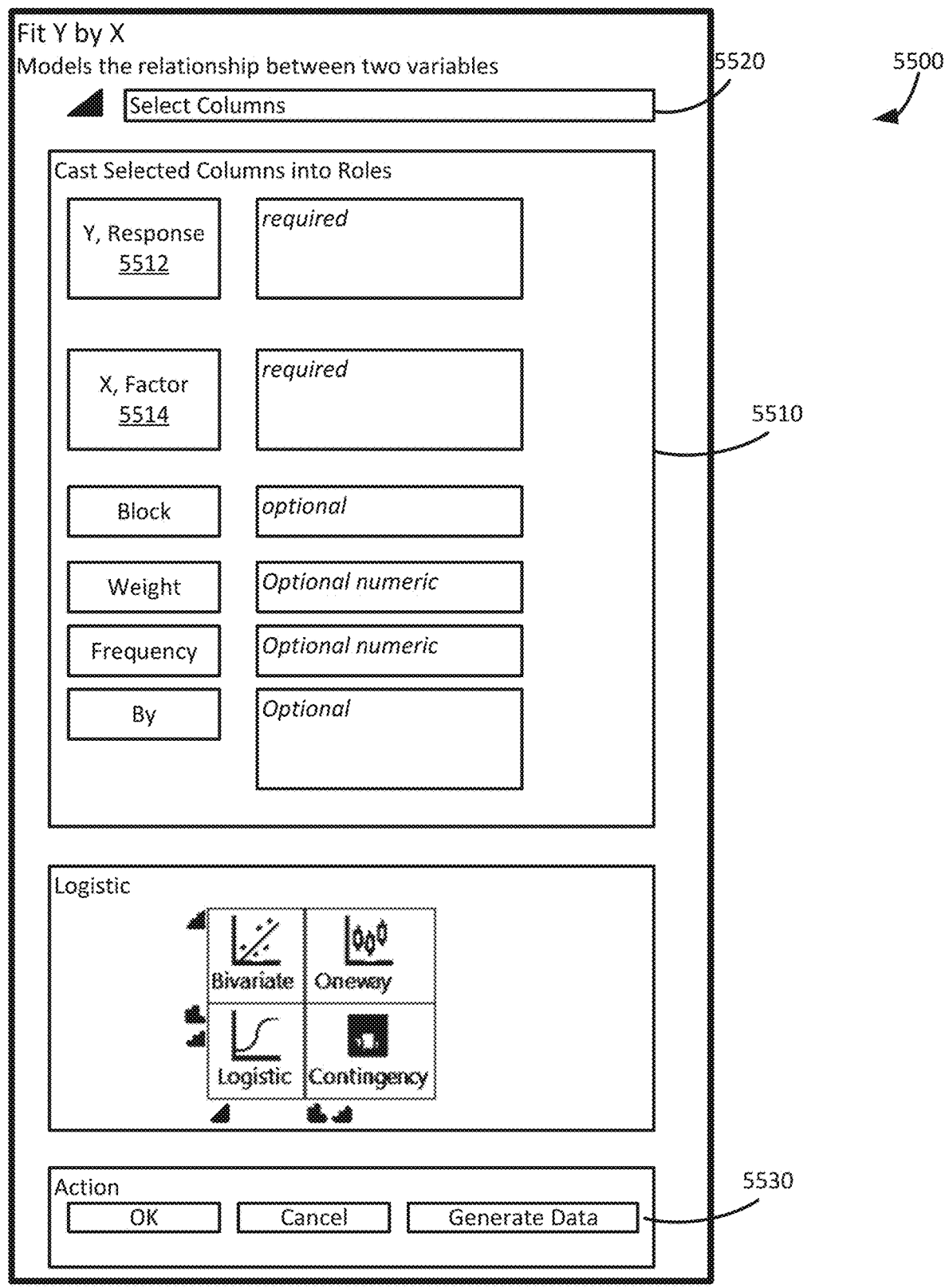
FIG. 55 illustrates an example graphical user interface for computer-generated data for an example software platform in at least one embodiment of the present technology.

FIG. 55 illustrates an example graphical user interface 5500 for computer-generated data for an example software platform. In this example, a user is given the capability to generate a suite of custom data sets for use in evaluating performance of software features for testing or validating features in the context of the user's unique workspace.

In this example, the graphical user interface 5500 is for a statistical platform. In the case of statistical software, the validation procedure may rely heavily on the use of datasets to test the analysis capabilities. These datasets must contain certain structures/features that ensure proper validation. The statistical platform in this example is a Fit Y by X platform which requires a data set with an X and a Y as shown in roles control portion 5510. Depending on the selected data types for the X and Y (e.g., selected columns of data from select columns control 5520), the output will be different. However, the user may want to test common functionality inherent to the platform without knowing exactly what the input type and output type is. For example, the user may not have used the select columns control 5520 to specify particular roles in roles control portion 5510 of the graphical user interface (e.g., setting Y, Response 5512 or X, Factor 5514) but may still want to test functions such as "Local Data Filter", "Redo", and "Save Script", as well as plots that appear once Fit Y by X is used to Model the relationship between two variables. A user may also have other user-specified objectives. For example, a user may want to test if there are issues with using certain features of the statistical platform in combination, such as features related to saving to memory or a disk certain scripts in combination. As another example, a user may want to model how long it takes different operations based on a combination of particular data and particular instructions to a platform.

One or more embodiments provided customized data set creation based on user needs. For instance, a user can select the generate data action 5530 to generate a design suite for an experiment based on user-specified objectives for one or more resulting responses of an experiment according to the design suite. A computing system can then evaluate the resulting responses according to the user-specified objectives.

One or more embodiments use a graphical user interface (e.g., graphical user interface 5900) to guide a user through differing things that one can change in a data set creation. Once specified, these can be used to derive inputs to a designed experiment (e.g., a design experiment according to a covering array or a Custom Design generated in JMP® provided by SAS Institute Inc. of Cary, N.C.). The designed experiment can depend on the purpose. For instance, the designed experiment may be designed using a covering array to find faults in the minimum runs or the designed experiment may be a Custom Design approach where a user might want to model different measures (e.g., performance measures) based on specified criteria. Once the criteria are specified, the computing system then creates a data set for each run of the designed experiment (or provides an option that creates the data set for any given row). For example, FIGS. 56A-56B provide an example of data set creation for this platform shown in FIG. 55. FIGS. 57A-57B provide an example of platform or option specific data set creation for the Fit Y by X platform of FIG. 55.

FIGS. 56A-56B illustrate an example graphical user interfaces for data generation for inputs and outputs for an example software platform. In this example, the tester is testing for software bugs that may generate an error in the software functioning and is using a covering array from possible X and Y values. In the graphical user interface 5600 the user can specify different variations for a computing system (e.g., one or more devices of system 5300) to generate synthetic data. This synthetic data can be used to give testers peace of mind regarding coverage of potential data structures specified by the user because if a covering array is used in constructing the design, then it can ensure complete coverage over certain combinations of factors (the strength of the covering array) with high levels of efficiency.

In the example graphical user interface 5600, the user can specify criteria related to generating data for inputs, outputs, and the number of runs in the design suite for different design spaces for the Fit Y by X platform. For instance, the user can specify that the input variable X can be one of continuous, categorical, or discrete numeric. Discrete numeric factors can sometimes be referred to as ordinal factors. The user is also able to specify the number of levels for categorical or discretized continuous inputs (e.g., 2, 3 or 10 levels). The user can specify the balance of inputs for sets of design cases in the design suite (e.g., balanced, unbalanced and random inputs for the factors). For instance, if a factor had two levels that could take one of L1 or L2, a balanced set of design cases would have the same or nearly the same number of L1 or L2's across all design cases of the design, whereas an unbalanced design may have more D's or more L2s, and a random set of design cases could be generated without regard to the balance. These same kinds of criteria can be specified for the output (Y) to ensure balance in output. This can be useful for when the user is checking a particular result from an experiment like certain performance criteria and wants to ensure testing of certain inputs that are likely to produce those desired criteria. In this example, the user was able to specify different numbers of runs (10, 50 and 1000) for different designs according to criteria for the input (X) and output (Y).

These values for the different data generation criteria could be specified as defaults that the user can augment (e.g., adding more or fewer values, or removing a factor in data generation using remove control 5602). Alternatively, or additionally, the user can add factors of pre-defined type using the add factor control 5606 or add a factor defined by the user (e.g., using textbox 5604). For instance, if the experiment is going to be conducted by another system, a user may want to specify blocking factors such as another operator or environmental factor for conducting the experiment.

In graphical user interface 5600 the user confirms or configures the test structure (e.g., setting x and y types, levels and balances, and the number of runs for the design test). Once the tester has determined the data structure factors and desired level of coverage, a design suite is generated.

The computing system can display the generated design suite to the user. Alternatively, or additionally, the computing system can display a visual summary of characteristics for specifying generation of data. FIG. 56B shows an example graphical user interface 5630 displaying an example visual summary of different characteristics for generating the design. Each of the rows of this visual summary is associated with a set of design cases, where each set of design cases has 10, 50 or 1000 design cases or runs in it. For example, row 5632 summarizes a first set of design cases that correspond to characteristics for data generation corresponding to a first quantity of design runs (i.e., 10 runs), and row 5634 summarizes a first set of design cases that correspond to characteristics for data generation corresponding to a second quantity of design runs (i.e., 50 runs). The design suite corresponding to this visual summary in graphical user interface 5630 can have 5,300 design cases with a first set of design cases corresponding to the 10 runs and a second set of design cases corresponding to the 50 runs. The visual summary advantageously presents a consolidated view of the important features of a much larger design suite. The user can also get a holistic response for these different sets of design cases in a response column 5636 (e.g., an outcome of an experiment for that set of design cases or whether all the design cases in the set met or exceeded a predicted or expected generated response).

In this example, the user saves a great deal of time by using the synthetic data, because the user did not need to spend extensive time tracking down or creating appropriate datasets, this one having 5,300 design cases as part of it. There may also be factors needed for data generation or one or more user objectives that the user has not specified. For example, FIG. 56C shows a graphical user interface 5660 of an expanded visual summary containing the information in FIG. 56B with additional information 5662 generated by the computing system in the absence of user supplied information. For instance, the computing system has assigned different options related to getting a response such as whether to save a script to data table, journal, window, log, report and/or a clipboard, and whether to redo analysis or copy a graph.

Embodiments are useful where a user has first specified a system (e.g., when embodiments are integrated with a software platform, or can receive an indication of a machine learning algorithm). In this case, information may be known to the computing system regarding the types of inputs, responses, and options that can be changed for that platform. Instead of being in a design space with infinite options for factors, design space options can be adjusted or narrowed for that platform, and some options for the platform can be pre-defined or pre-loaded (e.g., receiving characteristics based on receiving an indication of a software platform or machine learning algorithm associated with factors in the design suite). For instance, the user can specify a platform (like the Fit Y by X platform), and the computing system can provide a list of data set factors and platform factors for that platform or algorithm. The computing system can receive one or more resulting responses according to an experiment based on a generated design suite responsive to submitting the settings constrained by a design space of the design suite into the software platform or algorithm.

FIGS. 57A-57B illustrate example graphical user interfaces for platform-specific data generation for an example software platform for the Fit Y by X platform. In graphical user interface 5700, the list of data set factors and platform factors can be predefined. The user could augment, add, or remove factors as in FIG. 56A. In graphical user interface 5750, the computing system has created a design that takes the full set of data set and platform factors. Each row of this design provides a different data set and inputs to the platform. For each row, the computing system can generate a script that takes the data set defined by that row and runs it in the platform with the options given in that row.

In this example, platform-options are generated, and synthetic data generated for the platform. In this case the design suite summarized in graphical user interface 5750 was generated by Custom Design in JMP® for a continuous response variable. Other tools for design suite generation could have been used.

Some platforms have more complicated options than the example shown with respect to the Fit Y by X platform. For instance, JMP 16 provided by SAS Institute Inc. of Cary, N.C. has a Prediction Profiler that allows a user to interact with a statistical model. For example, a user can generate predictions from a model responsive to changing settings for inputs to the models in an interactive graphical user interface for the Prediction Profiler. For instance, the interactive graphical user interface can comprise an interactive matrix of plots. An interactive plot in the matrix could show an independent variable on the x axis and a dependent variable on the y axis. The interactivity of the plot could support a user's ability to drag a vertical line in the plot to change a current x-value. This action could force all the plots in the matrix to redraw (e.g., continuously) with the dragged line. For example, if there is a two-factor interaction involving the factor whose value is changing, then the slope of the function for the other factor involved in the interaction can change simultaneously.

The user can use the Prediction Profiler to find particular settings based on certain goals (such as maximizing an optimality criterion). For example, if a user was looking at a criterion such as predicting hardness of a substance, the inputs in an interactive plot of the Prediction Profiler may pertain to certain components of that substance such as silica, silane, and sulfur. Using the interactive plots, the user could increase or decrease silica and see how that would affect hardness and find settings for all three components that would maximize hardness. Prediction Profiler also allows users to set disallowed combinations for a model as described herein. Checking functionality of this platform in a meaningful way can be difficult as the profiler needs to display correctly under different settings. Further, the profiler allows users to select different goal options such as maximize desirability, and the profiler will need to present a point that is either optimal or close to optimal which may not be known.

Figure 58A:
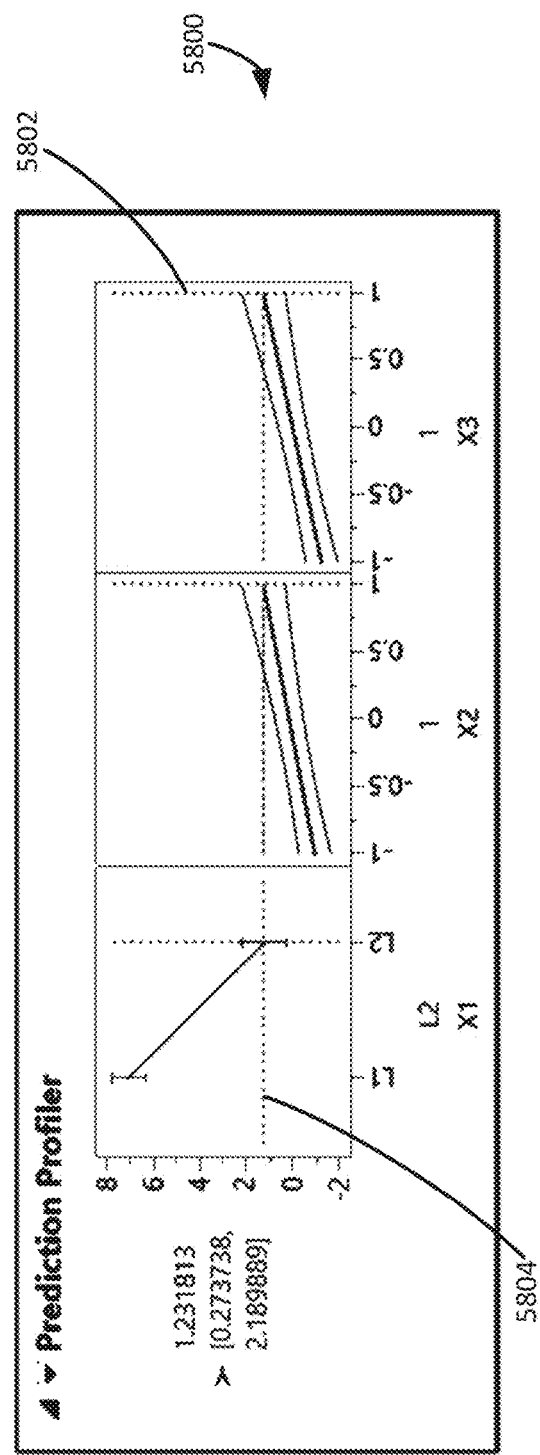
FIGS. 58A-58B illustrate an example of a graphical user interface for setting disallowed combinations for a design space of a design suite in at least one embodiment of the present technology.
Figure 58B:
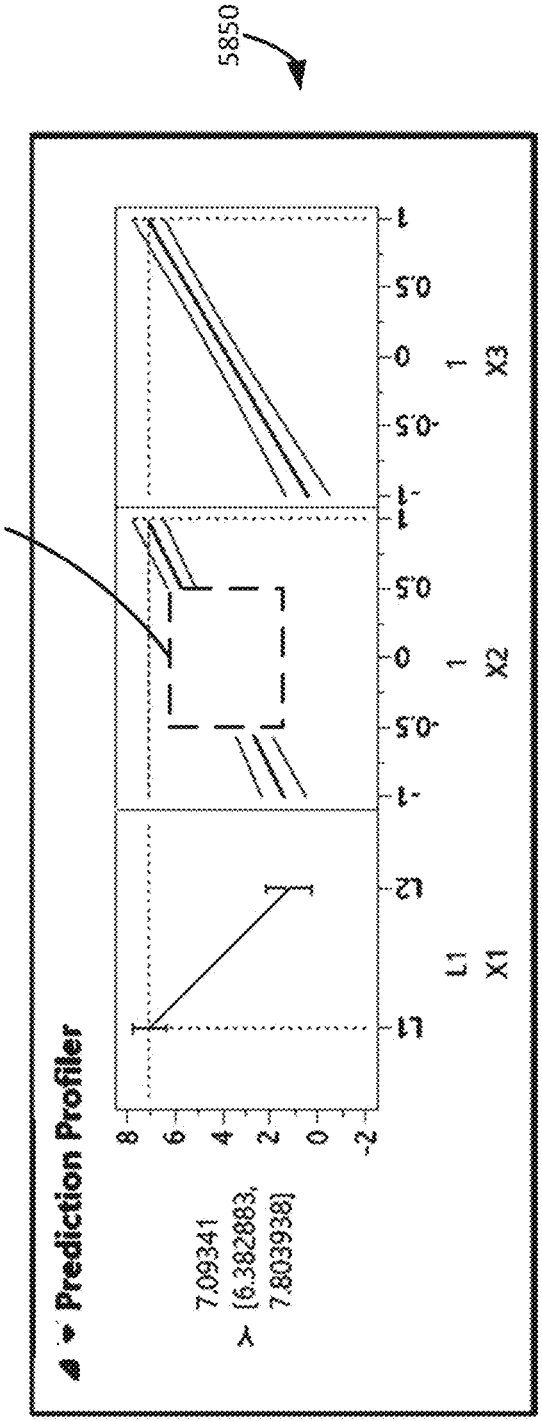

FIGS. 58A-58B illustrate an example of a graphical user interface for a Prediction Profiler platform that sets disallowed combinations for a design space of a design suite. FIGS. 58A-58B show a row of plots showing the conditional relationships of a dependent variable (Y) against all the independent variables (X1, X2, X3). That is, the function shown in each plot is the graph of the conditional relationship of the plotted x-variable at fixed values of all the other x variables. Vertical lines (e.g., vertical line 5802) in each plot fall onto the x-axis at the current fixed x-value. All the current x values are displayed below the relevant x-axis. Horizontal lines (e.g., horizontal line 5804) across each row of the matrix fall on the y-axis at the predicted y-value which is displayed to the left of each y-axis. In this example, there are independent variables including a 2-level categorical factor (X1) with levels L1 and L2, and for both X2 and X3 there are continuous inputs possible between −1 to +1. In this example disallowed combination, there is a restriction that when X1="L1", X2 cannot be between −0.5 to 0.5. The disallowed combination for a data generation is set and visualized with the Prediction Profiler. FIG. 58A shows a graphical user interface 5800 showing the possible values for X2 and X3 when X1=L2. FIG. 58B shows a graphical user interface 5850 showing the possible values for X2 and X3 when X1=L1. As shown in FIG. 58B, there is a gap 5852 in the possible values for X2 under the conditions shown in graphical user interface 5850.

FIG. 59 illustrates an example of a graphical user interface 5900 for specifying characteristics for design spaces of a design suite in the more complex example. In this example, the design suite is used to set up data set creation and test options for the Prediction Profiler. Considerations are given to a variety of areas for the Prediction Profiler such as the number of factors, types of factors, number of levels, distribution of factors (i.e., draws from a distribution vs. a designed experiment), number of runs, missing values, number of responses, generation of responses, multiple disallowed combination constraints, etc. In this example, where there is a variety of types of data, it quickly becomes problematic to ensure that a design suite has representative data sets that cover the range of data that can be expected in the field. It is useful that these problems are found before the system is used for real-life data.

Figure 60:
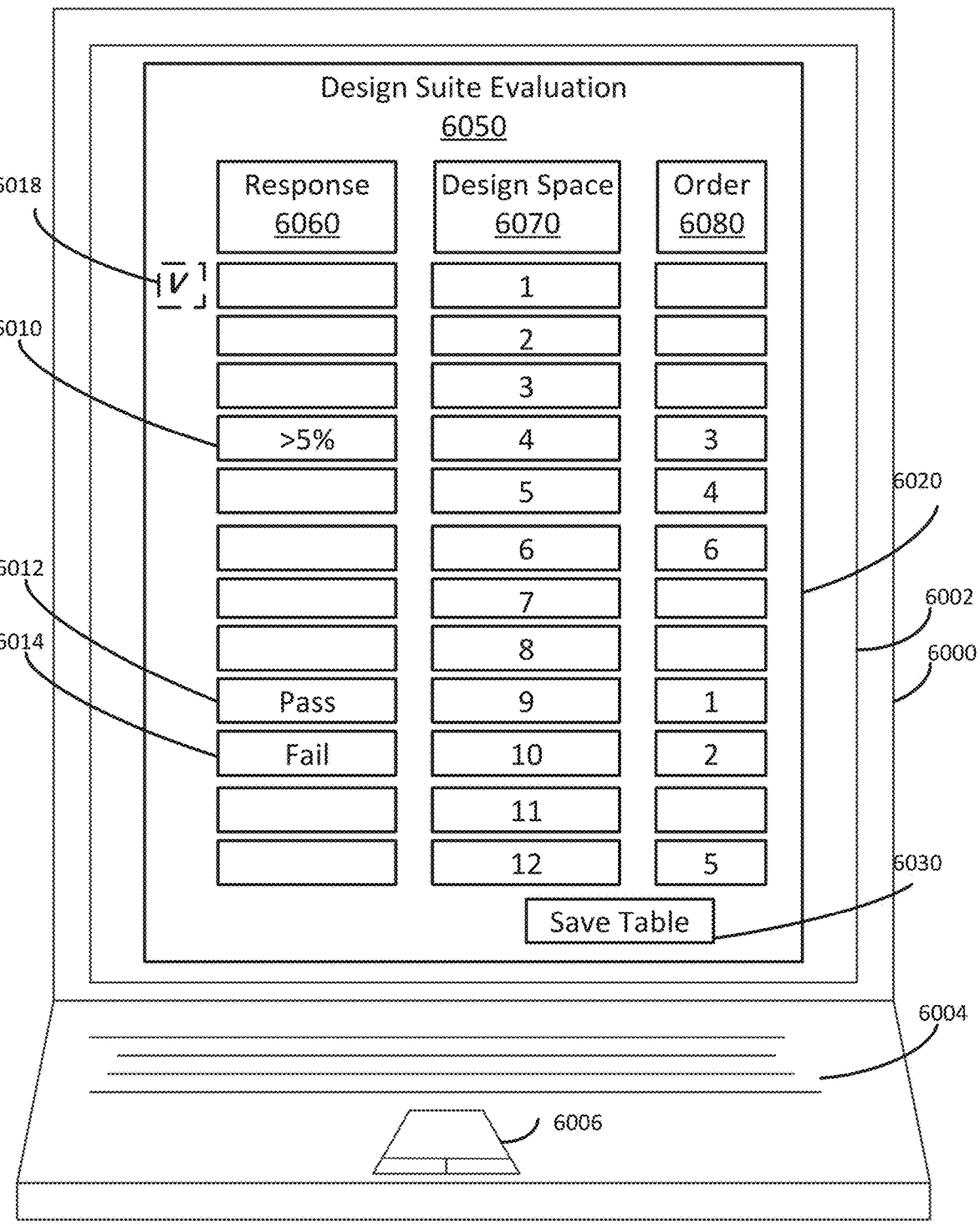
FIG. 60 illustrates an example graphical user interface for specifying execution of the design suite in at least one embodiment of the present technology.

FIG. 60 illustrates an example graphical user interface 6002 on a computing device 6000 for specifying execution of the design suite. In this example, a tester can generate a super-table that guarantees a desired level of coverage through a suite of computer instructions for creating individual datasets. This enables a user to create suites of datasets (some potentially very large) using a graphical user interface and select an order of execution of design cases (e.g., by clicking or selecting options or buttons of a graphical user interface). For example, a computing system can generate a design suite by designing a covering array for different sets of factors pertaining to different design spaces and receive one or more resulting responses according to a set of inputs of the covering array. An evaluation of the one or more responses can be displayed in a visual summary (e.g., indicating a failure or passing of design cases).

In the example in FIG. 60, the computing device 6000 displays in a visual summary 6020 evaluations performed for a design suite based on characteristics for specifying generation of computer-generated data associated with different design spaces (e.g., according to characteristics specified in FIG. 59). Rather than show the specific specified conditions for generating a set of design cases, these characteristics are shown implicitly by design space information in design space column 6070. Evaluations for each of the set of design cases corresponding to a design space are recorded in response column 6060 as the execution of a set of design cases are completed. The evaluations pertain to performance of the Prediction Profiler as an example, and responses are indicated indicating different responses pertaining to performance such as ("pass", "fail", margin of deviation of ">5%"). The user has specified an order of completion of a subset of design cases in the design suite by ranking the sets in an order column 6080. For instance, the user can use the track pad 6006 and keyboard 6004 to rank an order of certain ones of the design case sets of a design suite by selecting a particular visual representation of different characteristic associated with different design spaces. The user has received three evaluations according to user selection in the visual summary pertaining to characteristics sets defining different design cases.

The user selection of different orders of experimentation for the sets of design cases enables assignment by the computing system of different computing nodes for execution of the experiment. Subsequently, ordered design cases may be capable of executing multiple cases in the same or different sets in parallel.

In one or more embodiments, a user can select or mark other features of the visual summary 6020. For example, the computing system responsive to a user selection of a particular row has associated an indicator 6018 visually indicating a feature or quality of a dataset. For instance, a dataset may have been investigated, or used before, and the user may want to mark them as being "verified" as to their usefulness. As an example, a verified data set can be used to indicate data sets that have been useful in the past (e.g., data sets that were able to produce a failure in a system). They can also be used to indicate or to save characteristics for data sets that may be useful in the future. For instance, characteristics pertaining to generation of data may be saved to a construction library so that a computing system can generate data or a design suite from instructions for generating the verified data set for a subsequent design suite, without having to save the actual design cases.

Once a table is built as shown in FIG. 60. A user can select to save the table (e.g., by selecting a save table option 6030 to save a table to a disk or memory). The computing system can then save instructions to create the data tables without needing to store the actual generated inputs. This can save storage resources. Information or instructions for generating a dataset can take up less memory or disk storage than generated inputs according to the information or instructions. This tool can then be used not just by testers but also by other groups such as researchers developing new techniques and algorithms. The researchers can share simulated data tables as supplementary material to the research to encourage replication and further research. Alternatively, or additionally, different data sets could be stored in a project that keeps data available and allows a user to select through the different cases (data sets) that have been created. In this example, an indicator 6018 is used to mark a set of design cases that have been "verified" in some way (e.g., options have been evaluated and shown to result in a failure).

FIG. 60 presents a visual summary with simply a reference to 12 different design spaces. The visual summary could have been presented differently such as with explicit references to the characteristics that go into data generation associated with those design spaces. For example, FIGS. 61A-61C illustrate an example graphical user interface of a visual summary of a design based on a strength 2 covering array for specified factors of design spaces in the visual summary 6050 of FIG. 60. As in FIG. 60 a computing system can be used to generate a data set for each specified row (e.g., Custom Design provided by SAS Institute Inc. or a random distribution tool). In this display format, the user can easily see that each of the rows of the graphical user interface describes the factor type for each of different factors, specifies disallowed combinations, specifies options for generating the responses, and specifies options for testing the prediction profiler. For instance, in FIG. 61A, portion 6100 of the graphical user interface shows summarized computer generated criteria for inputs for factors (e.g., X1-X10) (e.g., according to user criteria in FIG. 59 specified for X1-X4 and remaining factors). In FIG. 61B, portion 6130 of the graphical user interface shows different computer-generated response criteria and constraints. In FIG. 61C, portion 6160 of the graphical user interface shows additional computer-generated constraints.

For instance, the user can specify one or more characteristics that comprise one or more constraints or distribution requirements for generating inputs for a first set of design cases in the design suite. As an example, FIG. 61B shows disallowed combinations in column 6133 for a respective design space. The computing system can refrain, according to the constraint from selecting inputs for a respective design case in a constrained region of candidate inputs. For example, for the first design space, the factor X1 cannot be assigned an input of 1 in a design case corresponding to design space 1 when X2 is equal to 1. Some of the design constraints are expressed in a continuous form. For example, in FIG. 61C, column 6161 has continuous constraints for respective design spaces. In this case, the computing system may modify a received disallowed combination for processing of assigning inputs (e.g., discretize candidate values for X1 and X2 to determine bounds for assigning inputs in the design suite).

As another example, FIG. 61C shows distributions requirements for design creation of inputs regarding considering interactions and main effects of factors in column 6162. This can control how inputs are assigned or distributed to isolate certain factors or certain combinations of factors (e.g., by selecting or refraining from selecting certain inputs).

Alternatively, or additionally, characteristics for specifying generation of computer-generated data comprise requirements for generating responses (e.g., different response types). For example, if the user response goal is related to maximizing an output, FIG. 61C, specifies options for responses of the Prediction Profiler such as whether to maximize and remember in column 6163 and the extent to maximize desirability in column 6164. As another example, in FIG. 61B the options include number of responses in column 6131 (e.g., 1, 3 or 5). Further, the different sets of design cases can have different user goals in the Prediction Profiler. For instance, response goal column 6132 provides different options for different response types in the Prediction Profiler such as Maximize, Random, Match Target, and Minimize. Accordingly, the visual summary can receive different types of responses based on specifications and this can be independently evaluated by the computing system. Distinct evaluations can be displayed in the visual summary 6020 in FIG. 60.

Each of these sets of design cases can have different numbers of design cases as specified. For instance, FIG. 61C shows a run size column 6165 with run sizes selected of either 32 or 64.

The user can have the flexibility to specify other factors than what is shown here. For example, the user could add a factor that determines the seed used to generate random output or even a factor that determines how the data table is generated (i.e., full factorial vs. fractional factorial designs). Accordingly, embodiments herein provide flexible interactive graphical user interfaces for a user to specify criteria for generating data even with complex platforms and to view evaluations performed according to that generated data. Should an evaluation indicate a problem with one or more design case in a design set, embodiments enable graphical user interfaces for detecting problematic design cases.

Figure 62A:
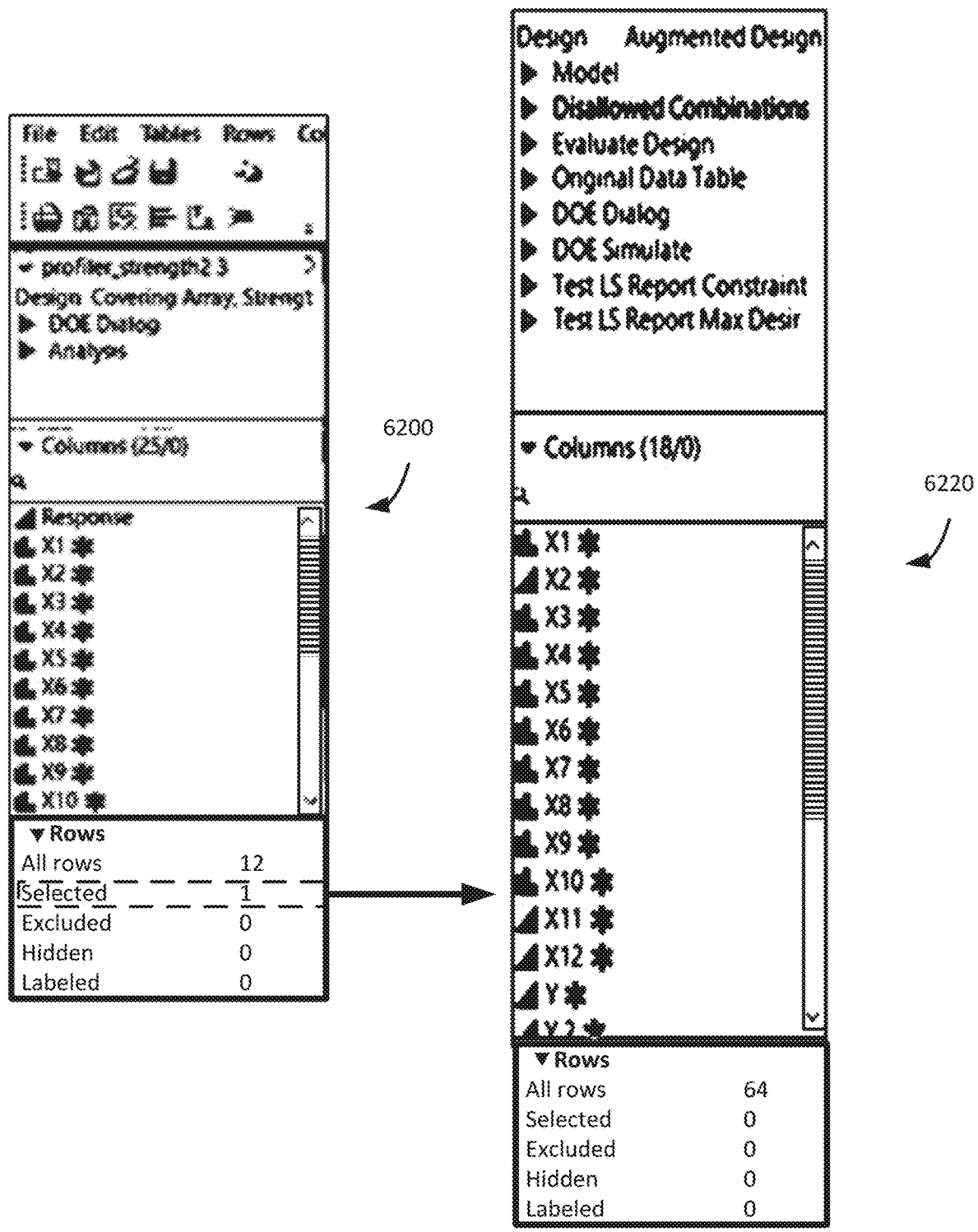

FIGS. 62A-E illustrate example graphical user interfaces for design cases corresponding to a single design space of multiple different design spaces of a design suite corresponding to the specifications in FIGS. 61A-61C. In FIG. 62A, graphical user interface 6200 shows information pertaining to the full design suite as defined by the user (e.g., with 12 rows corresponding to each of the design spaces and information on 10 specified factors). The user can select one or more of these set of design cases that make up a design suite for further exploration (e.g., for localizing the source of a problematic evaluation). In FIG. 62A, the user has selected one row of the visual summary which corresponds to a set of 64 design cases. Graphical user interface 6220 displays information pertaining to that set of selected design cases. The design cases in this set can be individually augmented by the user in the graphical user interface 6220. For example, the user can exclude design cases or add in additional disallowed combinations. It is noted that in FIG. 59 the user specified particular value options for factors X1-X4 (i.e., 3-level discrete numeric and 3-level categorical) and particular value options for remaining factors (i.e., continuous, categorical, and mix). In FIGS. 62B and 62C, the computing system has synthesized inputs for 12 factors corresponding to design space "5" in design space column 6190 in FIGS. 61A-C. For instance, there is input data generated for 64 design cases and 3 response values simulated. FIGS. 62B-62C show portions of a graphical user interface 6240 containing the specified input values for the 12 factors and the 64 runs corresponding to this one set of design cases of the design suite. FIGS. 62D and 62E show a graphical user interface 6260 which displays example generated response values in columns 6262 for 3 responses for each of the 64 runs according to the design. The generated response values can be used for evaluating responses according to the generated inputs in FIGS. 62B and 62C.

Rather than the user having to review the 576 design cases in a design suite, the user can view the visual summary of the design suite with a holistic evaluation, and hone on a particular subset of design cases for further analysis (e.g., design cases associated with a failure indication). Accordingly, one or more embodiments provide an improved technique for generating data according to different design spaces and improve user interaction with design suites comprising the generated data and experiments conducted according to the design suites.

What is claimed is:

1. A computer-program product tangibly embodied in a non-transitory machine-readable storage medium, the computer-program product including instructions operable to cause a computing system to:
  receive a request to generate computer-generated data for an experiment, wherein the computer-generated data comprises generated inputs defining one or more settings for a plurality of factors for a design of the experiment, and generated responses according to the design of the experiment, wherein the generated inputs and generated responses are generated to be representative of a respective design space of multiple different design spaces for the design of the experiment;
  receive one or more first characteristics, wherein:
    at least one of the one or more first characteristics is received by receiving an indication of an identity of a software platform or machine learning algorithm;
    the one or more first characteristics are for specifying generation of the computer-generated data associated with a first design space of the multiple different design spaces; and
    the first design space defines candidate options for generating inputs, of the generated inputs, according to a first set of factors of the plurality of factors;
  receive one or more second characteristics for specifying generation of the computer-generated data associated with a second design space of the multiple different design spaces, wherein the second design space defines candidate options for generating inputs, of the generated inputs, according to a second set of factors of the plurality of factors;
  responsive to the request, generate a design suite that comprises the computer-generated data that represents, in a first set of design cases of the design suite, settings constrained by the first design space, and represents, in a second set of design cases of the design suite, settings constrained by the second design space;

submit settings of the first set of design cases into the software platform or machine learning algorithm;

receive one or more resulting responses corresponding to conducting, with the software platform or machine learning algorithm, the first set of design cases in the experiment;

evaluate the one or more resulting responses according to one or more generated responses of the computer-generated data corresponding to the first set of design cases; and output an evaluation of the one or more resulting responses.

2. The computer-program product of claim 1, wherein the instructions are operable to cause the computing system to generate the design suite that comprises:

a first fractional factorial design with a first subset of candidate inputs for the first set of factors from a full factorial design for the first design space; and a second fractional factorial design with a second subset of candidate inputs for the second set of factors from a full factorial design for the second design space.

3. The computer-program product of claim 1, wherein the generated inputs of the design suite comprise synthetic inputs created by the computing system for designing the experiment without real-world or simulated data.

4. The computer-program product of claim 1, wherein the generated inputs of the design suite comprise generated inputs based on one or more previous experiments of one or more of synthetic inputs, real-world data, and simulated data.

5. The computer-program product of claim 1, wherein the instructions are operable to cause the computing system to generate the design suite by:

displaying in a graphical user interface a visual summary of the one or more first characteristics and the one or more second characteristics; and receive the one or more of the resulting responses according to user selection in the visual summary pertaining to the one or more first characteristics.

6. The computer-program product of claim 5, wherein the user selection comprises one or more of:

an order of experimentation for the first set of design cases and the second set of design cases; and assignment of different computing nodes for execution of the experiment for the first set of design cases and the second set of design cases.

7. The computer-program product of claim 1, wherein the instructions are operable to cause the computing system to:

generate the design suite by displaying in a graphical user interface a visual summary of the one or more first characteristics and the one or more second characteristics; and evaluate the one or more resulting responses by:

comparing respective responses of multiple design cases associated with the first set of design cases of the design suite to generated responses for the first set of design cases; and displaying in the visual summary an indication of overall performance for the first set of design cases.

8. The computer-program product of claim 1, wherein the instructions are operable to cause the computing system to:

generate the design suite by displaying in a graphical user interface a first visual representation of the one or more first characteristics and a second visual representation of the one or more second characteristics;

receive a user selection of the first visual representation; and responsive to the user selection, associate an indicator with the first visual representation indicating a verified data set for a construction library comprising the one or more first characteristics, wherein the construction library comprises instructions for generating the verified data set for a subsequent design suite.

9. The computer-program product of claim 1, wherein the instructions are operable to cause the computing system to:

receive the request by receiving a user indication to validate, according to one or more validation specifications for the multiple different design spaces, wherein the one or more validation specifications relate to determining deviation from a respective specified result for the software platform or machine learning algorithm based on testing one or more inputs of the design suite submitted to the software platform or machine learning algorithm; and evaluate the one or more resulting responses by indicating a respective deviation from the respective specified result.

10. The computer-program product of claim 1, wherein the instructions are operable to cause the computing system to:

generate the design suite by designing a covering array for the first set of factors;

receive the one or more resulting responses according to a set of inputs of the covering array;

evaluate the one or more resulting responses by indicating a failure indication corresponding to the set of inputs; and display the subset of design cases of the design suite that are associated with the failure indication.

11. The computer-program product of claim 1, wherein the instructions are operable to cause the computing system to:

generate the design suite based on a user-specified objective for the one or more resulting responses of the experiment; and evaluate the one or more resulting responses according to the user-specified objective.

12. The computer-program product of claim 1, wherein the one or more first characteristics comprise a first quantity of factors constraining the first design space and the one or more second characteristics comprise a second quantity of factors constraining the second design space and the second quantity of factors is different from the first quantity of factors; and wherein the instructions are operable to:

generate the design suite that comprises the first set of factors according to the first quantity of factors and the second set of factors according to the second quantity of factors;

receive the one or more additional responses corresponding to conducting the second set of design cases in the experiment; and evaluate the one or more additional responses according to one or more generated responses of the computer-generated data corresponding to the second set of design cases.

13. The computer-program product of claim 1, wherein the one or more first characteristics comprise an indication that a first factor of the first set of factors comprises a first categorical factor with a first quantity of categories which defines candidate options in the first design space;
wherein the one or more second characteristics comprise an indication that a first factor of the second set of factors comprises a continuous factor, or a second categorical factor with a second quantity of categories different from the first quantity of categories and which defines candidate options in the second design space; and
wherein the design suite comprises selected inputs selected from candidate inputs for the first categorical factor and selected inputs selected from candidate inputs for the continuous factor or the second categorical factor.

14. The computer-program product of claim 1, wherein the one or more first characteristics comprise a first quantity of design runs of the design suite for the first set of design cases and the one or more second characteristics comprise a second quantity of design runs for the second set of design cases that is different than the first quantity of design runs; and
wherein the instructions are operable to:
generate the design suite that comprises the first set of design cases and the second set of design cases;
receive the one or more additional responses corresponding to conducting the second set of design cases in the experiment; and
evaluate the one or more additional responses according to one or more generated responses of the computer-generated data corresponding to the second set of design cases.

15. The computer-program product of claim 1,
wherein the one or more first characteristics comprise one or more constraints or distribution requirements for generating inputs for the first set of design cases; and
wherein the instructions are operable to generate the design suite by refraining, according to the one or more constraints or distribution requirements, from selecting inputs for the first set of design cases in a constrained region of candidate inputs according to the one or more constraints or distribution requirements.

16. The computer-program product of claim 15, the instructions are operable to generate the design suite by:
receiving one or more disallowed combinations for the first design space;
wherein the one or more disallowed combinations comprise, for a first factor of the first set of design cases, a first set of values that are restricted from being assigned to the first factor if a second factor of the first set of design cases is assigned one of a second set of values in the design suite; and
wherein the one or more constraints comprise the one or more disallowed combinations, or a modification of the one or more disallowed combinations.

17. The computer-program product of claim 1,
wherein the one or more first characteristics comprise a first requirement on generation of one or more of the generated responses of a first type for the first set of design cases; and
wherein the one or more second characteristics comprise a second requirement on generation of one or more of the generated responses of a second type for the second set of design cases, wherein the first type and the second type are different; and
wherein the instructions are operable to cause the computing system to:

receive one or more additional responses corresponding to conducting the second set of design cases in the experiment;
evaluate the one or more additional responses according to one or more generated responses of the computer-generated data corresponding to the second set of design cases; and
output evaluations of the one or more resulting responses and one or more additional responses.

18. The computer-program product of claim 1,
wherein the instructions are operable to cause the computing system to receive the one or more first characteristics by displaying a graphical user interface prompting a user to specify multiple bounds for generation of the computer-generated data associated with a first design space; and
wherein the multiple bounds define:
a first quantity of factors;
a first quantity of design runs;
any disallowed combinations; and
generation of responses for the first set of design cases.

19. The computer-program product of claim 1,
wherein the one or more first characteristics comprise a first requirement on generation of one or more of the generated responses of a first type for the first set of design cases; and
wherein the one or more second characteristics comprise a second requirement on generation of one or more of the generated responses of a second type for the second set of design cases, wherein the first type and the second type are different.

20. The computer-program product of claim 1,
wherein the design suite indicates an ordering of executing the first set of design cases and the second set of design cases in the experiment; and
wherein the instructions are operable to cause the computing system to:
receive one or more additional responses corresponding to conducting the second set of design cases in the experiment; and
evaluate the one or more additional responses according to one or more generated responses of the computer-generated data corresponding to the second set of design cases.

21. A computer-implemented method comprising:
receiving a request to generate computer-generated data for an experiment, wherein the computer-generated data comprises generated inputs defining one or more settings for a plurality of factors for a design of the experiment, and generated responses according to the design of the experiment, wherein the generated inputs and generated responses are generated to be representative of a respective design space of multiple different design spaces for the design of the experiment;
receiving one or more first characteristics, wherein:
at least one of the one or more first characteristics is received by receiving an indication of an identity of a software platform or machine learning algorithm;
the one or more first characteristics are for specifying generation of the computer-generated data associated with a first design space of the multiple different design spaces; and
the first design space defines candidate options for generating inputs, of the generated inputs, according to a first set of factors of the plurality of factors;
receiving one or more second characteristics for specifying generation of the computer-generated data associated with a second design space of the multiple different design spaces, wherein the second design space defines candidate options for generating inputs, of the generated inputs, according to a second set of factors of the plurality of factors;

responsive to the request, generating a design suite that comprises the computer-generated data that represents, in a first set of design cases of the design suite, settings constrained by the first design space, and in a second set of design cases of the design suite settings constrained by the second design space;

submitting settings of the first set of design cases into the software platform or machine learning algorithm;

receiving one or more resulting responses corresponding to conducting, with the software platform or machine learning algorithm, the first set of design cases in the experiment;

evaluating the one or more resulting responses according to one or more generated responses of the computer-generated data corresponding to the first set of design cases; and outputting an evaluation of the one or more resulting responses.

22. The computer-implemented method of claim 21, wherein the generating the design suite comprises generating the design suite to comprise:
   a first fractional factorial design with a first subset of candidate inputs for the first set of factors from a full factorial design for the first design space; and
   a second fractional factorial design with a second subset of candidate inputs for the second set of factors from a full factorial design for the second design space.

23. The computer-implemented method of claim 21, wherein the generating the design suite comprises:
   displaying in a graphical user interface a visual summary of the one or more first characteristics and the one or more second characteristics; and
   receiving the one or more resulting responses according to user selection in the visual summary pertaining to the one or more first characteristics.

24. The computer-implemented method of claim 21, wherein the generating the design suite comprises displaying in a graphical user interface a visual summary of the one or more first characteristics and the one or more second characteristics; and
   wherein the evaluating the one or more resulting responses comprises:
   comparing respective responses of multiple design cases associated with the first set of design cases of the design suite to generated responses for the first set of design cases; and
   displaying in the visual summary an indication of overall performance for the first set of design cases.

25. The computer-implemented method of claim 21, wherein the receiving the one or more first characteristics comprises receiving an indication of a software platform or machine learning algorithm associated with the first set of factors; and
   wherein the receiving the one or more resulting responses comprises receiving responsive to submitting the settings constrained by the first design space into the software platform or machine learning algorithm.

26. The computer-implemented method of claim 21, wherein the receiving the request comprises receiving a user indication to validate, according to one or more validation specifications for the multiple different design spaces, wherein the one or more validation specifications relate to determining deviation from a respective specified result for the software platform or machine learning algorithm based on testing one or more inputs of the design suite submitted to the software platform or machine learning algorithm; and
   wherein the evaluating the one or more resulting responses comprises indicating a respective deviation from the respective specified result.

27. The computer-implemented method of claim 21, wherein the generating the design suite comprises designing a covering array for the first set of factors;
   wherein the receiving the one or more resulting responses comprises receiving according to a set of inputs of the covering array;
   wherein the evaluating the one or more resulting responses comprises indicating a failure indication corresponding to the set of inputs; and
   wherein the computer-implemented method further comprises displaying the subset of design cases of the design suite that are associated with the failure indication.

28. The computer-implemented method of claim 21, wherein the generating the design suite comprises displaying in a graphical user interface a first visual representation of the one or more first characteristics and a second visual representation of the one or more second characteristics; and
   wherein the computer-implemented method further comprises:
   receiving a user selection of the first visual representation; and
   responsive to the user selection, associating an indicator with the first visual representation indicating a verified data set for a construction library comprising the one or more first characteristics, wherein the construction library comprises instructions for generating the verified data set for a subsequent design suite.

29. The computer-implemented method of claim 21, wherein the one or more first characteristics comprise a first requirement on generation of one or more of the generated responses of a first type for the first set of design cases; and
   wherein the one or more second characteristics comprise a second requirement on generation of one or more of the generated responses of a second type for the second set of design cases, wherein the first type and the second type are different; and
   wherein the method further comprises:
   receiving one or more additional responses corresponding to conducting the second set of design cases in the experiment;
   evaluating the one or more additional responses according to according to one or more generated responses of the computer-generated data corresponding to the second set of design cases; and
   outputting distinct evaluations of the one or more resulting responses and one or more additional responses.

30. A computing device comprising processor and memory, the memory containing instructions executable by the processor wherein the computing device is configured to:
   receive a request to generate computer-generated data for an experiment, wherein the computer-generated data comprises generated inputs defining one or more settings for a plurality of factors for a design of the experiment, and generated responses according to the design of the experiment, wherein the generated inputs and generated responses are generated to be representative of a respective design space of multiple different design spaces for the design of the experiment;

receive one or more first characteristics, wherein:
- at least one of the one or more first characteristics is received by receiving an indication of an identity of a software platform or machine learning algorithm;
- the one or more first characteristics are for specifying generation of the computer-generated data associated with a first design space of the multiple different design spaces; and
- the first design space defines candidate options for generating inputs, of the generated inputs, according to a first set of factors of the plurality of factors;

receive one or more second characteristics for specifying generation of the computer-generated data associated with a second design space of the multiple different design spaces, wherein the second design space defines candidate options for generating inputs, of the generated inputs, according to a second set of factors of the plurality of factors;

responsive to the request, generate a design suite that comprises the computer-generated data that represents, in a first set of design cases of the design suite, settings constrained by the first design space, and represents, in a second set of design cases of the design suite, settings constrained by the second design space;

submit settings of the first set of design cases into the software platform or machine learning algorithm;

receive one or more resulting responses corresponding to conducting, with the software platform or machine learning algorithm, the first set of design cases in the experiment;

evaluate the one or more resulting responses according to one or more generated responses of the computer-generated data corresponding to the first set of design cases; and output an evaluation of the one or more resulting responses.

\* \* \* \* \*

UNITED STATES PATENT AND TRADEMARK OFFICE
CERTIFICATE OF CORRECTION

PATENT NO. : 11,328,106 B2
APPLICATION NO. : 17/365083
DATED : May 10, 2022
INVENTOR(S) : Ryan Adam Lekivetz et al.

It is certified that error appears in the above-identified patent and that said Letters Patent is hereby corrected as shown below:

In the Specification

Column 9, Line 32, delete "remote server 140", and insert --a remote server--, therefor.

Column 9, Line 37, delete "system 150,", and insert --system,--, therefor.

Column 9, Line 54, delete "network 114,", and insert --network 108,--, therefor.

Column 13, Line 32, delete "raw bites", and insert --raw bytes--, therefor.

Column 15, Line 57, delete "may be receive", and insert --may be received--, therefor.

Column 16, Line 56, delete "grid nodes).", and insert --grid nodes.--, therefor.

Column 19, Line 8, delete "flow chart", and insert --flow chart 500--, therefor.

Column 20, Line 40, delete "DMBS 628", and insert --DBMS 628--, therefor.

Column 20, Line 49, delete "and 620", and insert --and 610--, therefor.

Column 20, Line 51, delete "and 620", and insert --and 610--, therefor.

Column 20, Line 66, delete "DMBS 628", and insert --DBMS 628--, therefor.

Column 21, Line 2, delete "DMBS 628", and insert --DBMS 628--, therefor.

Column 21, Line 18, delete "flow chart", and insert --flow chart 700--, therefor.

Signed and Sealed this
Nineteenth Day of March, 2024

Katherine Kelly Vidal
*Director of the United States Patent and Trademark Office*

Column 65, Lines 66-67, delete "X1 == "L2" && (X2 >= 0 && X2 <= 1) || X2 >= -0.5 && X2 <= 5 && (X3 >= && X3 <= 1).", and insert --X1 == "L2" && (X2 >= 0 && X2 <= 1) || X2 >= -0.5 && X2 <= 0.5 && (X3 >= 0.5 && X3 <= 1).--, therefor.